US012608522B1

(12) United States Patent
Alasseur et al.

(10) Patent No.: US 12,608,522 B1
(45) Date of Patent: Apr. 21, 2026

(54) REPLAYING SCENARIOS WITHIN DISTRIBUTED INTERACTIVE APPLICATIONS

(71) Applicant: Cadence Design Systems, Inc., San Jose, CA (US)

(72) Inventors: Xavier Alasseur, Ajaccio (FR); Arnold Jean Marie Gustave Ginetti, Antibes (FR)

(73) Assignee: Cadence Design Systems, Inc., San Jose, CA (US)

( * ) Notice: Subject to any disclaimer, the term of this patent is extended or adjusted under 35 U.S.C. 154(b) by 314 days.

(21) Appl. No.: 18/467,888

(22) Filed: Sep. 15, 2023

Related U.S. Application Data

(63) Continuation-in-part of application No. 18/124,086, filed on Mar. 21, 2023.

(51) Int. Cl.
| | |
|---|---|
| *G06F 30/31* | (2020.01) |
| *G06F 3/04842* | (2022.01) |
| *G06F 9/451* | (2018.01) |

(52) U.S. Cl.
CPC .......... G06F 30/31 (2020.01); G06F 3/04842 (2013.01); G06F 9/451 (2018.02)

(58) Field of Classification Search
CPC ....... G06F 30/31; G06F 9/451; G06F 3/04842
See application file for complete search history.

(56) References Cited

U.S. PATENT DOCUMENTS

| | | | | |
|---|---|---|---|---|
| 8,370,791 | B2 * | 2/2013 | Ogami | G06F 30/392 |
| | | | | 716/139 |
| 9,223,915 | B1 * | 12/2015 | Ginetti | G06F 30/367 |
| 9,294,354 | B2 * | 3/2016 | Kumar | G06F 30/39 |
| 9,619,608 | B1 * | 4/2017 | Bernard | G06F 30/39 |
| 9,684,750 | B1 * | 6/2017 | Bernard | G06F 30/30 |
| 9,721,052 | B1 * | 8/2017 | Bernard | G06F 30/39 |
| 10,404,700 | B1 * | 9/2019 | Bernard | G06F 30/30 |
| 11,188,508 | B1 * | 11/2021 | Wang | G06F 16/113 |
| 11,212,387 | B1 * | 12/2021 | Olson | H04M 3/493 |
| 11,379,753 | B1 * | 7/2022 | Leao | G06N 7/01 |
| 12,475,282 | B1 * | 11/2025 | Ginetti | G06F 30/31 |
| 2003/0140113 | A1 * | 7/2003 | Balasuriya | H04L 67/141 |
| | | | | 709/248 |
| 2006/0113379 | A1 * | 6/2006 | Cricco | H04W 8/245 |
| | | | | 235/380 |
| 2006/0123376 | A1 * | 6/2006 | Vogel | G06F 30/30 |
| | | | | 716/139 |
| 2006/0259679 | A1 * | 11/2006 | Schumann | G06F 12/0607 |
| | | | | 711/E12.079 |
| 2007/0157139 | A1 | 7/2007 | White | |
| 2011/0016294 | A1 * | 1/2011 | Brubaker | G06F 30/00 |
| | | | | 715/700 |

(Continued)

*Primary Examiner* — Tadesse Hailu

(74) *Attorney, Agent, or Firm* — Mark H. Whittenberger; Holland & Knight LLP

(57) ABSTRACT

Embodiments included herein are directed towards a method for use in an electronic design. The embodiments may include receiving, at a graphical user interface, a command associated with a currently displayed electronic design session and determining, using a processor, that a modal dialog from a non-currently displayed electronic design session is triggered by the command. Embodiments may further include causing a display at the graphical user interface of a form associated with the modal dialog that requires user action.

18 Claims, 108 Drawing Sheets

(56)         References Cited

U.S. PATENT DOCUMENTS

| | | | |
|---|---|---|---|
| 2011/0027952 A1 | 2/2011 | Kronholz | |
| 2011/0089572 A1 | 4/2011 | Tercan | |
| 2012/0023471 A1* | 1/2012 | Fischer | G06F 30/39 |
| | | | 716/115 |
| 2015/0318044 A1* | 11/2015 | Hu | H01L 24/85 |
| | | | 438/107 |
| 2016/0261274 A1* | 9/2016 | Tidwell | G06F 1/324 |
| 2018/0260498 A1* | 9/2018 | Nagaraja | G06F 30/327 |
| 2020/0280527 A1* | 9/2020 | Venugopalan | H04L 45/28 |
| 2025/0036861 A1* | 1/2025 | Goshen | G06F 40/205 |

* cited by examiner

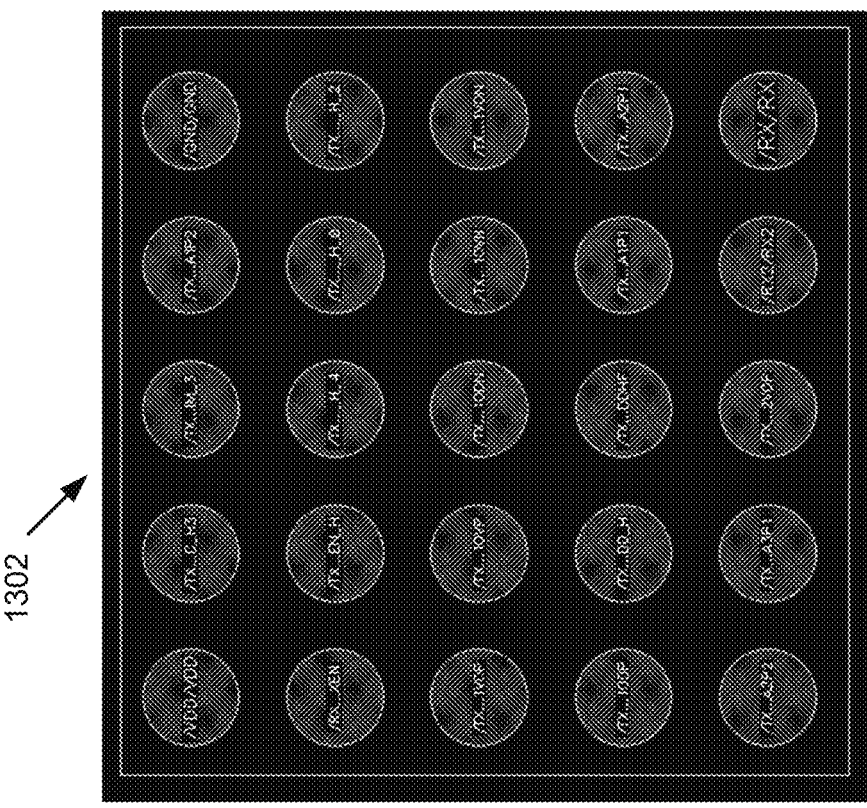
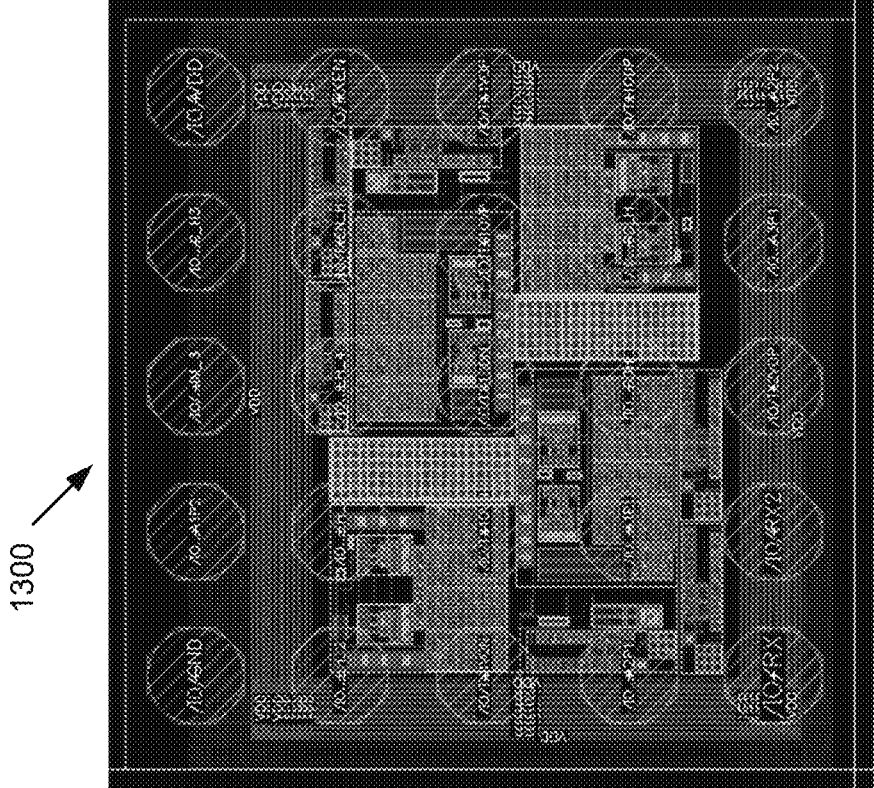
FIG. 13

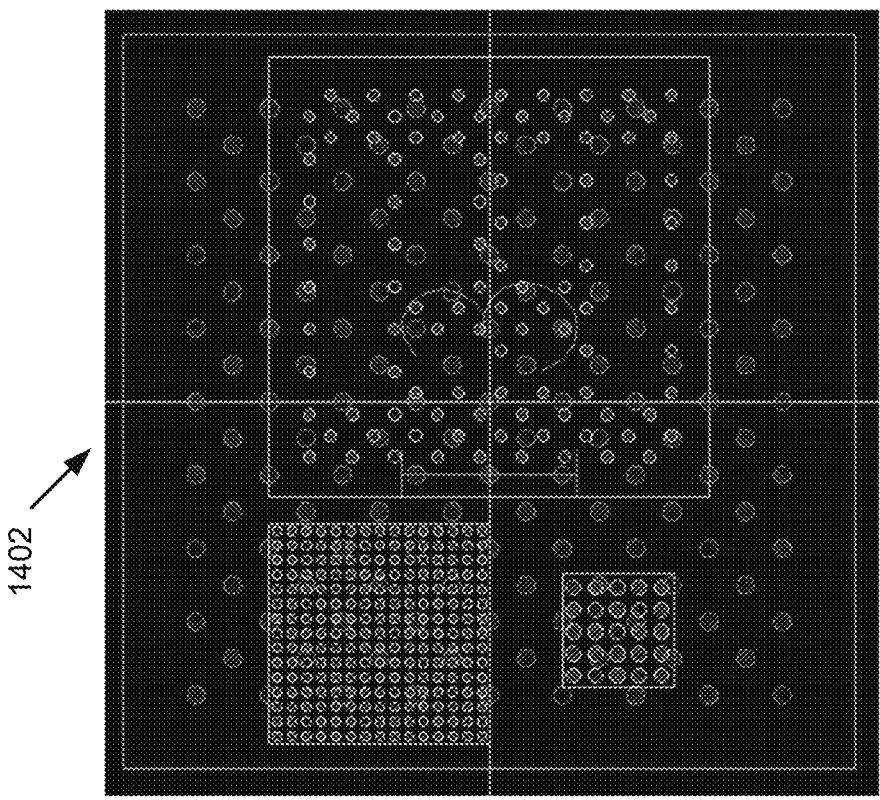
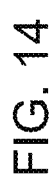
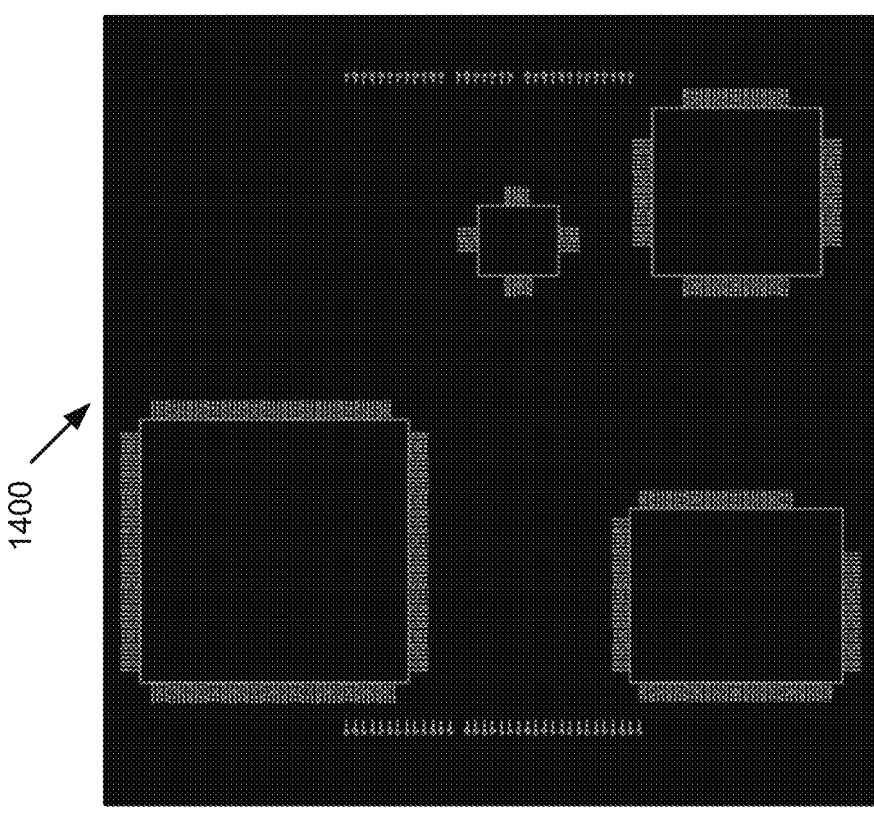
FIG. 14

1800

1802

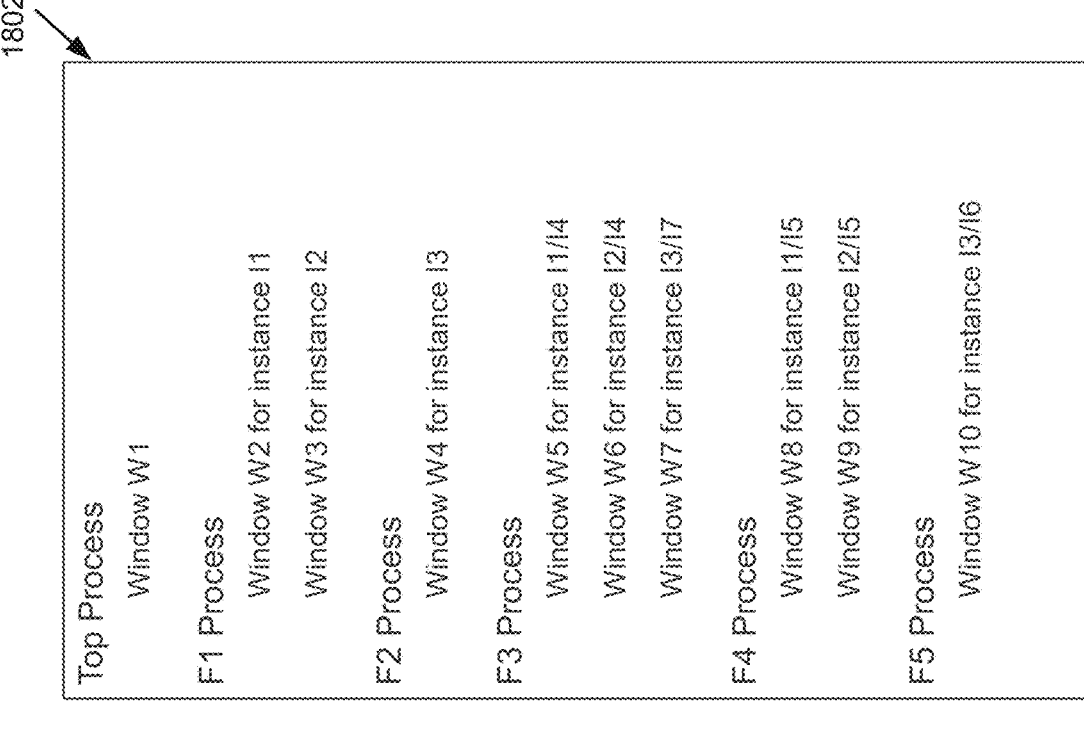

Top Fabric
    Instance I1 of Fabric F1
    Instance I2 of Fabric F1
    Instance I3 of Fabric F2

F1 Fabric
    Instance I4 of Fabric F3
    Instance I5 of Fabric F4

F2 Fabric
    Instance I6 of Fabric F5
    Instance I7 of Fabric F3

Top Process
    Window W1

F1 Process
    Window W2 for instance I1
    Window W3 for instance I2

F2 Process
    Window W4 for instance I3

F3 Process
    Window W5 for instance I1/I4
    Window W6 for instance I2/I4
    Window W7 for instance I3/I7

F4 Process
    Window W8 for instance I1/I5
    Window W9 for instance I2/I5

F5 Process
    Window W10 for instance I3/I6

FIG. 18

2100

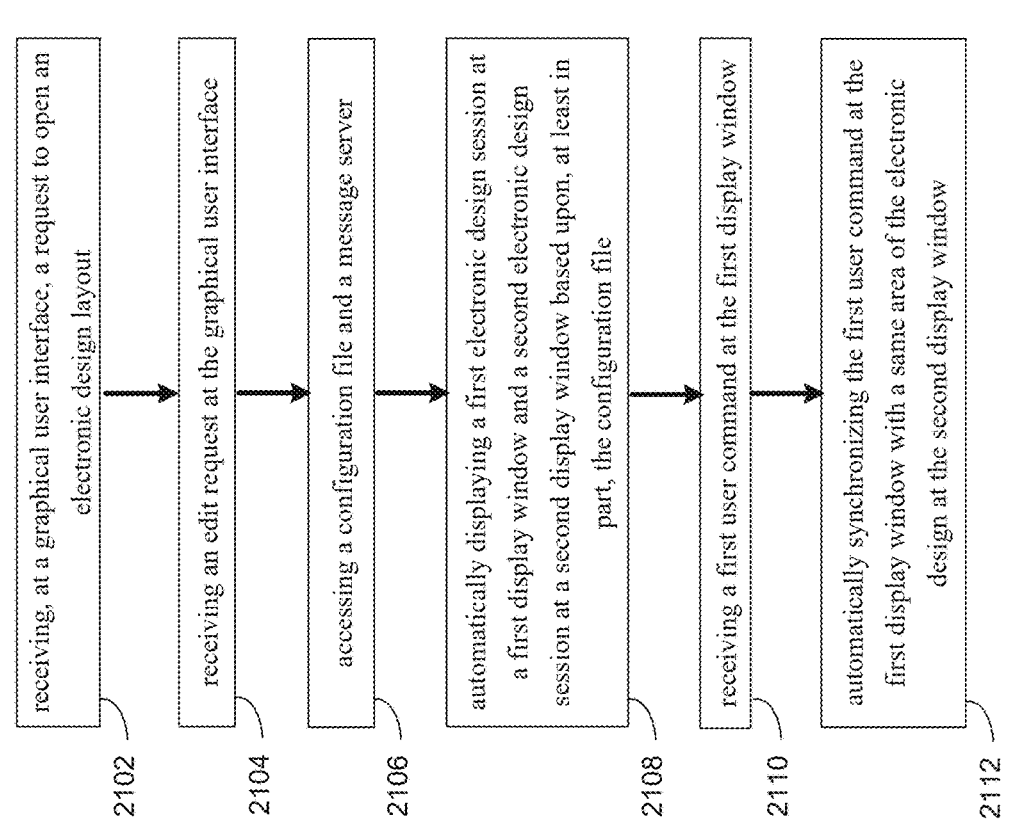

receiving, at a graphical user interface, a request to open an electronic design layout

2102 receiving an edit request at the graphical user interface

2104 accessing a configuration file and a message server

2106 automatically displaying a first electronic design session at a first display window and a second electronic design session at a second display window based upon, at least in part, the configuration file

2108 receiving a first user command at the first display window

2110 automatically synchronizing the first user command at the first display window with a same area of the electronic design at the second display window

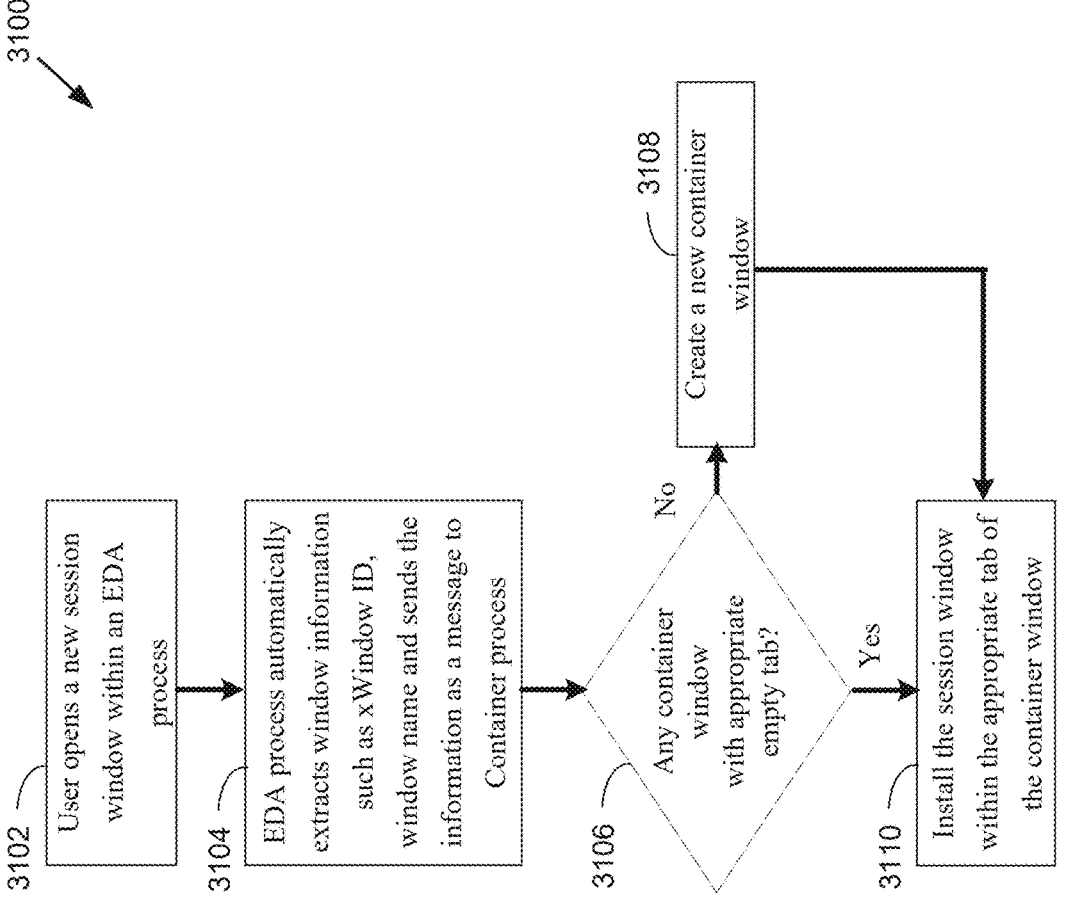

3100

3102   User opens a new session window within an EDA process

3104   EDA process automatically extracts window information such as xWindow ID, window name and sends the information as a message to Container process 3106   Any container window with appropriate empty tab?

3108   Create a new container window

No

Yes

3110   Install the session window within the appropriate tab of the container window

FIG. 31

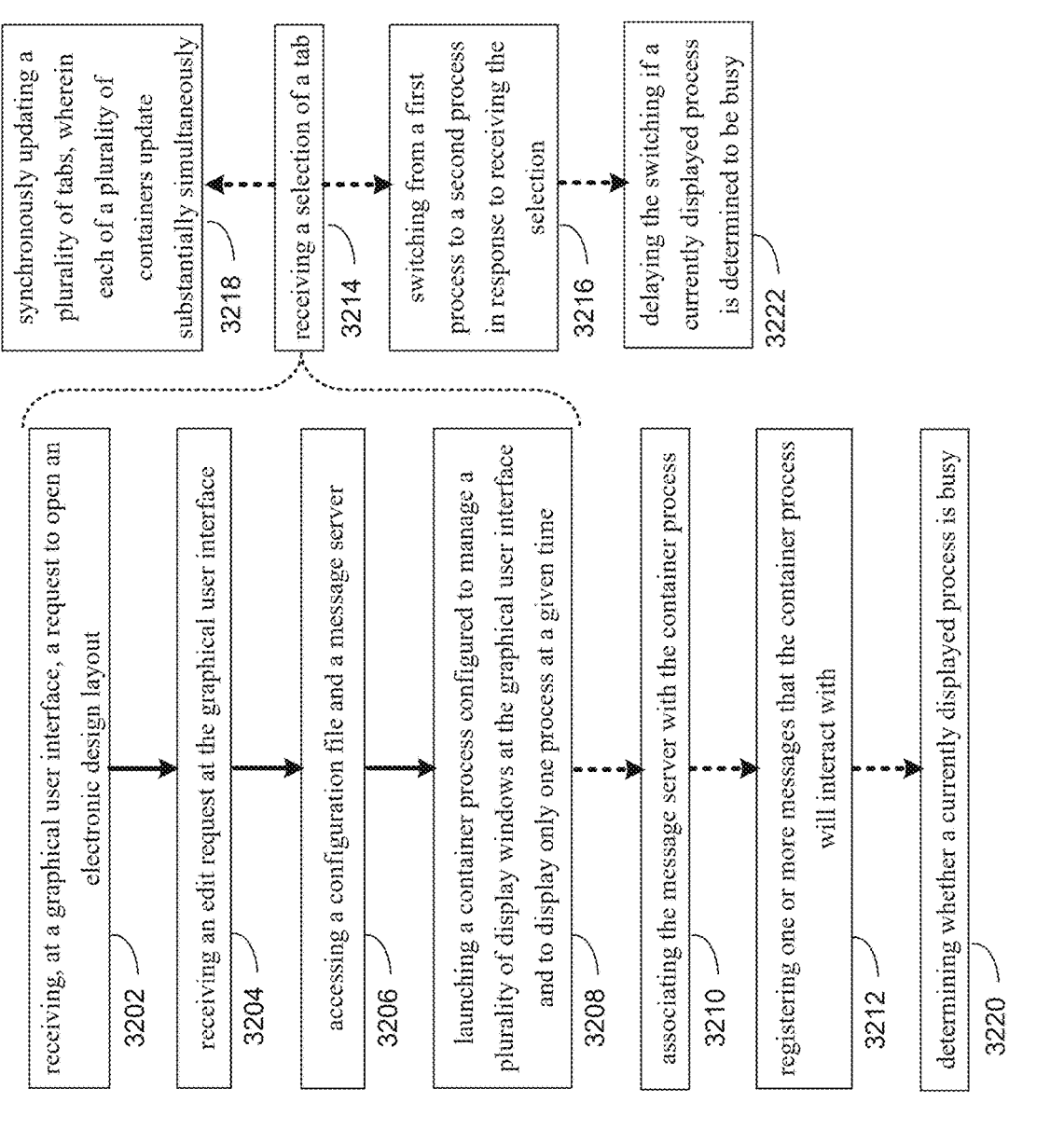

receiving, at a graphical user interface, a request to open an electronic design layout

3202 receiving an edit request at the graphical user interface

3204 accessing a configuration file and a message server

3206 launching a container process configured to manage a plurality of display windows at the graphical user interface and to display only one process at a given time

3208 associating the message server with the container process

3210 registering one or more messages that the container process will interact with

3212 determining whether a currently displayed process is busy

3220 synchronously updating a plurality of tabs, wherein each of a plurality of containers update substantially simultaneously

3218 receiving a selection of a tab

3214 switching from a first process to a second process in response to receiving the selection

3216 delaying the switching if a currently displayed process is determined to be busy

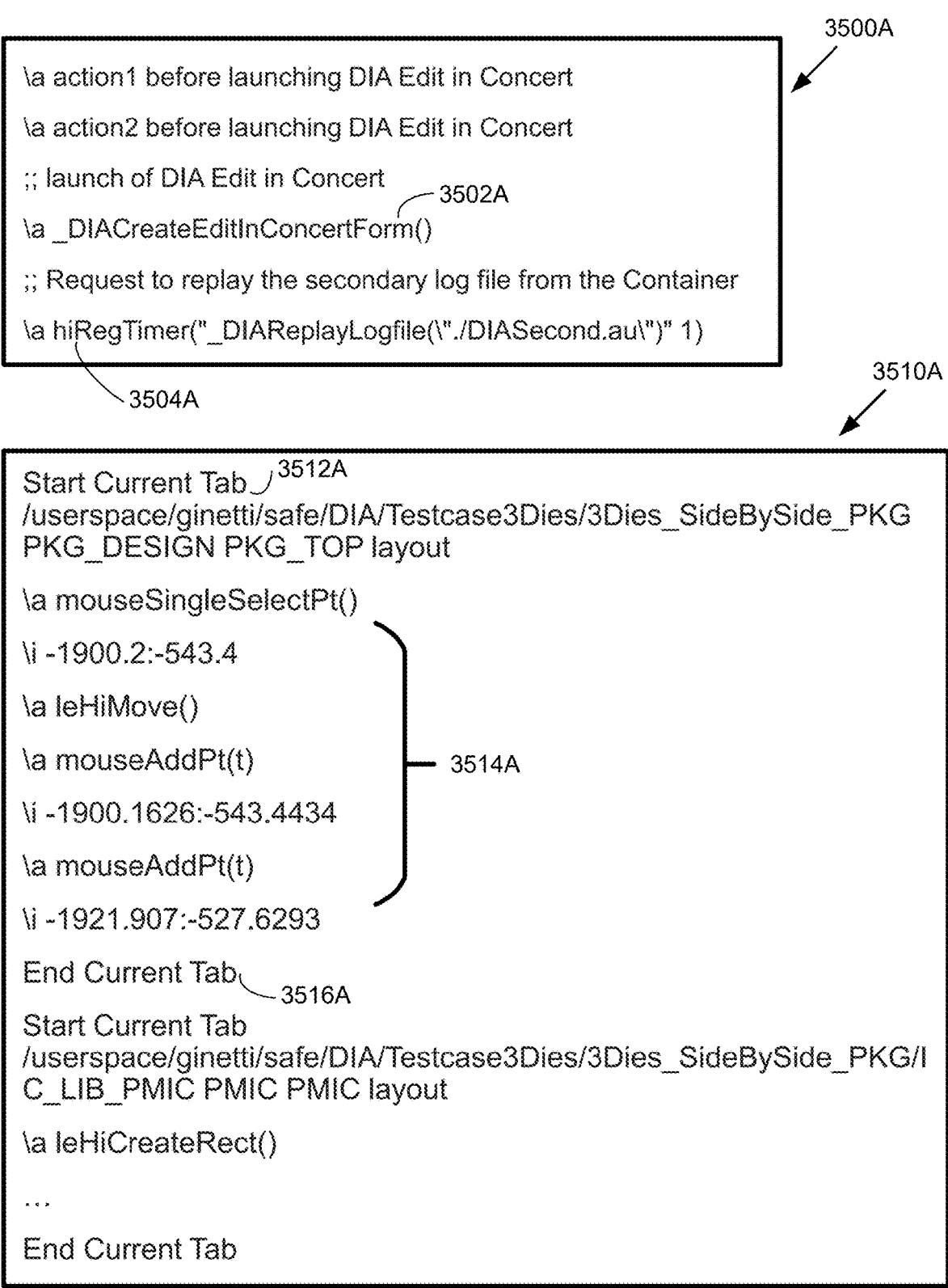

3500A

\a action1 before launching DIA Edit in Concert

\a action2 before launching DIA Edit in Concert

;; launch of DIA Edit in Concert

\a _DIACreateEditInConcertForm()    3502A

;; Request to replay the secondary log file from the Container

\a hiRegTimer("_DIAReplayLogfile(\"./DIASecond.au\")" 1)

3504A

3510A

Start Current Tab   3512A
/userspace/ginetti/safe/DIA/Testcase3Dies/3Dies_SideBySide_PKG
PKG_DESIGN PKG_TOP layout \a mouseSingleSelectPt()

\i -1900.2:-543.4

\a leHiMove()

\a mouseAddPt(t)

\i -1900.1626:-543.4434

\a mouseAddPt(t)

\i -1921.907:-527.6293

3514A

End Current Tab
   3516A
Start Current Tab
/userspace/ginetti/safe/DIA/Testcase3Dies/3Dies_SideBySide_PKG/I
C_LIB_PMIC PMIC PMIC layout \a leHiCreateRect()

...

End Current Tab

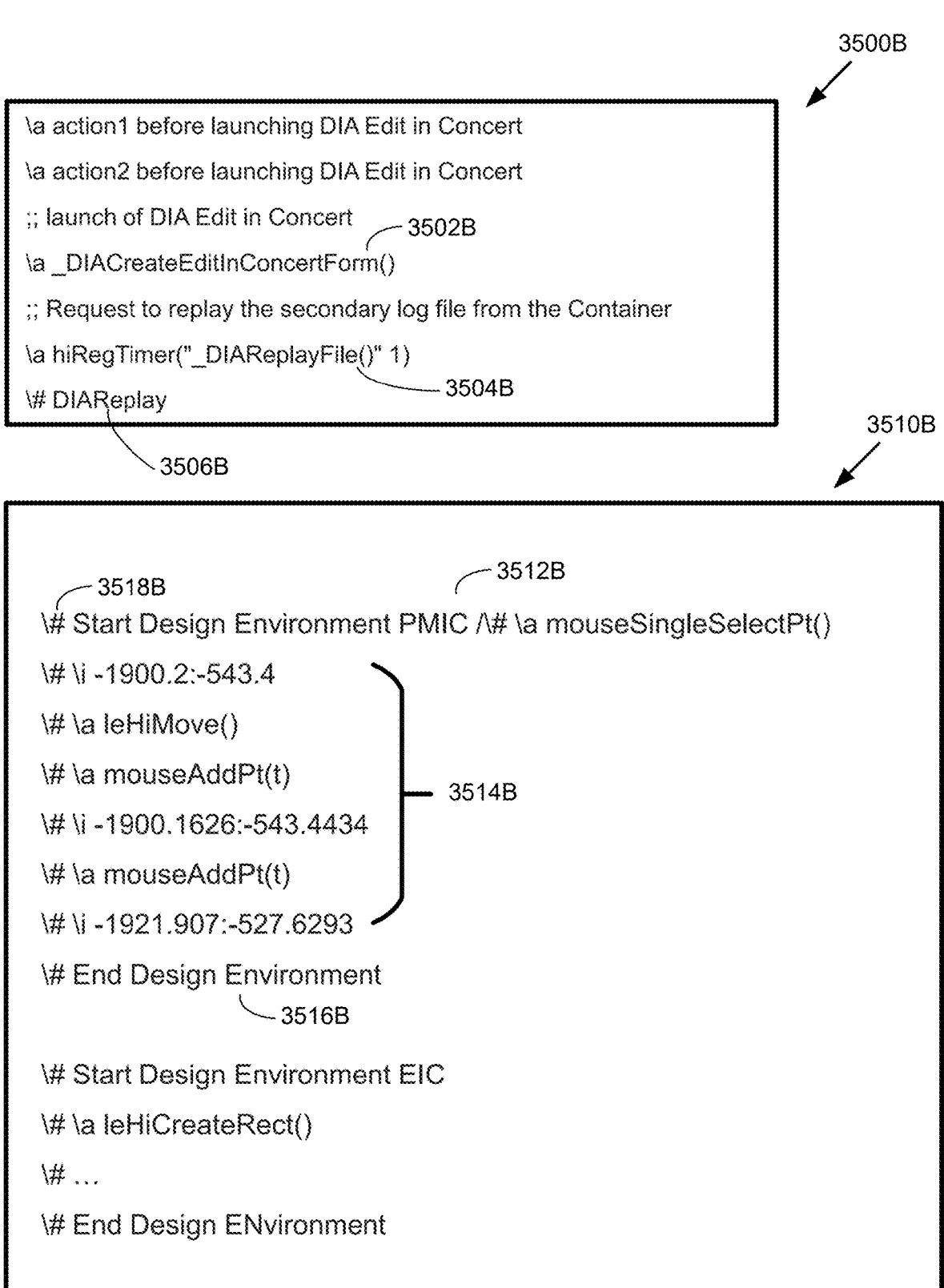

```
\a action1 before launching DIA Edit in Concert

\a action2 before launching DIA Edit in Concert

;; launch of DIA Edit in Concert          3502B

\a _DIACreateEditInConcertForm()

;; Request to replay the secondary log file from the Container

\a hiRegTimer("_DIAReplayFile()" 1)
                                    3504B
\# DIAReplay
```

3506B

3510B

```
          3518B              3512B
\# Start Design Environment PMIC /\# \a mouseSingleSelectPt()

\# \i -1900.2:-543.4

\# \a leHiMove()

\# \a mouseAddPt(t)
                              3514B
\# \i -1900.1626:-543.4434

\# \a mouseAddPt(t)

\# \i -1921.907:-527.6293

\# End Design Environment
                    3516B

\# Start Design Environment EIC

\# \a leHiCreateRect()

\# ...

\# End Design ENvironment
```

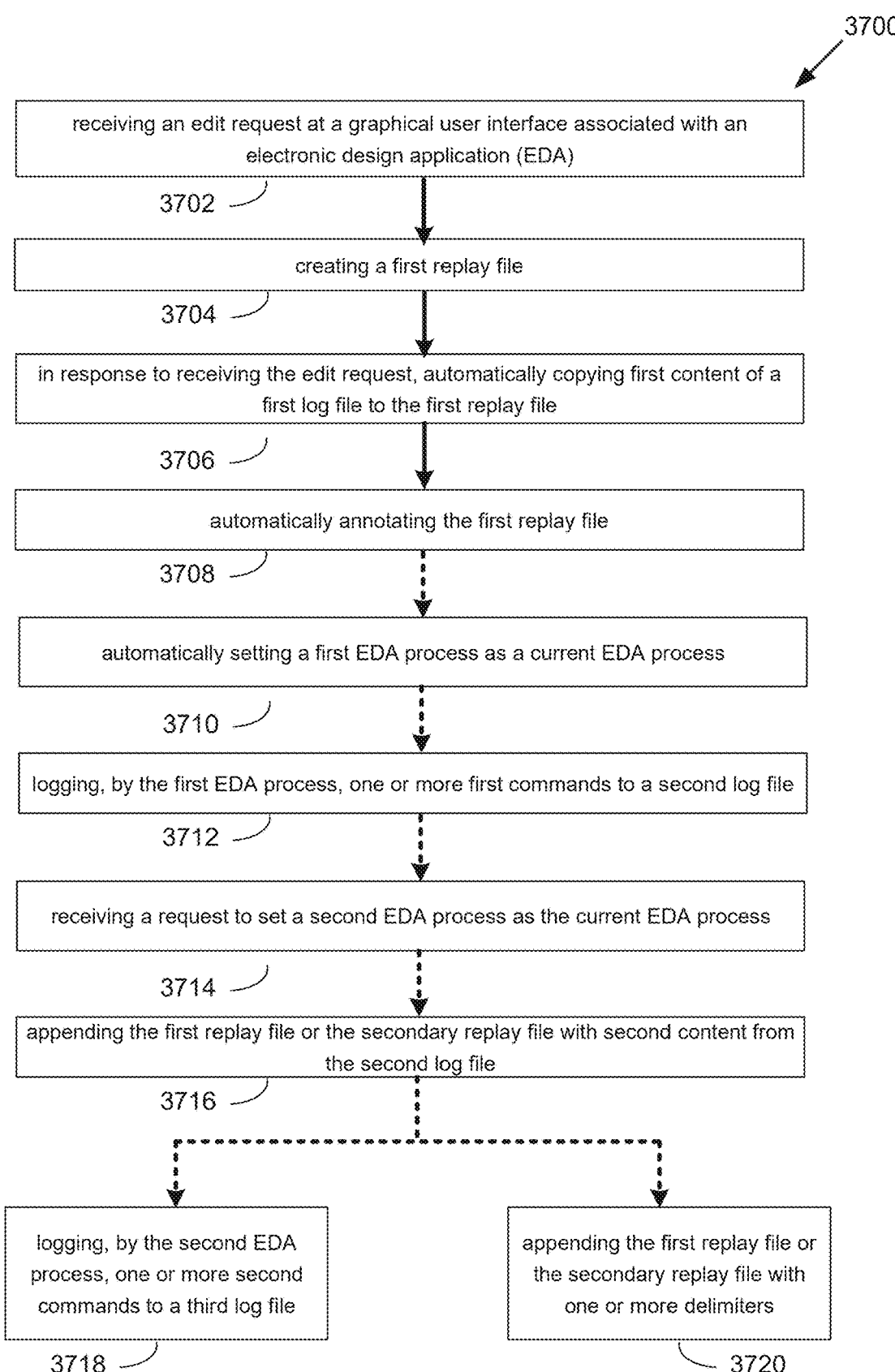

receiving an edit request at a graphical user interface associated with an electronic design application (EDA)

3702 creating a first replay file

3704 in response to receiving the edit request, automatically copying first content of a first log file to the first replay file

3706 automatically annotating the first replay file

3708 automatically setting a first EDA process as a current EDA process

3710 logging, by the first EDA process, one or more first commands to a second log file

3712 receiving a request to set a second EDA process as the current EDA process

3714 appending the first replay file or the secondary replay file with second content from the second log file

3716 logging, by the second EDA process, one or more second commands to a third log file

3718 appending the first replay file or the secondary replay file with one or more delimiters

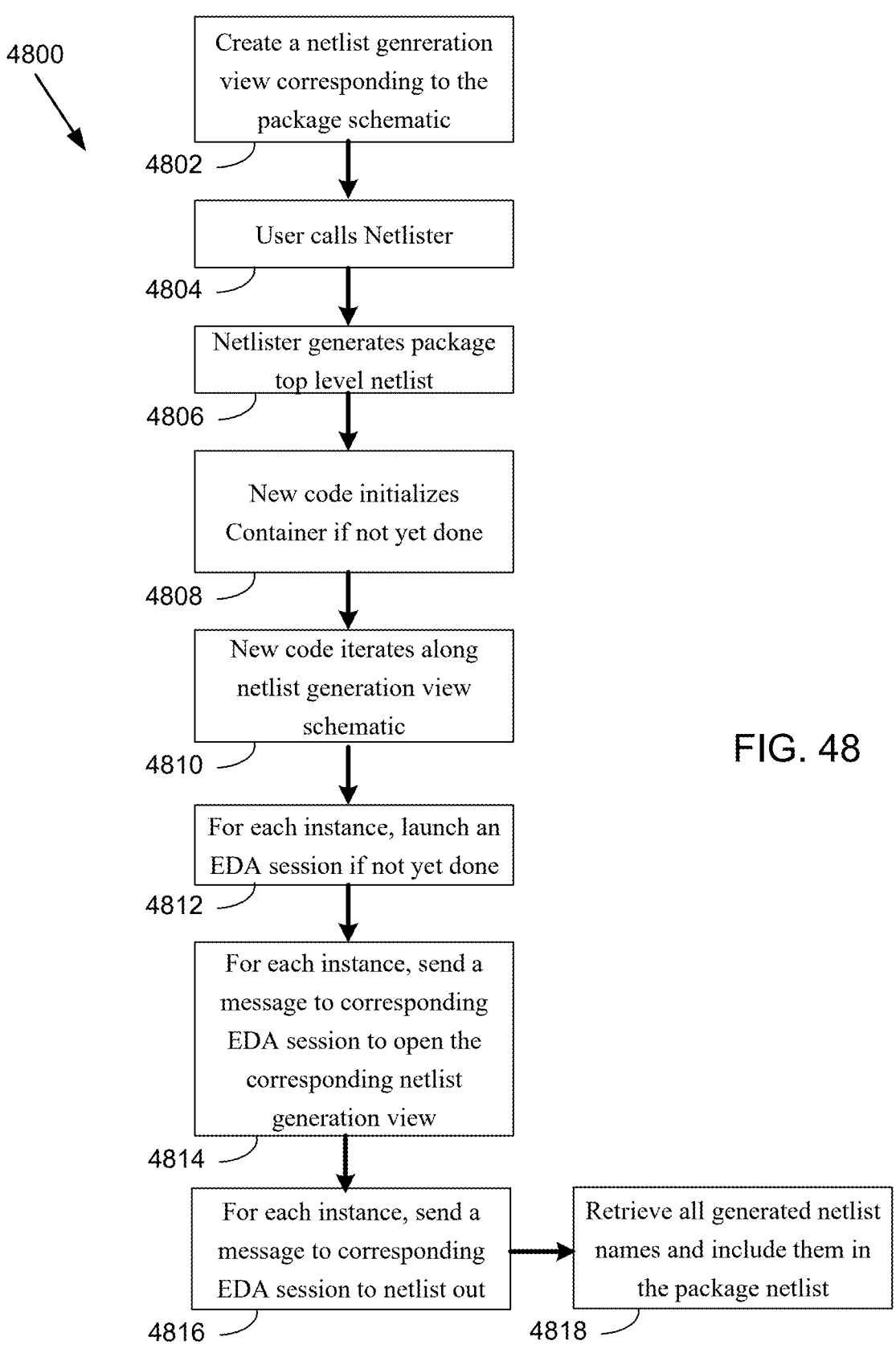

4800

Create a netlist genreration view corresponding to the package schematic

4802

User calls Netlister

4804

Netlister generates package top level netlist

4806

New code initializes Container if not yet done

4808

New code iterates along netlist generation view schematic

4810

For each instance, launch an EDA session if not yet done

4812

For each instance, send a message to corresponding EDA session to open the corresponding netlist generation view

4814

For each instance, send a message to corresponding EDA session to netlist out

4816

Retrieve all generated netlist names and include them in the package netlist

```
// Point Netlist Generated on: May  6 17:25:07 2022
// Generated for: spectre
// Design Netlist Generated on: May  6 17:25:07 2022
// Design library name: PKG_DESIGN
// Design cell name: PKG_TOP
// Design view name: schematic
simulator lang=spectre
global 0

// Library name: PKG_DESIGN
// Cell name: PKG_TOP
// View name: schematic
I1 (TX2VOP TXRCCALMON TX1OOP RXAVDDLF GND RX2OON TXPA1P1 RXAGNDLF TXPA1P1 \
        RXRCCALEN TXATBDEC_R_2 TXAVDDLF RXEN_R RXRCCALMON GND TXAVDDHF \
        RX2OOP TX2OON TXEN RXAVDD_R TX1OON RX2OVP RXRTRIM_2 TXATBDEC_R_1 \
        RXPA3P2 TXRTRIM_2 RXAGNDHF RXATBDEC_R_1 RXPA3P2 RXATBDEC_R_2 \
        TXRTRIM_0 RX2VOP TXATBDEC_R_0 TXRTRIM_1 RXRTRIM_0 RX2OVN TXAGNDHF \
        RXPA3P1 RXVOUT TXATBDEC_R_3 TX2OVN RXATBDEC_R_3 TX1OVN RXRTRIM_1 \
        TXAGND_EXTRA1 TXAGND_EXTRA0 TXATBDEC_R_4 TX2VON TX2OVP RXATB_P \
        RXATBDEC_R_0 TXAGNDLF RXATBDEC_R_4 VDD VDD TXATBDEC_R_4 TXPA2P2 \
        TX1OVP TXVOUT TXAVDD_R RXAVDDHF TXVIN TX2OOP RXVIN RXAVDD_EXTRA1 \
        RXAVDD_EXTRA0 TXAVDDHF TXRTRIM_3 RXAGND TXAVDD_R TXPA1P2 TX1VOP \
        RX2VON TXATB_N RXRTRIM_3 TXAVDD_EXTRA1 TXAVDD_EXTRA0 TXATBDEC_R_2 \
        RXATB_N TXPA3P1 GND GND GND GND GND GND GND GND RXPA3P1 \1TXEN_N \
        TXRCCALEN RXPA1P1 1TX1VON TXATB_P TXAGND_N RXEN TXPA3P2 RXAGND_N \
        RXPA1P2 TXPA2P1) LNA_PKG
I2 (TX1OOP TX2VOP TXPA1P1 GND RX TXATBDEC_R_0 TXATBDEC_R_2 \1TXEN_N TX1OON \
        TXRTRIM_3 TXATBDEC_R_4 TX1OVN TXATBDEC_R3 TXAVDDHF VDD TX1OVP \
        TXPA2P2 RX2 TXAVDD_R TX1VOP TXPA1P2 RXEN TXPA3P1 1TX1VON TXPA2P1) \
        PMIC_PKG
I0 (GND GND A148 TX1OOP GND GND RXAGNDHF GND GND GND GND GND GND A141 \
        RX2OON GND GND GND A157 A167 GND A143 GND RXAVDD_EXTRA1 GND GND \
        GND GND GND GND TX2VOP GND RXPA1P1 GND RXVOUT GND A142 RX2OOP \
        RXPA2P1 RX GND GND A151 GND GND RXAGNDLF A139 TXATBDEC_R3 GND A145 \
        GND TX1OON GND RXRTRIM_0 A140 GND GND RXRTRIM_1 RXATB_N \
        TXATBDEC_R_1 GND GND GND GND GND RXPA2P2 GND GND GND A149 \
        RXRTRIM_2 RXAVDDLF A166 RXEN GND GND RXAVDD_EXTRA0 GND RXRCCALMON \
        GND 1TX1VON GND A131 GND GND GND GND GND GND RX2OVN GND A146 GND \
        GND GND A150 A155 RXATBDEC_R_2 GND A138 GND GND TX2OOP GND GND \
        A133 RXATBDEC_R_4 TX1VOP RXPA3P2 RXPA1P2 GND RX2OVP TXATBDEC_R_0 \
        GND A168 A156 A139 A169 GND \1TXEN_N A165 RXPA3P1 GND GND RX2 \
        TXAGND_EXTRA0 A147 GND GND A161 RXRTRIM_3 GND RXATBDEC_R_0 GND GND \
        GND A144 RX2VOP TX1OVP A130 A137 GND GND GND RXAGND_N GND \
        A159 TX2OVN GND RX2VON GND GND GND GND GND GND A153 TXAGNDHF A163 \
        RXRCCALEN GND GND RXEN GND TX2OVP GND GND GND GND TXAGNDLF A152 \
        RXAVDDHF GND GND GND GND GND VDD A135 GND A162 GND RXATB_P RXAGND \
        GND A128 TX1OVN GND TX2VON GND GND A134 GND GND A160 GND RXVIN \
        RXATBDEC_R_1 GND RXAVDD_R GND GND GND GND GND GND GND GND GND GND \
        TXAGND_R GND GND RXATBDEC_R_3 GND TXAGND_EXTRA1 TX1OON GND TXATB_N \
        TXATBDEC_R_3 A138 RXEN_R A158) EIC_PKG
simulatorOptions options reltol=1e-3 vabstol=1e-6 iabstol=1e-12 temp=27 \
        tnom=27 scale=1.0 scalem=1.0 gmin=1e-12 rforce=1 maxnotes=5 maxwarns=5 \
        digits=5 cols=80 pivrel=1e-3 captclock=1000 \
        sensfile="../psf/sens.output" checklimitdest=psf
modelParameter info what=models where=rawfile
```

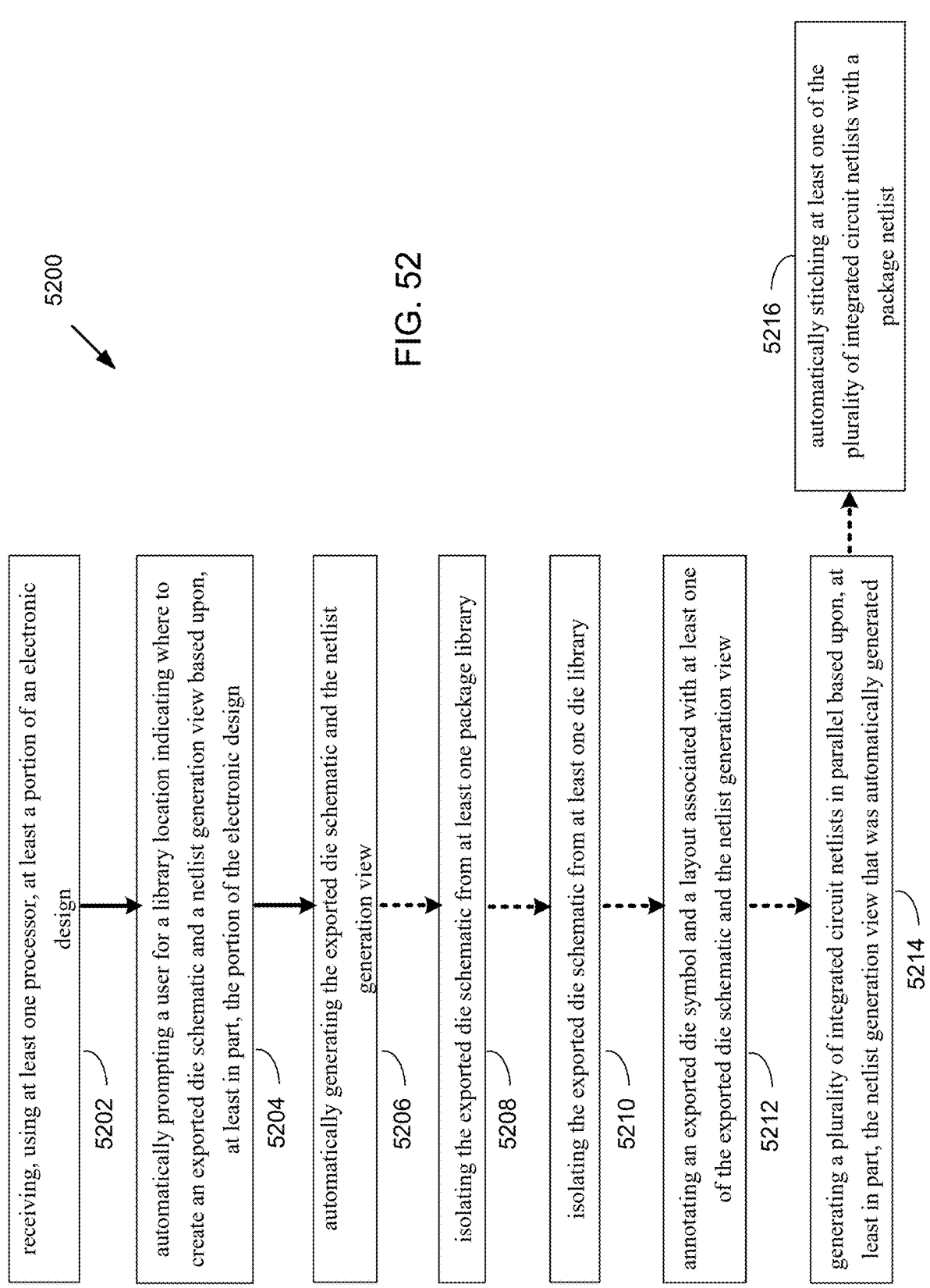

FIG. 52

5200 receiving, using at least one processor, at least a portion of an electronic design

5202 automatically prompting a user for a library location indicating where to create an exported die schematic and a netlist generation view based upon, at least in part, the portion of the electronic design

5204 automatically generating the exported die schematic and the netlist generation view

5206 isolating the exported die schematic from at least one package library

5208 isolating the exported die schematic from at least one die library

5210 annotating an exported die symbol and a layout associated with at least one of the exported die schematic and the netlist generation view

5212 generating a plurality of integrated circuit netlists in parallel based upon, at least in part, the netlist generation view that was automatically generated

5214 automatically stitching at least one of the plurality of integrated circuit netlists with a package netlist

5216

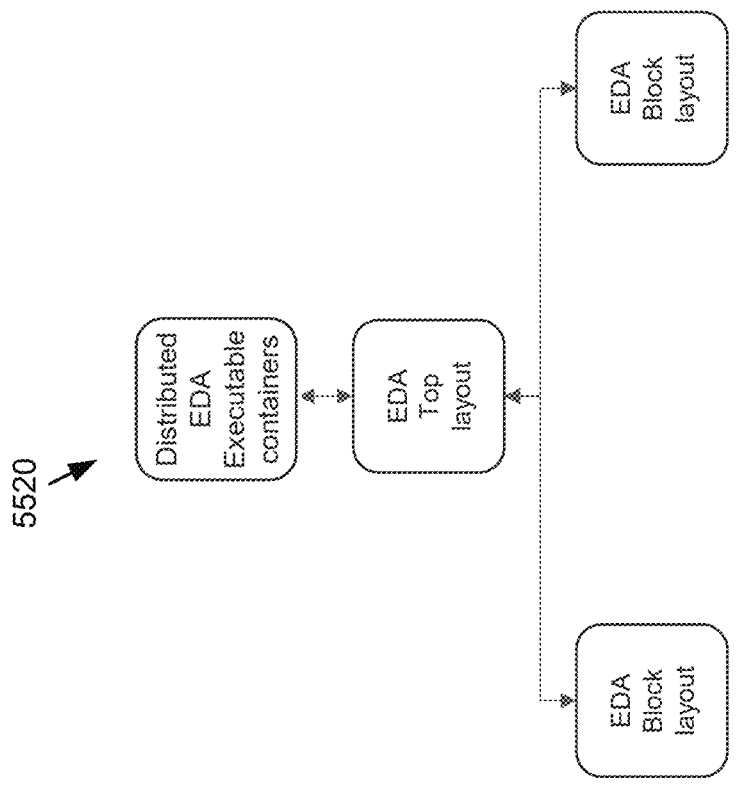
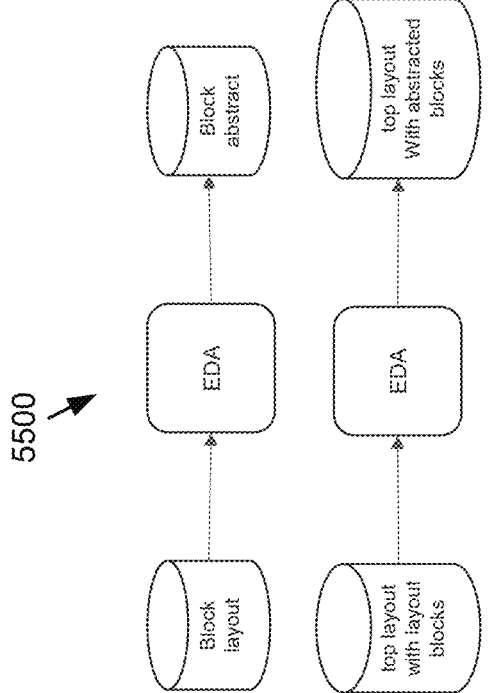
FIG. 55

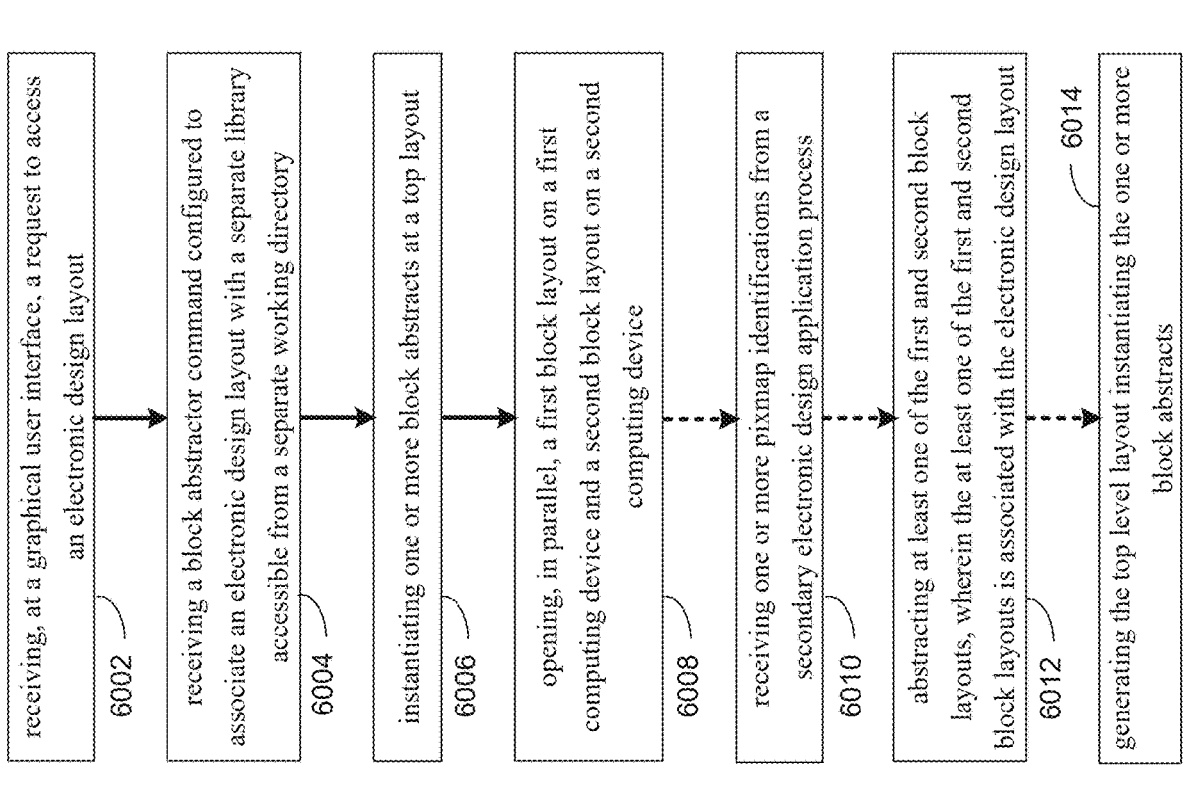

receiving, at a graphical user interface, a request to access an electronic design layout

6002 receiving a block abstractor command configured to associate an electronic design layout with a separate library accessible from a separate working directory

6004 instantiating one or more block abstracts at a top layout

6006 opening, in parallel, a first block layout on a first computing device and a second block layout on a second computing device

6008 receiving one or more pixmap identifications from a secondary electronic design application process

6010 abstracting at least one of the first and second block layouts, wherein the at least one of the first and second block layouts is associated with the electronic design layout

6012 generating the top level layout instantiating the one or more block abstracts

6014

User invokes a tool to split tech file
6202

User creates different master with different tech files
6204

User invokes a block abstractor
6206

User instantiates block abstracts in top layout
6208

User invokes DIA capability
6210

6100

6102
6104
6106

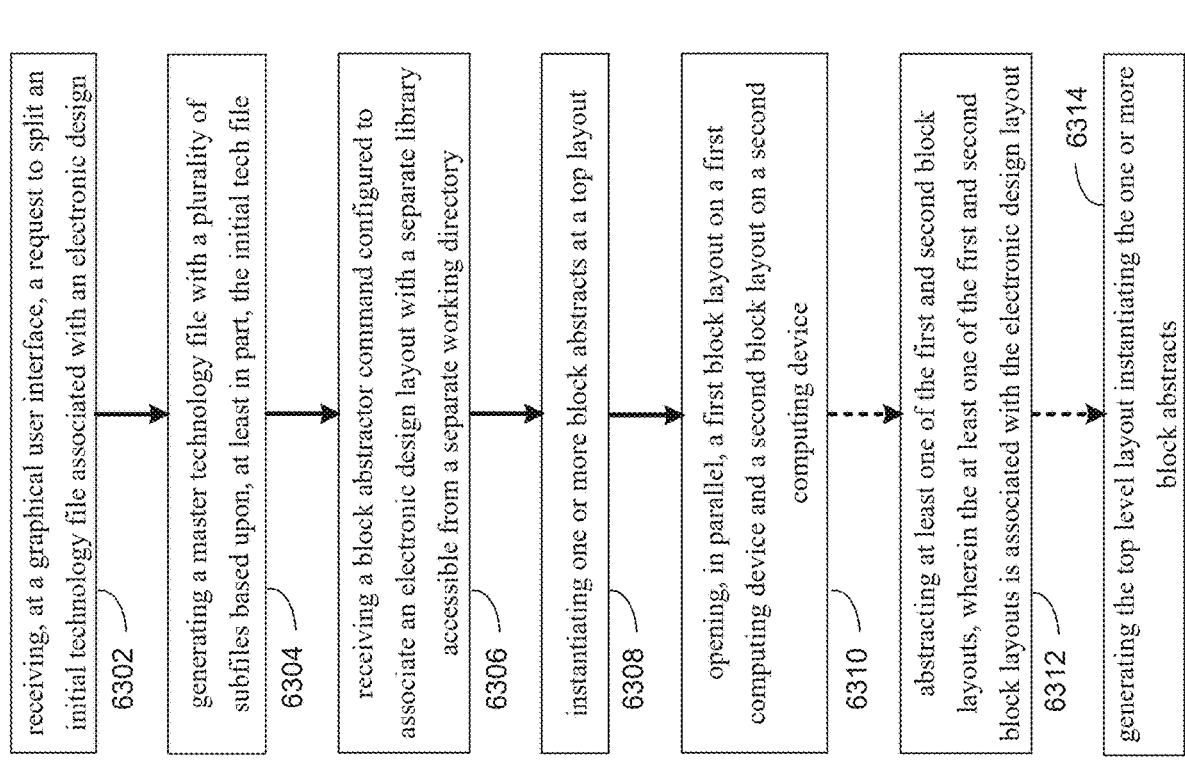

FIG. 63 receiving, at a graphical user interface, a request to split an initial technology file associated with an electronic design

6302 generating a master technology file with a plurality of subfiles based upon, at least in part, the initial tech file

6304 receiving a block abstractor command configured to associate an electronic design layout with a separate library accessible from a separate working directory

6306 instantiating one or more block abstracts at a top layout

6308 opening, in parallel, a first block layout on a first computing device and a second block layout on a second computing device

6310 abstracting at least one of the first and second block layouts, wherein the at least one of the first and second block layouts is associated with the electronic design layout

6312

6314 generating the top level layout instantiating the one or more block abstracts

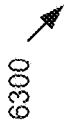

6300

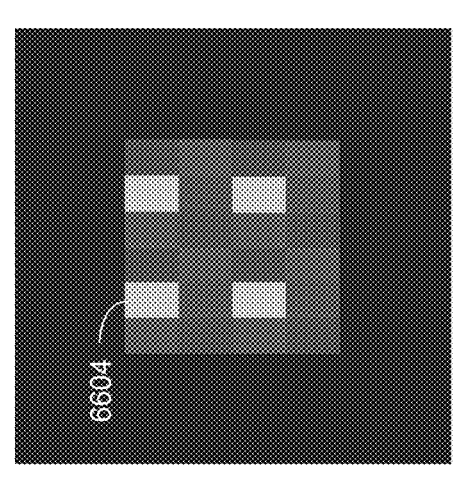
FIG. 66
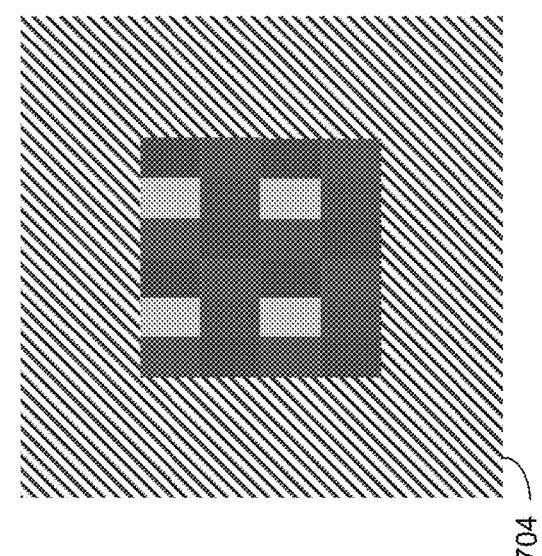
FIG. 65
FIG. 64
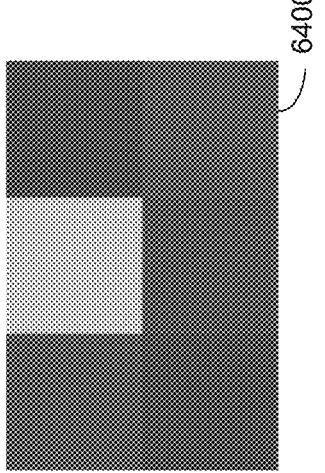
FIG. 67
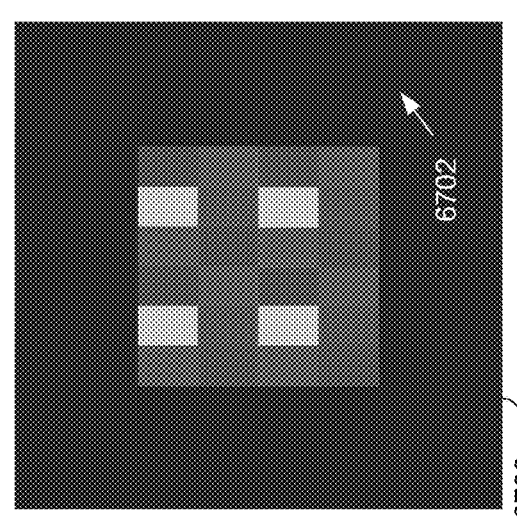

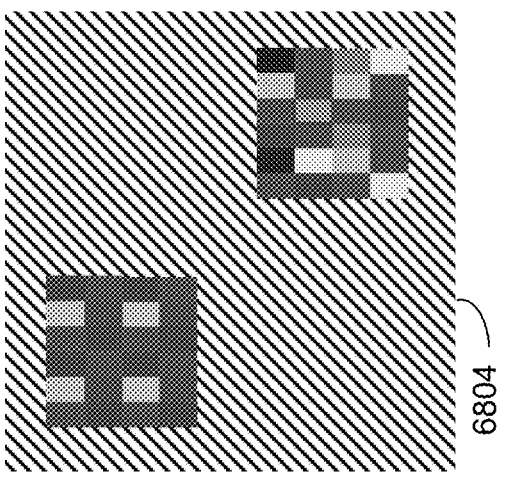
6804
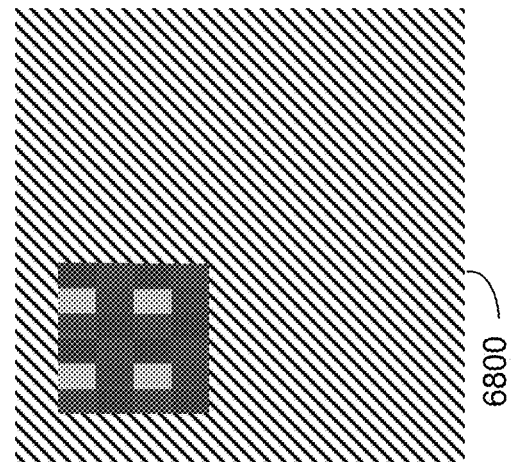
6800
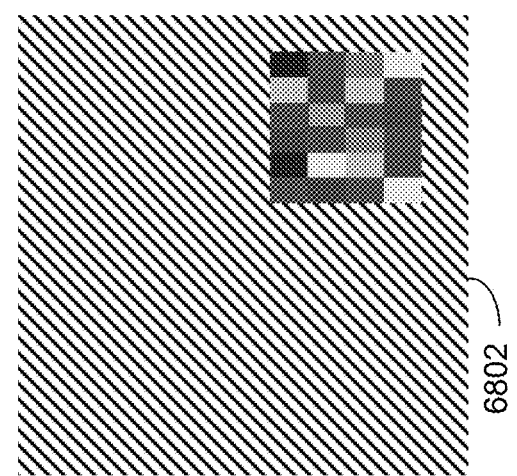
6802
FIG. 68

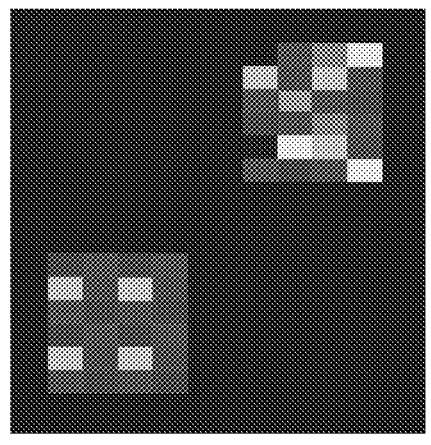
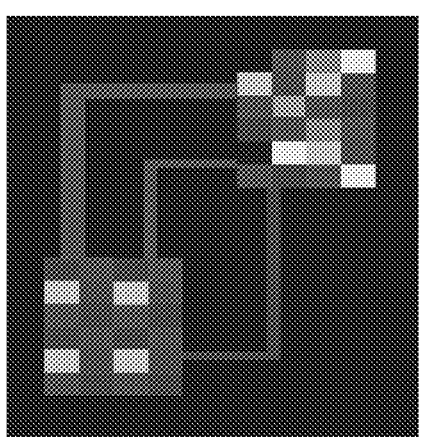
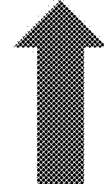
FIG. 69
FIG. 70
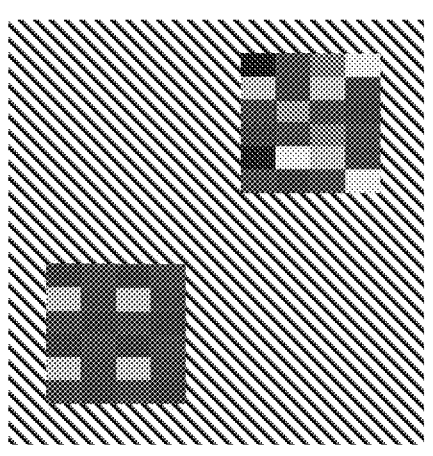
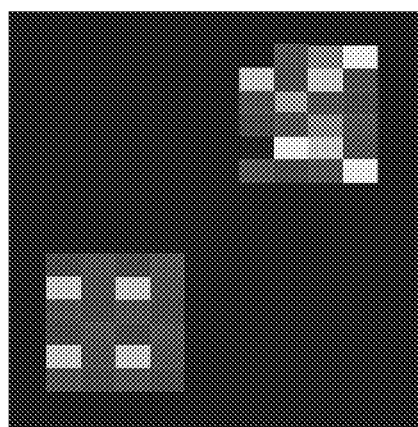

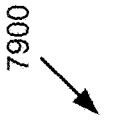

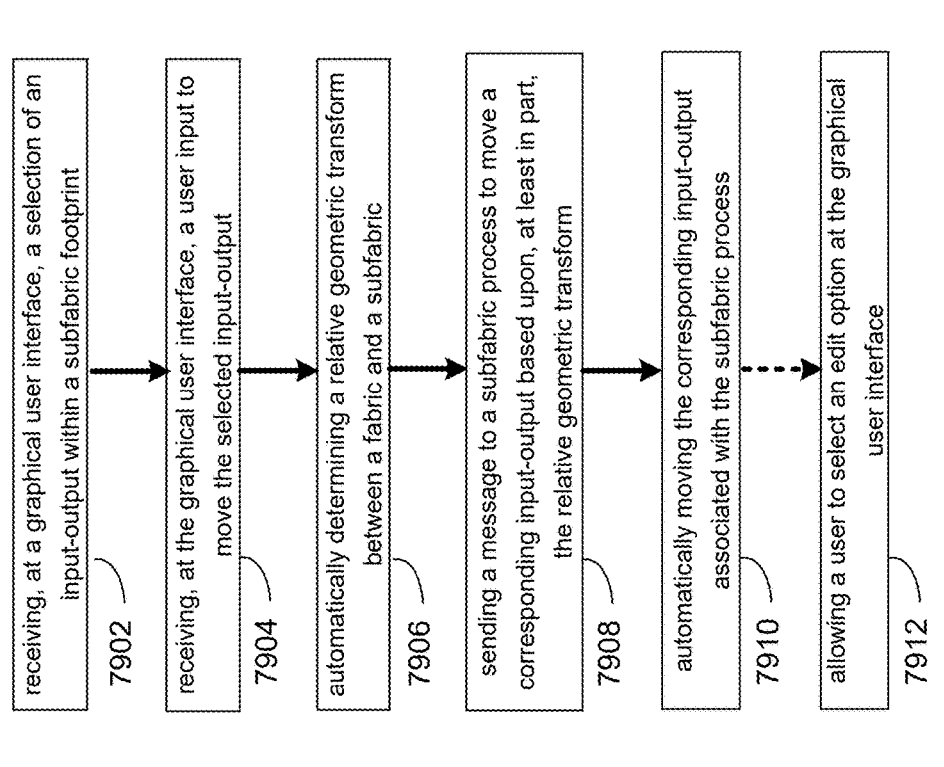

7900 receiving, at a graphical user interface, a selection of an input-output within a subfabric footprint

7902 receiving, at the graphical user interface, a user input to move the selected input-output

7904 automatically determining a relative geometric transform between a fabric and a subfabric

7906 sending a message to a subfabric process to move a corresponding input-output based upon, at least in part, the relative geometric transform

7908 automatically moving the corresponding input-output associated with the subfabric process

7910 allowing a user to select an edit option at the graphical user interface

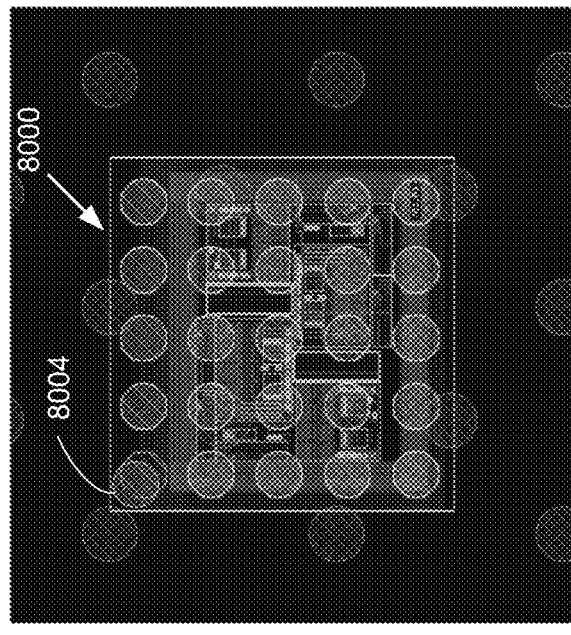
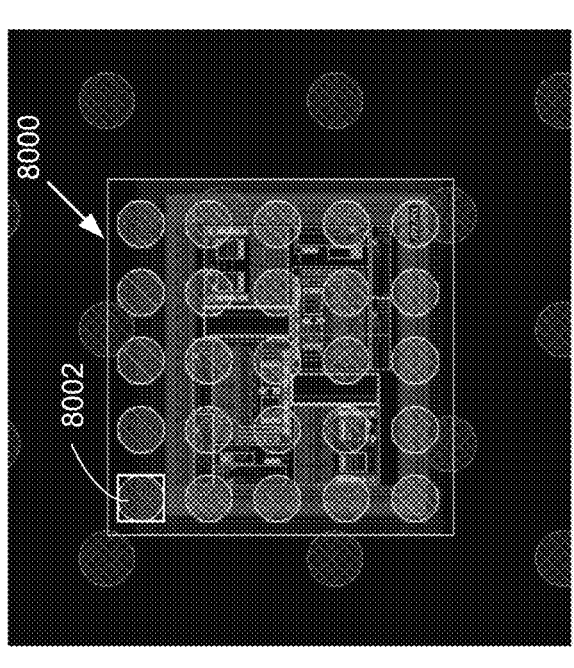
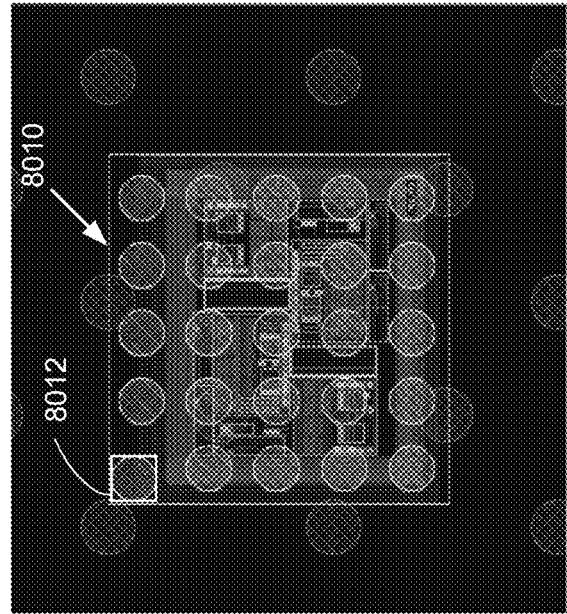
FIG. 80

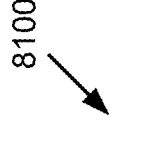

8100

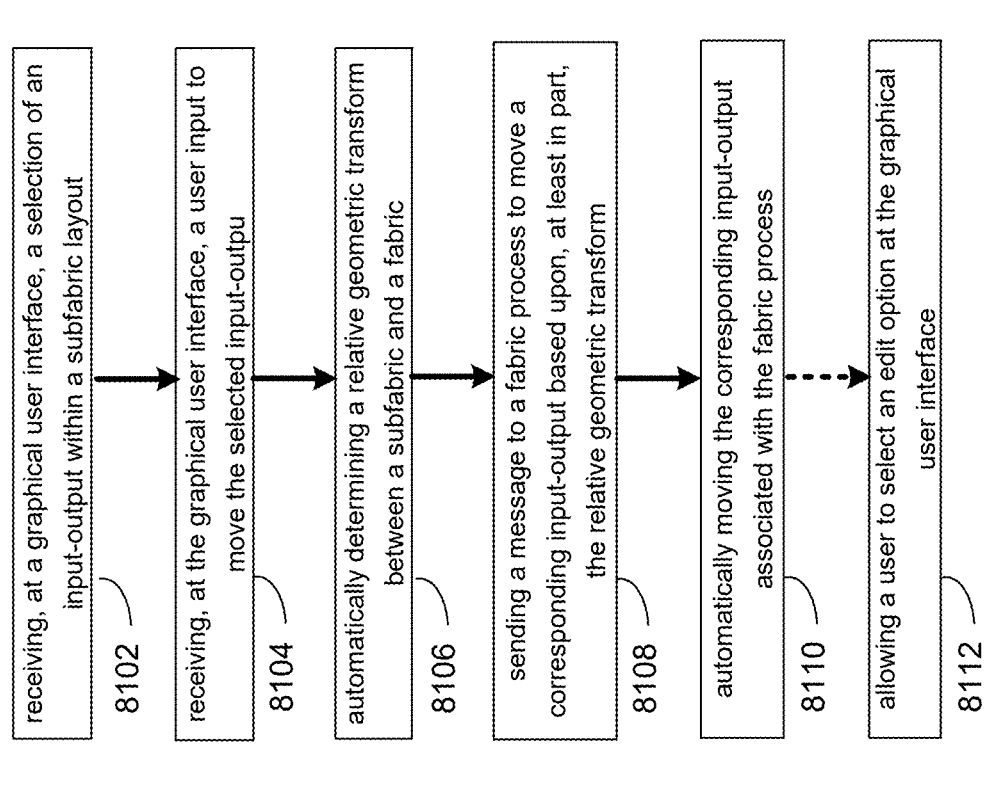

receiving, at a graphical user interface, a selection of an input-output within a subfabric layout

8102 receiving, at the graphical user interface, a user input to move the selected input-outpu

8104 automatically determining a relative geometric transform between a subfabric and a fabric

8106 sending a message to a fabric process to move a corresponding input-output based upon, at least in part, the relative geometric transform

8108 automatically moving the corresponding input-output associated with the fabric process

8110 allowing a user to select an edit option at the graphical user interface

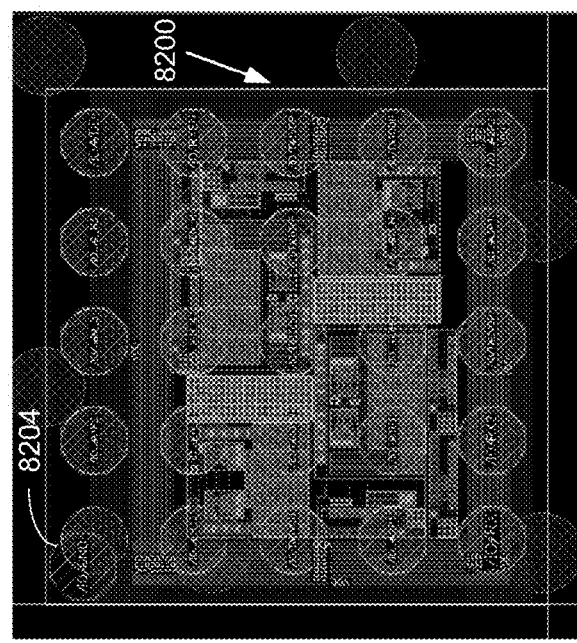
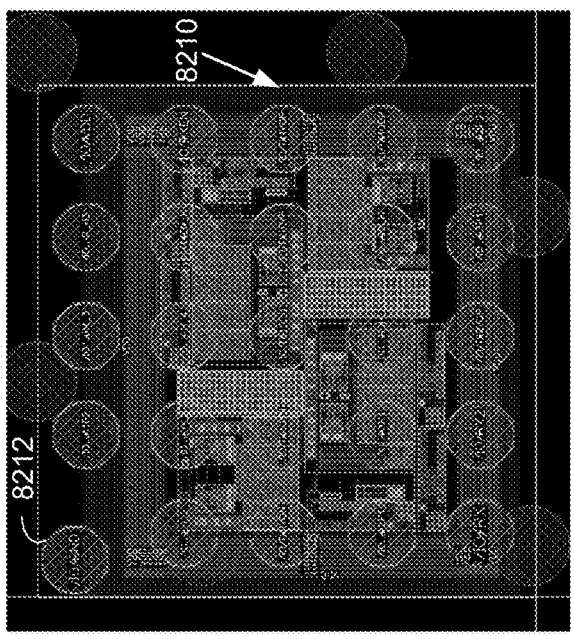
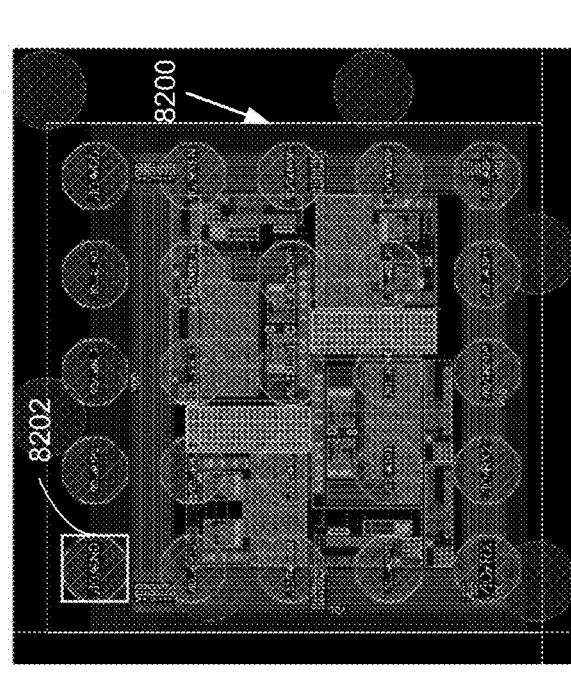
FIG. 82

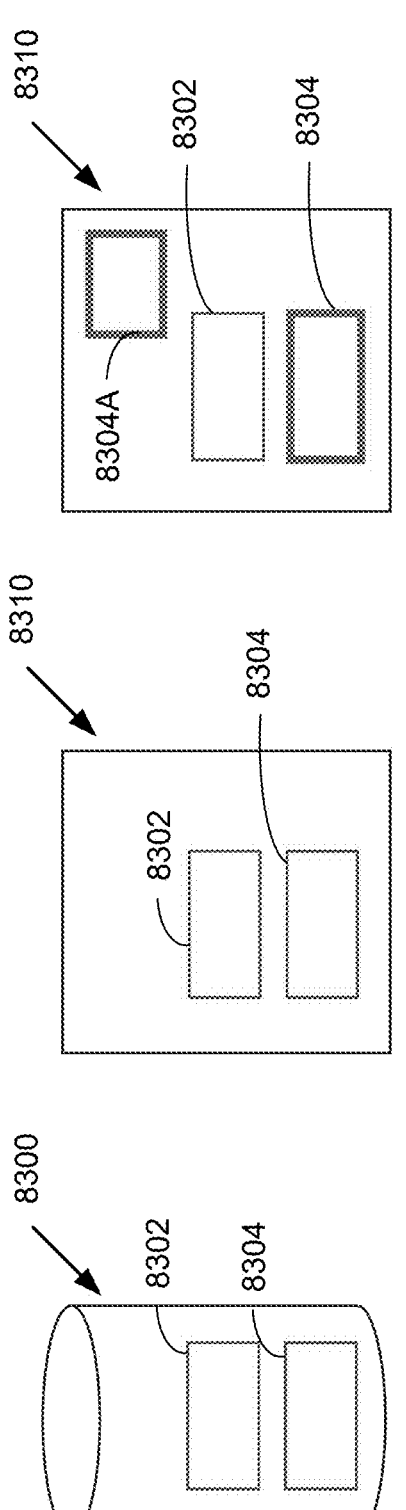
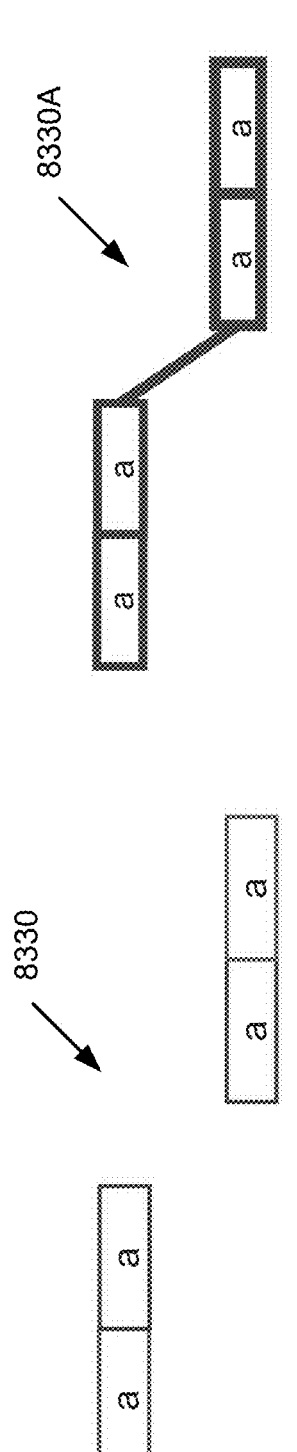
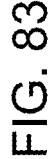
FIG. 83

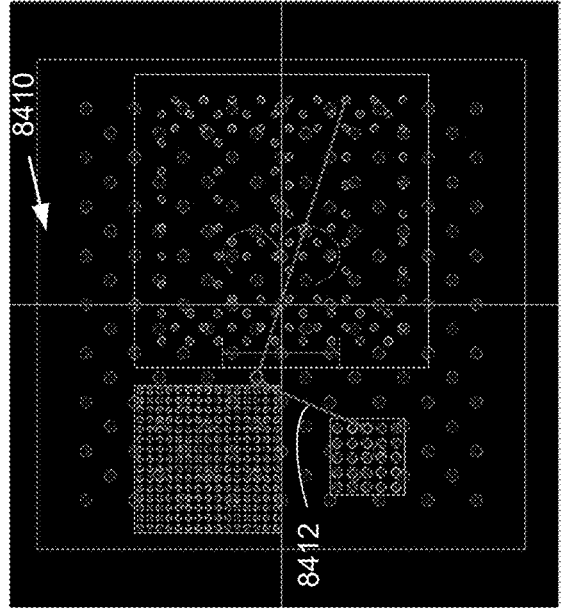
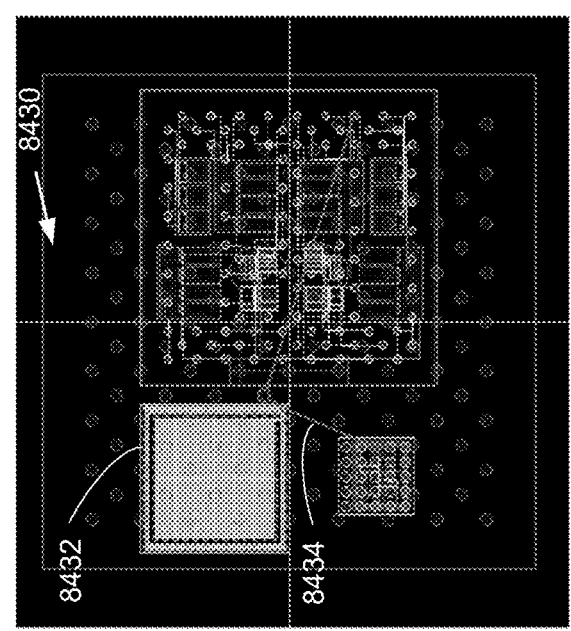
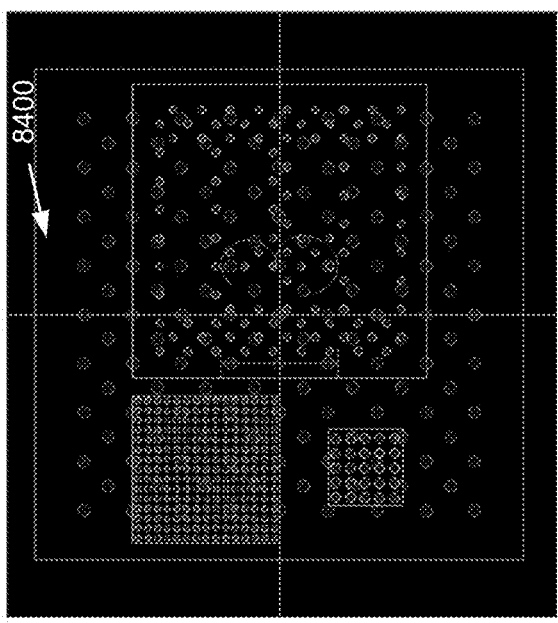
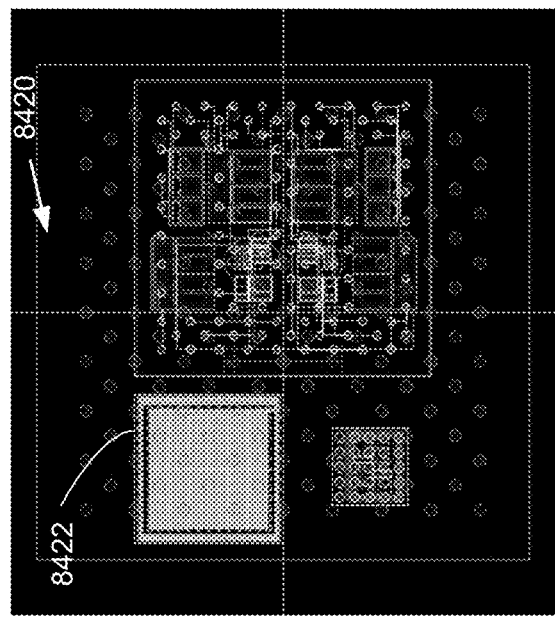
FIG. 84

8500

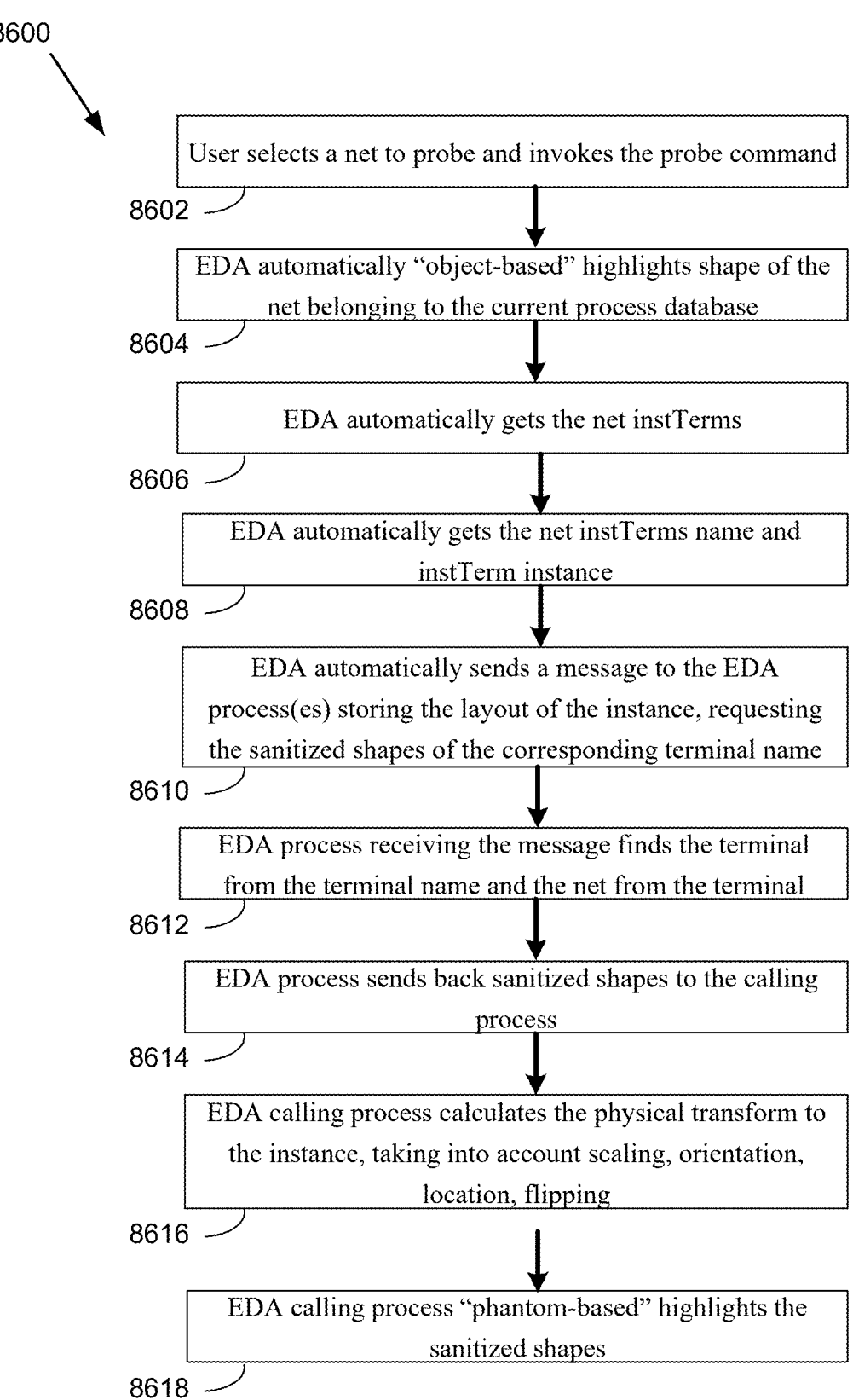

8600

User selects a net to probe and invokes the probe command

8602

EDA automatically "object-based" highlights shape of the net belonging to the current process database

8604

EDA automatically gets the net instTerms

8606

EDA automatically gets the net instTerms name and instTerm instance

8608

EDA automatically sends a message to the EDA process(es) storing the layout of the instance, requesting the sanitized shapes of the corresponding terminal name

8610

EDA process receiving the message finds the terminal from the terminal name and the net from the terminal

8612

EDA process sends back sanitized shapes to the calling process

8614

EDA calling process calculates the physical transform to the instance, taking into account scaling, orientation, location, flipping

8616

EDA calling process "phantom-based" highlights the sanitized shapes

receiving, using a processor, at least a portion of an electronic design associated with a current electronic design process

8802 receiving, at a graphical user interface, a selection of a net of the electronic design to probe

8804 automatically highlighting, at the graphical user interface, one or more shapes associated with the net

8806 automatically retrieving one or more pins and pin names associated with a subfabric associated with the net

8808 sending a request to a subfabric process for one or more shapes associated with the pin names

8810 receiving one or more sanitized shapes from the subfabric process

8812 displaying and emphasizing the one or more sanitized shapes at the graphical user interface

8814 retrieving the one or more pins and pin names from a first database

8816 calculating a physical transformation of the one or more sanitized shapes

8820 determining the one or more sanitized shapes by retrieving a pin from a pin name, retrieving a net from the pin, and collecting shapes assigned to the net

8822 retrieving the one or more sanitized shapes from a second database, wherein the first and second database are different

8818

Figure 89:
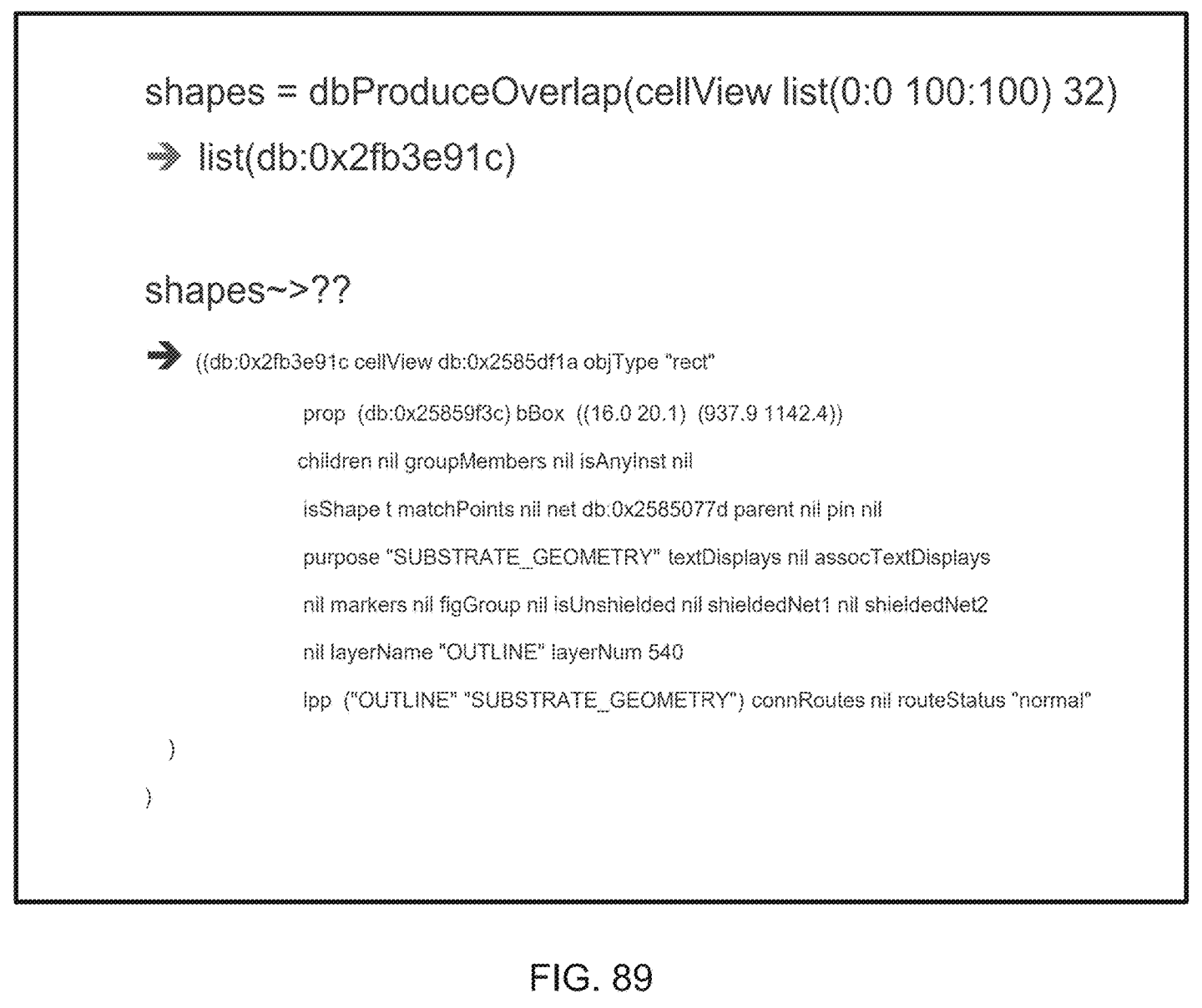

```
shapes = dbProduceOverlap(cellView list(0:0 100:100) 32)

⇒ list(db:0x2fb3e91c)

shapes~>??

((db:0x2fb3e91c cellView db:0x2585df1a objType "rect"
    prop (db:0x25859f3c) bBox ((16.0 20.1) (937.9 1142.4))
    children nil groupMembers nil isAnyInst nil
    isShape t matchPoints nil net db:0x25850077d parent nil pin nil
    purpose "SUBSTRATE_GEOMETRY" textDisplays nil assocTextDisplays
    nil markers nil figGroup nil isUnshielded nil shieldedNet1 nil shieldedNet2
    nil layerName "OUTLINE" layerNum 540
    lpp ("OUTLINE" "SUBSTRATE_GEOMETRY") connRoutes nil routeStatus "normal"
```

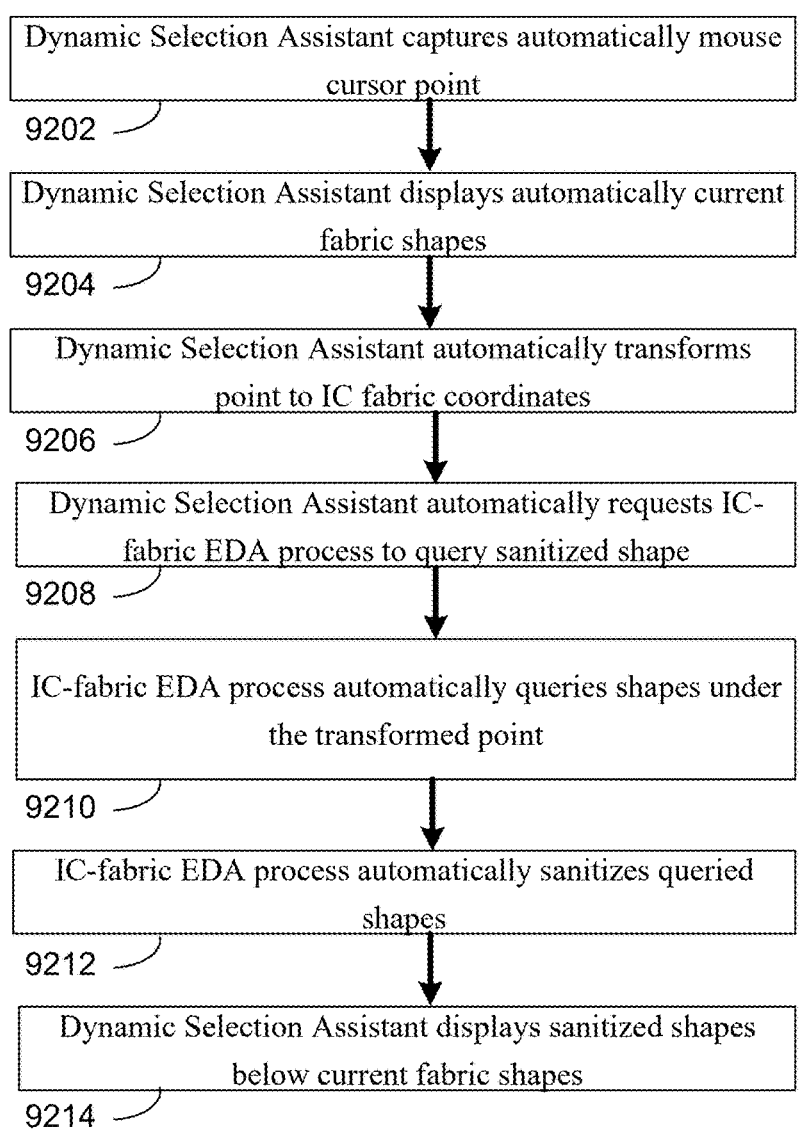

Dynamic Selection Assistant captures automatically mouse cursor point

9202

Dynamic Selection Assistant displays automatically current fabric shapes

9204

Dynamic Selection Assistant automatically transforms point to IC fabric coordinates

9206

Dynamic Selection Assistant automatically requests IC-fabric EDA process to query sanitized shape

9208

IC-fabric EDA process automatically queries shapes under the transformed point

9210

IC-fabric EDA process automatically sanitizes queried shapes

9212

Dynamic Selection Assistant displays sanitized shapes below current fabric shapes

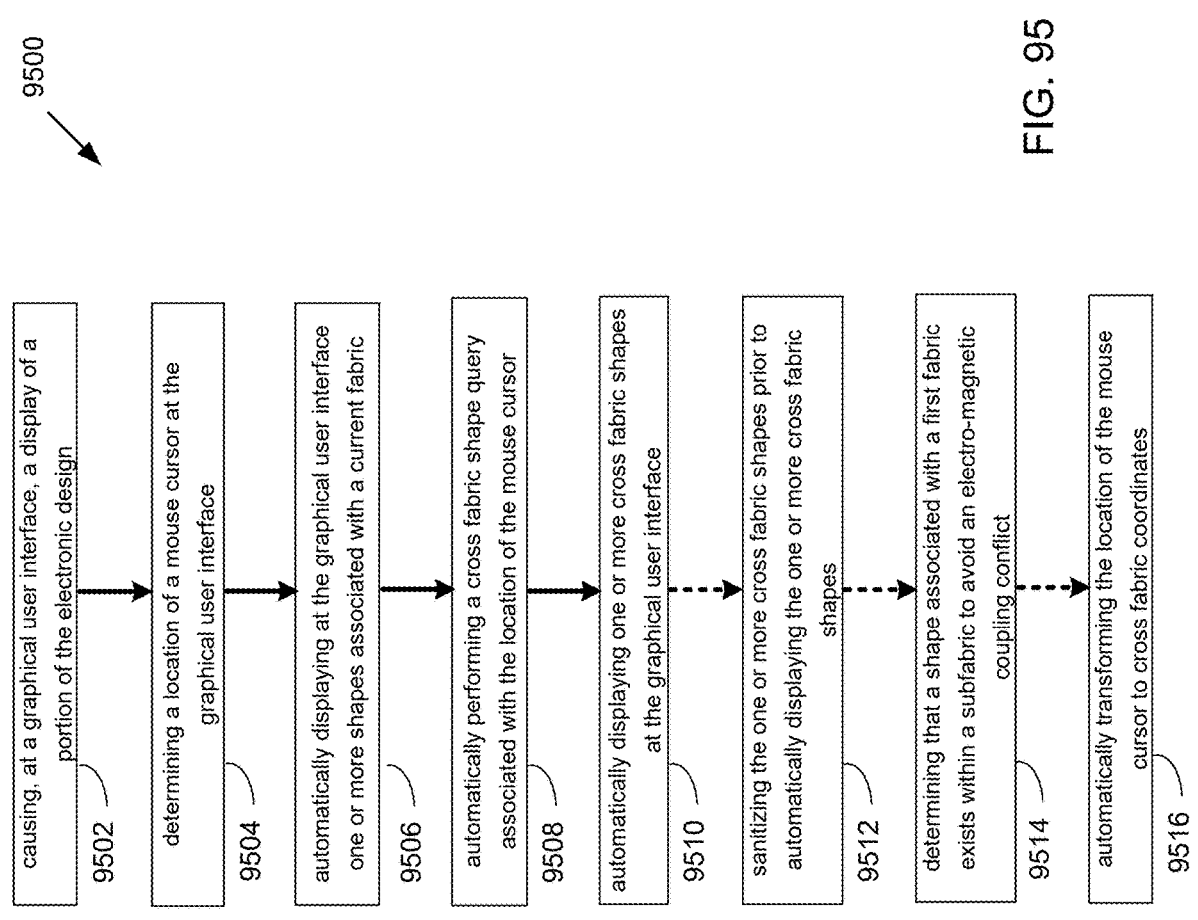

9500

FIG. 95 causing, at a graphical user interface, a display of a portion of the electronic design

9502 determining a location of a mouse cursor at the graphical user interface

9504 automatically displaying at the graphical user interface one or more shapes associated with a current fabric

9506 automatically performing a cross fabric shape query associated with the location of the mouse cursor

9508 automatically displaying one or more cross fabric shapes at the graphical user interface

9510 sanitizing the one or more cross fabric shapes prior to automatically displaying the one or more cross fabric shapes

9512 determining that a shape associated with a first fabric exists within a subfabric to avoid an electro-magnetic coupling conflict

9514 automatically transforming the location of the mouse cursor to cross fabric coordinates

9516

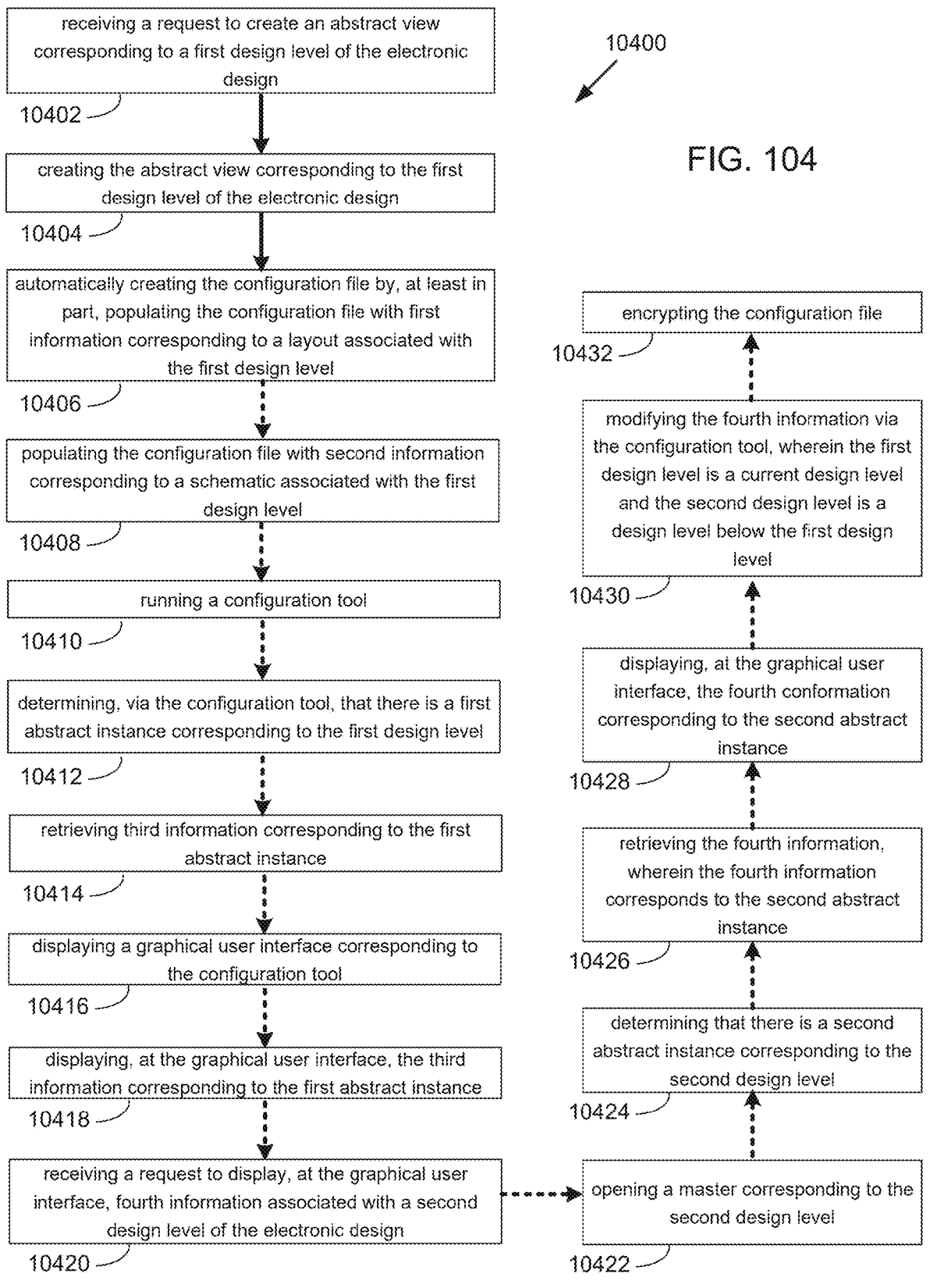

FIG. 104

10400 receiving a request to create an abstract view corresponding to a first design level of the electronic design

10402 creating the abstract view corresponding to the first design level of the electronic design

10404 automatically creating the configuration file by, at least in part, populating the configuration file with first information corresponding to a layout associated with the first design level

10406 populating the configuration file with second information corresponding to a schematic associated with the first design level

10408 running a configuration tool

10410 determining, via the configuration tool, that there is a first abstract instance corresponding to the first design level

10412 retrieving third information corresponding to the first abstract instance

10414 displaying a graphical user interface corresponding to the configuration tool

10416 displaying, at the graphical user interface, the third information corresponding to the first abstract instance

10418 receiving a request to display, at the graphical user interface, fourth information associated with a second design level of the electronic design

10420 encrypting the configuration file

10432 modifying the fourth information via the configuration tool, wherein the first design level is a current design level and the second design level is a design level below the first design level

10430 displaying, at the graphical user interface, the fourth conformation corresponding to the second abstract instance

10428 retrieving the fourth information, wherein the fourth information corresponds to the second abstract instance

10426 determining that there is a second abstract instance corresponding to the second design level

10424 opening a master corresponding to the second design level

10422

10500

10900

11400

User continues to work on current session

11500

New current session real time logged events

Change current session

User switches to another session (EIC) and performs actions that are real time logged

8

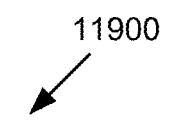
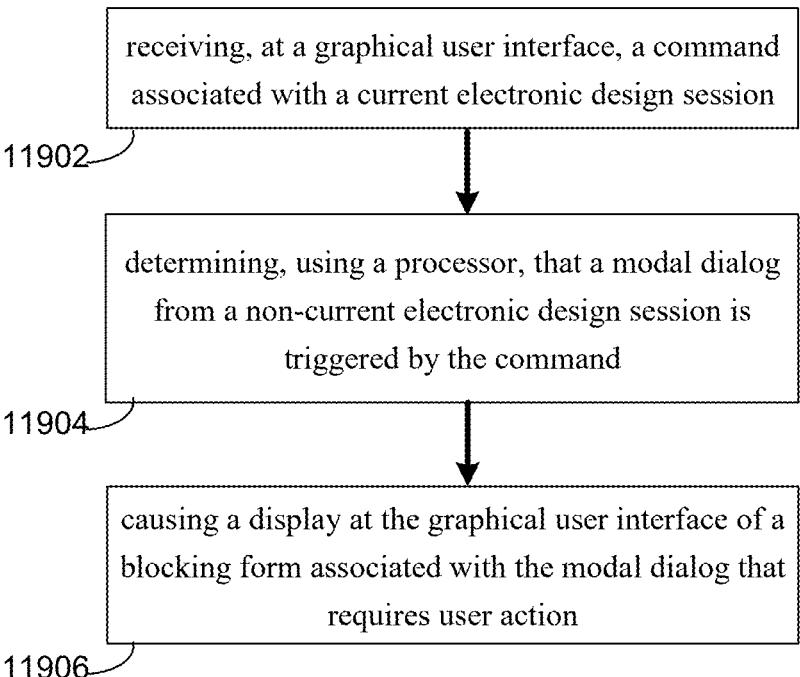
11902
11904
11906
FIG. 119

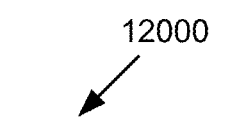
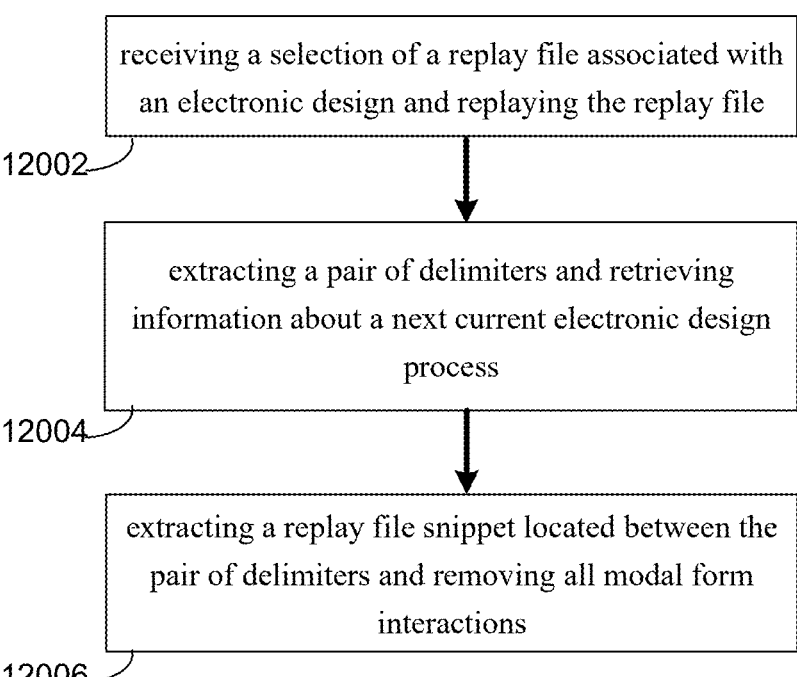
12000
receiving a selection of a replay file associated with an electronic design and replaying the replay file
12002
extracting a pair of delimiters and retrieving information about a next current electronic design process
12004
extracting a replay file snippet located between the pair of delimiters and removing all modal form interactions
12006
FIG. 120

REPLAYING SCENARIOS WITHIN DISTRIBUTED INTERACTIVE APPLICATIONS

CROSS-REFERENCE TO RELATED APPLICATIONS

The present application is a continuation-in-part of U.S. application Ser. No. 18/124,086 filed on Mar. 21, 2023, which is hereby incorporated in its entirety.

FIELD OF THE INVENTION

The present disclosure relates to electronic circuit design, and more particularly, to distributed interactive applications for electronic circuit design.

BACKGROUND

An electronic design application (EDA) may provide various features and functionality including, but not limited to, libraries, process design kits (PDK), and scripting language capability. For example, the electronic design application may allow for creation of design libraries and technology libraries, among other features. Challenges may arise for designers while using the electronic design application and features provided. For example, various features provided by the electronic design application may not synchronize together conveniently or seamlessly and may require additional tasks to be performed for effective electronic design. This may lead to inefficiency in the electronic design process.

SUMMARY

In one or more embodiments of the present disclosure, a computer-implemented method for use in an electronic design is provided. The method may include receiving, at a graphical user interface, a command associated with a currently displayed electronic design session and determining, using a processor, that a modal dialog from a non-currently displayed electronic design session is triggered by the command. The method may further include causing a display at the graphical user interface of a form associated with the modal dialog that requires user action.

One or more of the following features may be included. The method may include performing a real-time logging of the command and the determined modal dialog in the currently displayed electronic design session. The method may further include allowing a user to select the form to temporarily access the non-currently displayed electronic design session. In response to receiving a selection, the method may also include disabling a real-time logging of the currently displayed electronic design session. The method may further include caching one or more log events received while real-time logging is disabled. The method may also include generating a start modal tag for a temporary session and enabling real-time logging. The method may further include receiving one or more user actions associated with a modal form. The method may also include closing the modal form and disabling real-time logging. The method may further include automatically switching back to the currently displayed electronic design session. The method may also include re-enabling real-time logging of the currently displayed electronic design session and logging one or more cached events of the currently displayed electronic design session.

In one or more embodiments of the present disclosure, a computer-implemented method for use in an electronic design is provided. The method included herein may include receiving a selection of a replay file associated with an electronic design and replaying the replay file. The method may further include extracting a pair of delimiters and retrieving information about a next electronic design process. The method may also include extracting a replay file snippet located between the pair of delimiters and removing all modal form interactions.

One or more of the following features may be included. The method may include caching the modal form interactions within a session table. The method may further include setting a new electronic design process based upon, at least in part, the replay file snippet. The method may also include receiving a request to replay the replay file snippet. The method may further include detecting a modal form from a non-currently displayed electronic design session. The method may also include allowing a user to select the form to temporarily access the non-currently displayed electronic design session. The method may further include obtaining a list of user interactions from a session table and replaying the user interactions. The method may further include switching back to replaying the replay file and ending the replay file snippet.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

3

Figure 12:
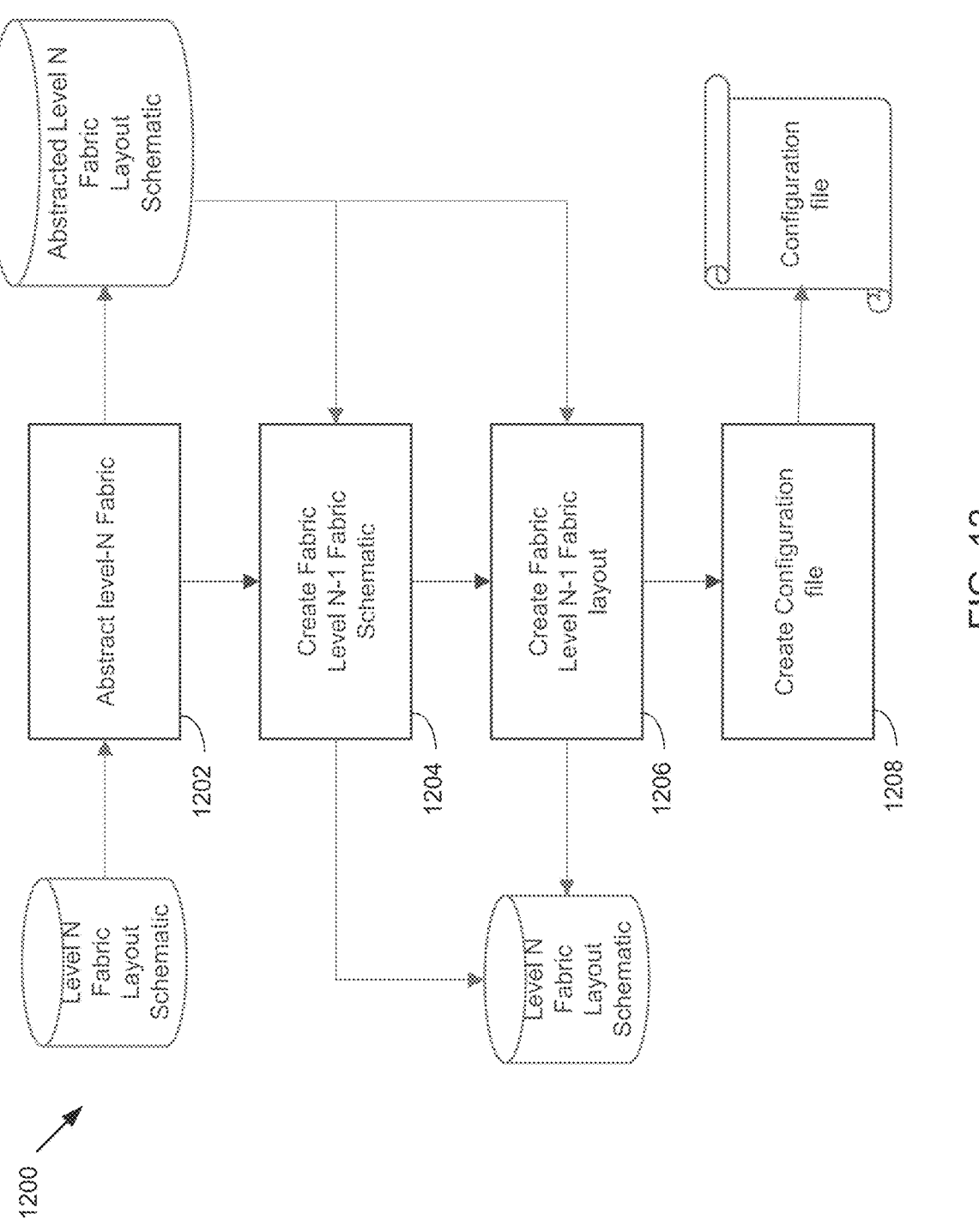
Figure 15:
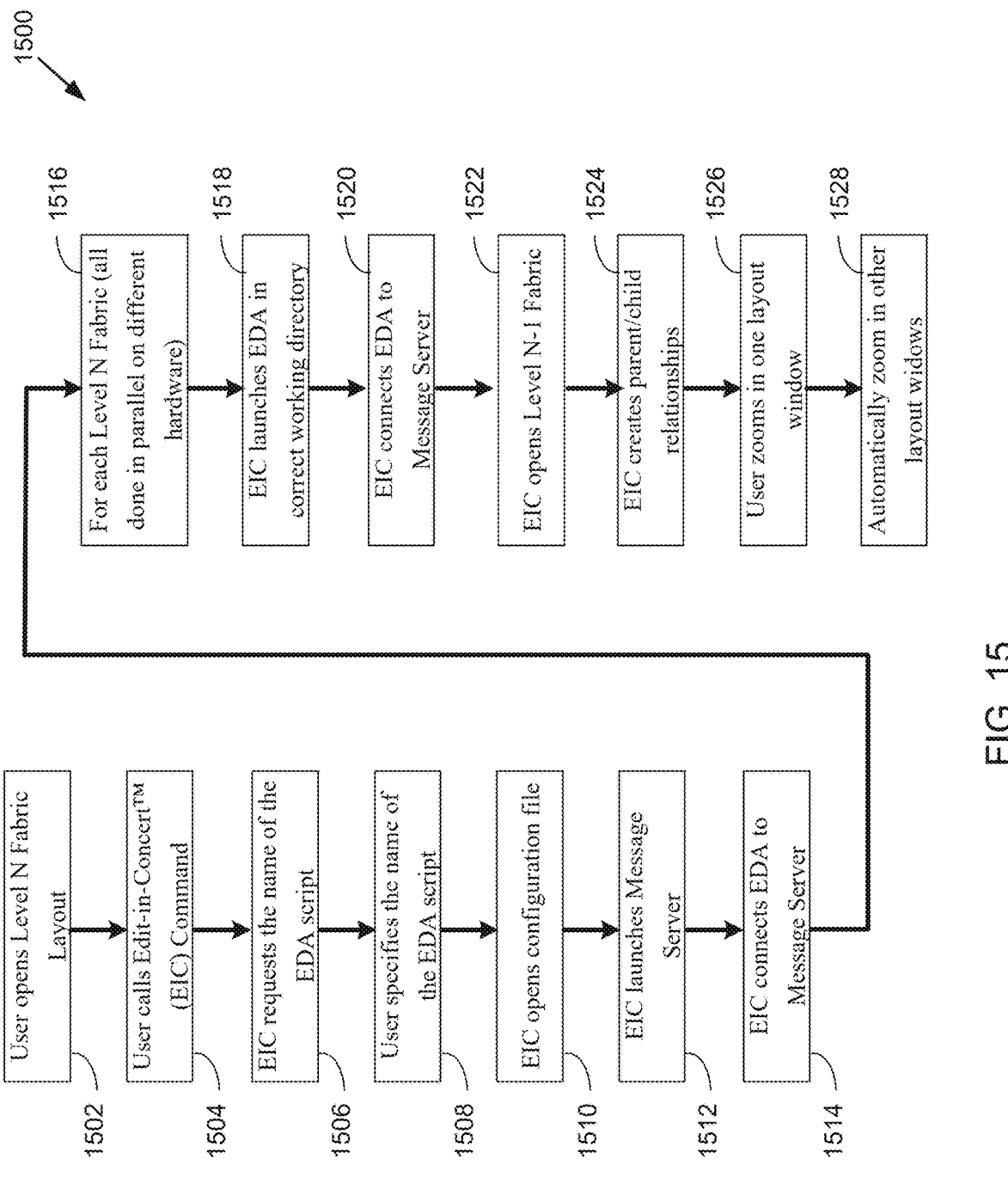
Figure 16:
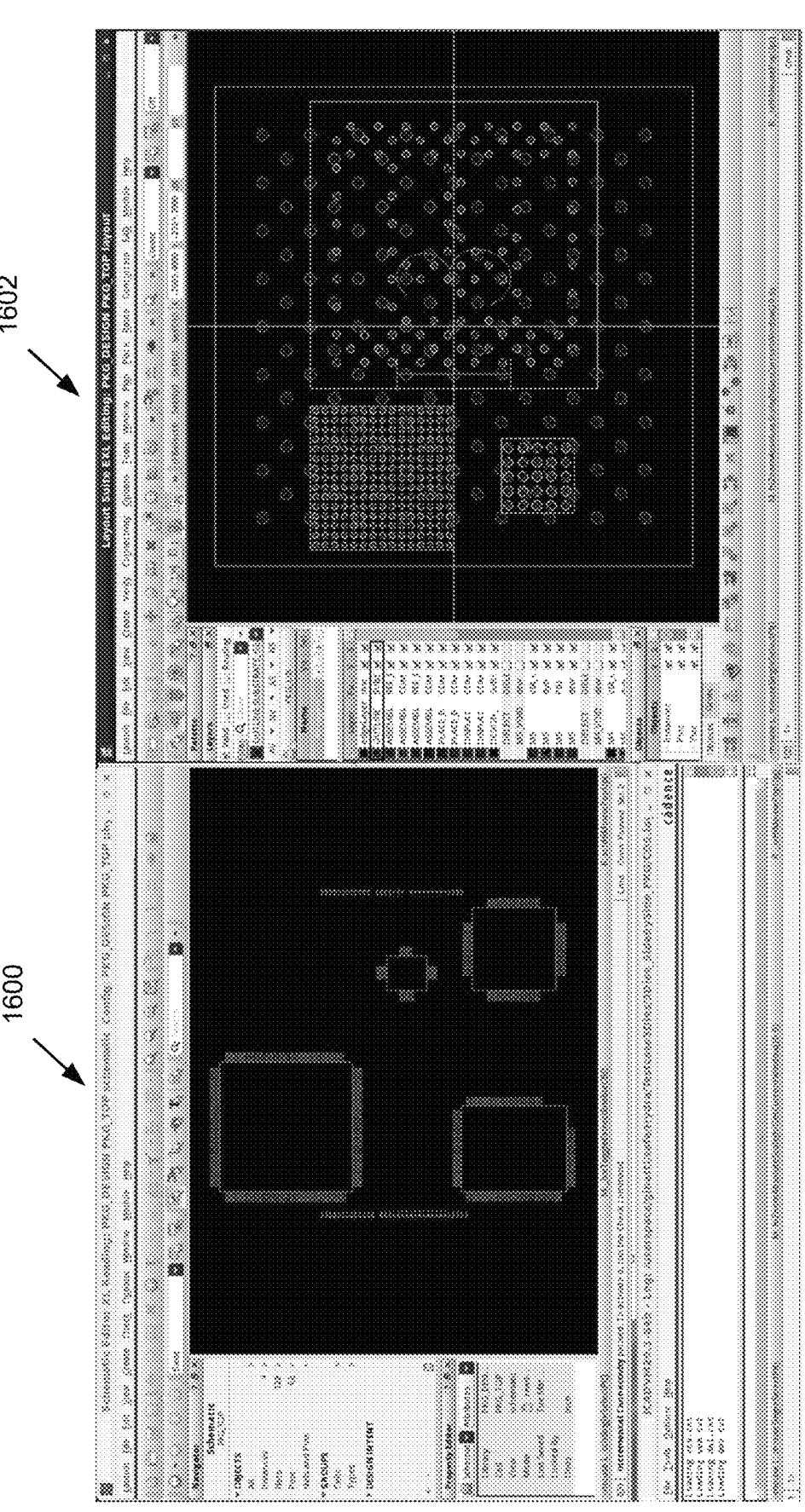
Figure 17:
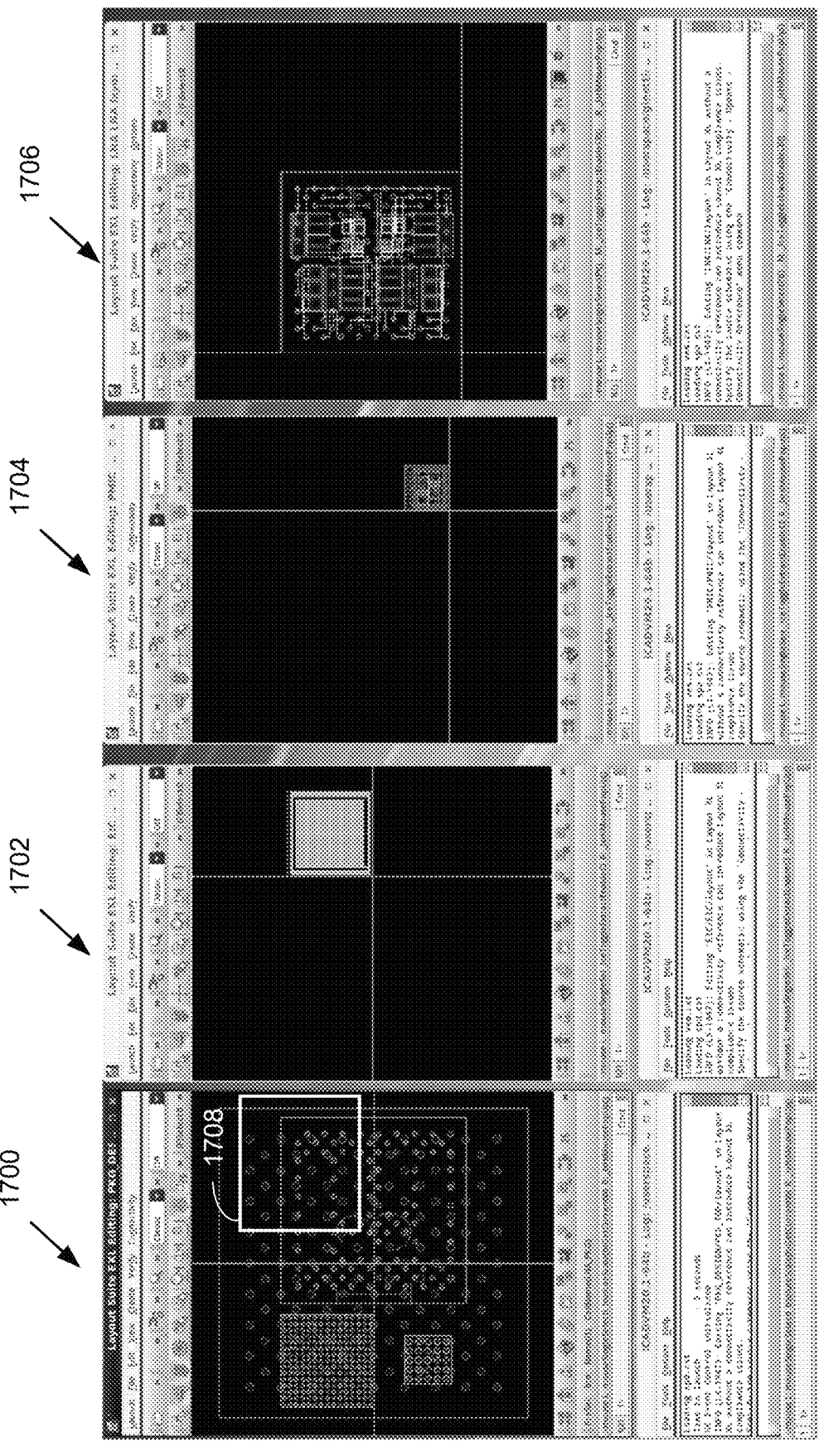
Figure 19:
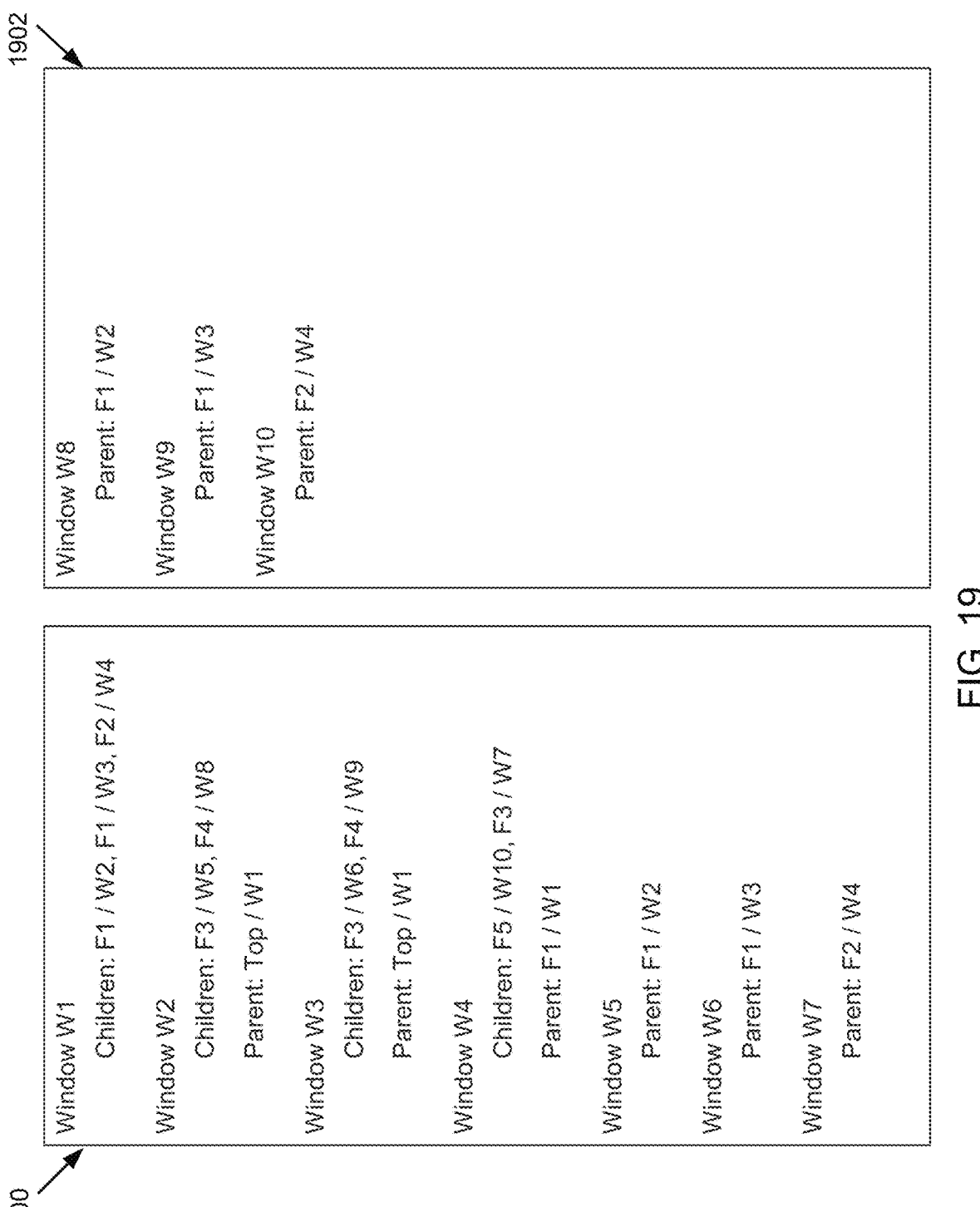
Figure 20:
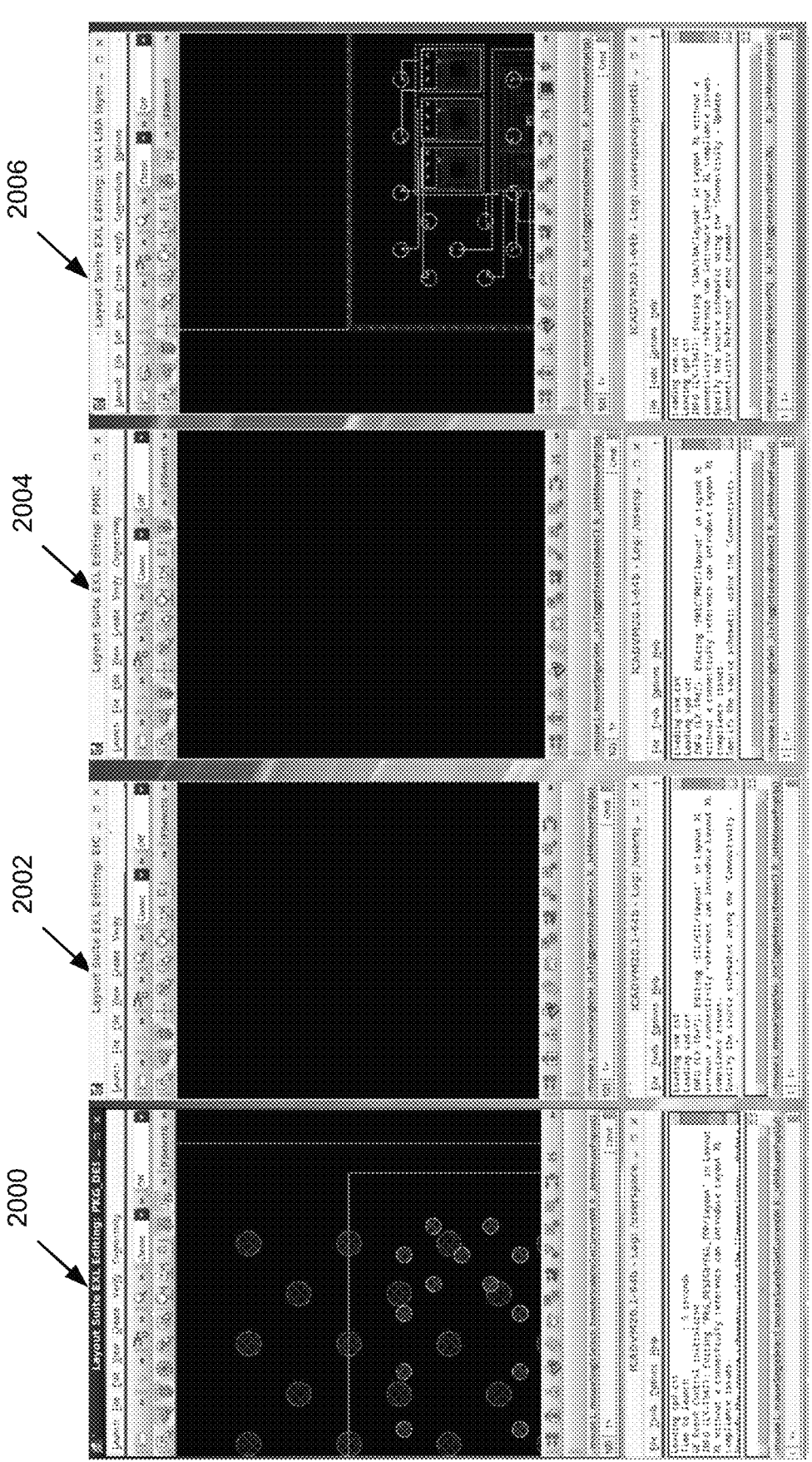
Figure 22:
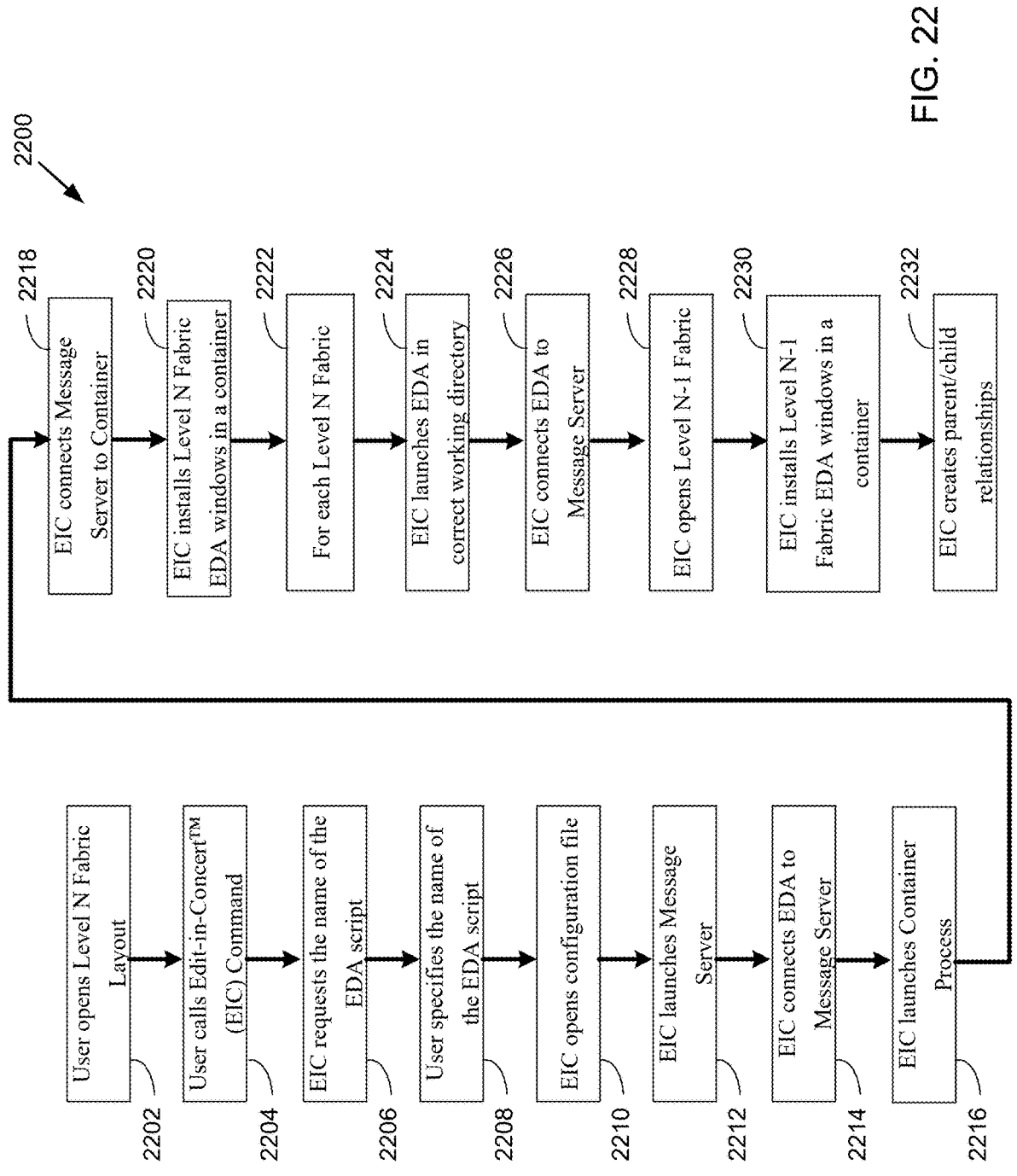
Figure 23:
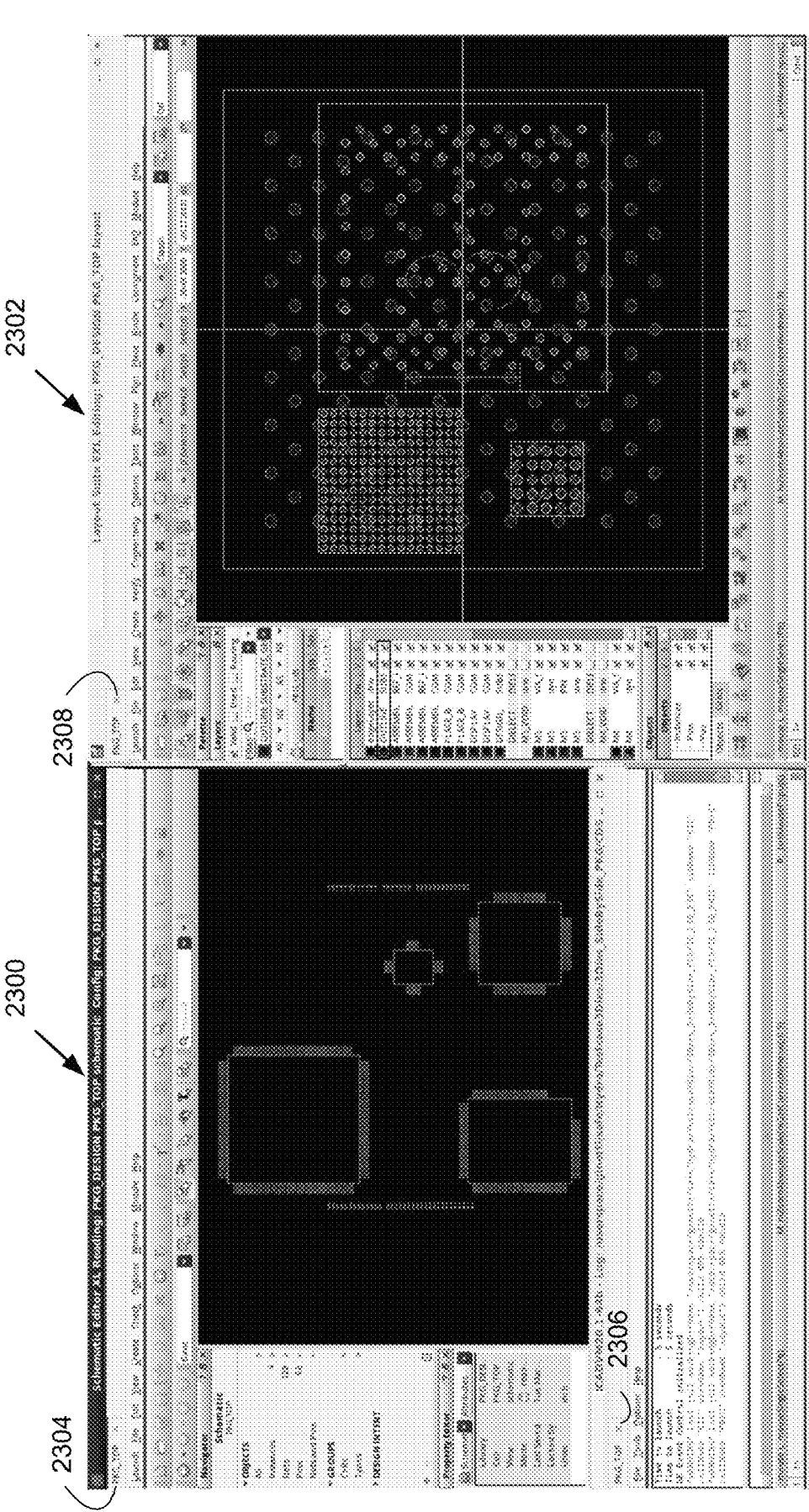
Figure 24:
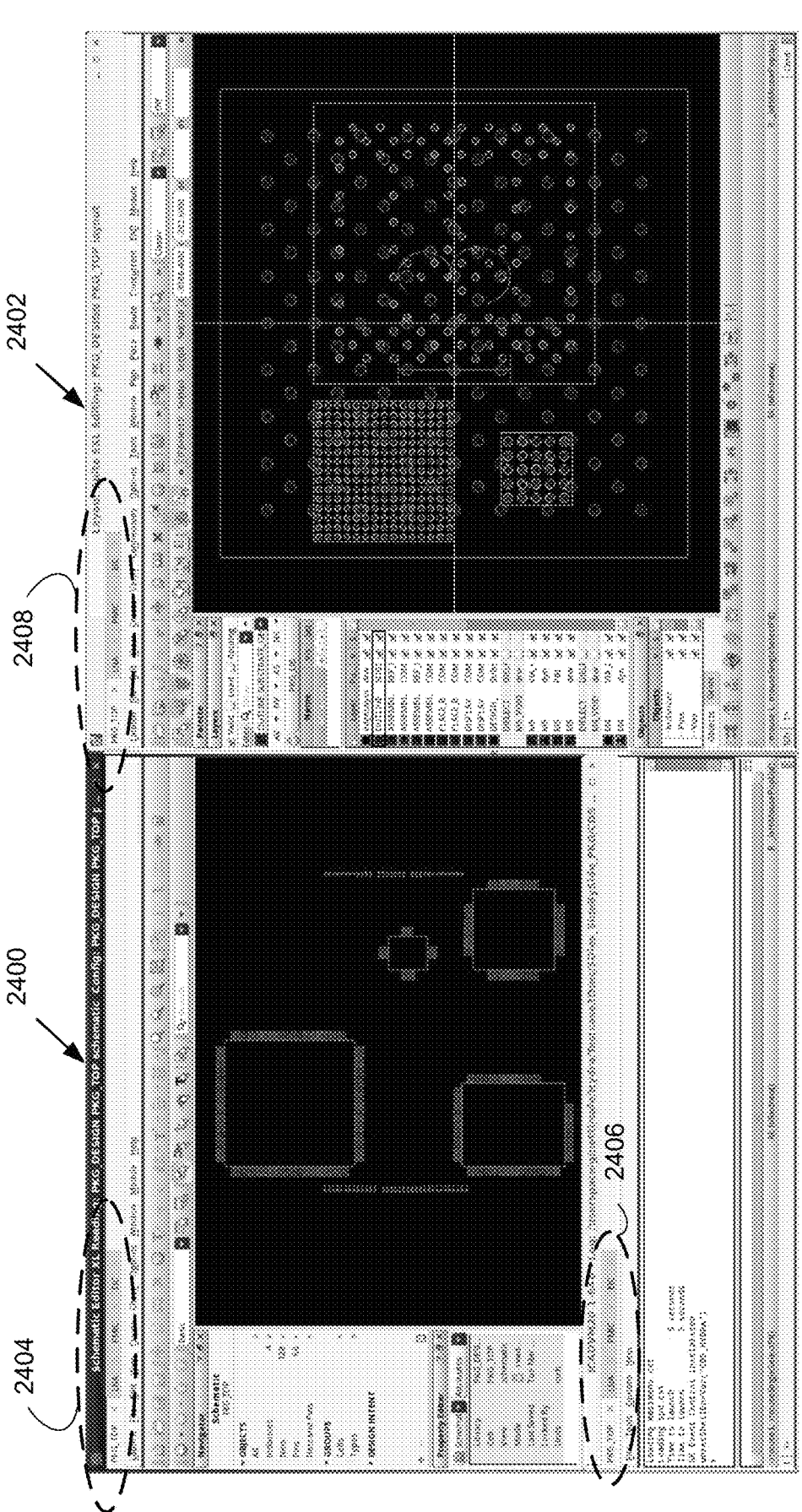
Figure 25:
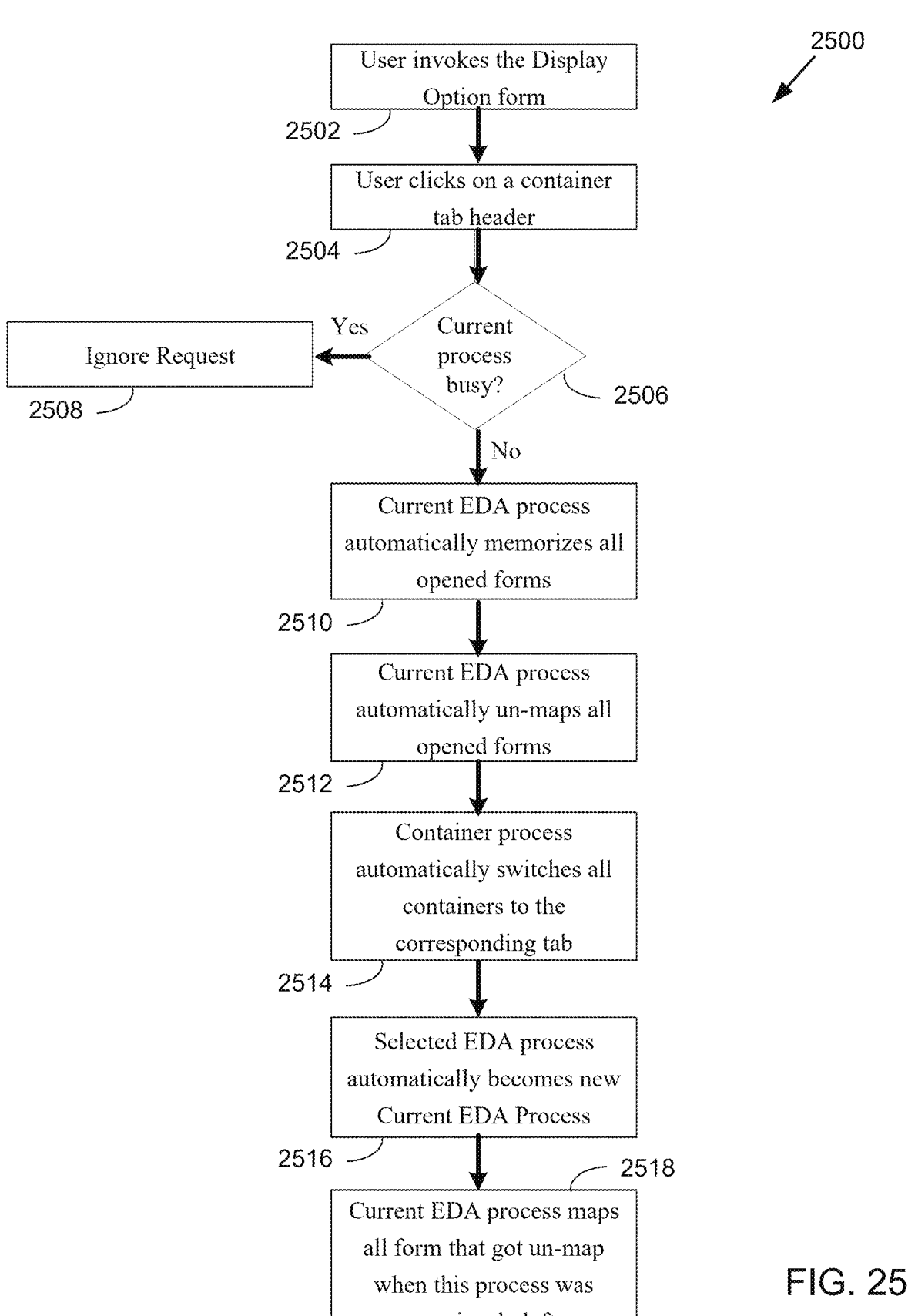
Figure 33:
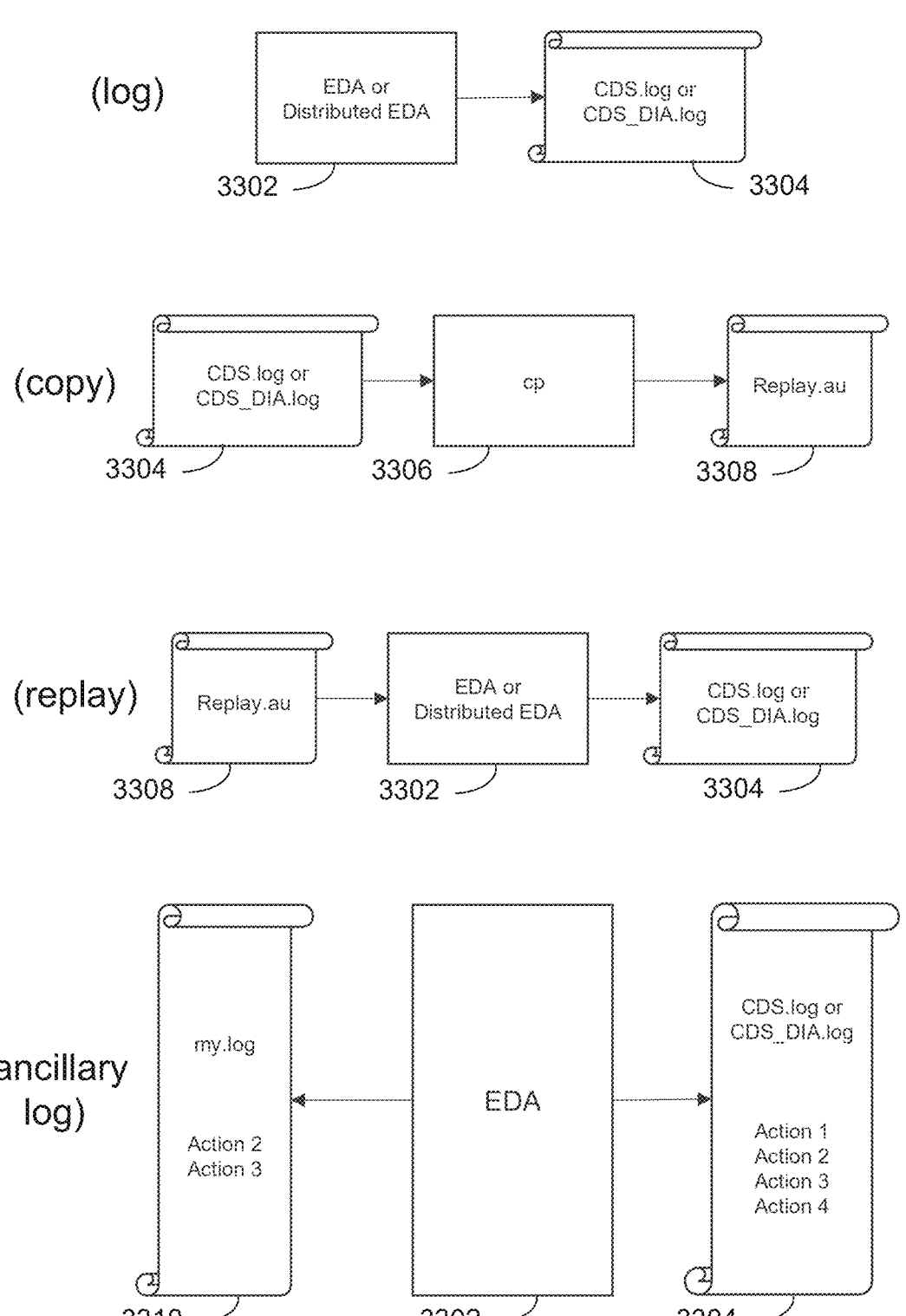
Figure 34:
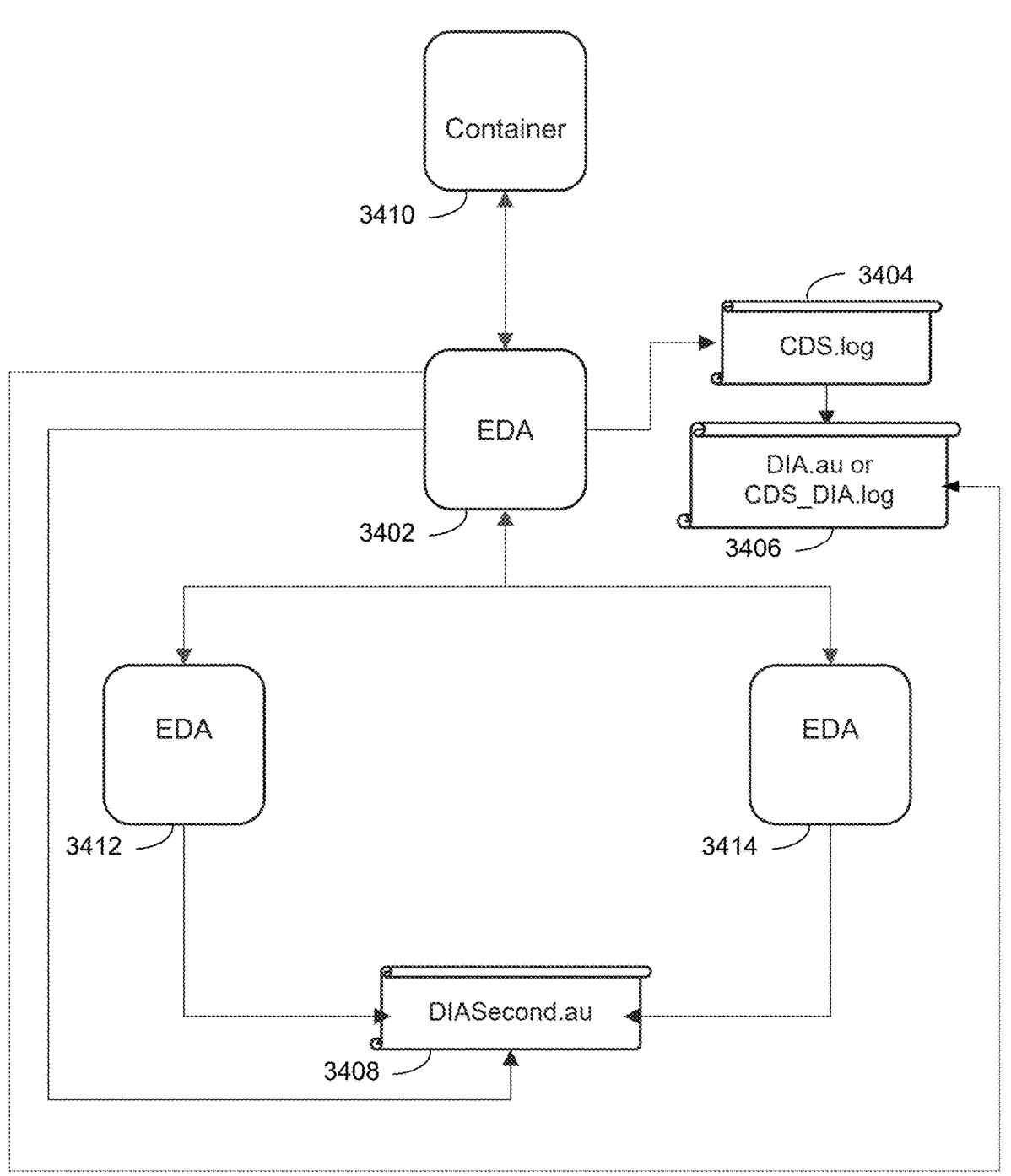
Figure 36:
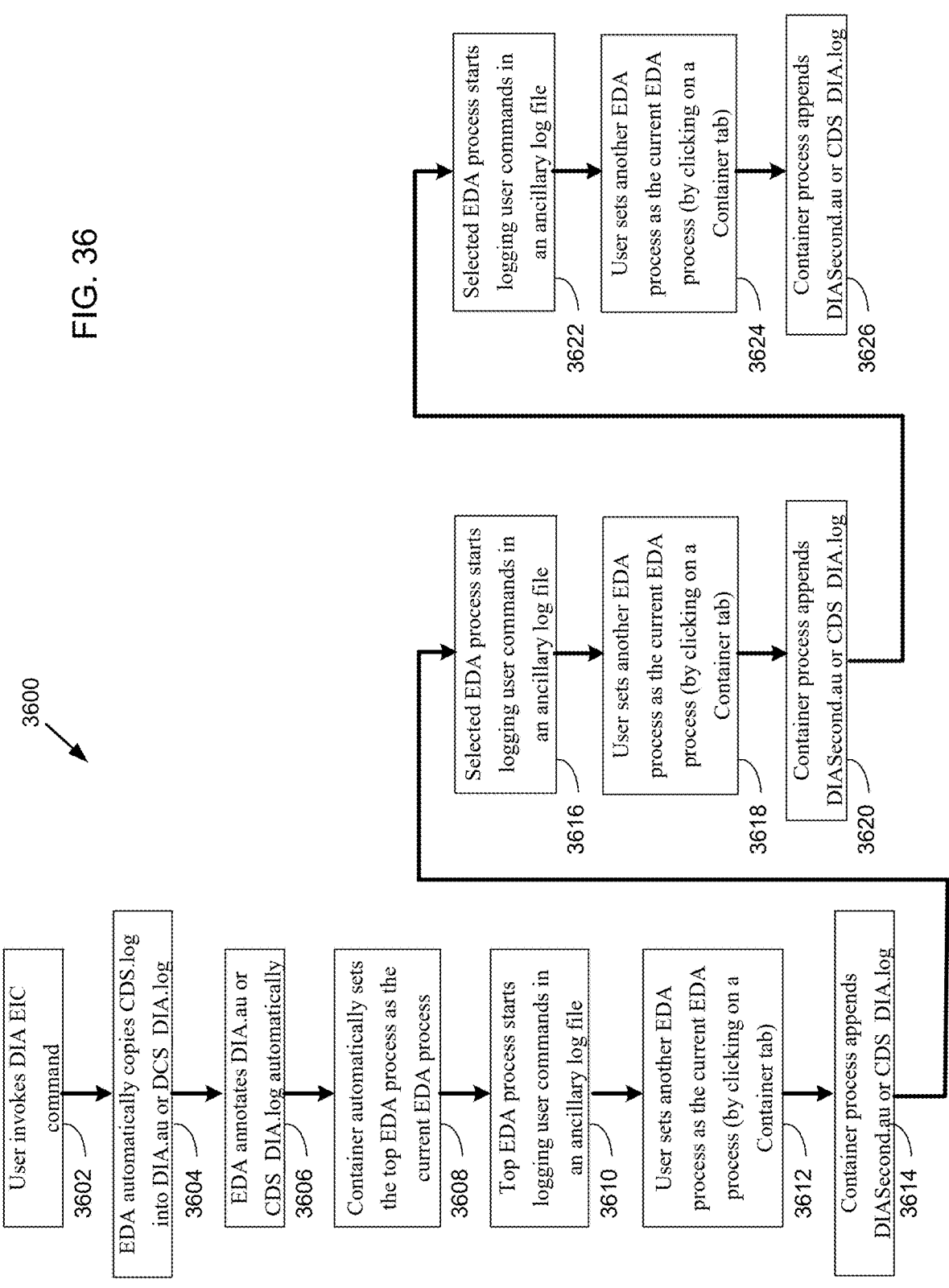
Figure 38:
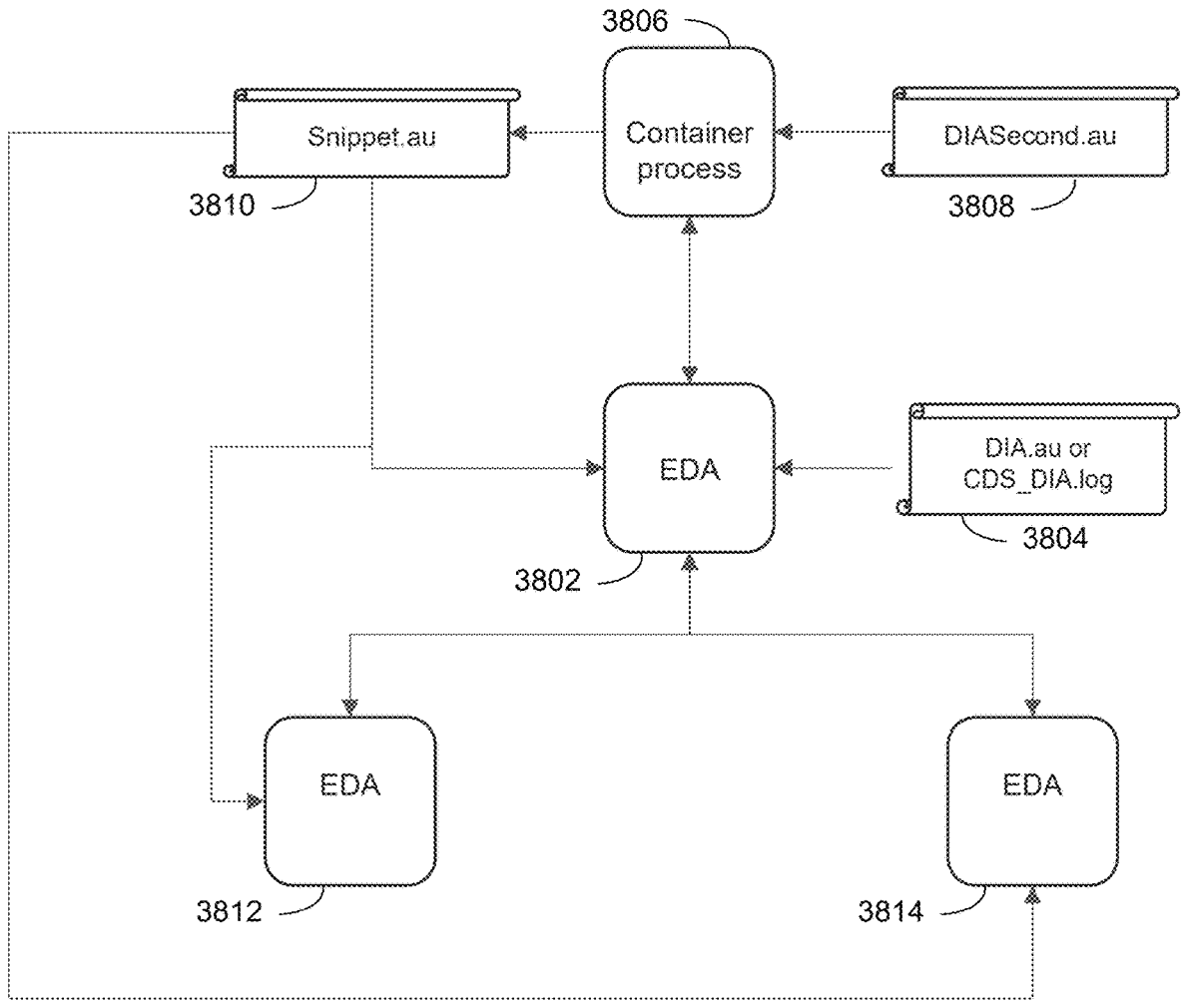
Figure 39:
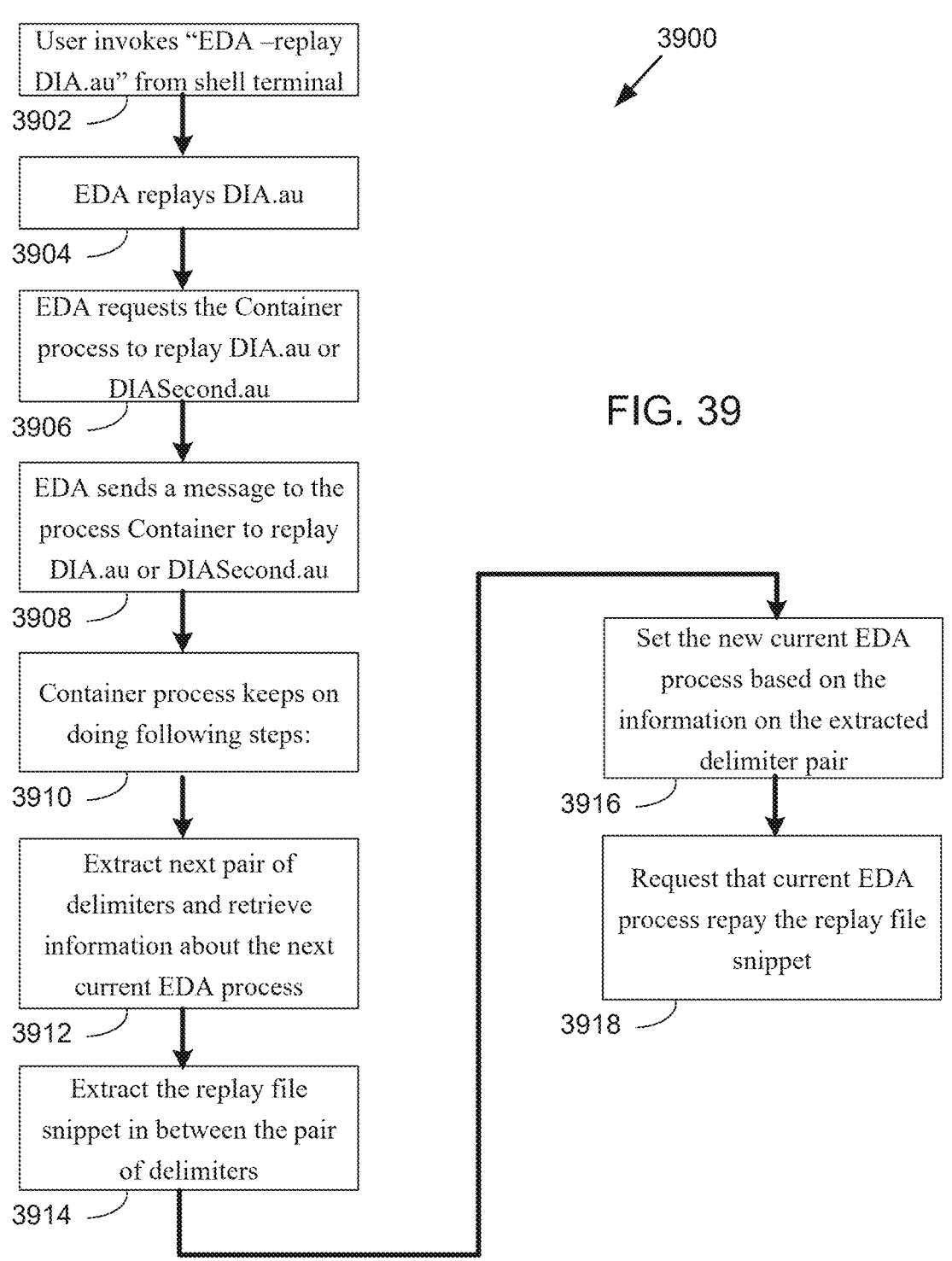
Figure 40:
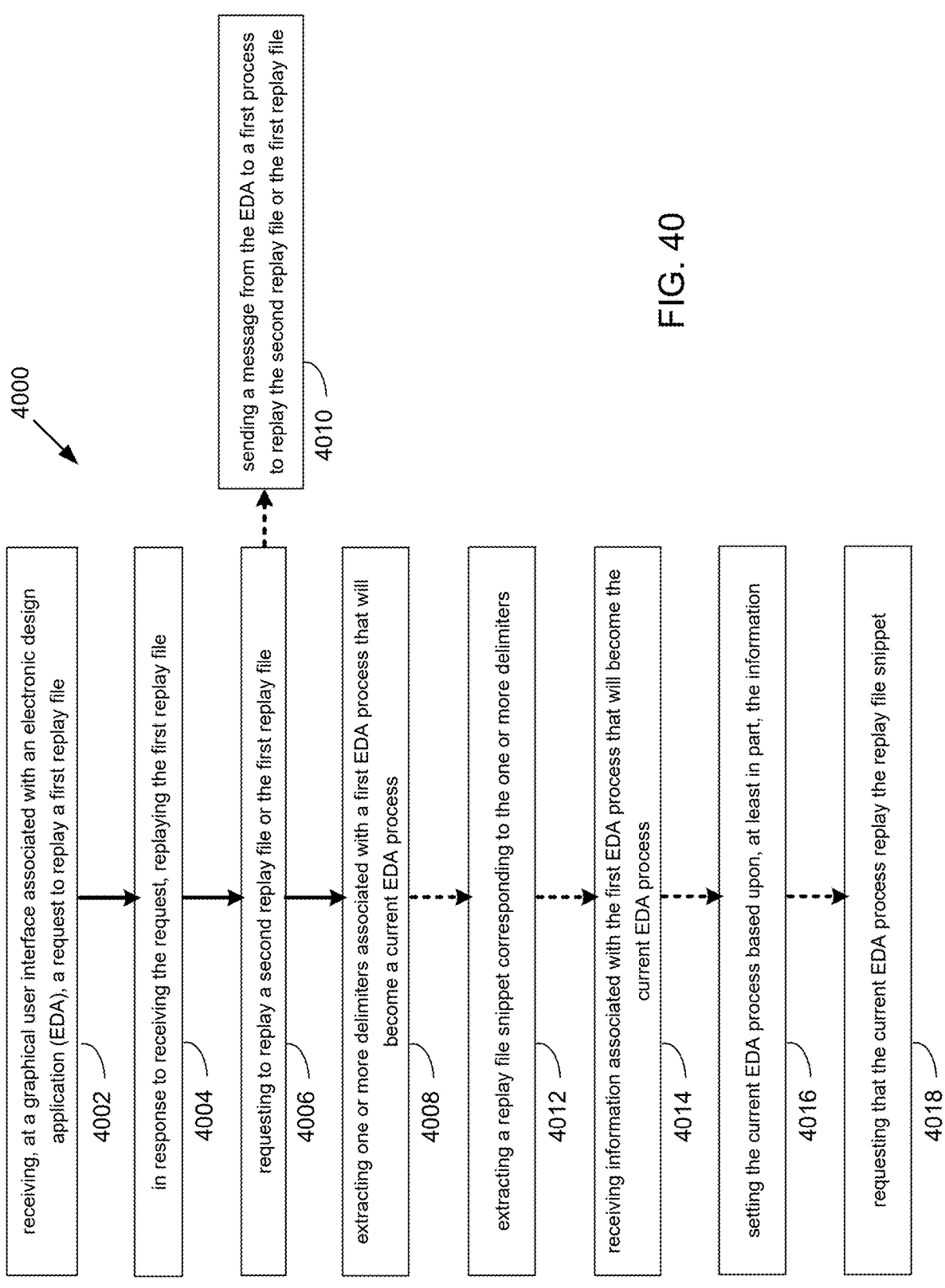
Figures 41, 42:
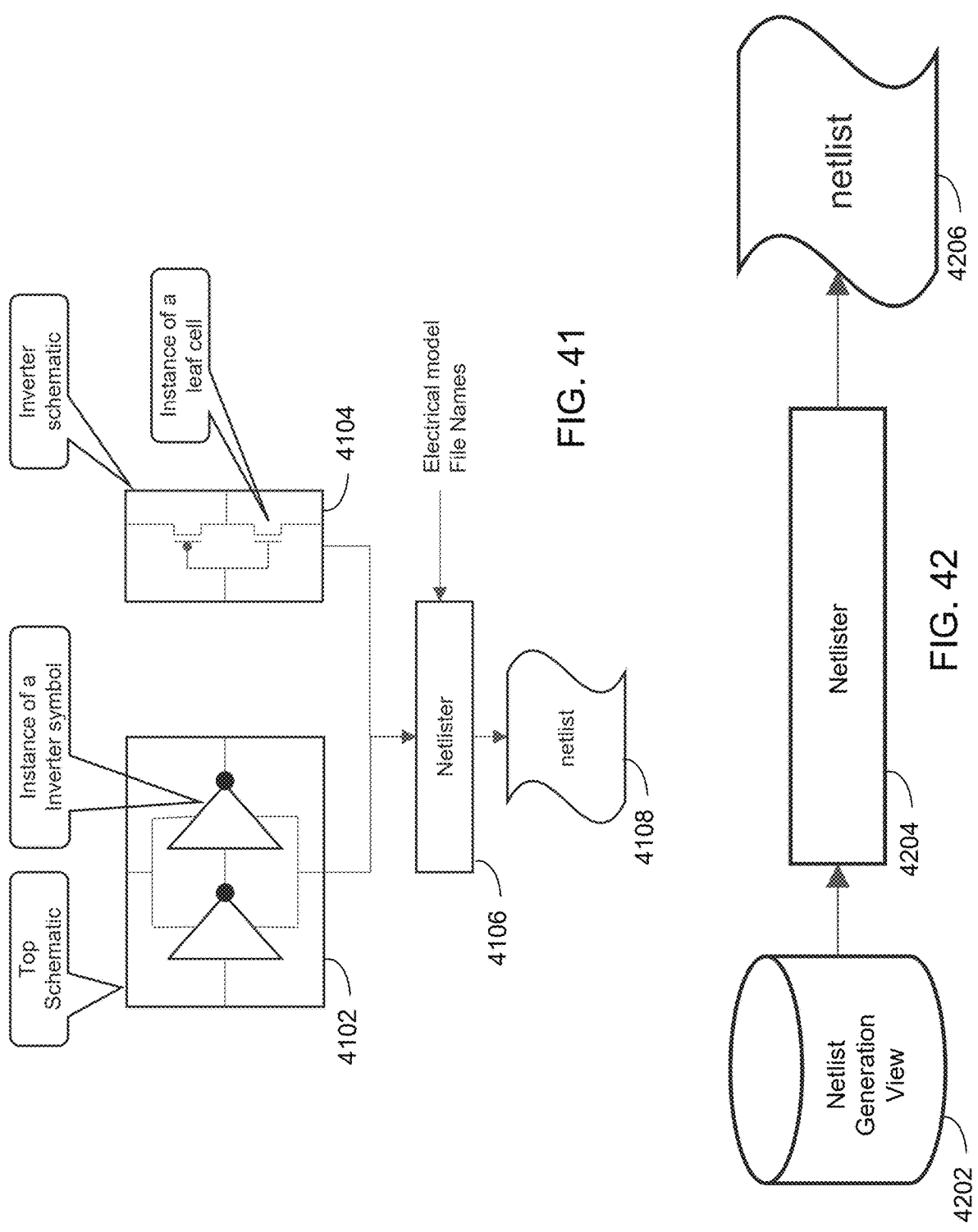
Figure 43:
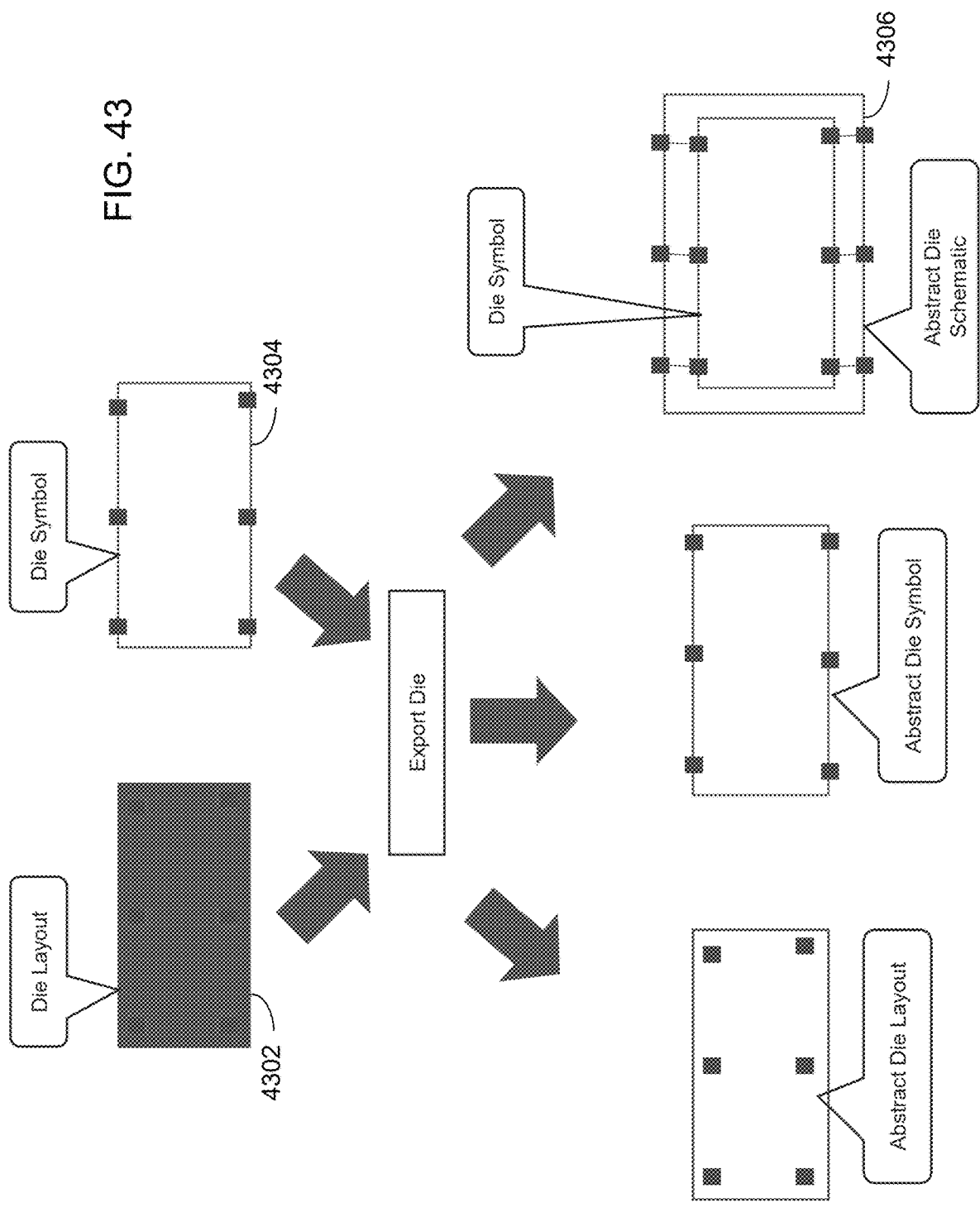
Figure 44:
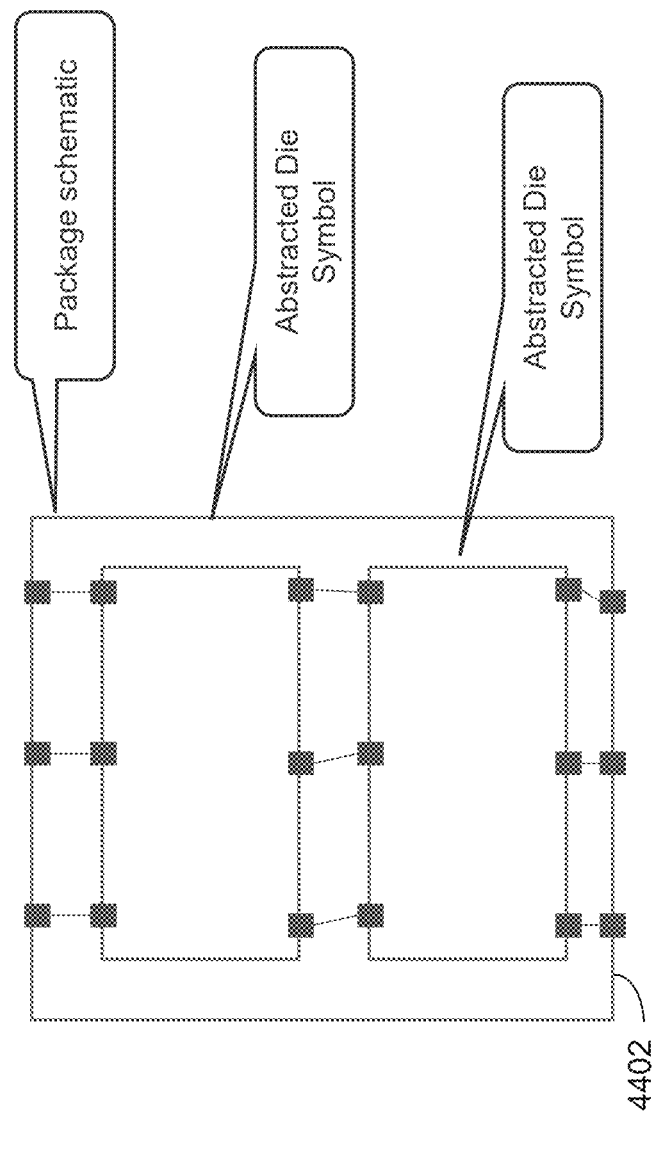
Figure 45:
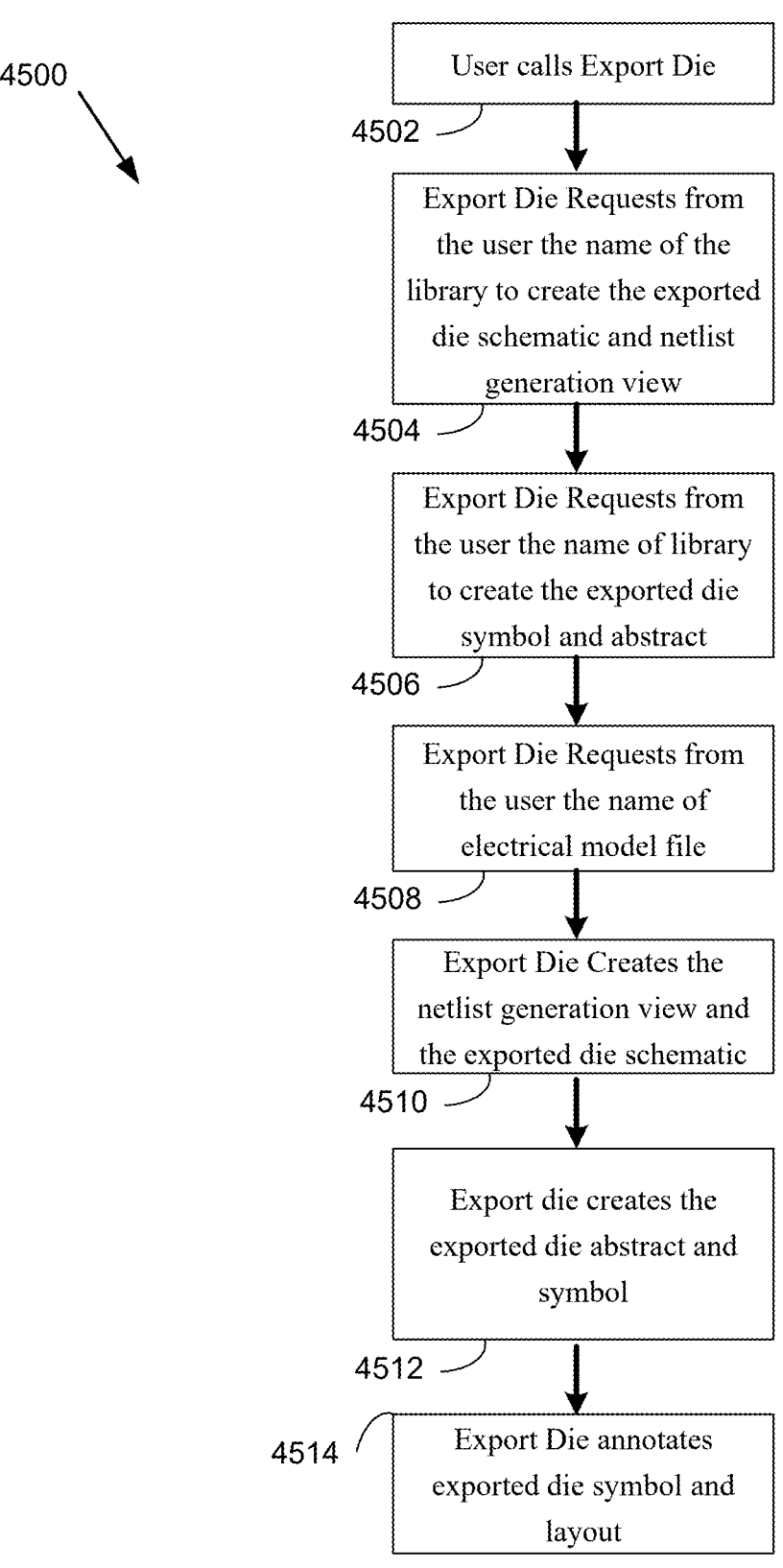
Figure 46:
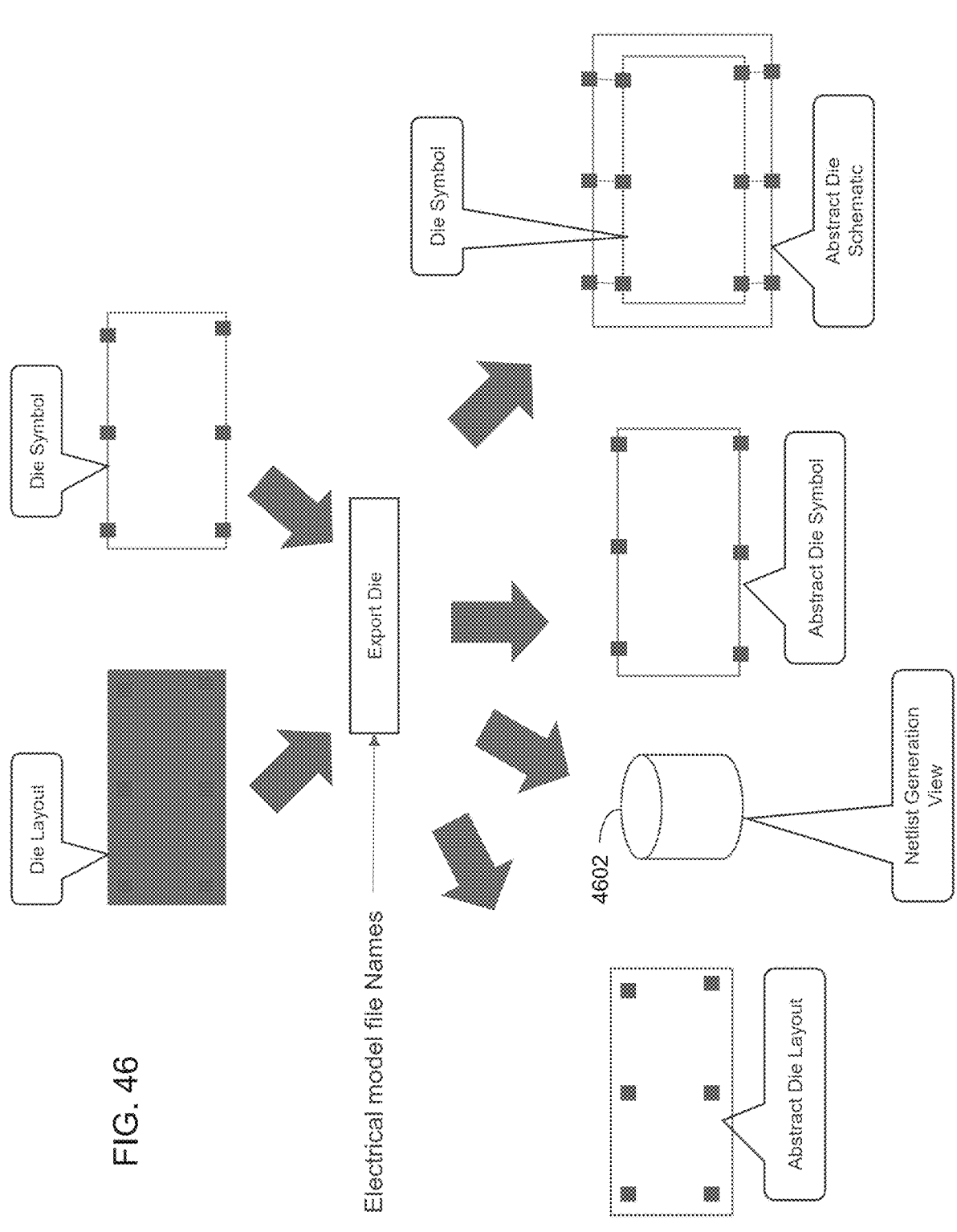

FIG. 12 illustrates an example process of the distributed EDA according to an embodiment of the present disclosure;

FIG. 13 shows an example layout and abstract associated with the distributed EDA in accordance with the present disclosure;

FIG. 14 shows an example schematic and abstract associated with the distributed EDA in accordance with the present disclosure;

FIG. 15 illustrates an example process of the distributed EDA according to an embodiment of the present disclosure;

FIGS. 16-17 illustrate example graphical user interfaces associated with the distributed EDA according to an embodiment of the present disclosure;

FIGS. 18-19 illustrate example relationships associated with the distributed EDA according to an embodiment of the present disclosure;

FIG. 20 illustrates example graphical user interfaces associated with the distributed EDA according to an embodiment of the present disclosure;

FIG. 21 is an example flowchart of a DIA process (2100) according to an embodiment of the present disclosure;

FIG. 22 illustrates an example process of the distributed EDA according to an embodiment of the present disclosure;

FIGS. 23-24 illustrate example graphical user interfaces according to an embodiment of the present disclosure;

FIG. 25 illustrates an example process of the distributed EDA according to an embodiment of the present disclosure;

FIGS. 26-30 illustrate example graphical user interfaces according embodiments of the present disclosure;

FIG. 31 illustrates an example process of the distributed EDA according to an embodiment of the present disclosure;

FIG. 32 is an example flowchart of a DIA process (3200) according to an embodiment of the present disclosure;

FIG. 33 illustrates diagrammatic flowcharts showing operations associated with the EDA;

FIG. 34 illustrates an example architecture of the distributed EDA according to an embodiment of the present disclosure;

FIG. 35A illustrates example files associated with the distributed EDA according to an embodiment of the present disclosure;

FIG. 35B also illustrates example files associated with the distributed EDA according to an embodiment of the present disclosure;

FIG. 36 illustrates an example process of the distributed EDA according to an embodiment of the present disclosure;

FIG. 37 is an example flowchart of a DIA process (3700) according to an embodiment of the present disclosure FIG. 38 illustrates an example architecture of the distributed EDA according to an embodiment of the present disclosure;

FIG. 39 illustrates an example process of the distributed EDA according to an embodiment of the present disclosure;

FIG. 40 is an example flowchart of a DIA process (4000) according to an embodiment of the present disclosure;

FIGS. 41-42 illustrate example schematic netlisting operations associated with the EDA;

FIG. 43 illustrates an example of exporting a die using the EDA;

FIG. 44 illustrates an example package schematic associated with the EDA;

FIG. 45 illustrates an example process for exporting a die using the distributed EDA in accordance with the present disclosure;

FIG. 46 illustrates example components associated with the example process for exporting the die of FIG. 45;

4

Figure 47:
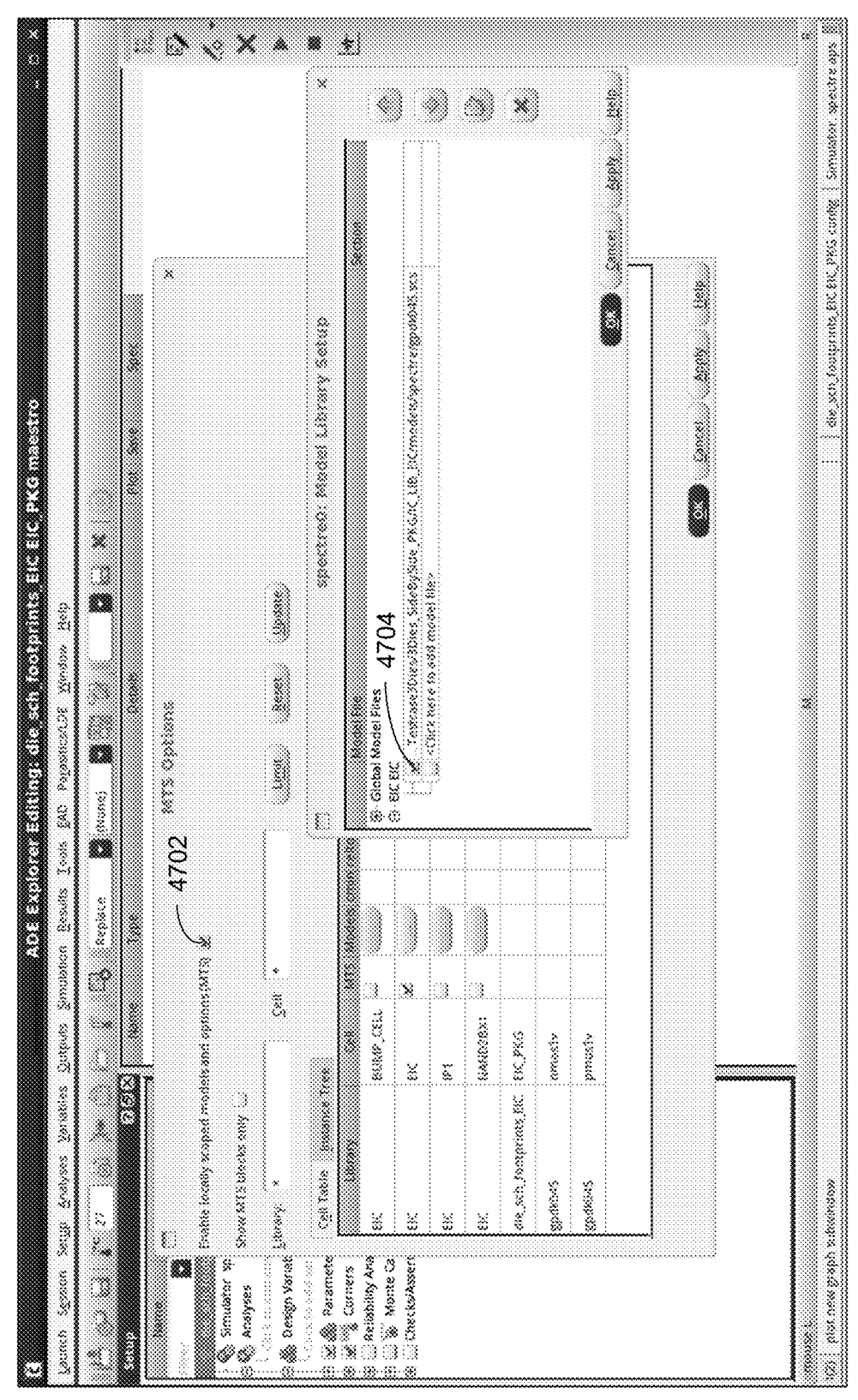
Figure 50:
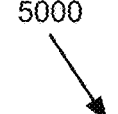
Figure 51:
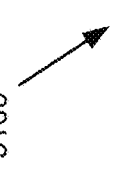
Figures 53, 54:
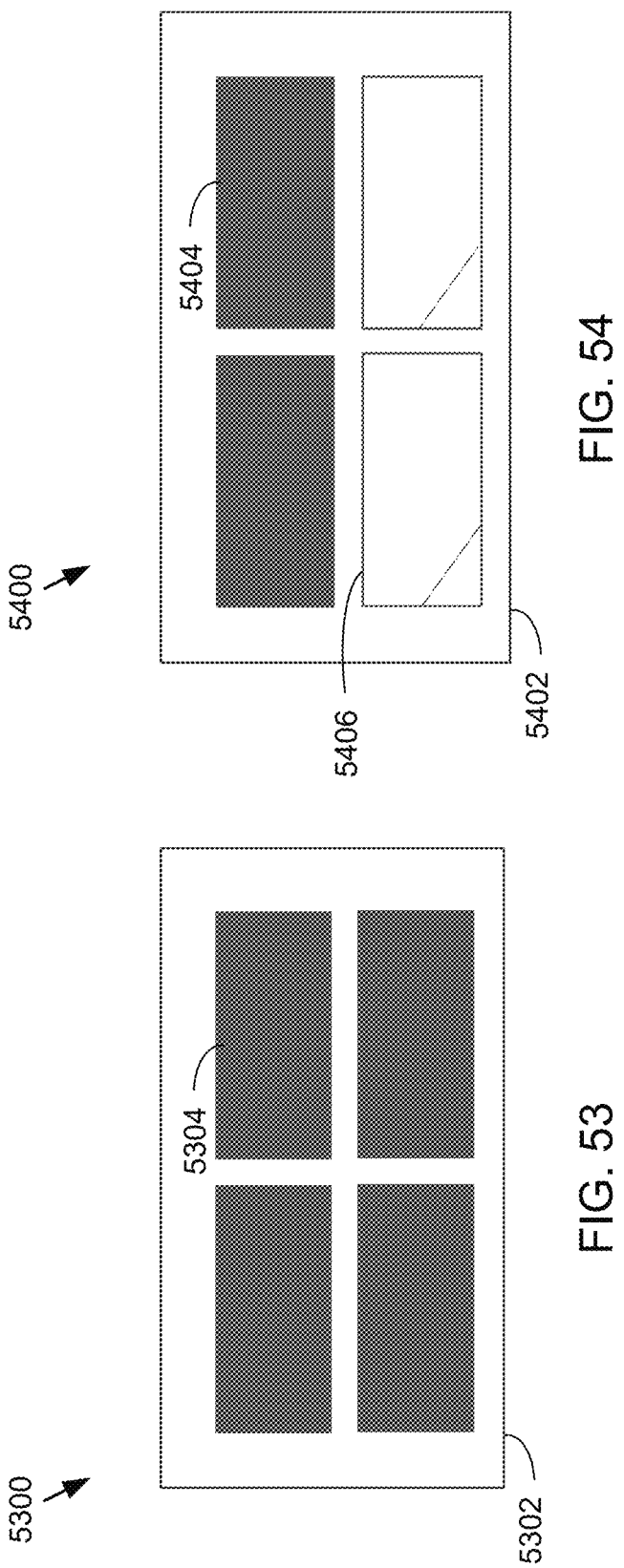
Figure 56:
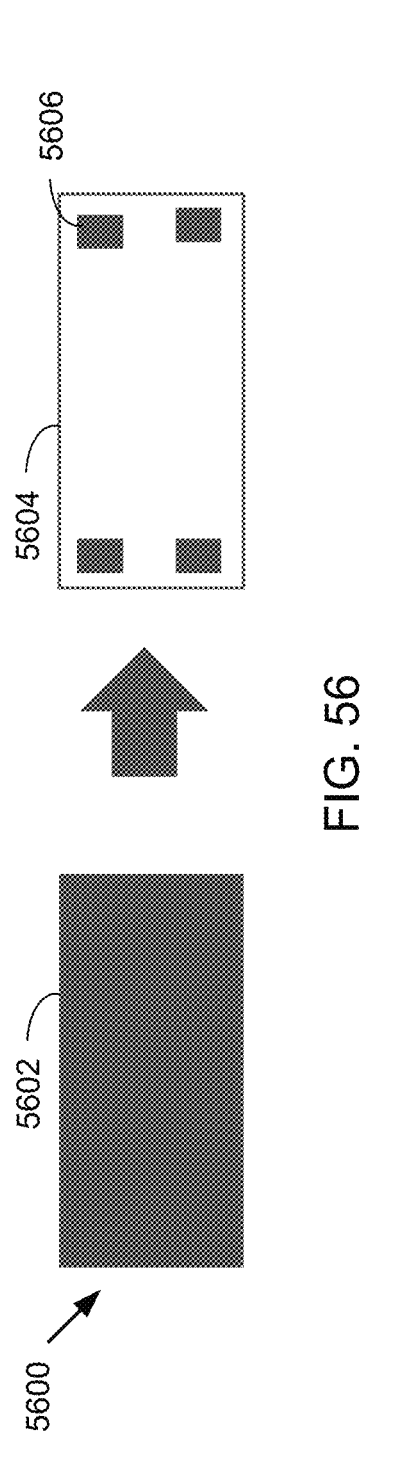
Figure 58:
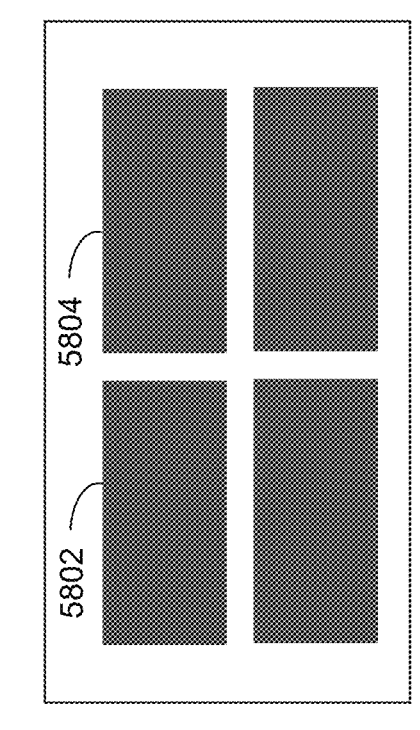
Figure 57:
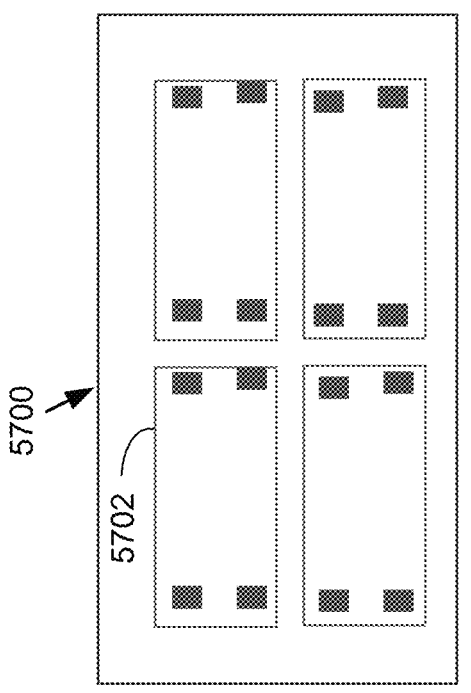
Figure 59:
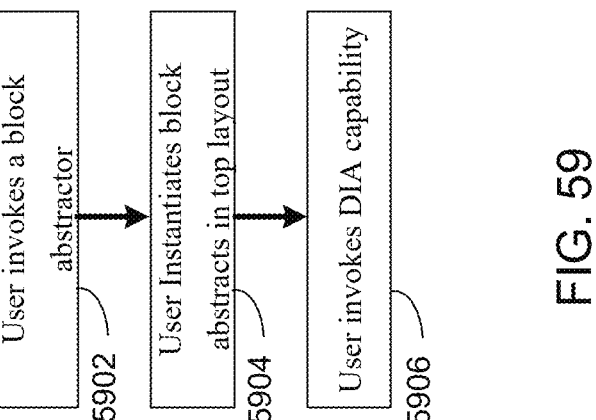
Figure 62:
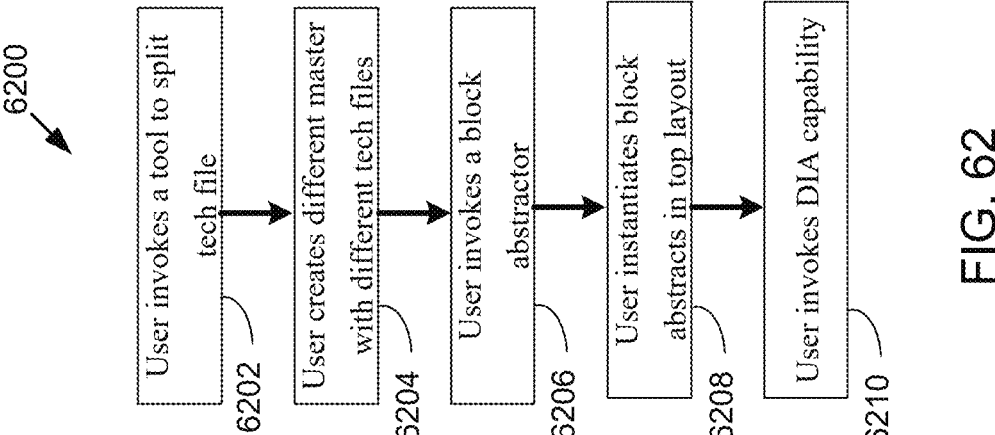
Figure 61:
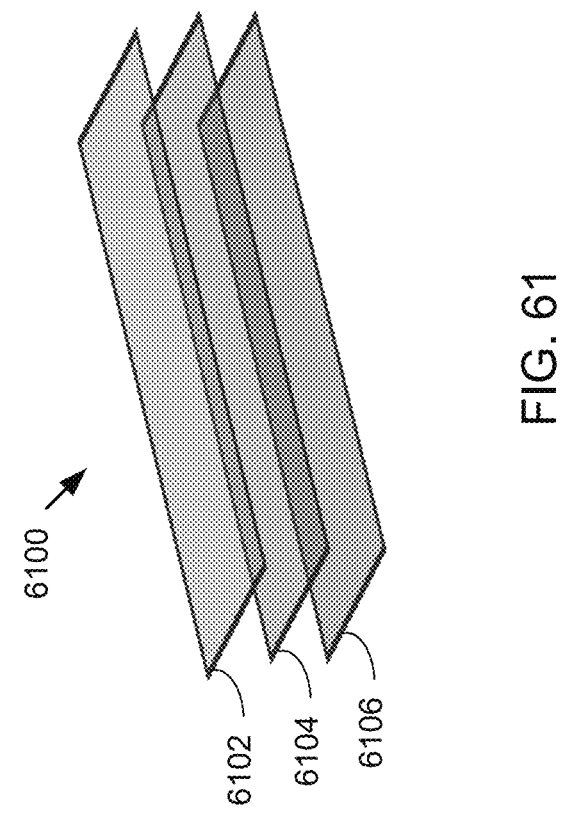
Figure 71:
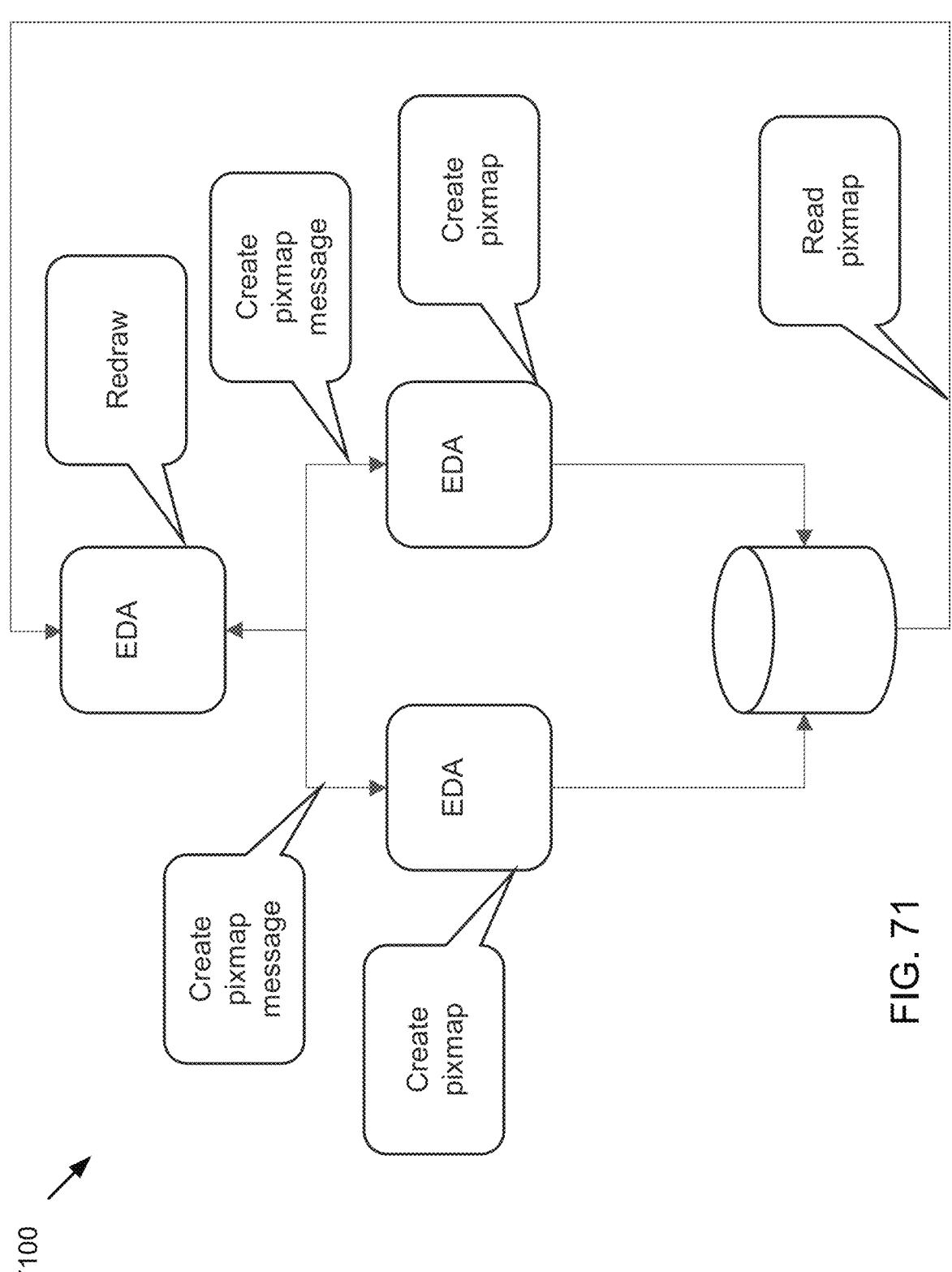
Figure 72:
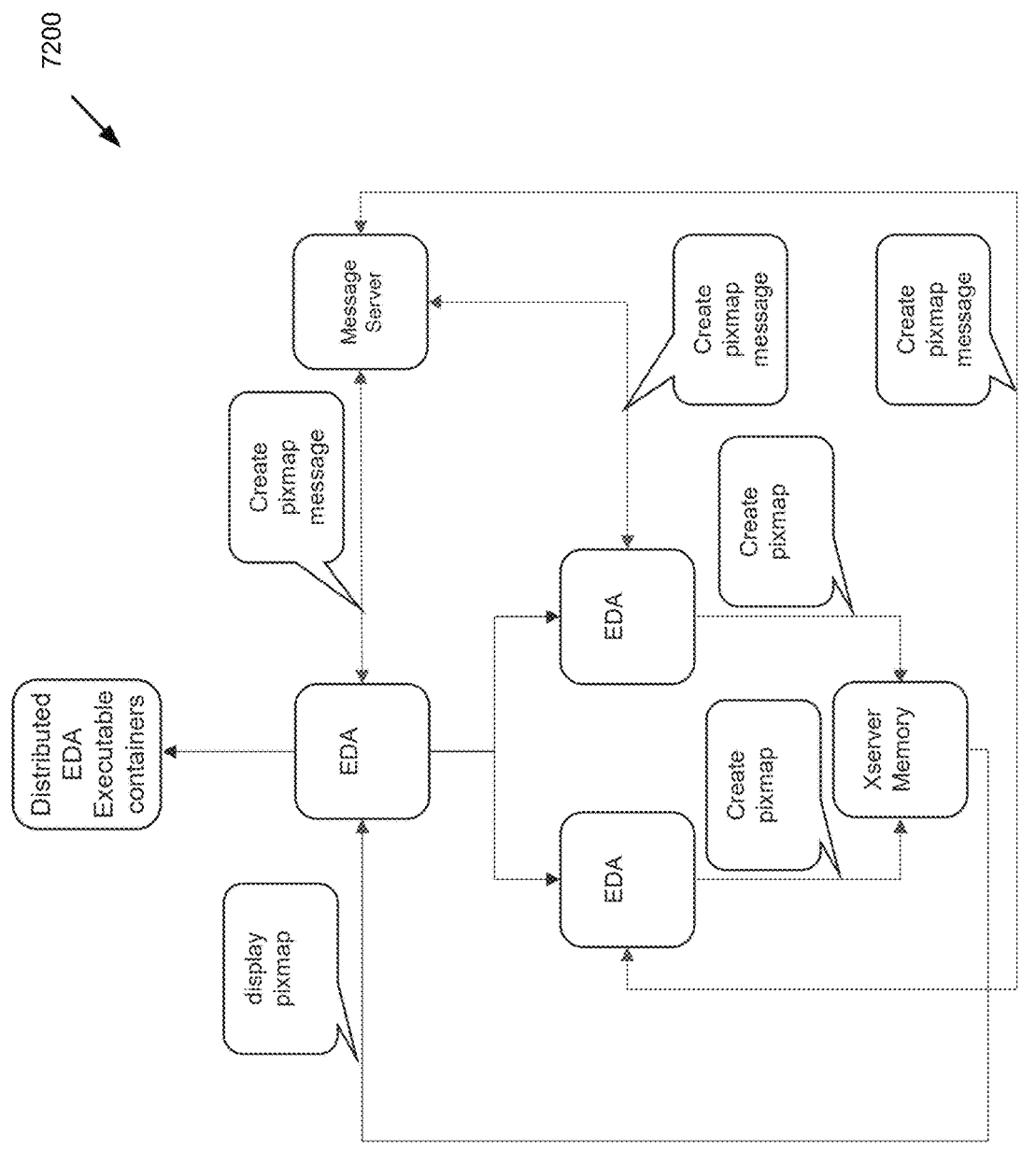
Figure 73:
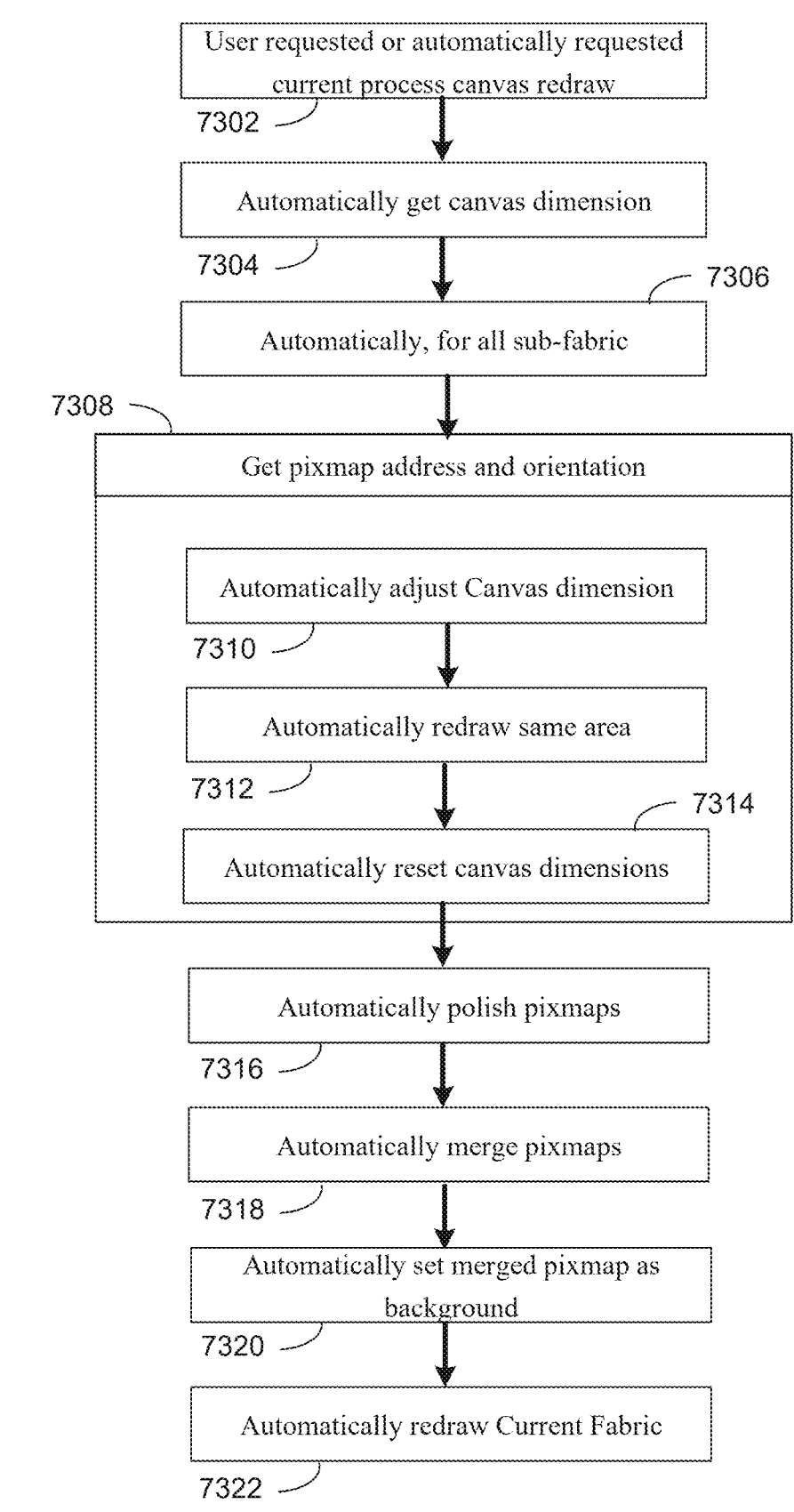
Figure 74:
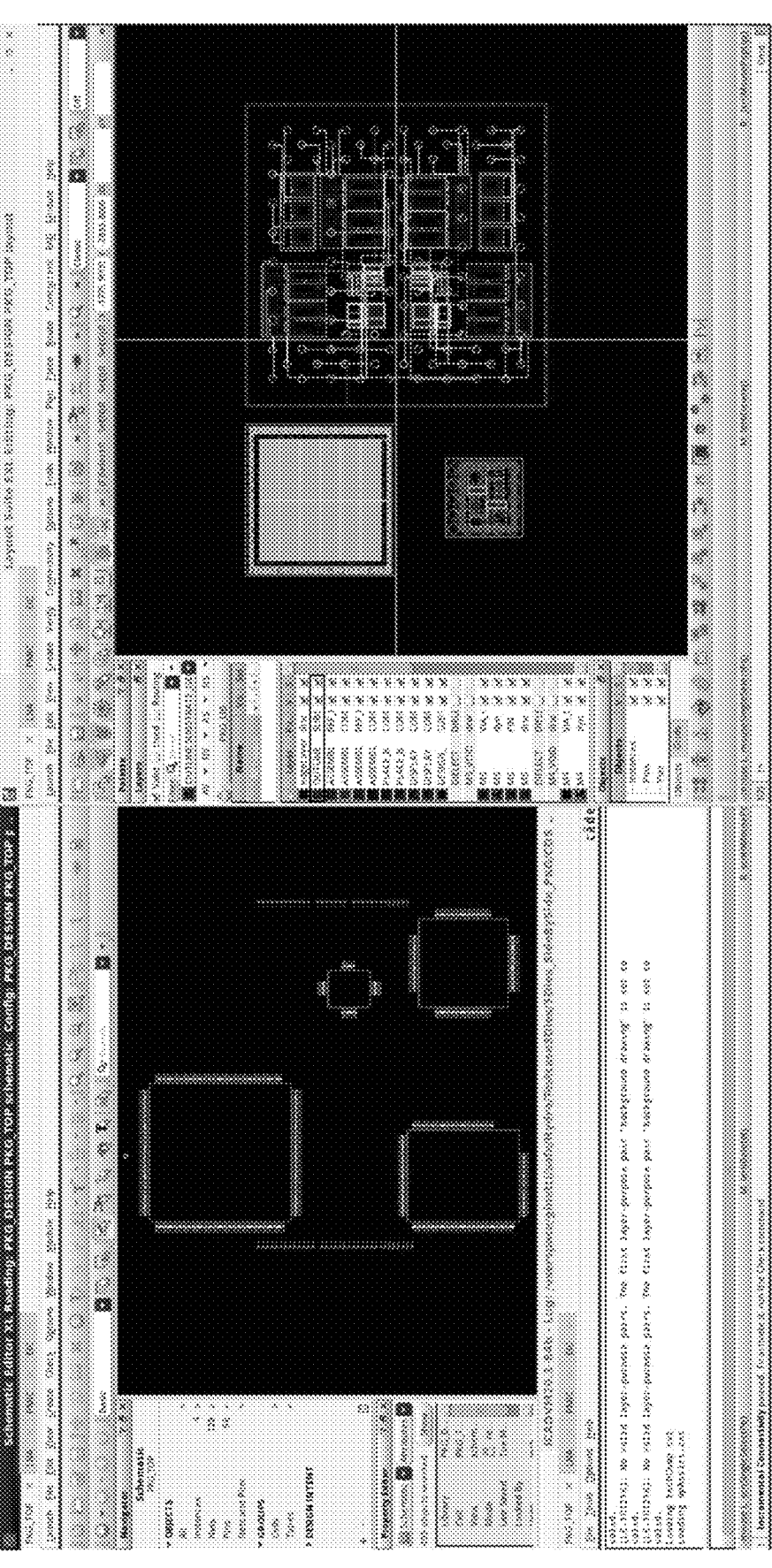
Figure 75:
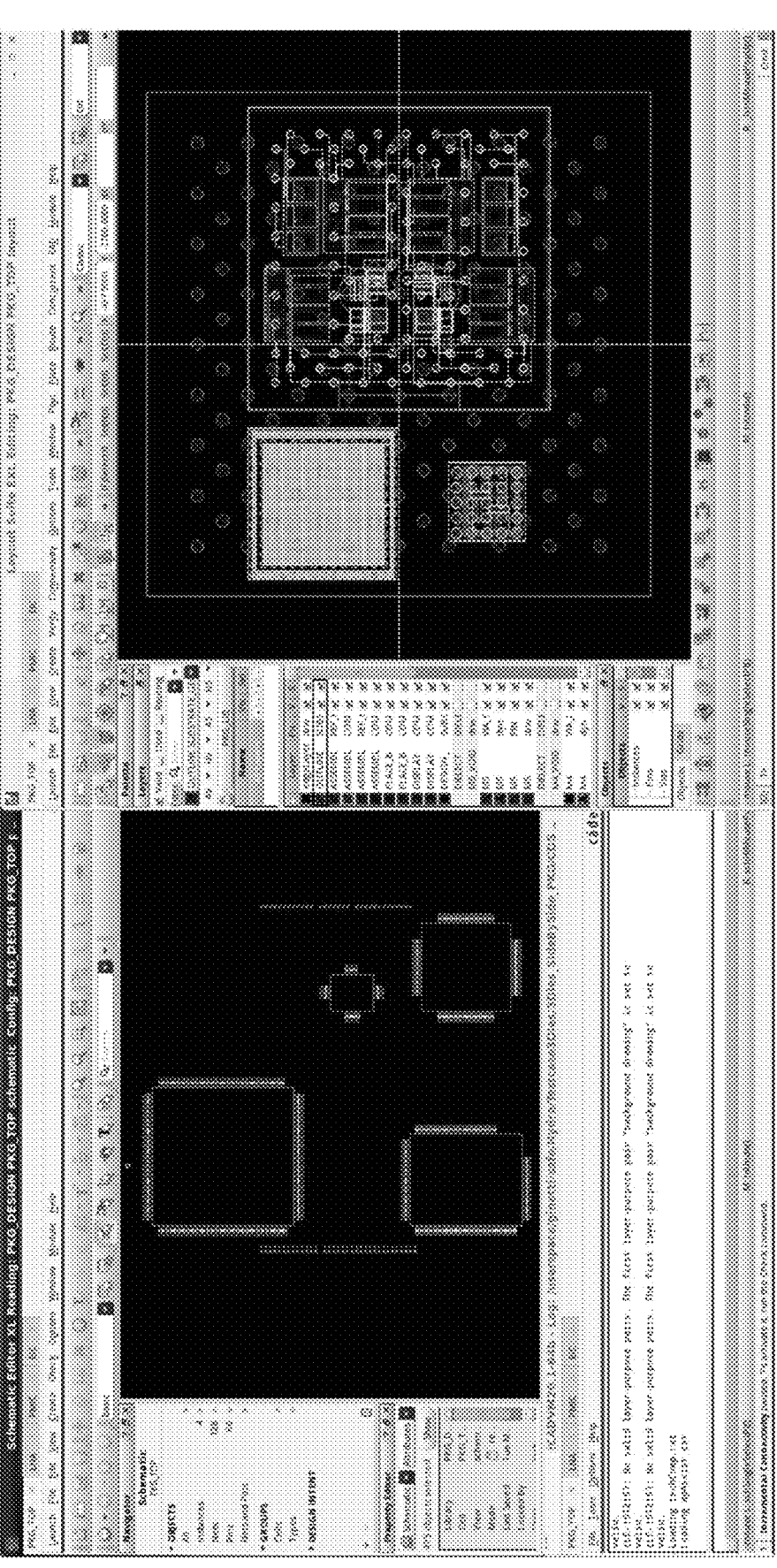
Figure 76:
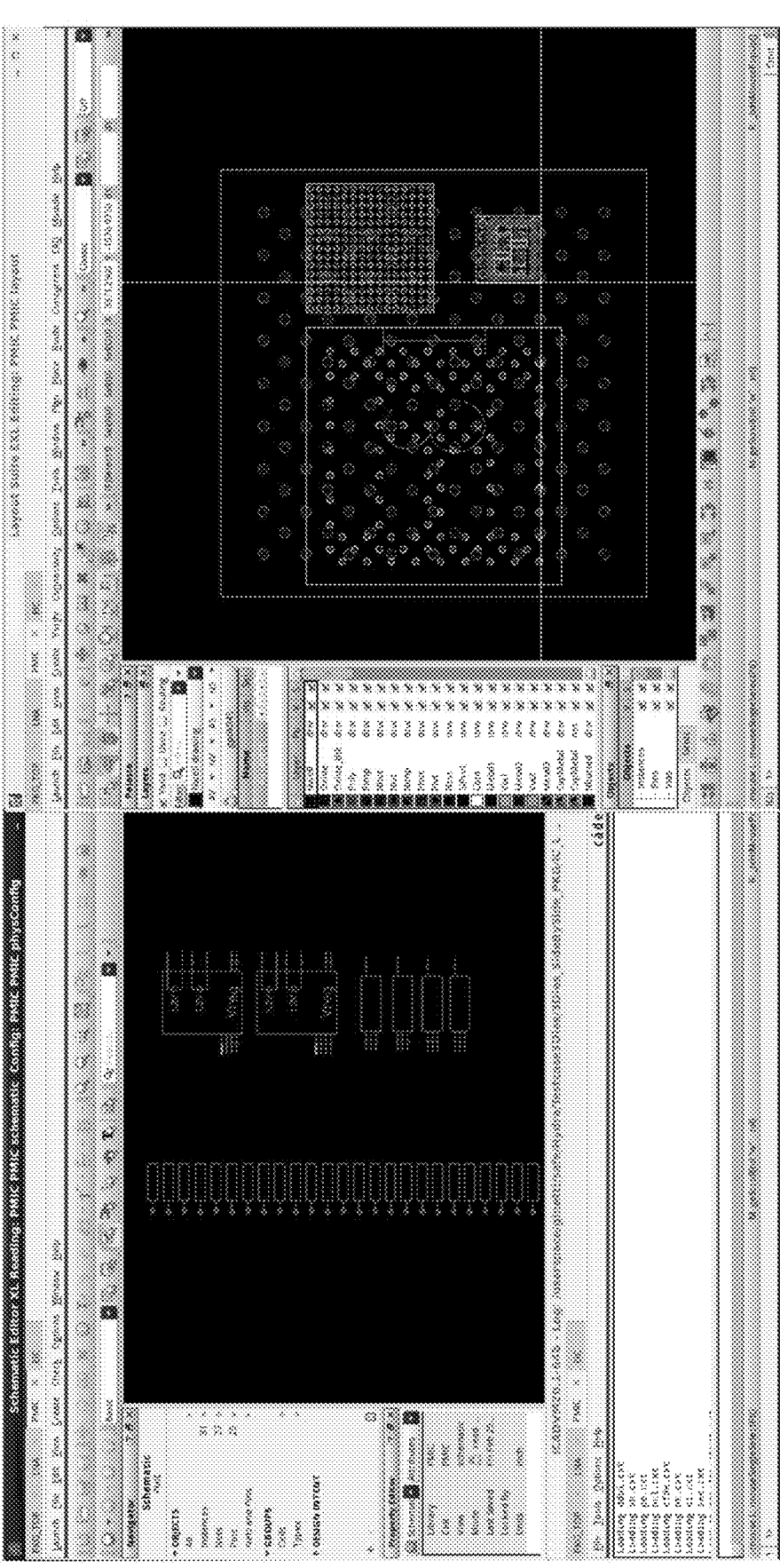
Figure 77:
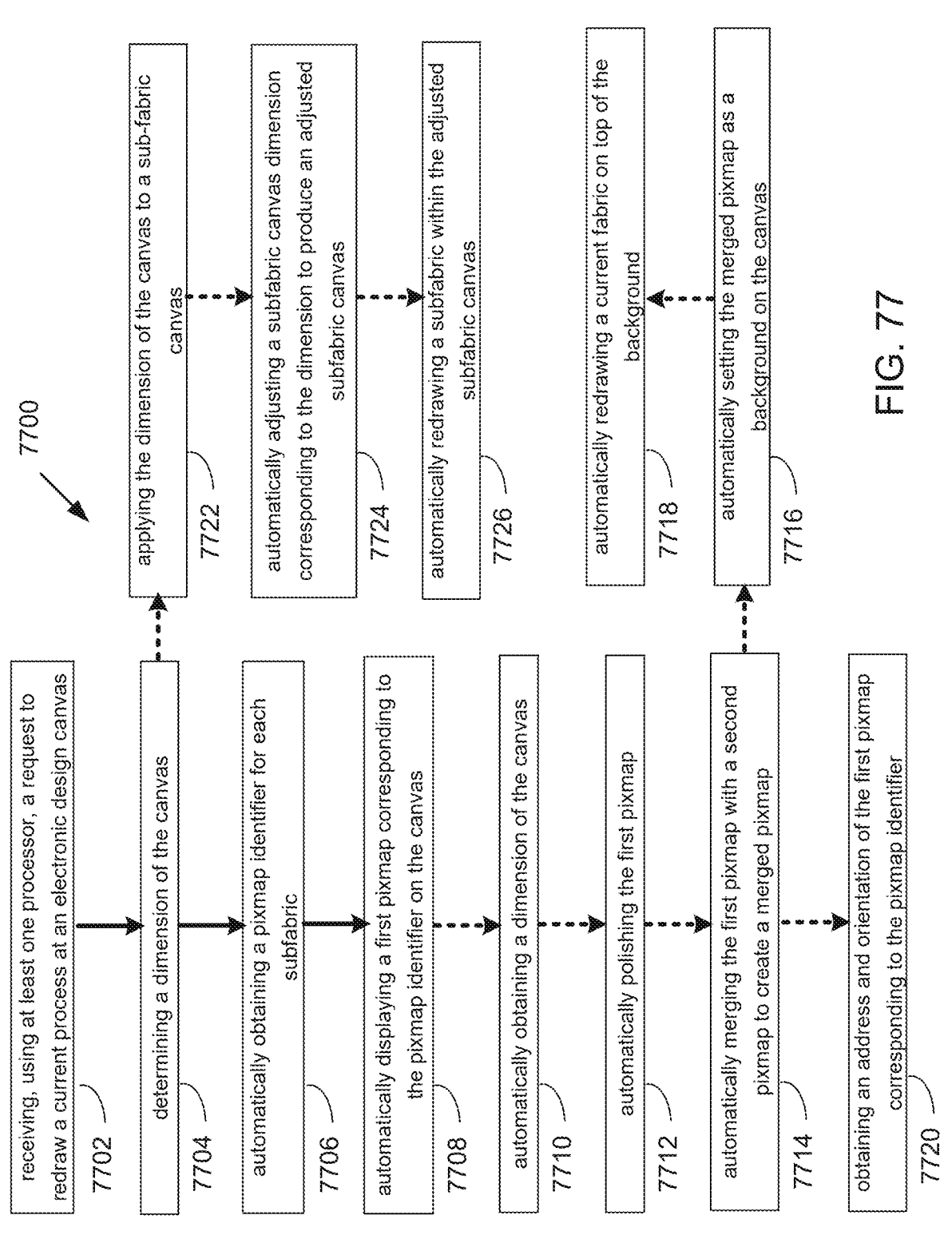
Figure 78:
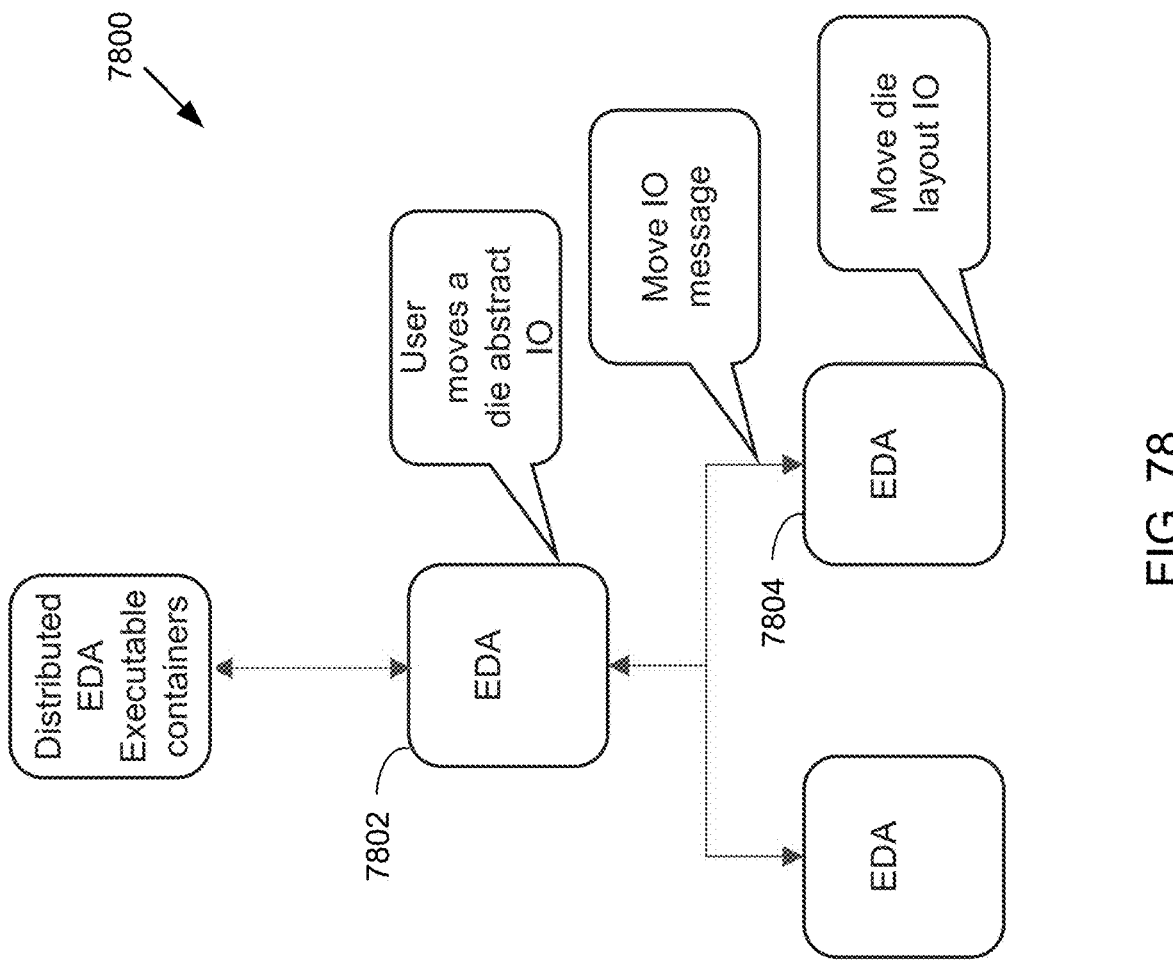
Figure 85:
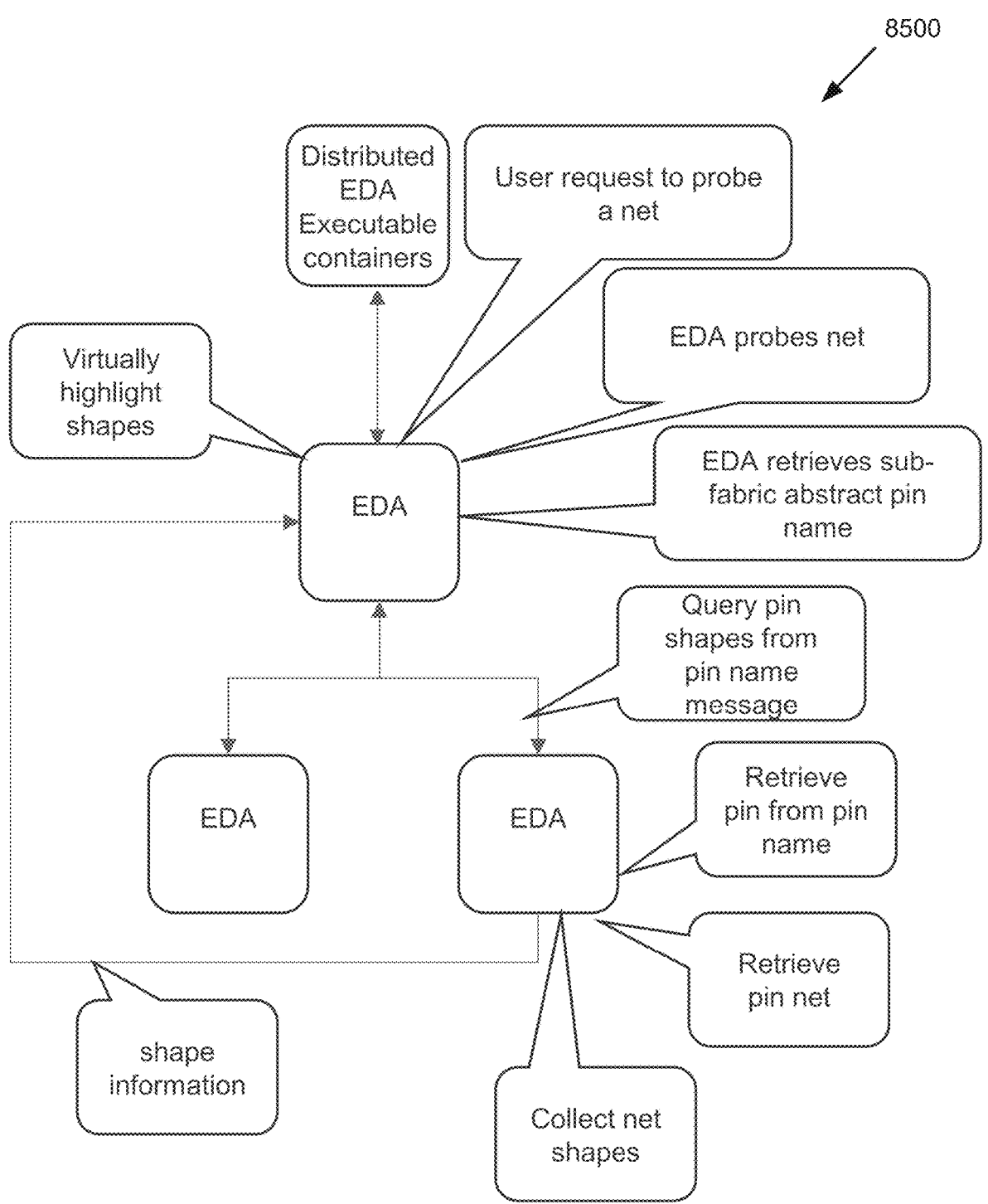
Figure 87:
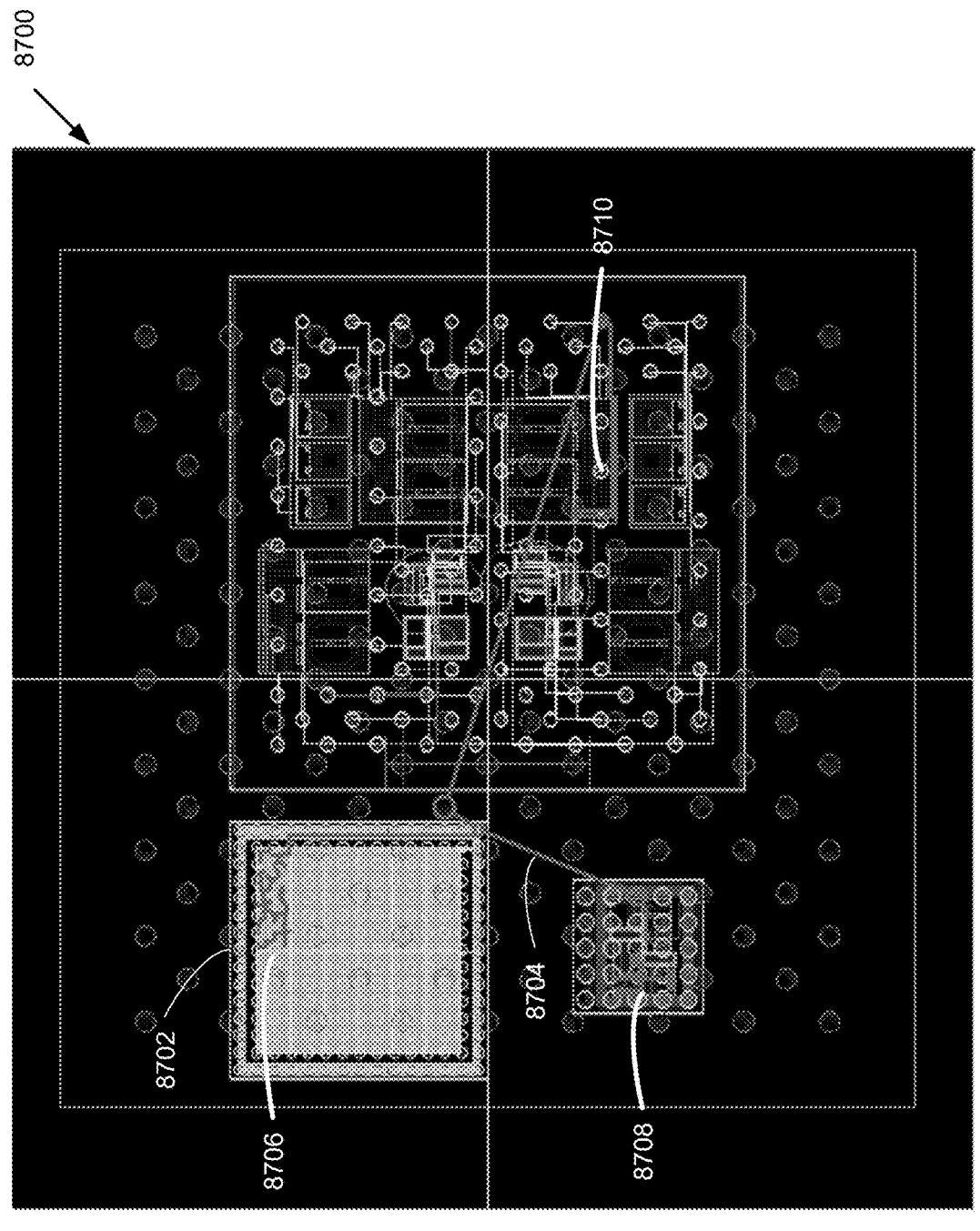
Figure 90:
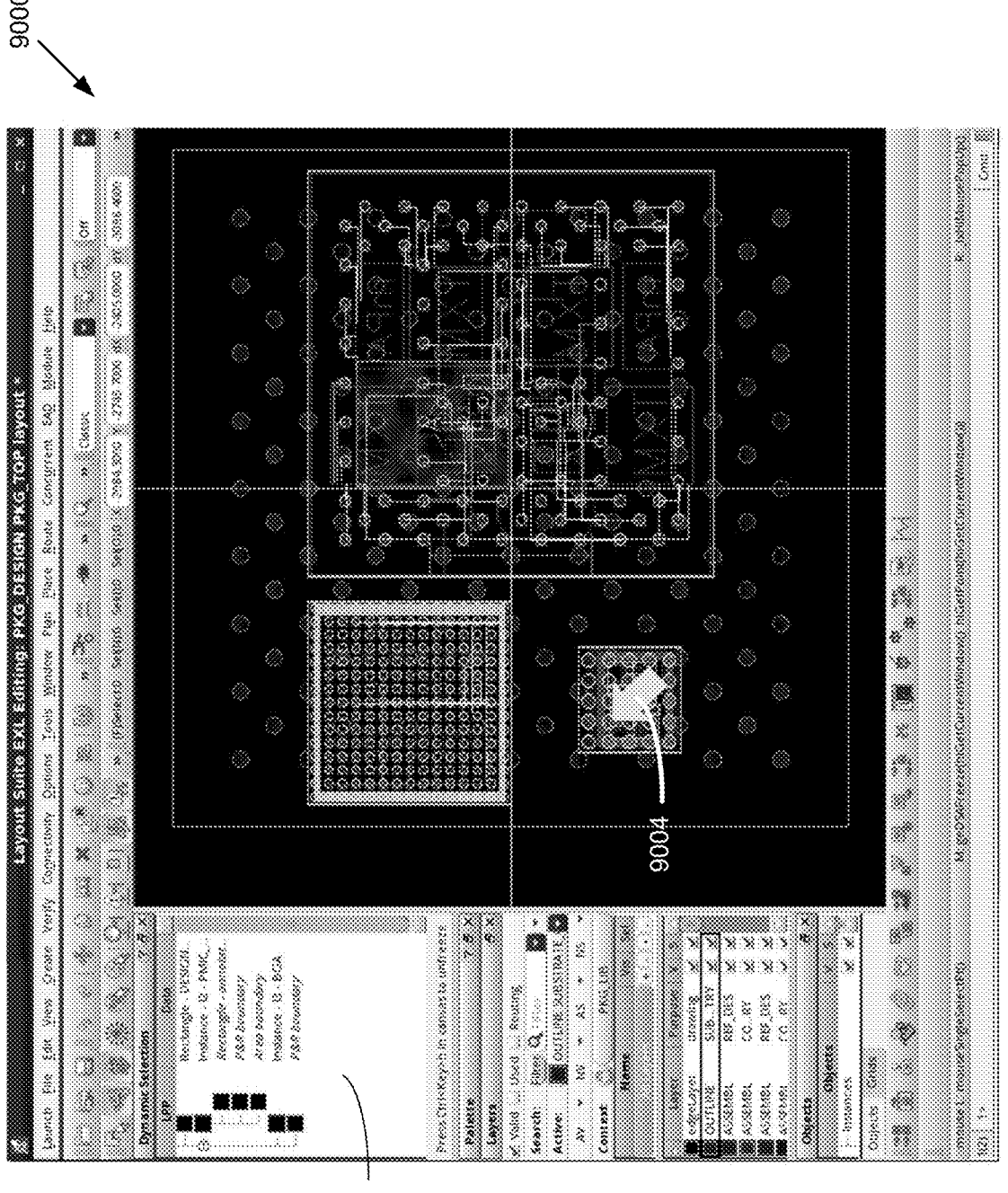
Figure 91:
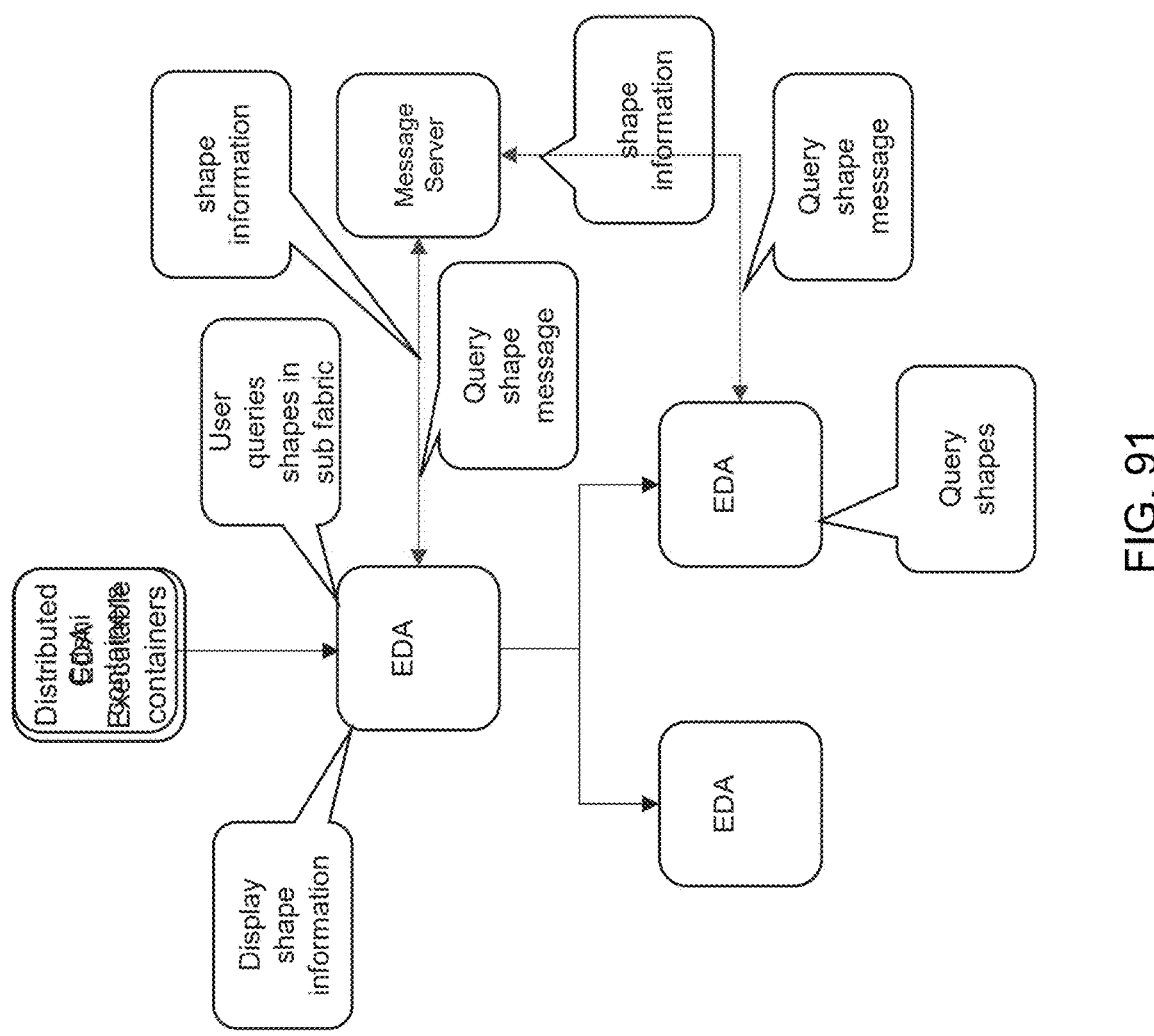
Figure 93:
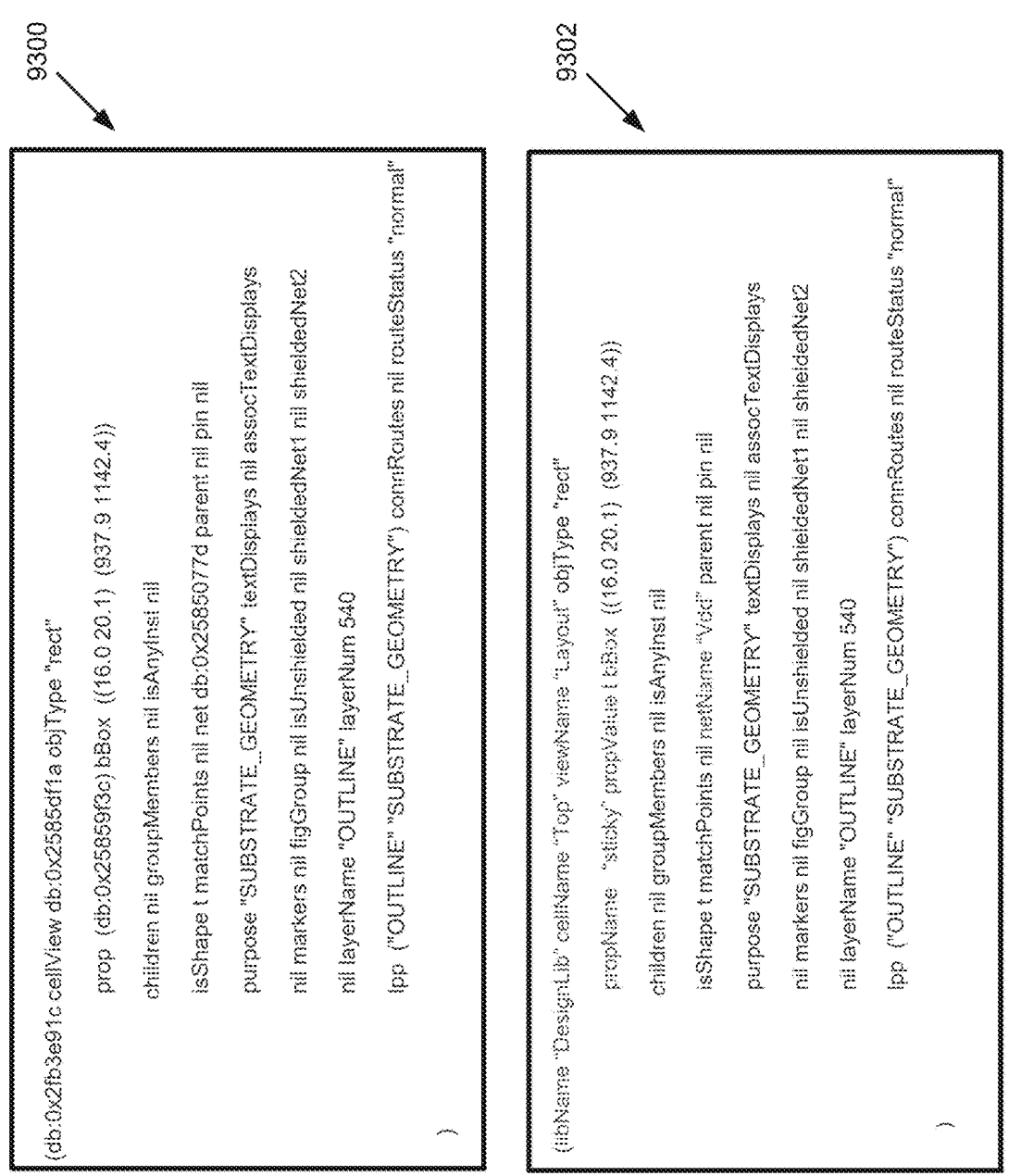
Figure 94:
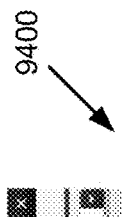
Figure 96:
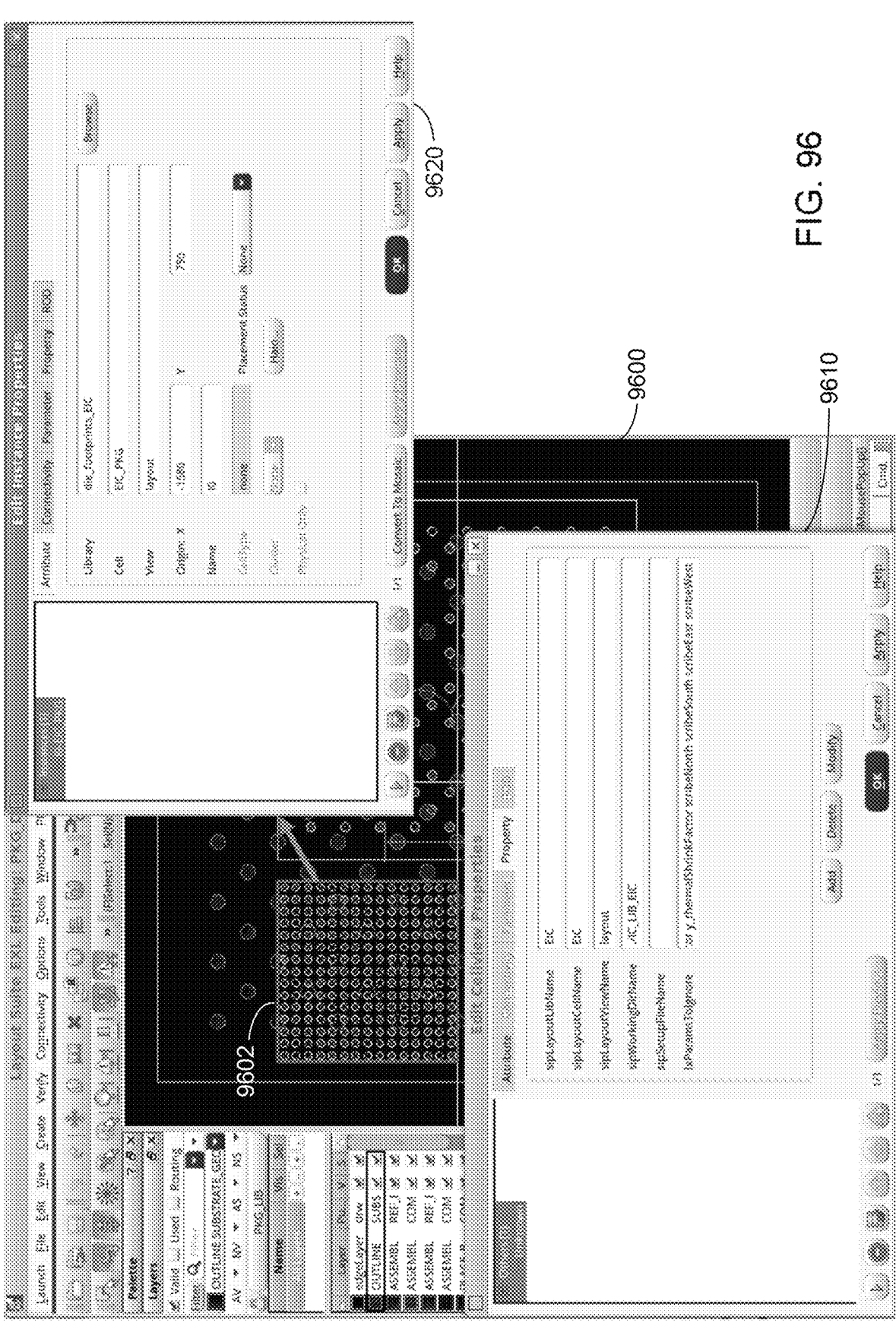
Figure 97:
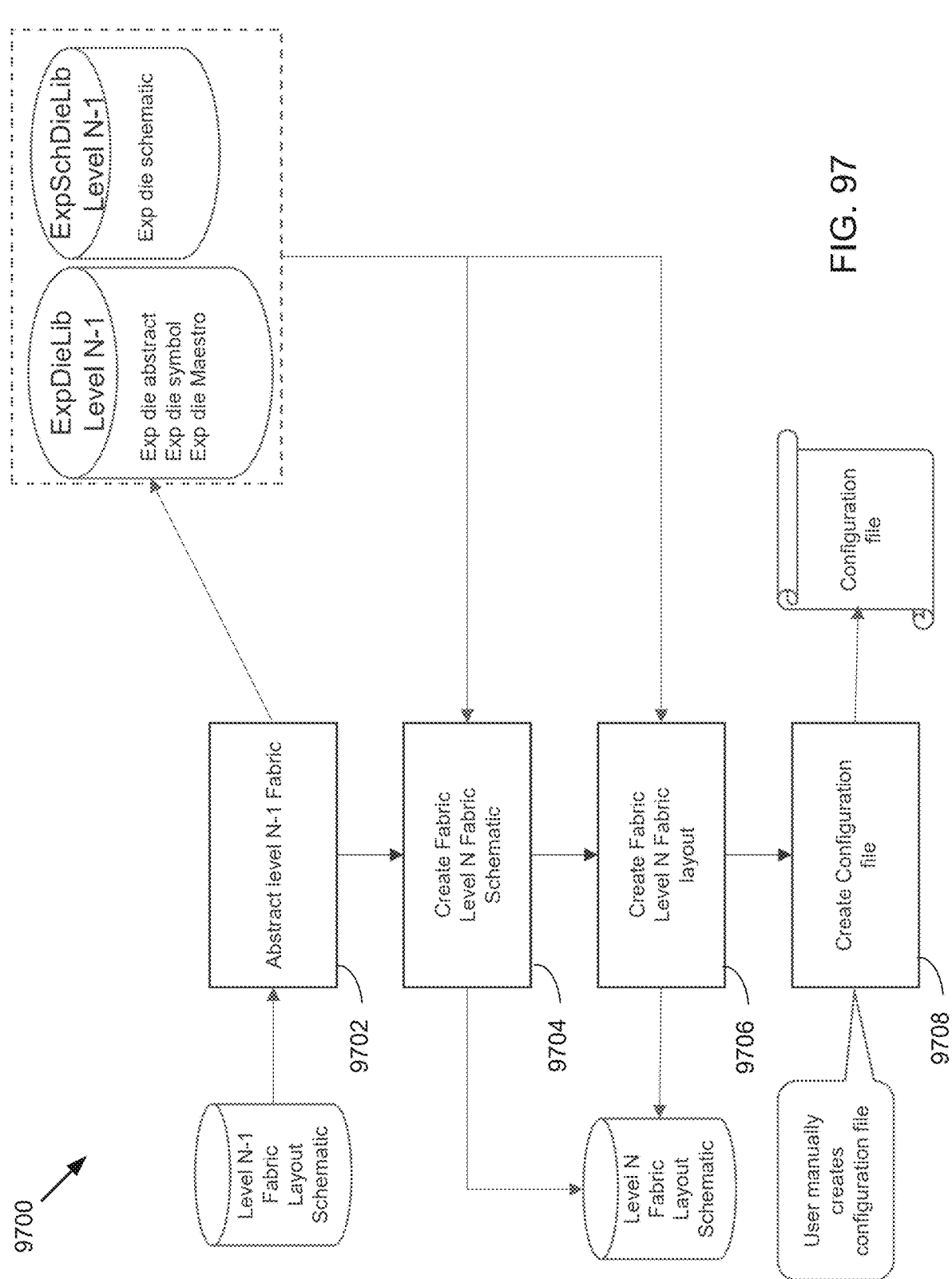
Figure 98:
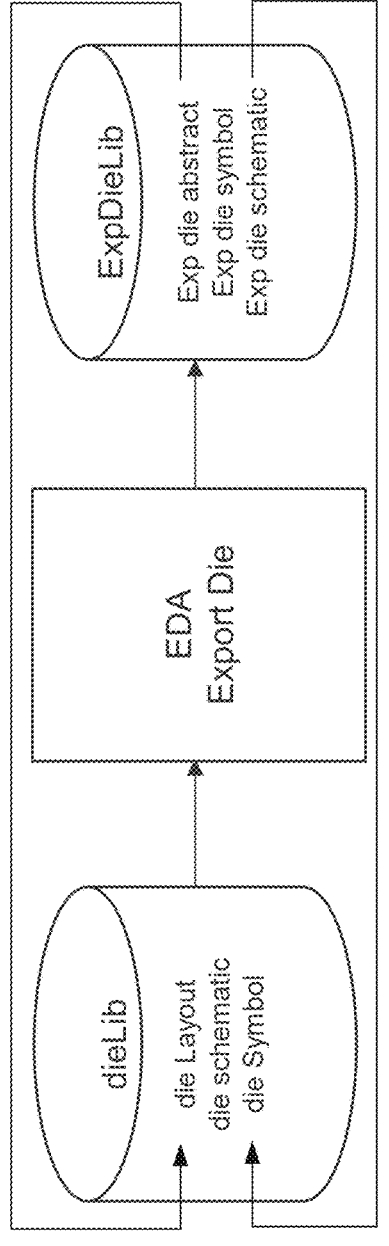
Figure 99:
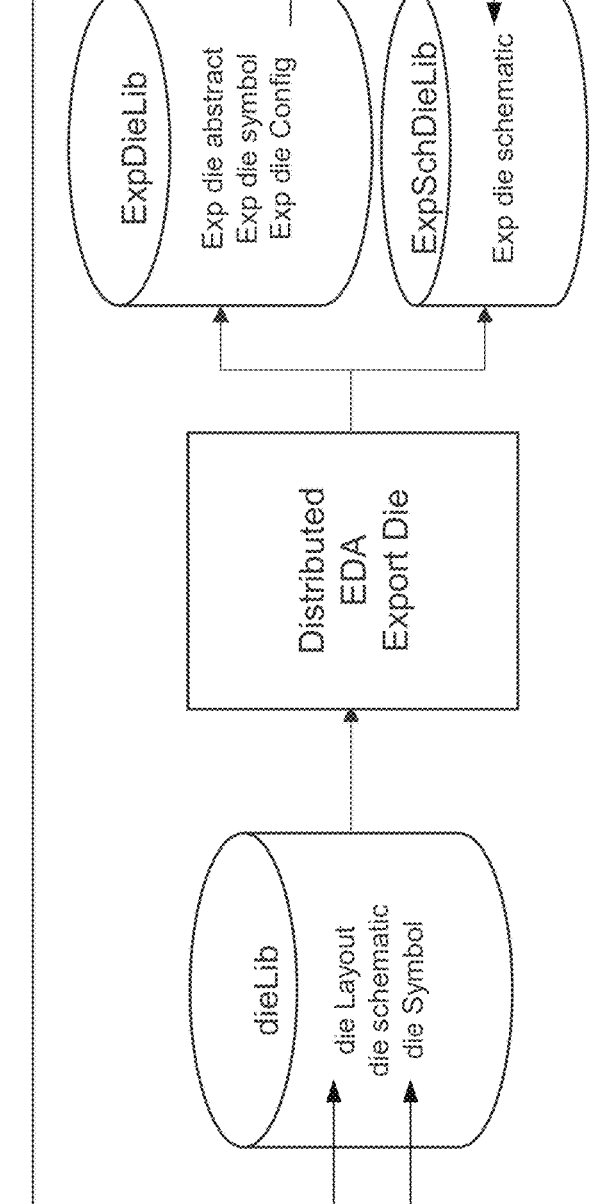
Figure 100:
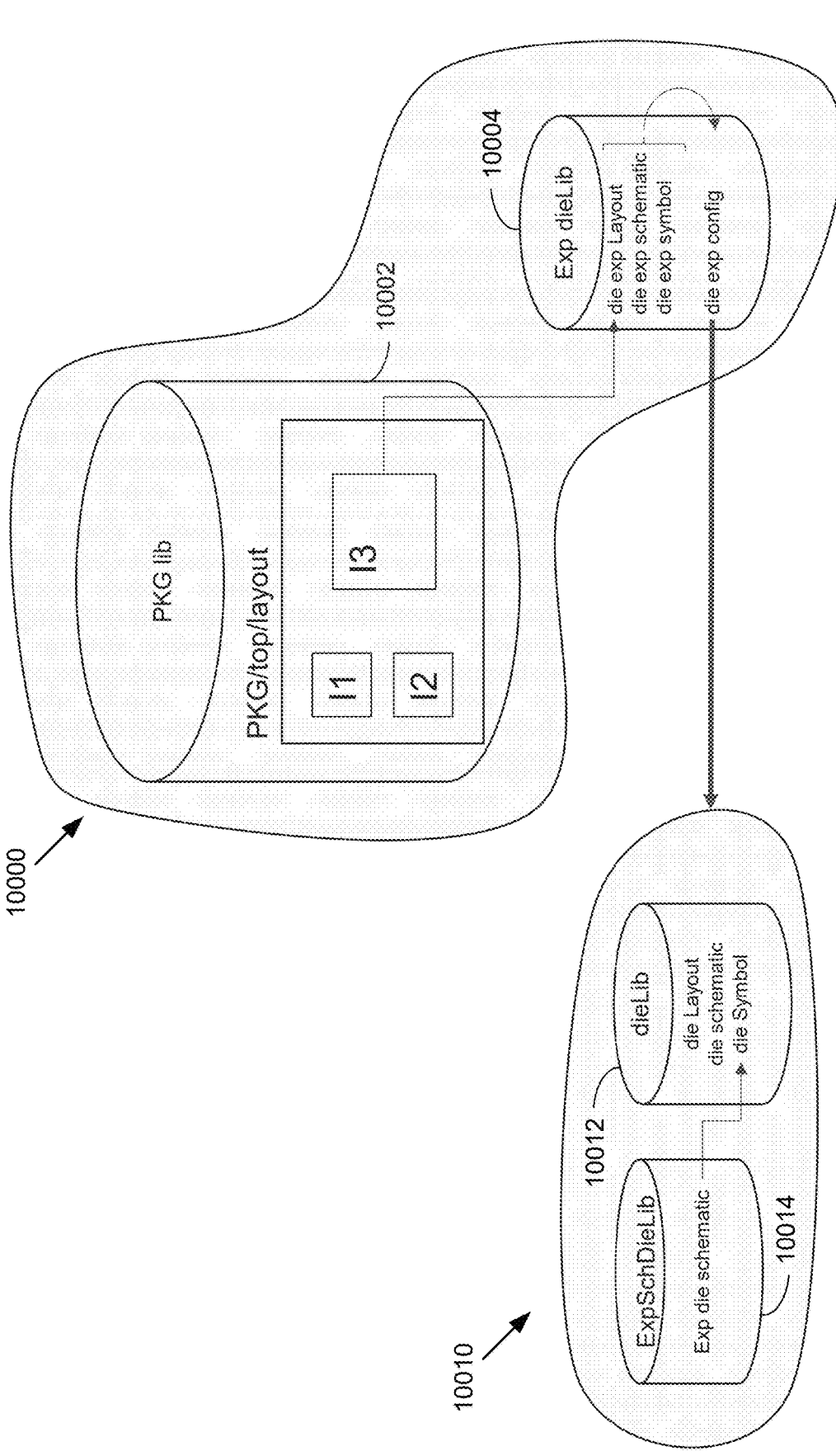
Figure 101:
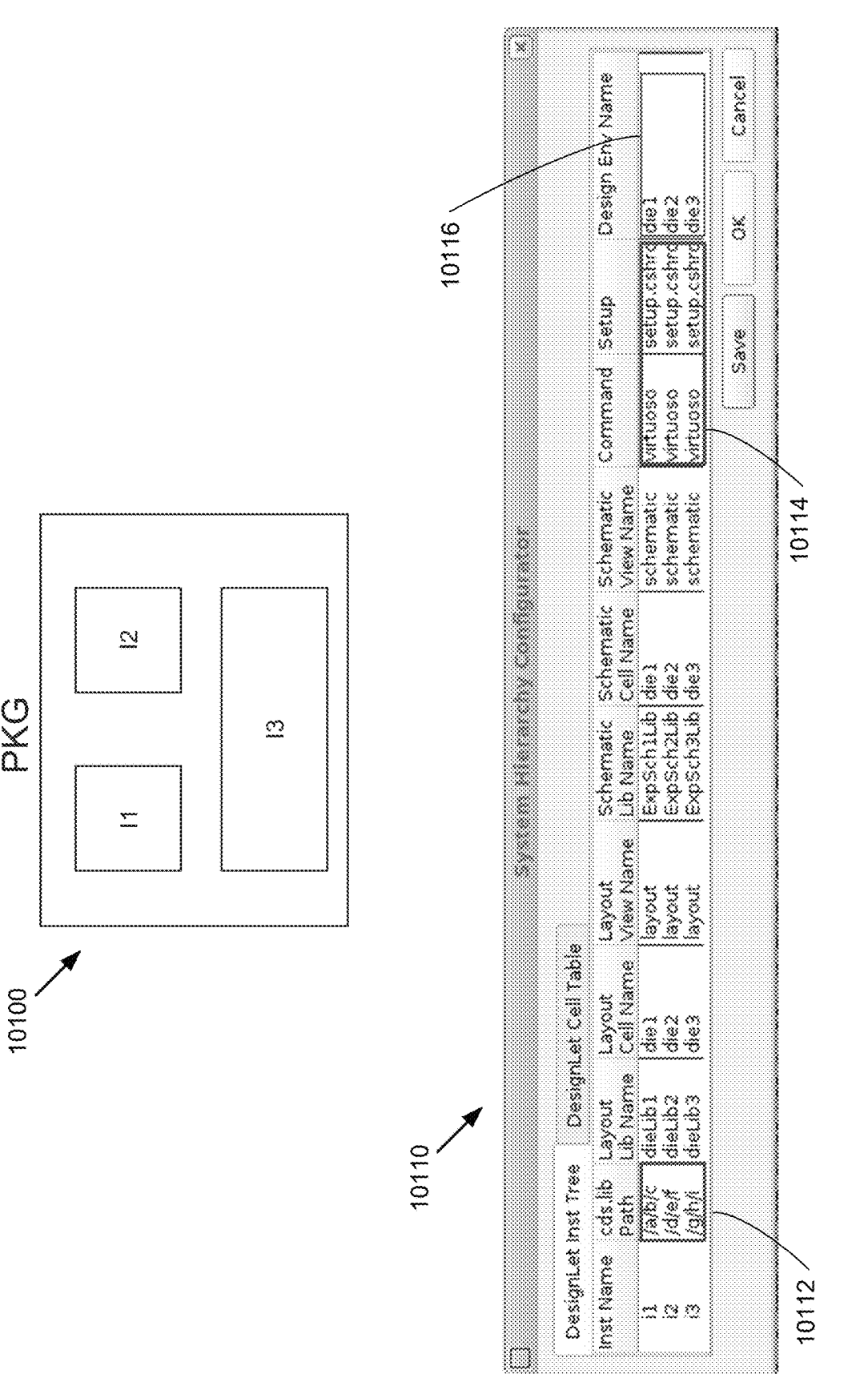
Figure 102:
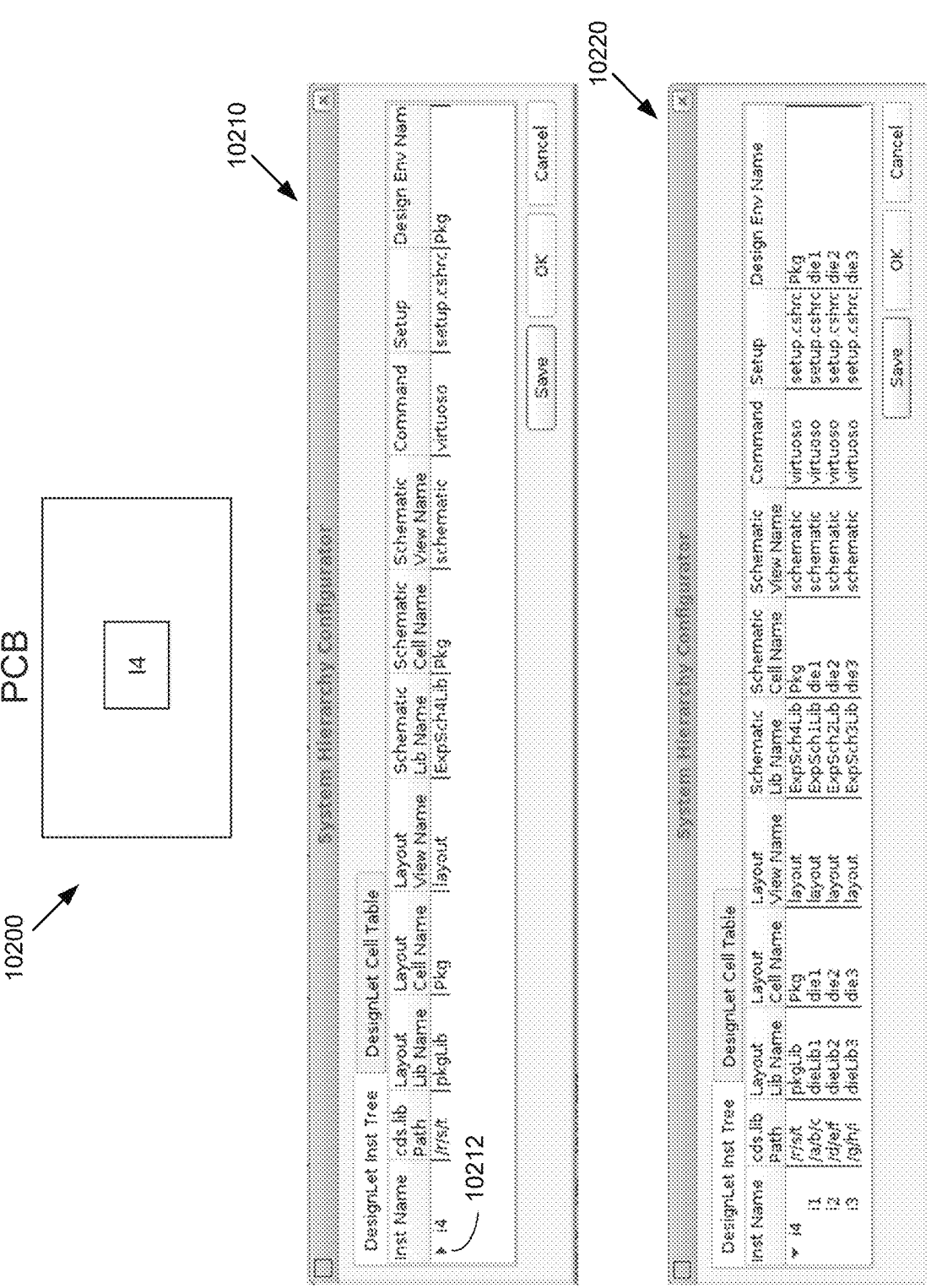
Figure 103:
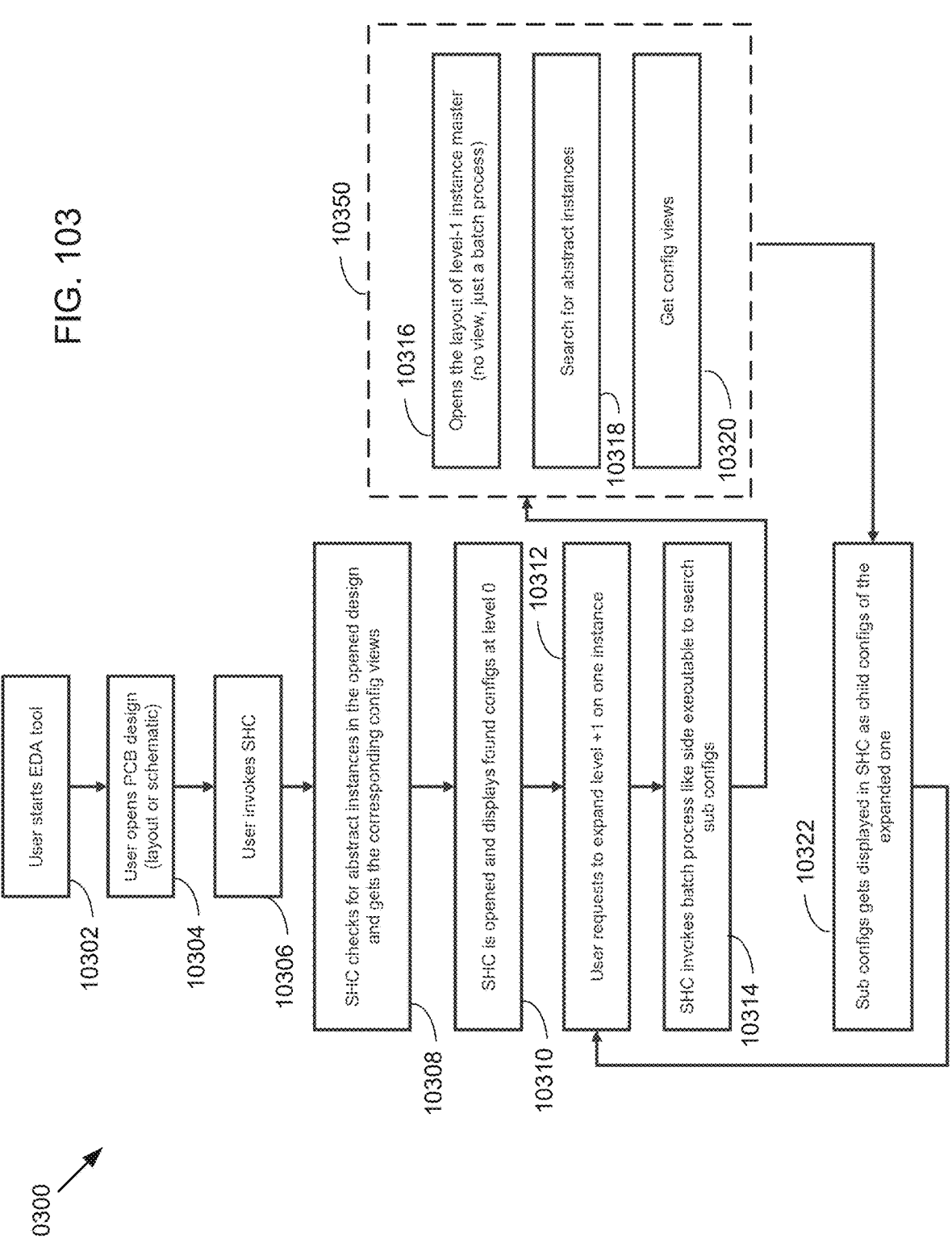
Figure 105:
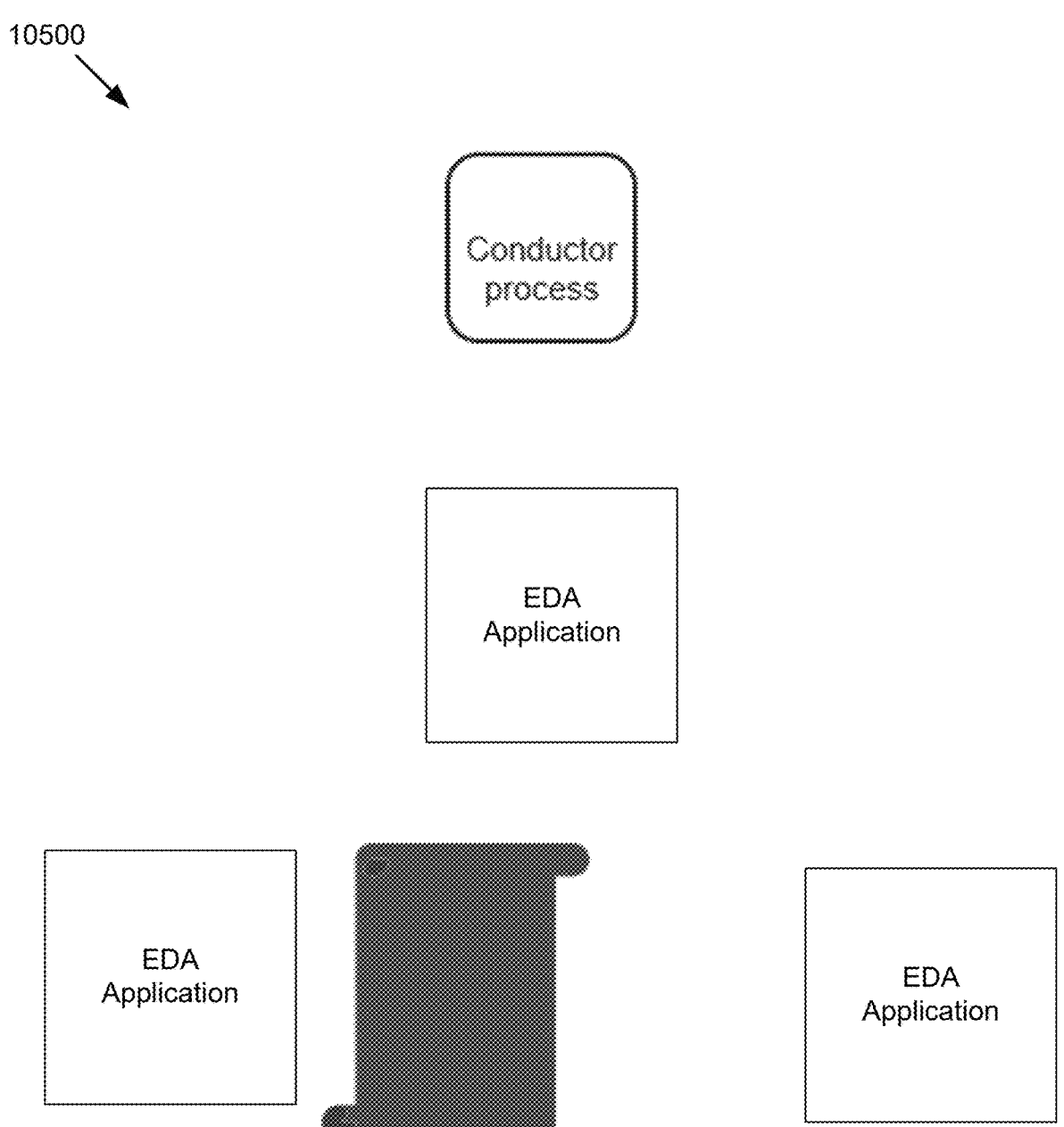
Figure 106:
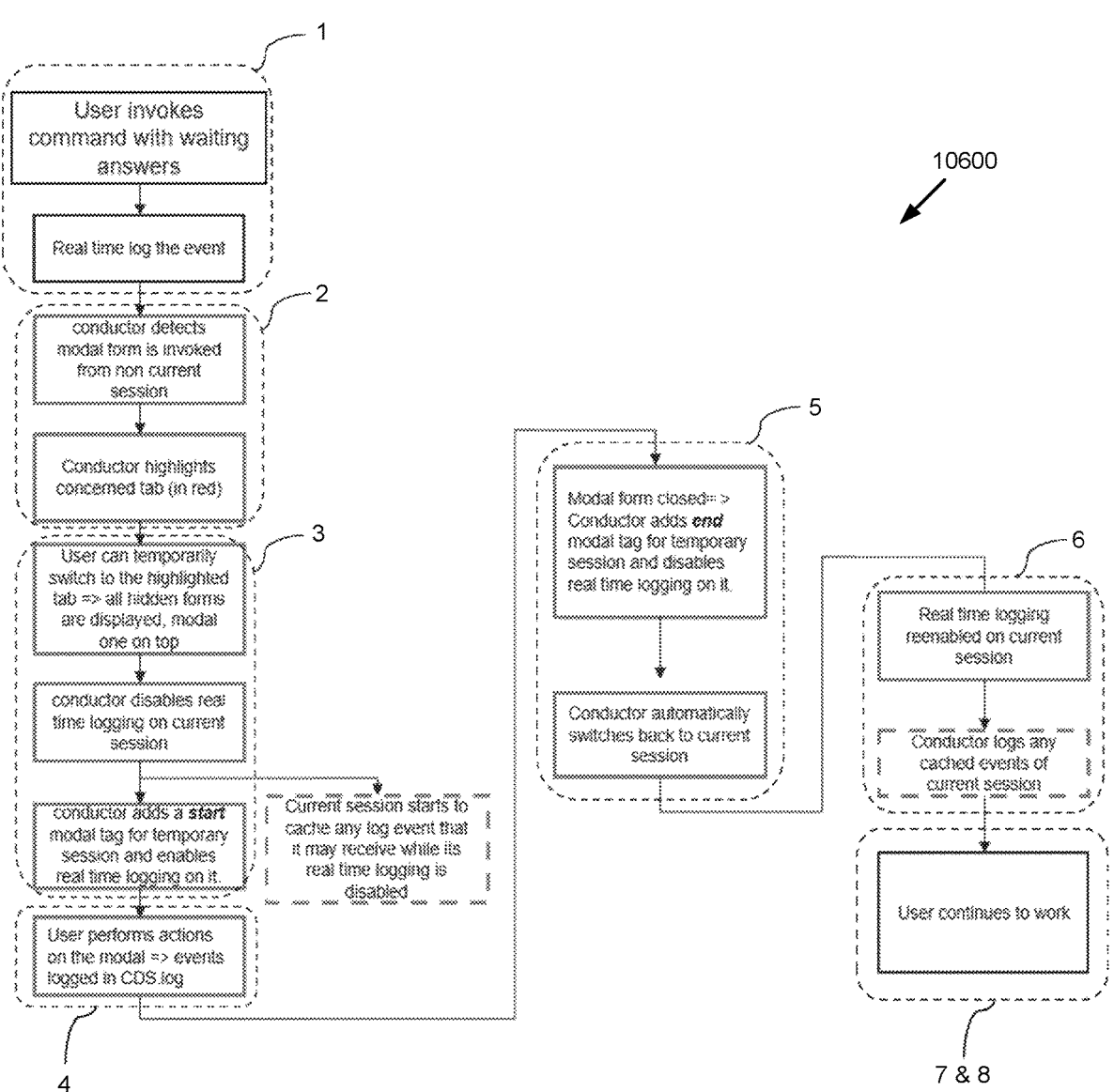
Figure 107:
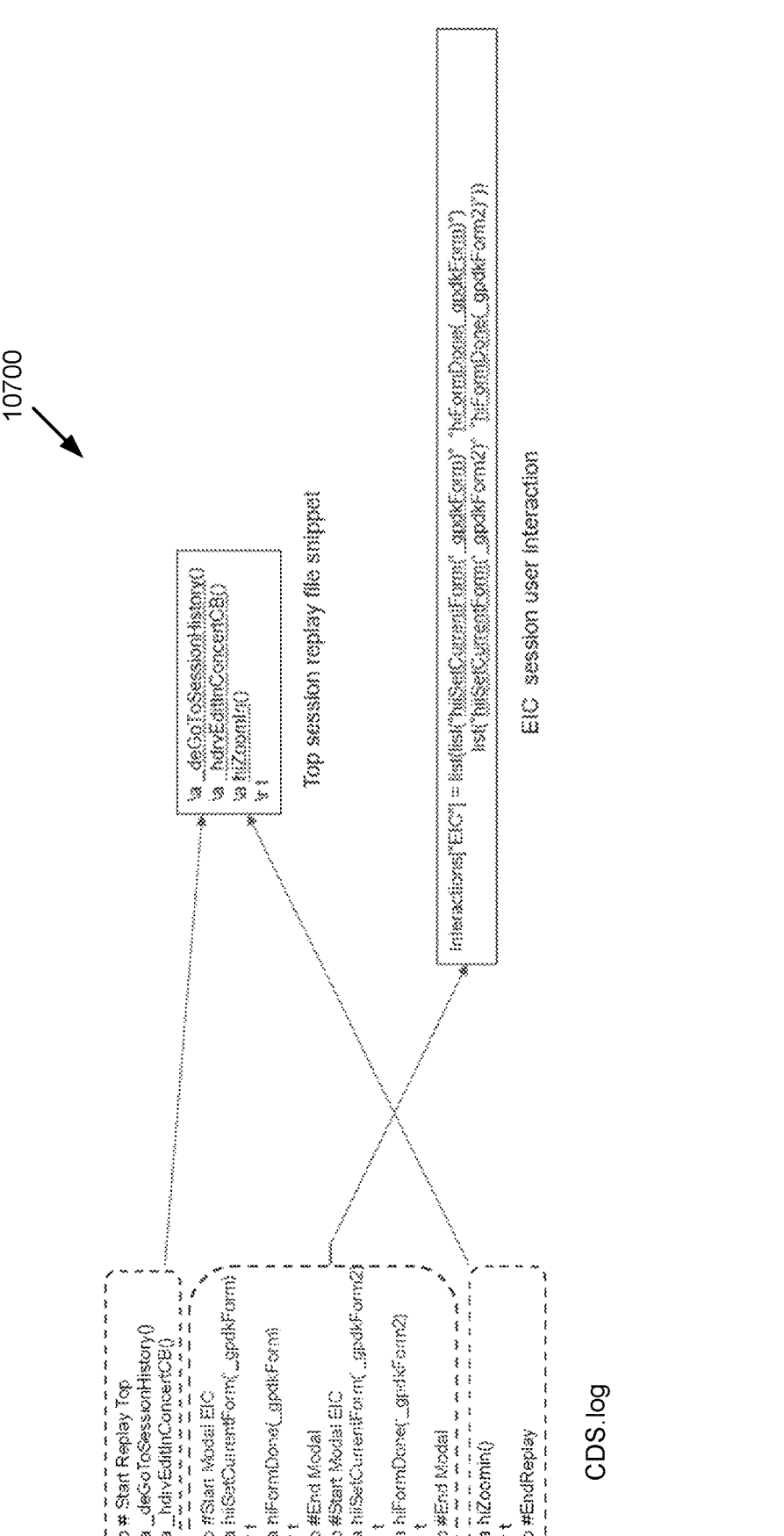
Figure 108:
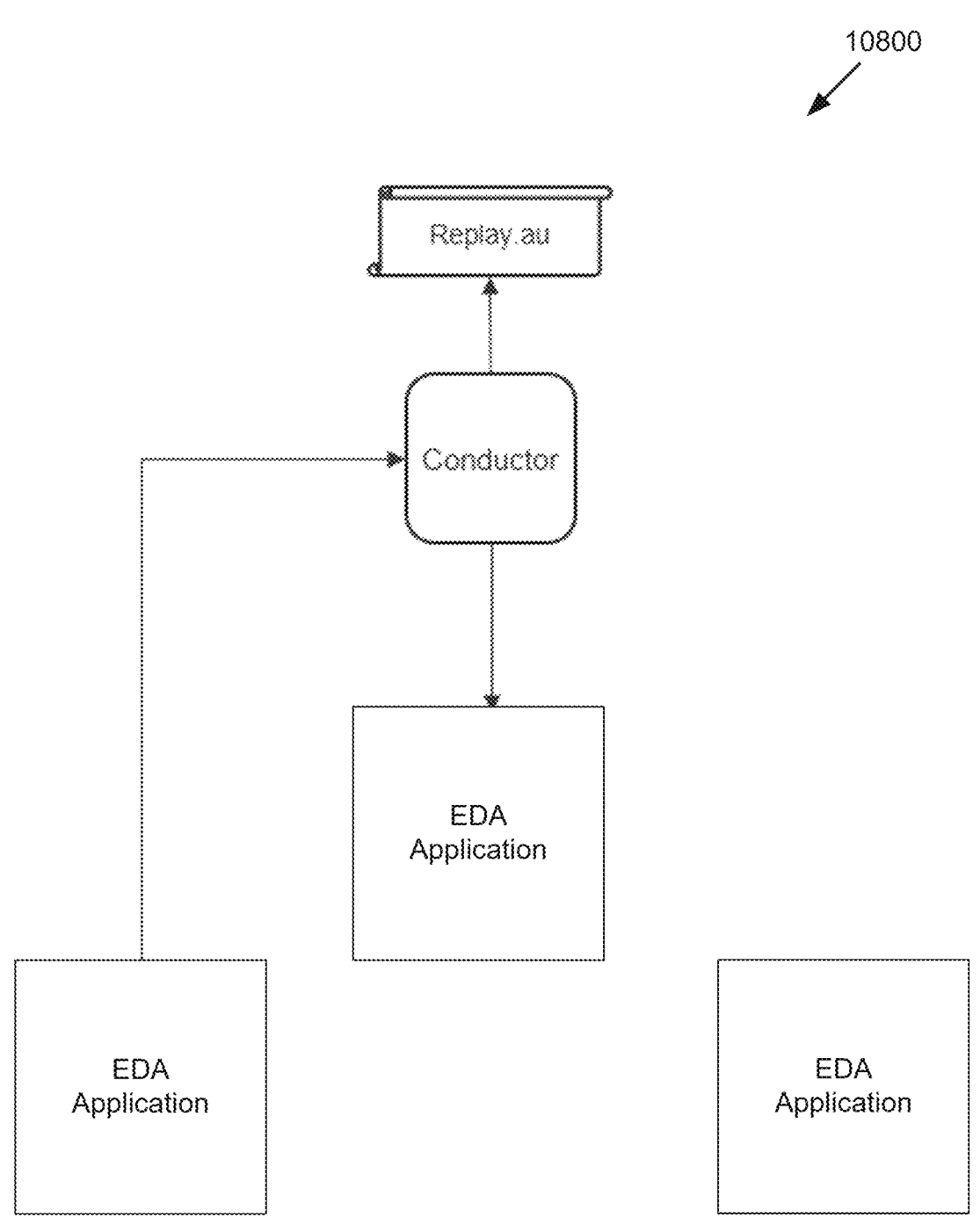
Figure 116:
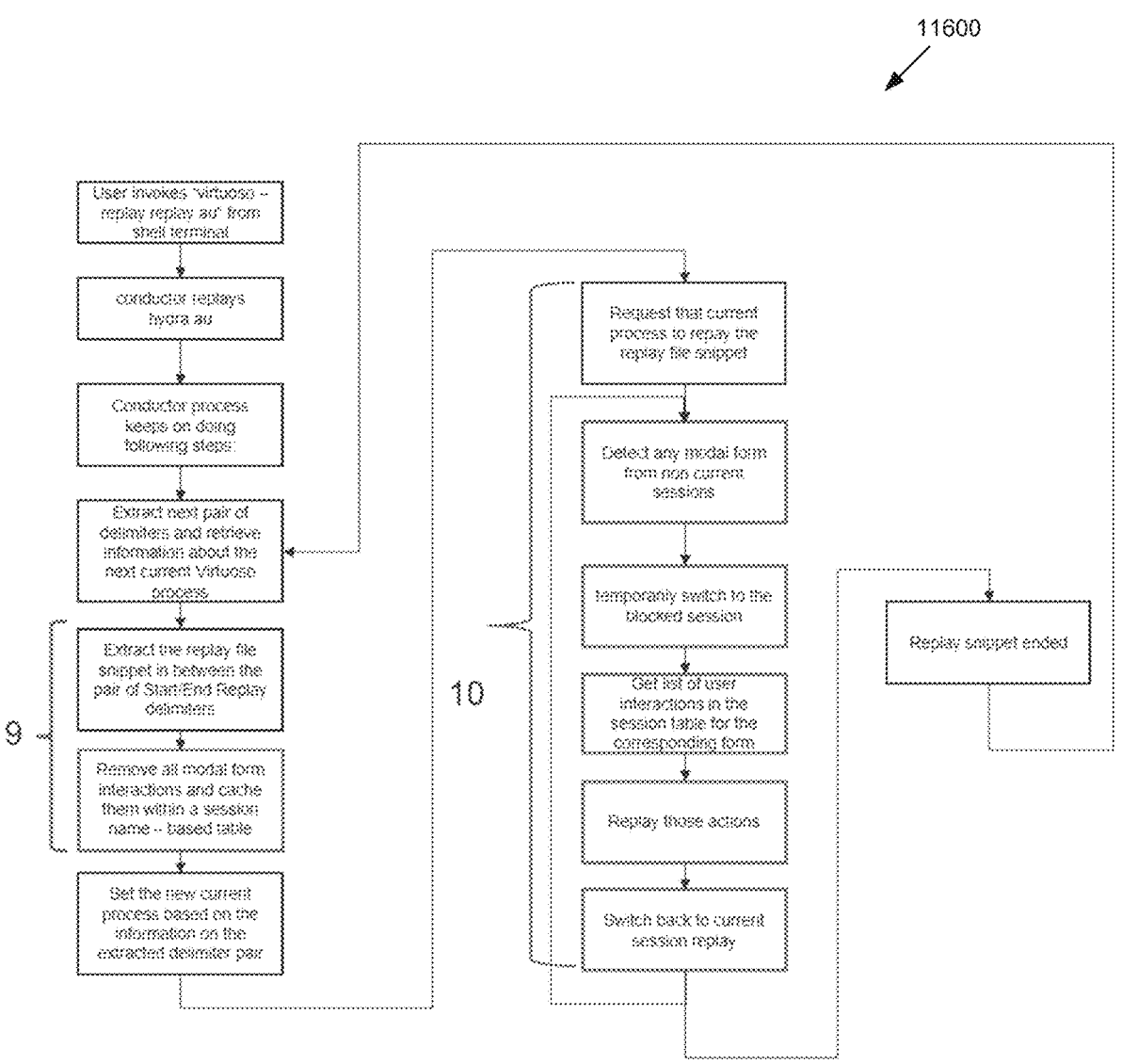
Figure 117:
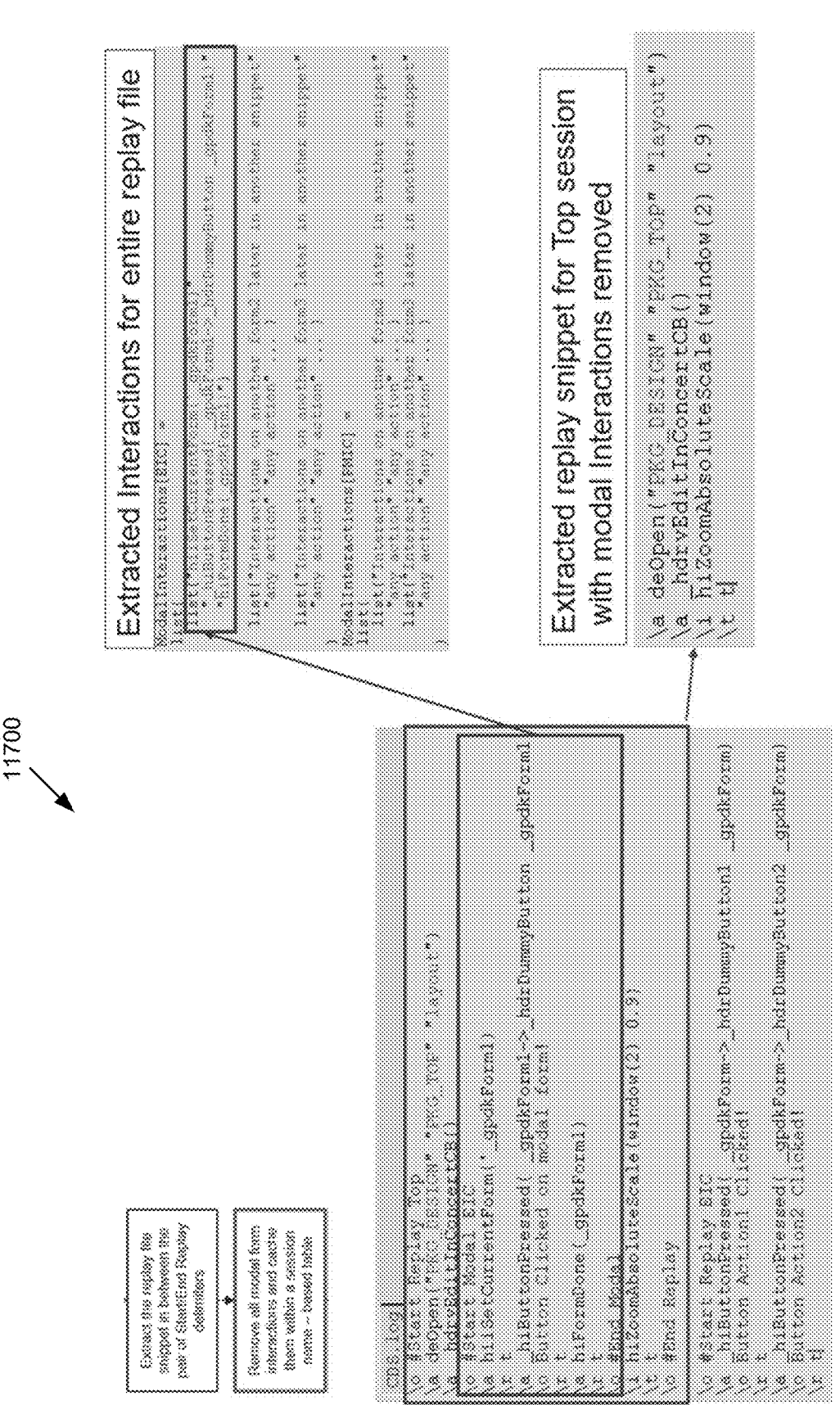
Figure 118:
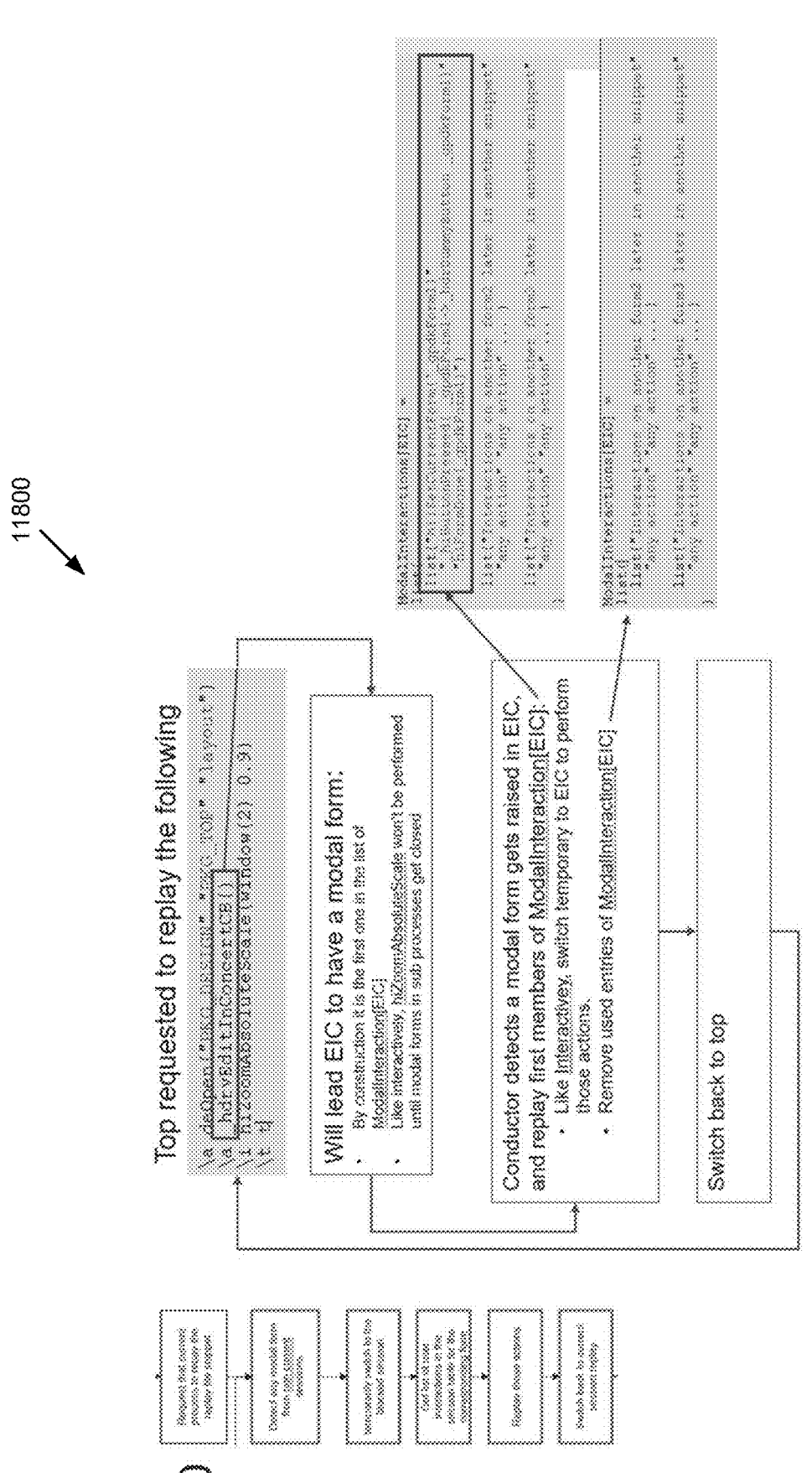

FIG. 47 is an example netlist generation view generated using the distributed EDA in accordance with embodiments of the present disclosure;

FIG. 48 illustrates an example netlisting process of the distributed EDA in accordance with embodiments of the present disclosure;

FIGS. 49-51 illustrate example netlists generated using the distributed EDA in accordance with embodiments of the present disclosure;

FIG. 52 is an example flowchart of a DIA process (5200) according to an embodiment of the present disclosure;

FIGS. 53-54 illustrate example layouts associated with the EDA;

FIG. 55 illustrates example architectures for opening databases within DIA;

FIG. 56 illustrates an example abstraction associated with the distributed EDA according to an embodiment of the present disclosure;

FIG. 57 illustrates an example layout associated with the distributed EDA according to an embodiment of the present disclosure;

FIG. 58 illustrates an example DIA capability associated with the distributed EDA according to an embodiment of the present disclosure;

FIG. 59 illustrates an example partitioning process associated with the distributed EDA according to an embodiment of the present disclosure;

FIG. 60 is an example flowchart of a DIA process (6000) according to an embodiment of the present disclosure;

FIG. 61 illustrates an example partitioning associated with the distributed EDA according to an embodiment of the present disclosure;

FIG. 62 illustrated an example partitioning process associated with the distributed EDA according to an embodiment of the present disclosure is shown;

FIG. 63 is an example flowchart of a DIA process (6300) according to an embodiment of the present disclosure;

FIG. 64 illustrates an example pixmap;

FIG. 65 illustrates an example transparent or uncolored pixel as described by the present disclosure;

FIG. 66 illustrates an example pixmap created by the EDA as described by the present disclosure;

FIG. 67 illustrates an example of pixmap polishing by the distributed EDA according to an embodiment of the present disclosure;

FIG. 68 illustrates an example of pixmap merging by the distributed EDA according to an embodiment of the present disclosure;

FIG. 69 illustrates an example of setting merged pixmaps as a background of a current pixmap by the distributed EDA according to an embodiment of the present disclosure;

FIG. 70 illustrates an example of drawing a current design on top of a background by the distributed EDA according to an embodiment of the present disclosure;

FIG. 71 illustrates an example architecture for file-based pixmap overlay by the distributed EDA according to an embodiment of the present disclosure;

FIG. 72 illustrates an example architecture for server-based pixmap overlay by the distributed EDA according to an embodiment of the present disclosure;

FIG. 73 illustrates an example of an overlaying canvas process of the distributed EDA in accordance with the present disclosure;

FIG. 74 illustrates an example of setting merged pixmaps as a background of a current pixmap by the distributed EDA in accordance with the present disclosure;

FIG. 75 illustrates an example of drawing a current package design on top of a background by the distributed EDA in accordance with the present disclosure;

FIG. 76 illustrates an example of drawing a current power management integrated circuit (PMIC) design on top of a background by the distributed EDA in accordance with the present disclosure;

FIG. 77 is an example flowchart of a DIA process (7700) according to an embodiment of the present disclosure;

FIG. 78 illustrates an example architecture for editing fabrics by the distributed EDA according to an embodiment of the present disclosure;

FIG. 79 is an example flowchart of a DIA process (7900) according to an embodiment of the present disclosure;

FIG. 80 illustrates an example subfabric footprint and layout associated with the DIA process (7900) according to an embodiment of the present disclosure;

FIG. 81 is an example flowchart of a DIA process (8100) according to an embodiment of the present disclosure;

FIG. 82 illustrates an example subfabric layout and footprint associated with the DIA process (8100) according to an embodiment of the present disclosure;

FIG. 83 illustrates example databases and shapes associated with the EDA of the present disclosure;

FIG. 84 illustrates example fabric layouts associated with the EDA of the present disclosure;

FIG. 85 illustrates an example architecture for cross-probing associated with the distributed EDA according to an embodiment of the present disclosure;

FIG. 86 illustrates an example cross-probing process associated with the distributed EDA according to an embodiment of the present disclosure;

FIG. 87 illustrates an example fabric layout associated with the distributed EDA according to an embodiment of the present disclosure;

FIG. 88 is an example flowchart of a DIA process (8800) according to an embodiment of the present disclosure;

FIG. 89 illustrates an example query associated with the EDA of the present disclosure;

FIG. 90 illustrates an example graphical user interface associated with the EDA of the present disclosure;

FIG. 91 illustrates an example architecture associated with the distributed EDA according to an embodiment of the present disclosure;

FIG. 92 illustrates an example cross-querying process associated with the distributed EDA according to an embodiment of the present disclosure;

FIG. 93 illustrates an example of shape sanitizing associated with the distributed EDA according to an embodiment of the present disclosure;

FIG. 94 illustrates an example graphical user interface associated with the distributed EDA according to an embodiment of the present disclosure; and FIG. 95 is an example flowchart of a DIA process (9500) according to an embodiment of the present disclosure;

FIG. 96 illustrates example graphical user interfaces associated with the EDA according to an embodiment of the present disclosure;

FIG. 97 illustrates an example process of the EDA according to an embodiment of the present disclosure;

FIGS. 98-99 illustrate example abstraction operations according to embodiments of the present disclosure;

FIG. 100 illustrates example libraries associated with the distributed EDA according to an embodiment of the present disclosure;

FIG. 101 illustrates an example abstract view and corresponding graphical user interface associated with the distributed EDA according to an embodiment of the present disclosure;

FIG. 102 illustrates an example view and corresponding graphical user interfaces associated with the distributed EDA according to an embodiment of the present disclosure;

FIG. 103 illustrates an example of a configuration process of the distributed EDA in accordance with the present disclosure;

FIG. 104 is an example flowchart of a DIA process (10400) according to an embodiment of the present disclosure;

FIG. 105 illustrates an example diagram of a modal dialog handling process of the distributed EDA in accordance with the present disclosure;

FIG. 106 illustrates an example flowchart of a modal dialog handling process of the distributed EDA in accordance with the present disclosure;

FIG. 107 illustrates an example of replay file snippet extraction associated with a modal dialog handling process of the distributed EDA in accordance with the present disclosure;

FIG. 108 illustrates an example of a modal dialog handling process of the distributed EDA in accordance with the present disclosure;

FIGS. 109-115 illustrate example graphical user interfaces associated with a modal dialog handling process of the distributed EDA in accordance with the present disclosure;

FIG. 116 illustrates an example flowchart of a modal dialog handling process of the distributed EDA in accordance with the present disclosure;

FIG. 117 illustrates an example of a modal dialog handling process of the distributed EDA in accordance with the present disclosure;

FIG. 118 illustrates an example of a modal dialog handling process of the distributed EDA in accordance with the present disclosure;

FIG. 119 illustrates an example flowchart of a modal dialog handling process of the distributed EDA in accordance with the present disclosure; and FIG. 120 illustrates an example flowchart of a modal dialog handling process of the distributed EDA in accordance with the present disclosure.

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein; rather, these embodiments are provided so that this disclosure will be thorough and complete, and will fully convey the concept of the present disclosure to those skilled in the art. Like reference numerals in the drawings denote like elements.

INTRODUCTION

An electronic design application (EDA) or integrated circuit layout application may include a set of technologies and features including, but not limited to: custom component placement, routing, module generation, layout optimization, and/or signal floorplanning. The techniques and features described by the present disclosure may be employed by or implemented in EDAs such as those available from the assignee of the present disclosure (e.g., Cadence® Virtuoso® Design Environment or the like). The EDA may provide a scripting language that provides database access and tool configuration and interoperability capability (e.g., SKILL® scripting language or the like). The EDA may further provide a canvas feature for main layout editing, and various process design kits (PDK) including libraries and related data (e.g., model files, physical verification rule files, and/or control files for various tools) that facilitate circuit design.

Figures 2, 3, 4:
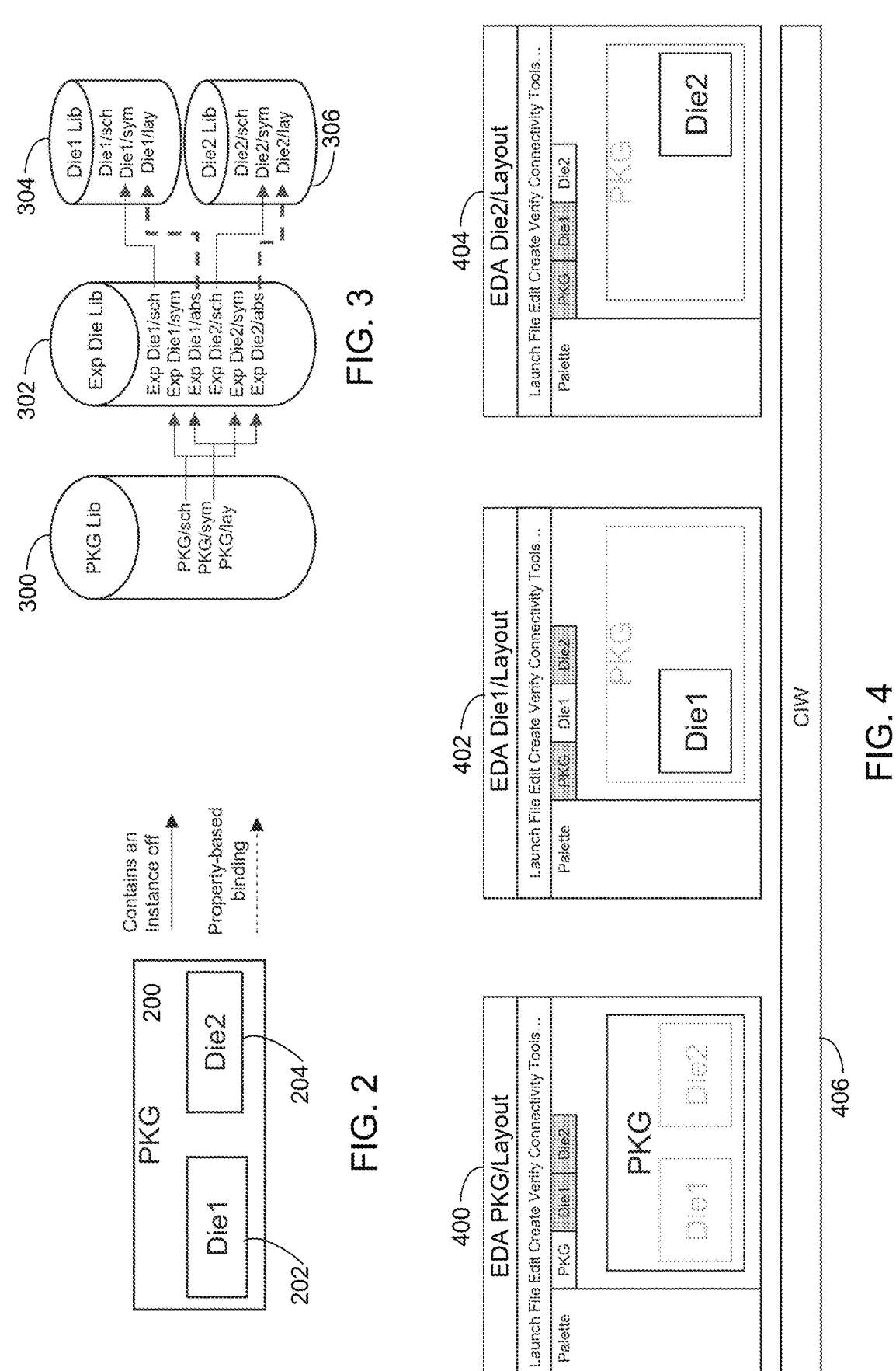
FIG. 2 is a block diagram associated with an EDA.
FIG. 3 is a diagram illustrating example libraries associated with the EDA.
FIG. 4 illustrates example layouts associated with the EDA.

Referring to FIG. 2, a package (PKG) 200, die 202 (shown as "Die1"), and die 204 (shown as "Die2") associated with the EDA are shown. A package may surround a semiconductor block and a die may include a semiconductor block on which an operational circuit may be assembled. Referring to FIG. 3, a PKG library 300 and die library 302 associated with the EDA are shown. The PKG library 300 may include one or more die libraries (e.g., die libraries 304 and 306 corresponding to Die1 and Die2, respectively). Referring to FIG. 4, an EDA PKG layout 400, EDA die layout 402 (corresponding to Die 1), and EDA die layout 404 (corresponding to Die 2) are shown and may be associated with a command interpreter window (CIW) 406.

The EDA associated with FIGS. 2-4 may be associated with a scripting language (e.g., SKILL®) namespace and a library architecture (e.g., 5.X library architecture as may be available from the assignee of the present disclosure). In some situations, the EDA associated with FIGS. 2-4 may provide insufficient support of PDK scripting language (e.g., SKILL®) symbol conflicts, may not support design library and/or tech library name conflicts, and may provide insufficient scaling. For example, in some situations, it may be necessary to open, redraw, and/or netlist a complete system from the same EDA session (running on the same machine). The techniques and features described by the present disclosure may address one or more of the deficiencies of the EDA as described above through one or more distributed interactive application (DIA) processes that may be implemented via the EDA. The term DIA as used herein may refer to a distributed interactive application or multiple distributed interactive applications. The EDA and various DIA processes associated therewith may run on one or more systems, as described below.

System Overview

Figure 1:
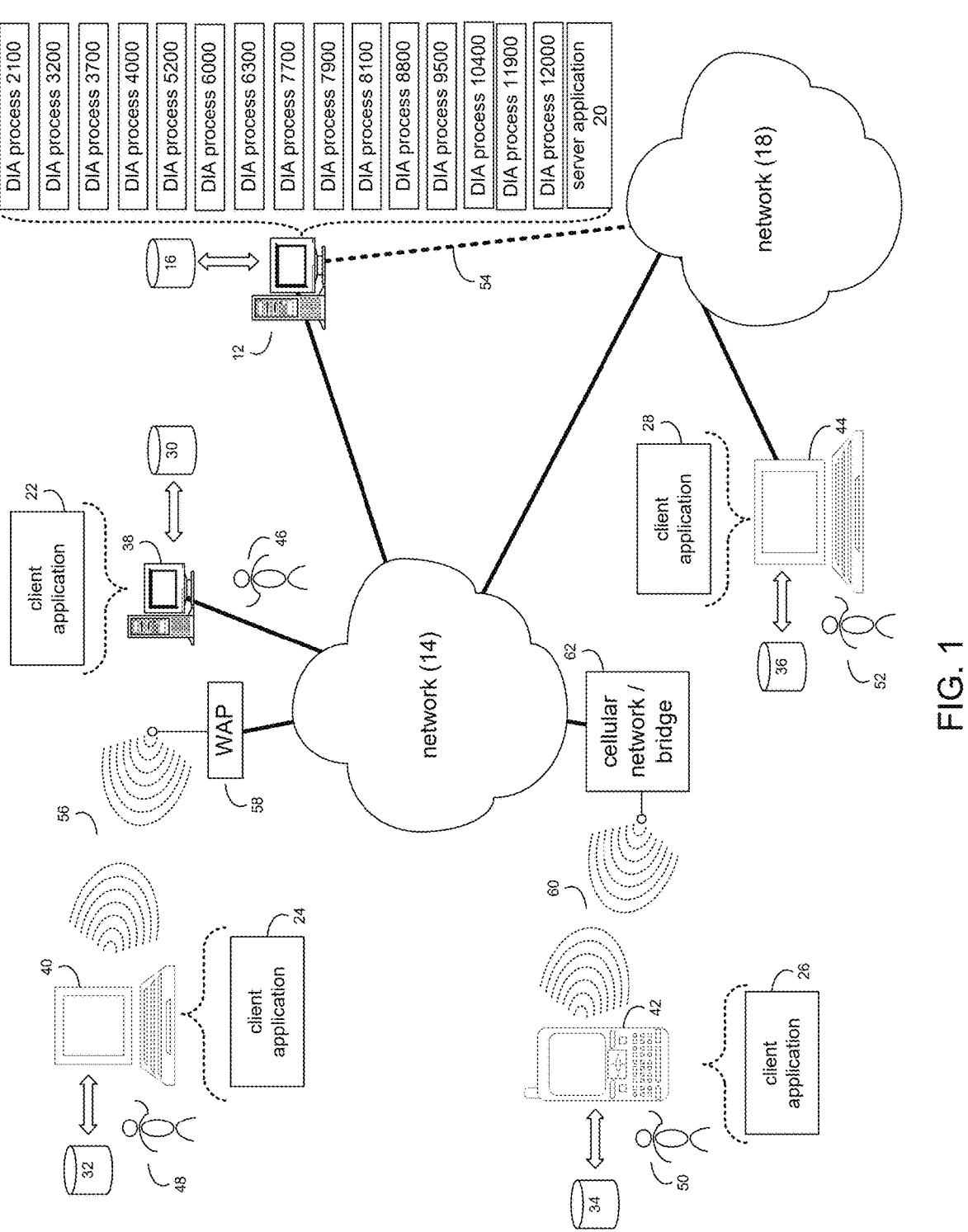
FIG. 1 diagrammatically depicts one or more distributed interactive application (DIA) processes coupled to a distributed computing network.

Referring to FIG. 1, there is shown one or more distributed interactive application ("DIA") processes 2100-10400 that may reside on and may be executed by server computer 12, which may be connected to network 14 (e.g., the internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft Windows XP Server™; Novell Netware™; or Redhat Linux™, for example. Additionally and/or alternatively, the one or more DIA processes 2100-10400 may reside on a client electronic device, such as a personal computer, notebook computer, personal digital assistant, or the like.

The instruction sets and subroutines of the one or more DIA processes 2100-10400, which may be stored on storage device 16 coupled to server computer 12, may be executed by one or more processors (not shown) and one or more memory architectures (not shown) incorporated into server computer 12. Storage device 16 may include but is not limited to: a hard disk drive; a tape drive; an optical drive; a RAID array; a random-access memory (RAM); and a read-only memory (ROM).

Server computer 12 may execute a web server application, examples of which may include but are not limited to: Microsoft IIS™, Novell Webserver™, or Apache Webserver™, that allows for HTTP (i.e., HyperText Transfer Protocol) access to server computer 12 via network 14. Network 14 may be connected to one or more secondary networks (e.g., network 18), examples of which may include but are not limited to: a local area network; a wide area network; or an intranet, for example.

Server computer 12 may execute one or more server applications (e.g., server application 20), examples of which may include but are not limited to, e.g., Lotus Domino™ Server and Microsoft Exchange™ Server. Server application 20 may interact with one or more client applications (e.g., client applications 22, 24, 26, 28) in order to execute the one or more DIA processes 2100-10400. Examples of client applications 22, 24, 26, 28 may include, but are not limited to, design verification tools such as those available from the assignee of the present disclosure. These applications may also be executed by server computer 12. In some embodiments, the one or more DIA processes 2100-10400 may be stand-alone applications that interface with server application 20 or may be applets/applications that may be executed within server application 20.

The instruction sets and subroutines of server application 20, which may be stored on storage device 16 coupled to server computer 12, may be executed by one or more processors (not shown) and one or more memory architectures (not shown) incorporated into server computer 12.

As mentioned above, in addition/as an alternative to being server-based applications residing on server computer 12, the one or more DIA processes 2100-10400 may be client-side applications residing on one or more client electronic devices 38, 40, 42, 44 (e.g., stored on storage devices 30, 32, 34, 36, respectively). As such, the one or more DIA processes 2100-10400 may be stand-alone applications that interface with a client application (e.g., client applications 22, 24, 26, 28), or may be applets/applications that may be executed within a client application. As such, the one or more DIA processes 2100-10400 may be client-side processes, server-side processes, or hybrid client-side/server-side processes, which may be executed, in whole or in part, by server computer 12, or one or more of client electronic devices 38, 40, 42, 44.

The instruction sets and subroutines of client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory architectures (not shown) incorporated into client electronic devices 38, 40, 42, 44 (respectively). Storage devices 30, 32, 34, 36 may include but are not limited to: hard disk drives; tape drives; optical drives; RAID arrays; random access memories (RAM); read-only memories (ROM), compact flash (CF) storage devices, secure digital (SD) storage devices, and memory stick storage devices. Examples of client electronic devices 38, 40, 42, 44 may include, but are not limited to, personal computer 38, laptop computer 40, personal digital assistant 42, notebook computer 44, a data-enabled, cellular telephone (not shown), and a dedicated network device (not shown), for example. Using client applications 22, 24, 26, 28, users 46, 48, 50, 52 may utilize formal analysis, testbench simulation, and/or hybrid technology features to verify a particular integrated circuit design.

Users 46, 48, 50, 52 may access server application 20 directly through the device on which the client application (e.g., client applications 22, 24, 26, 28) is executed, namely client electronic devices 38, 40, 42, 44, for example. Users 46, 48, 50, 52 may access server application 20 directly through network 14 or through secondary network 18. Further, server computer 12 (e.g., the computer that executes server application 20) may be connected to network 14 through secondary network 18, as illustrated with phantom link line 54.

In some embodiments, the one or more DIA processes 2100-10400 may be cloud-based processes as any or all of the operations described herein may occur, in whole, or in part, in the cloud or as part of a cloud-based system. The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 56 established between laptop computer 40 and wireless access point (i.e., WAP) 58, which is shown directly coupled to network 14. WAP 58 may be, for example, an IEEE 802.11a, 802.11b, 802.11g, Wi-Fi, and/or Bluetooth device that is capable of establishing wireless communication channel 56 between laptop computer 40 and WAP 58. Personal digital assistant 42 is shown wirelessly coupled to network 14 via wireless communication channel 60 established between personal digital assistant 42 and cellular network/bridge 62, which is shown directly coupled to network 14.

As is known in the art, all of the IEEE 802.11x specifications may use Ethernet protocol and carrier sense multiple access with collision avoidance (CSMA/CA) for path sharing. The various 802.11x specifications may use phase-shift keying (PSK) modulation or complementary code keying (CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows™, Microsoft Windows CE™, Redhat Linux™, Apple IOS, ANDROID, or a custom operating system.

Distributed Interactive Applications (DIA)

Figures 5, 6:
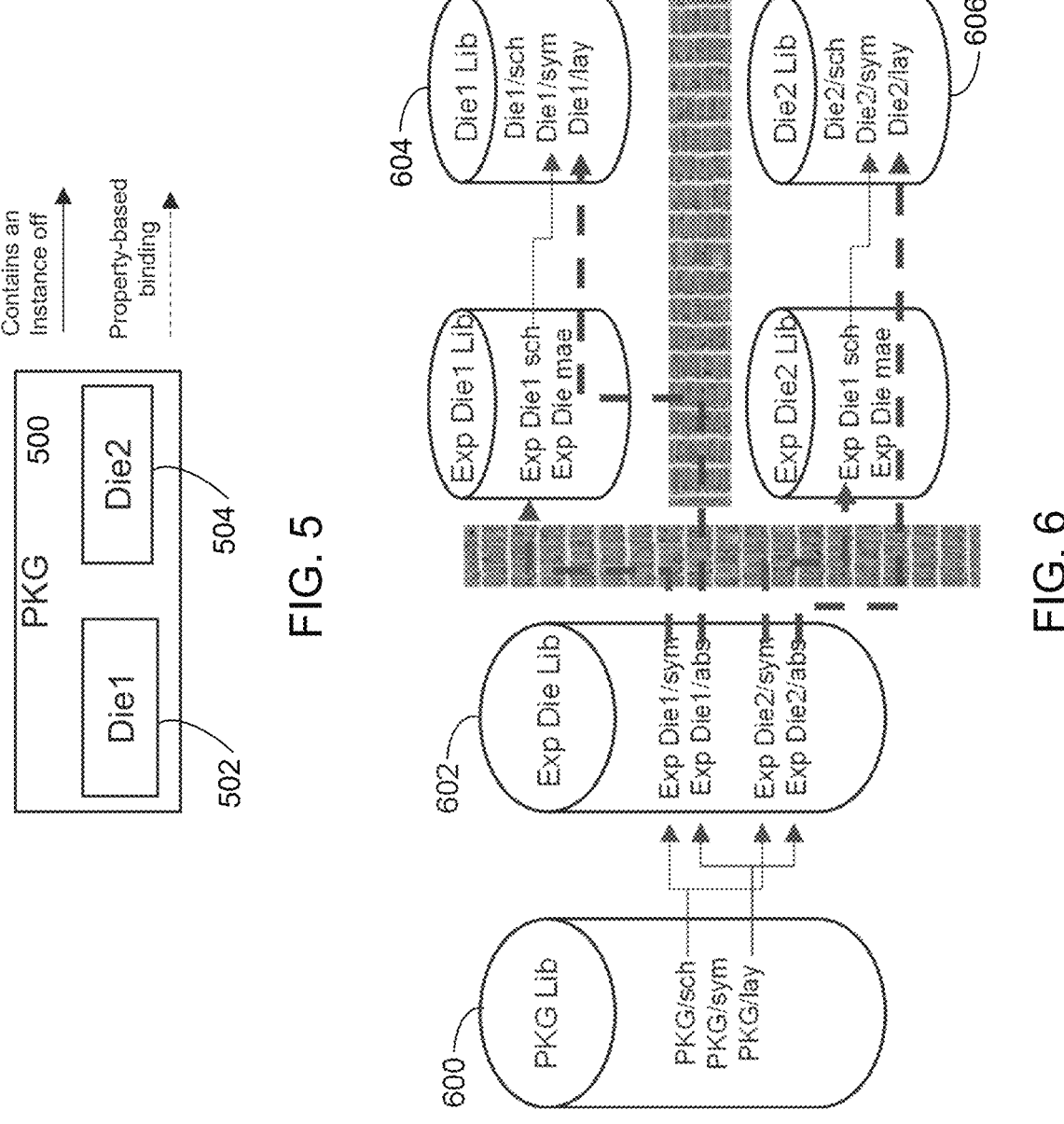
FIG. 5 is a block diagram associated with a distributed EDA in accordance with embodiments of the present disclosure.
FIG. 6 is a diagram illustrating example libraries associated with the distributed EDA in accordance with embodiments of the present disclosure.
Figure 7:
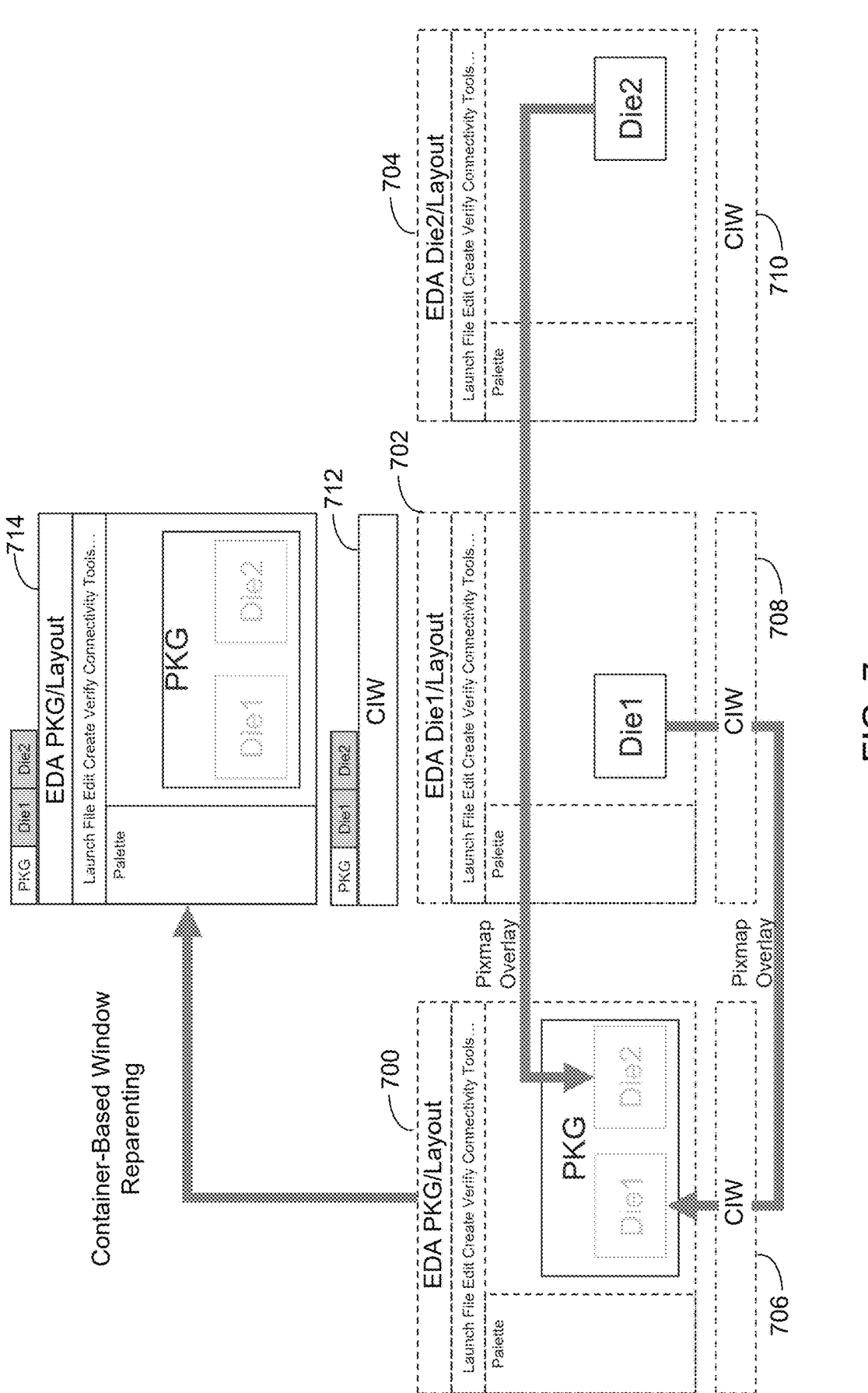
FIG. 7 illustrates example layouts associated with the distributed EDA in accordance with embodiments of the present disclosure.

Distributed interactive applications may include properties or capabilities of both distributed applications and interactive applications. A distributed application may be a multi-process application that runs on more than one hardware component or computer. An interactive application may be an application that allows for user interaction with the application. For example, an interactive application may be different than a batch application in that a user may not easily or meaningfully interact with the batch application. Distributed interactive applications may enable the user to interactively use several different applications that may be distributed on (e.g., run on) multiple computers, or a farm of computers. The different applications may communicate with each other, but the user may only interact with one application at a time. In other words, the user may perceive that the user is interacting with only one interactive application but may be interacting with many interactive applications that may be distributed on (e.g., run on) multiple computers, or a farm of computers. Referring now to FIGS. 5-7, a distributed EDA as described in accordance with the present disclosure may incorporate distributed interactive applications (DIA).

Referring to FIG. 5, a PKG 500, die 502 (shown as "Die1"), and die 504 (shown as "Die2") associated with the distributed EDA are shown. Referring to FIG. 6, a PKG library 600 and die library 602 associated with the distributed EDA is shown. The PKG library 600 may not include one or more die libraries (e.g., die libraries 604 and 606 corresponding to Die1 and Die2, respectively). Referring to FIG. 7, an EDA PKG layout 700, EDA die layout 702 (corresponding to Die 1), and EDA die layout 704 (corresponding to Die 2) are shown. The EDA PKG layout 700, EDA die layout 702, and EDA die layout 704 may correspond to CIWs 706, 708, and 710, respectively. In some embodiments, as shown in FIG. 7, the EDA may include container-based window reparenting (e.g., between EDA PKG layout 700 and EDA PKG layout 714) where a user may only see one EDA process at one time. Further, the EDA may include a pixmap overlay feature (e.g., between EDA die layout 704 and EDA PKG layout 700 and between EDA die layout 702 and EDA PKG layout 700). In some embodiments, a distributed EDA executable (as described in further detail below) may create two containers. For example, one created container may be for layout windows (e.g., layout windows 700, 702, 704, and 714) and the other created container may be for CIWs (e.g., CIWs 706, 708, 712, and 714). If a user selects (e.g., clicks on) tab Die1 corresponding to one of the containers, the other container may activate the tab Die1. As a result, the user may see the same active tab page in all displayed containers corresponding to a current DIA being used.

Figure 8:
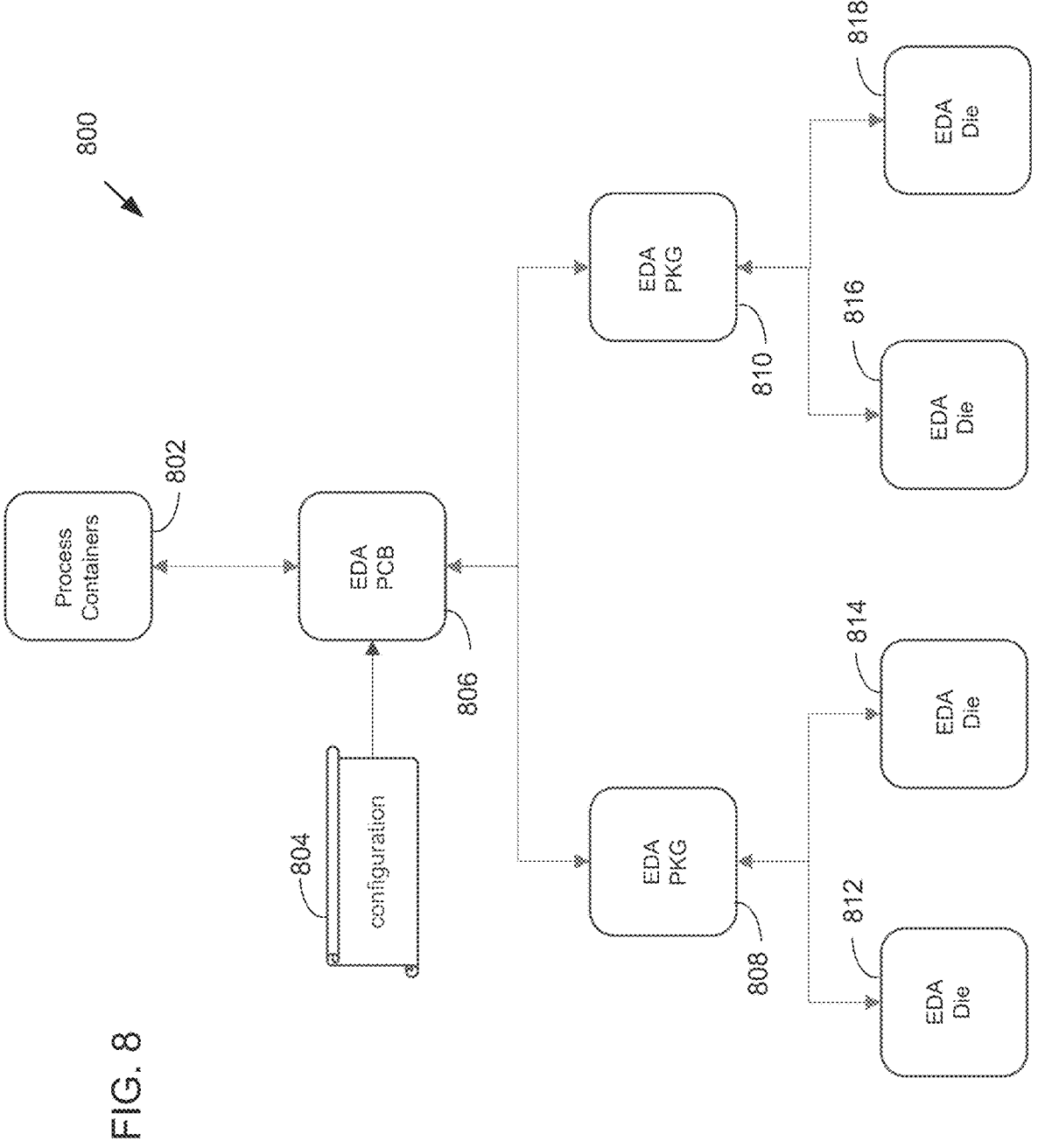
FIGS. 8-11 illustrate example architectures for the distributed EDA in accordance with embodiments of the present disclosure.

Referring to FIG. 8, an example architecture 800 for the distributed EDA in accordance with the present disclosure is shown. The architecture 800 may provide one EDA process per fabric. The term "fabric" as used herein may refer to different layers or layouts associated with various design aspects such as packages, dies, etc. An EDA process may only have knowledge of a parent and children associated with the EDA process and may include bi-directional communication in between a parent/child process. Further, the architecture 800 may provide one distributed EDA executable for all containers. The distributed EDA executable may include a subset of the capabilities of the distributed EDA and may be a sub-application that may embed different EDA session windows within a container window. The distributed EDA executable may perform re-parenting of windows of DIA into a common framework, create a container for each window type opened by DIA (e.g., one container for CIWs, one container for schematic windows, etc.), and synchronize visible tab pages between each container window.

The architecture 800 may show a hierarchy associated with various processes. For example, the architecture 800 may include process containers 802, configuration file 804, and processes associated with various views (e.g., EDA printed circuit board (PCB) 806, EDA PKGS 808 and 8010, and EDA dies 812, 814, 816, and 818). In some embodiments, only one process may be exposed to the user at any time (e.g., a current fabric process). The architecture 800 may include distributed processes and distributed memory (e.g., on a server farm), and bi-directional recursive code across the distributed processes. A parent process may have knowledge of which library/cell/view to open based on a configuration file and window events may be reported to a container process, which may be a process performed or caused or caused to be performed by the distributed EDA executable. For example, the once launched, the distributed EDA executable may perform or cause to be performed one or more operations that may be part of a distributed EDA executable process, which may also be referred to as the container process, and the terms distributed EDA executable process and container process may be used interchangeably, as described herein.

Figure 9:
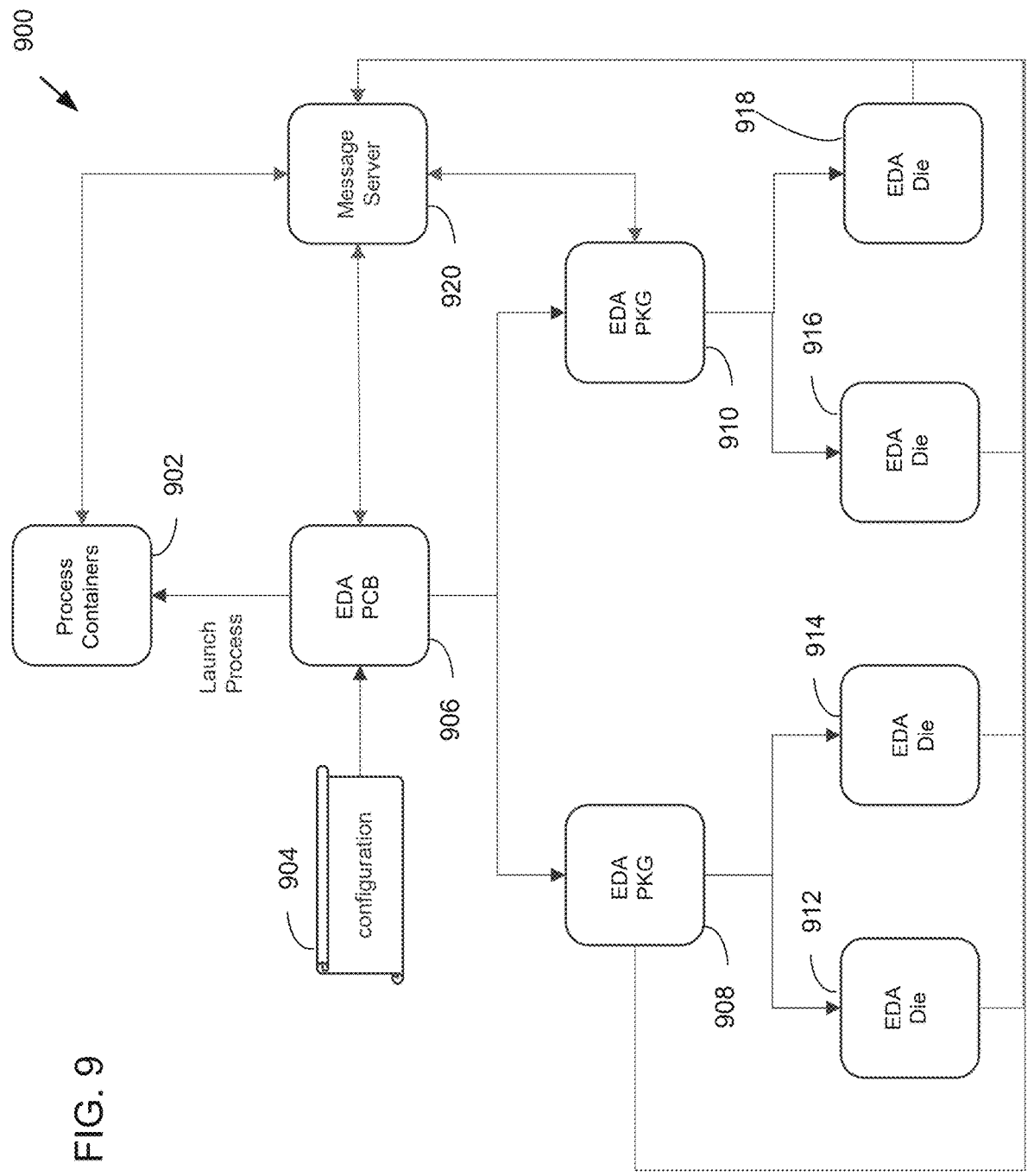

Referring to FIG. 9, another example architecture for the distributed EDA in accordance with the present disclosure is shown. An architecture 900 may show a hierarchy associated with various processes. For example, the architecture 900 may include process containers 902, configuration file 904, message server 920, and processes associated with various views (e.g., EDA PCB 906, EDA PKGS 908 and 910, and EDA dies 912, 914, 916, and 918). In some embodiments, only one process may be exposed to the user at any time (e.g., a current fabric process). The architecture 900 may allow for bi-directional communication through the message server 920. For example, the architecture 900 may allow for one or more messages or commands to be exchanged between containers 902 and message server 920 (e.g., listen, send, put, and/or get messages or commands).

Figure 10:
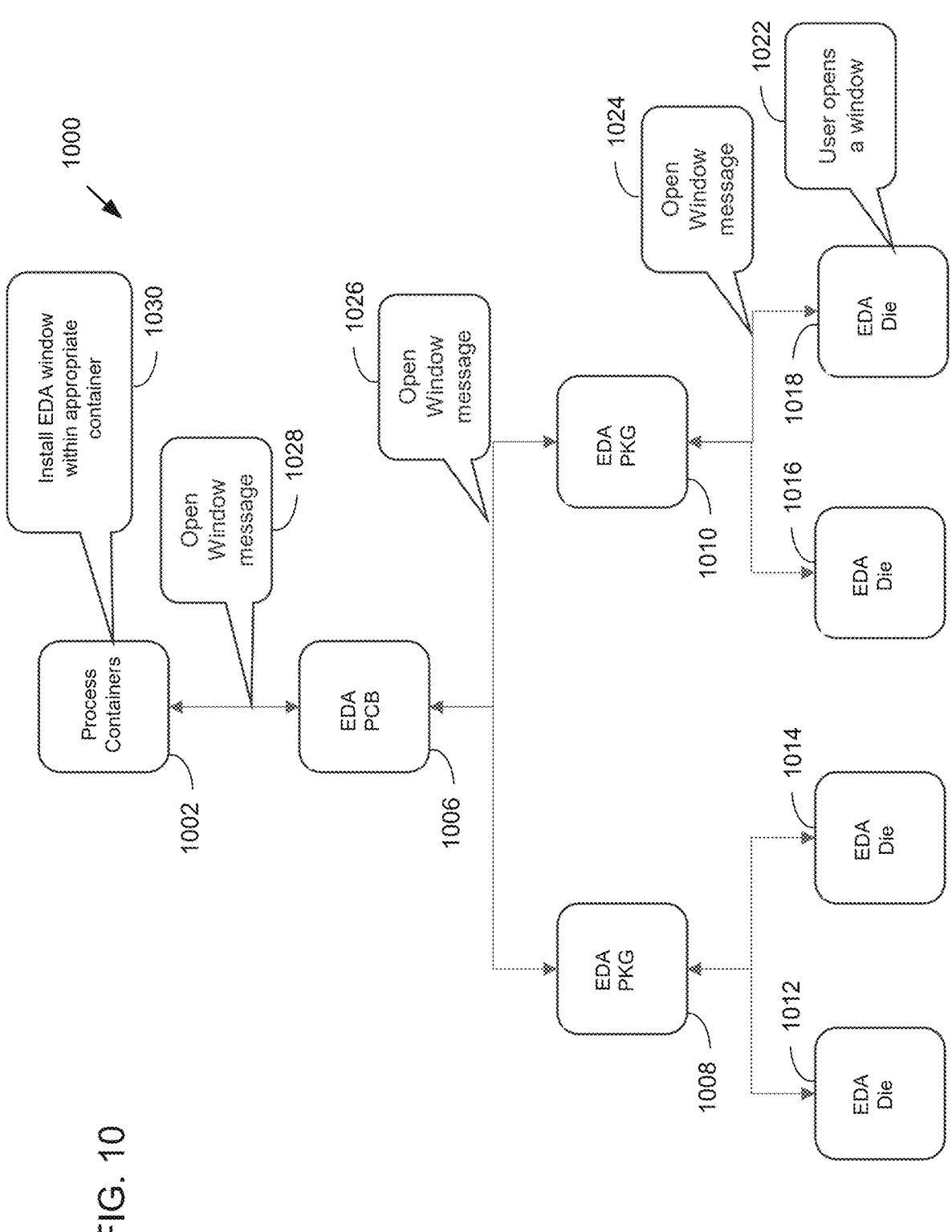

Referring to FIG. 10, another example architecture for the distributed EDA in accordance with the present disclosure is shown. An architecture 1000 may show a hierarchy associated with various processes. For example, the architecture 1000 may include process containers 1002 and processes associated with various views (e.g., EDA PCB 1006, EDA PKGS 1008 and 1010, and EDA dies 1012, 1014, 1016, and 1018). In some embodiments, the architecture 1000 may support a lightweight distributed EDA executable-based process (e.g., the container process) that may only communicate with a top process (e.g., which may be associated with a top layer or view). The container process may support one or more messages or commands (e.g., messages or commands 1022, 1024, 1026, 1028, and/or 1030). The container process may reparent one or more distributed EDA windows within a container window, install one or more distributed EDA windows within the container window (e.g., within the appropriate container), and/or dynamically update a title and/or an icon associated with the container window. In some embodiments, each container may have one tab per distributed EDA session. Further, the container tabs may switch simultaneously. Also, a user may be exposed to only one distributed EDA session at a time. Additionally, new distributed EDA windows may be recursively reported to the container process. Further, the container process may help specify or indicate the current process.

Figure 11:
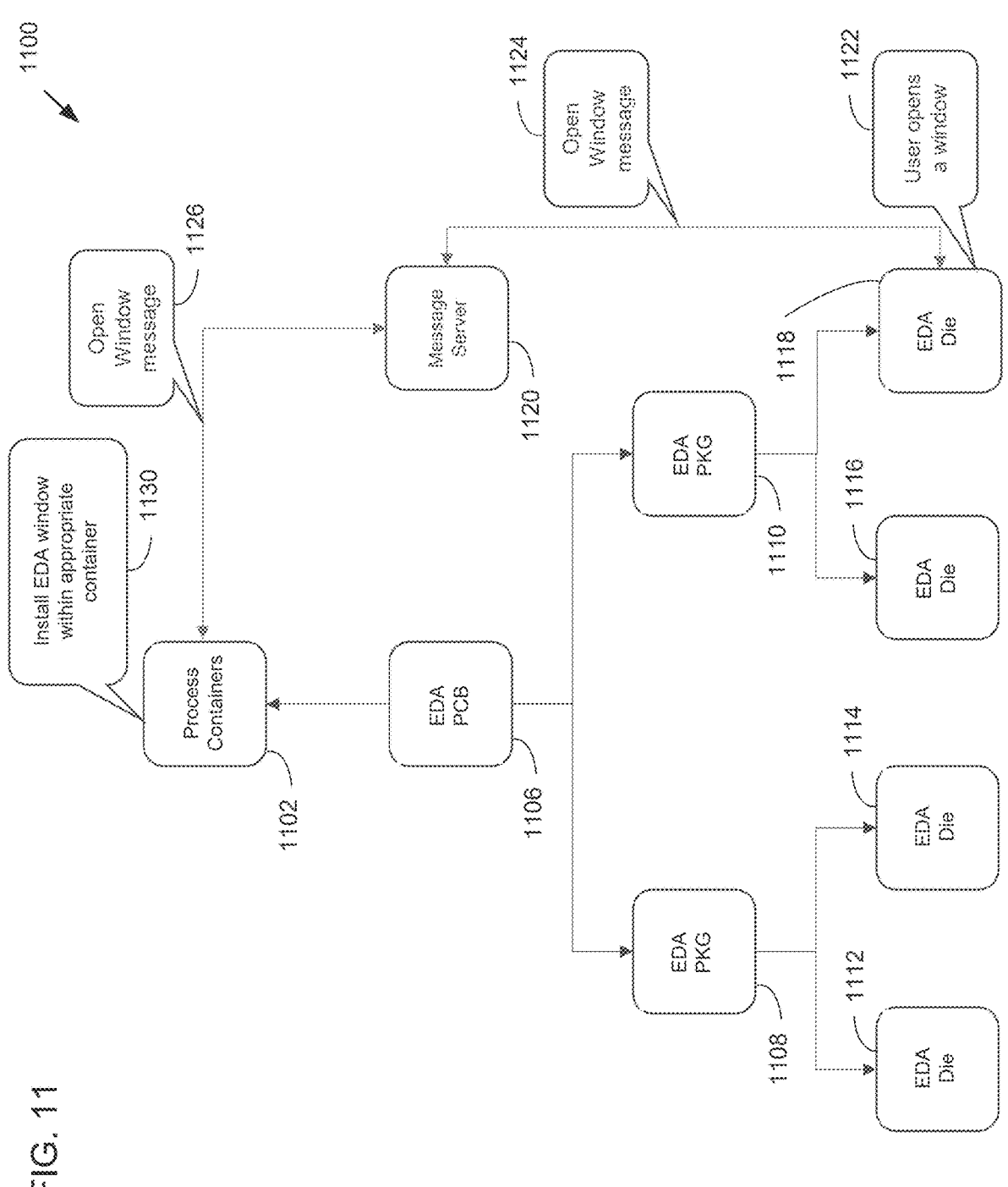

Referring to FIG. 11, another example architecture for the distributed EDA in accordance with the present disclosure is shown. An architecture 1100 may show a hierarchy associated with various processes. For example, the architecture 1100 may include process containers 1102, message server 1120, and processes associated with various views (e.g., EDA PCB 1106, EDA PKGS 1108 and 1110, and EDA dies 1112, 1114, 1116, and 1118). In some embodiments, one or more messages or commands (e.g., messages or commands 1122, 1124, 1126, and/or 1130) may be communicate by or through the message server 1120, which may manage the messages or commands.

DIA Process 2100—Opening Fabrics within DIA

A distributed EDA as described herein may allow for opening fabrics (e.g., with conflicting library names) within DIA. Referring to FIG. 12 an example process 1200 for preparing a design associated with a distributed EDA according to an embodiment of the present disclosure is shown. The process 1200 may include abstracting (1202) a level N fabric. For example, a user may invoke a tool (e.g., an "export fabric" tool) that may automatically create a die abstract from a die layout.

Abstracting may refer to one or more operations for creating an abstract, which may be a high-level representation of a layout or view and may include information about types and sizes of cells and positions of pins. Abstracts may be use instead of full or complete layouts to achieve better ease of access and performance. Referring also to FIG. 13, an example layout 1300 and abstract 1302 associated with the distributed EDA in accordance with the present disclosure is shown. The layout 1300 may be a die layout corresponding to an integrated circuit (IC). The abstract 1302 may be a die abstract corresponding to the IC. For example, process 1200 may create the (IC) abstract 1302 from the (IC) layout 1300.

The process 1200 may further include creating (1204) a fabric level N-1 fabric schematic. For example, in some embodiments, the user may manually create a level N-1 package schematic. If level N is a printed circuit board (PCB), level N-1 may be a package and level N-2 may be an IC. Referring also to FIG. 14, an example schematic 1400 and abstract 1402 associated with the distributed EDA in accordance with the present disclosure are shown. The schematic 1400 may be the level N-1 package schematic (e.g., manually created by the user). The process 1200 may also include creating (1206) a fabric level N-1 fabric layout. For example, in some embodiments, the user may manually create a level N-1 package layout. The layout 1402 may be the level N-1 package layout (e.g., manually created by the user).

The process 1200 may also include creating (1208) a configuration file. For example, in some embodiments, the user may manually create the configuration file. The configuration file may specify where the level N fabric database corresponding to the abstracted level N Fabric Layout is stored (e.g., by CONFIGURE AsbtractedLevelNLib/Cell1/View1 path ToLevelNWorkingDir). From a given path (e.g., pathToLevelNWorkingDir), a file (e.g., cds.lib) may be found that may specify paths for all libraries used in the Level N fabric.

Referring to FIG. 15 an example process 1500 for opening fabrics within DIA of the distributed EDA according to an embodiment of the present disclosure is shown. The process 1500 may include opening (1502) (e.g., by a user) a level N fabric layout. Referring also to FIG. 16, example graphical user interfaces 1600 and 1602 associated with the distributed EDA according to an embodiment of the present disclosure are shown. The graphical user interface 1602 may include the level N fabric layout (which may correspond to a package). The process 1500 may further include calling (1504) (e.g., by a user) an editing capability command (e.g., an Edit-in-Concert™ (EIC) command as may be available from an EDA produced by the assignee of the present disclosure). EIC may be a design editing mode, where fabrics in a system may be superimposed. A current fabric may be displayed in the foreground and may be available for edit. Fabrics in the background may serve as a guide for the corresponding design. For example, a multi-fabric test board design with a single packaged die may span across three fabrics including the board, package, and die, where each fabric may have its own independent technology file.

The process 1500 may further include requesting (1506) (e.g., by the editing capability) a name of an EDA script. The process 1500 may also include specifying (1508) (e.g., by the user) the name of the EDA script. The process 1500 may additionally include opening (1510) (e.g., by the editing capability) a (corresponding) configuration file. Furthermore, the process 1500 may include launching (1512) (e.g., by the editing capability) a message server. Moreover, the process 1500 may include connecting (1514) (e.g., by the editing capability), the distributed EDA to the message server (which may include registering messages that the distributed EDA will process or listen to).

Further, for each level N Fabric, one or more of the following operations may be performed (1516) in parallel on different hardware. The process 1500 may include launching (1518) (e.g., by the editing capability), the distributed EDA in a correct working directory. Referring also to FIG. 17, further example graphical user interfaces 1700, 1702, 1704, and 1706 associated with the distributed EDA according to an embodiment of the present disclosure are shown. For example, graphical user interface 1700 may illustrate a level N fabric and graphical user interfaces 1702, 1704, and 1706 may illustrate level N-1 fabrics. As illustrated by FIG. 17, a user may call the editing capability and one or more processes (e.g., four process in this example) may be initialized in the correct working directory and correct data may be shown. The process 1500 may further include connecting (1520) (e.g., by the editing capability), the distributed EDA to the message server (which may include registering messages that the distributed EDA will process or listen to). The process 1500 may also include opening (1522) (e.g., by the editing capability), a level N-1 fabric (e.g., that may correspond to one or more of graphical user interfaces 1702, 1704, and 1706, as illustrated by FIG. 17).

The process 1500 may additionally include creating (1524) (e.g., by the editing capability) one or more parent-child relationships. Referring to FIG. 18, a table 1800 illustrates a design hierarchy. A level N fabric process (e.g., of the distributed EDA) may maintain a first window table. For each window opened, the first window table may track a related level N-1 fabric and level N-1 window. A table 1802 illustrates process windows. A level N-1 fabric process (e.g., of the distributed EDA) may maintain a second window table. Referring to FIG. 19, tables 8100 and 8102 may illustrate parent-child relationships associated with windows. For each window that launched the level N fabric process, a second window may keep track of a related level N fabric process and level N window. The window tables may also maintain geometric transforms from a parent window to a child window and from the child window to the parent window. For example, zooming or panning within one (e.g., parent) window may automatically zoom or pan at a same location within other (e.g., child) windows.

Furthermore, the process 1500 may include zooming (1526) (e.g., as may be commanded by the user) in a layout window. Moreover, the process 1500 may include automatically zooming (1528) in other layout windows. For example, messages may automatically be sent to other EDA processes to zoom accordingly to show the same area within other fabrics. Referring to FIG. 20, example graphical user interfaces 2000, 2002, 2004, and 2006 associated with the distributed EDA according to an embodiment of the present disclosure are shown. As illustrated by FIG. 20, a user may zoom in on an area of a window (e.g., graphical user interface 2000) and the distributed EDA may automatically zoom in to the corresponding area in other windows (e.g., graphical user interface 2006) (and dies may be flipped).

In some embodiments, the container process, which may also perform operations for opening fabrics, may be launched and initialized via an EDA editing capability command. In response to the command, a script may be created that may include a setting of an environment variable that may specify a name of a message server session, and a message to be put back on the message server once the container process is launched. The script may also include a name of a corresponding container command. The script may be run, the message server may be pinged (e.g., periodically) to determine whether the container process put back the message, and messages that can be obtained from the message server (that were sent from another process) may be registered (e.g., within the message server). Further, the container process may register (e.g., within the message server) messages that can be obtained from the message server (that were sent from another process) and may put back on the message server the message read from the environment variable.

Using the techniques and features described by the present disclosure, a distributed EDA process for opening fabrics may be launched and initialized via the distributed EDA editing capability command. In response to the command, a script may be created that may include a setting of an environment variable. The environment variable may specify a change directory command (e.g., cd library-PathSpecifiedInConfigurationFile), a name of a message server session, a name of a host running the message server, and a message to put back on the message server once the distributed EDA process is launched. The script may also include a name of a corresponding EDA command (e.g., as may have been captured from user input). The script may be run, and the message server may be pinged (e.g., periodically) to determine whether the EDA process put back the message. Further, an EDA sub-process may register (within the message server) messages that can be obtained from the message server (that were sent from another process) and may put back on the message server the message read from the environment variable. EDA sub-processes may be launched in parallel.

Referring now to FIG. 21, a flowchart depicting an embodiment consistent with DIA process 2100 for opening fabrics (e.g., with conflicting library names) within DIA is provided. The process 2100 described herein may include one or more of the techniques, features, and/or operations described above. The process may include receiving 2102, at a graphical user interface, a request to open an electronic design layout (e.g., as shown in FIG. 13). The process may further include receiving 2104 an edit request (e.g., an EIC request) at the graphical user interface. The process may also include accessing 2106 a configuration file (e.g., as shown in FIG. 12) and a message server. The process may additionally include automatically displaying 2108 a first electronic design session at a first display window and a second electronic design session at a second display window based upon, at least in part, the configuration file (e.g., as shown by FIG. 17). Furthermore, the process may also include receiving 2110 a first user command at the first display window. Moreover, the process may include automatically synchronizing 2112 the first user command at the first display window with a same area of the electronic design at the second display window.

For example, and referring back to FIG. 17, if the user zooms around Die 3 (e.g., portion 1708 of graphical user interface), the EDA may zoom in to the corresponding portion (e.g., as shown in corresponding graphical user interface 2000) and (e.g., via DIA process 2100) automatically zoom in to the same area corresponding to children DIA. The children DIA may handle Die 1 (e.g., corresponding to graphical user interface 2002), Die 2 (e.g., corresponding to graphical user interface 2004), and Die 3 (e.g., corresponding to graphical user interface 2006) and may take into account the orientation of the respective dies in the parent DIA. The corresponding graphical user interface 2000 may show a corresponding (zoomed-in) portion of Die 3 and may not show portions of Die 1 or Die 2. The system (e.g., via DIA process 2100) may automatically zoom in to the same area corresponding to graphical user interfaces 2002, 2004 and 2006. As illustrated, graphical user interface 2002 may show nothing because the zoomed-in area of graphical user interface 1700 does not include Die 1. In other words, the zoomed-in area is outside of Die 1. Further, graphical user interface 2004 may also show nothing because the zoomed-in area of graphical user interface 1700 does not include Die 2. However, the graphical user interface 2006 may show Die 3 because Die 3 may be within the zoomed-in area of graphical user interface 1700. In the example illustrated by FIG. 20, Die 3 maybe a flipped die, and thus the image corresponding to Die 3 in graphical user interface 2006 may be flipped.

One or more of the following features may be included. The first user command may be a zoom command. The first user command may be a pan command. The configuration file may specify a location of a definition file for one or more subfabrics. The first and second electronic design sessions may be distinct. The first and second electronic design sessions may be launched on different machines. The automatically synchronizing (e.g., as shown by FIG. 20) may include accounting for a position, orientation, or flipped state of an integrated circuit (IC). The first electronic design session may be generated from a first database and the second electronic design session may be generated from a second database, wherein the first database and the second database are distinct. The edit request (e.g., EIC request) may include a name of an electronic design script.

Thus, using the techniques and features described herein, a new configuration file may specify a location of a library definition file (e.g., cds.lib) of subfabrics. Further, sub-EDA sessions may be automatically launched within a current working directory and correct data may be loaded. Also, zooming and panning to the same area of the overall system may occur automatically between the different layout windows (e.g., of different processes) and may account for a relative position, orientation, and/or flipped state of a corresponding IC. Co-zooming and co-panning in distributed applications may typically reflect the same database (e.g., a layout router interactive application coupled with the EDA may show the same layout as the EDA). However, using the techniques and features described herein for a distributed EDA, databases opened by different applications may be entirely different (e.g., different packages, ICs, etc.). Further, different processes may be launched on different machines to balance the load.

DIA Process 3200—Controlling Multiple DIA

The distributed EDA as described herein may allow for controlling multiple DIA. One or more of the techniques, features, and/or operations described above regarding opening fabrics within DIA (with respect to FIGS. 12-21 and/or processes 1200 and 2100) may be included in one or more processes for controlling multiple DIA as described herein (e.g., process 3200). Further, one or more of the techniques, features, and/or operations described below may be included in the one or more processes for controlling multiple DIA (e.g., process 3200).

Referring to FIG. 22, an example process 2200 for controlling multiple DIA associated with the distributed EDA according to an embodiment of the present disclosure is shown. The process 2200 may include opening (2202) (e.g., by a user) a level N fabric layout. Referring back to FIG. 16, example graphical user interfaces 1600 and 1602 associated with the distributed EDA according to an embodiment of the present disclosure are shown. The graphical user interface 1602 may include the level N fabric layout (which may correspond to a package). The process 2200 may further include calling (2204) (e.g., by a user) an editing capability command (e.g., an Edit-in-Concert™ (EIC) command as may be available from an EDA produced by the assignee of the present disclosure). The process 2200 may further include requesting (2206) (e.g., by the editing capability) a name of an EDA script. The process 2200 may also include specifying (2208) (e.g., by the user) the name of the EDA script. The process 2200 may additionally include opening (2210) (e.g., by the editing capability) a (corresponding) configuration file. Furthermore, the process 2200 may include launching (2212) (e.g., by the editing capability) a message server. Moreover, the process 2200 may include connecting (2214) (e.g., by the editing capability), the distributed EDA to the message server (which may include registering messages that the distributed EDA will process or listen to).

Further, the process 2200 may include launching (2216) (e.g., by the editing capability) the container process. The container process may manage one or more (or all) windows of one or more (or all) EDA processes and may expose one process at a time to the user. Also, the process 2200 may include connecting (2218) (e.g., by the editing capability) the message server to a container and registering the messages that the container process may receive, process, and/or listen to. Additionally, the process 2200 may include installing 2220 (one or more) level N fabric EDA windows in the container. For example, the EDA may send, to the message server, a message targeting the container process and including one or more X window IDs which may each correspond to a different window. The message server may forward this message to the container process. The container process may embed a window associated with the X Window ID as a tab window within a container window. Referring also to FIG. 23, example graphical user interfaces 2300 and 2302 associated with the distributed EDA according to an embodiment of the present disclosure are shown. The graphical user interfaces 2300 and 2302 may correspond to graphical user interfaces 1600 and 1602 of FIG. 16 and illustrate EDA windows embedded within container windows (e.g., as tab windows such as tab windows 2304, 2306, and 2308) as described above.

Further, for each level N Fabric, one or more of the following operations may be performed (2222) (e.g., in parallel on different hardware). The process 2200 may include launching (2224) (e.g., by the editing capability), the distributed EDA in a correct working directory (e.g., as discussed above with respect to FIG. 17). The process 2200 may further include connecting (2226) (e.g., by the editing capability), the distributed EDA to the message server (which may include registering messages that the distributed EDA will process or listen to). The process 2200 may also include opening (2228) (e.g., by the editing capability), a level N-1 fabric (e.g., as discussed above with respect to FIG. 17). The process 2200 may additionally include installing (2230) (e.g., by the editing capability) (one or more) level N-1 fabric EDA windows in the container. For example, referring also to FIG. 24, when all subfabrics have been loaded, all corresponding windows may be embedded within the container (e.g., as tabs) and each container window may have one tab per fabric (e.g., tab windows 2404, 2406, and 2408). New container windows may be automatically created as necessary. The process 2200 may additionally include creating (2232) (e.g., by the editing capability) one or more parent-child relationships (e.g., as discussed above with respect to FIGS. 18 and 19).

Figure 26:
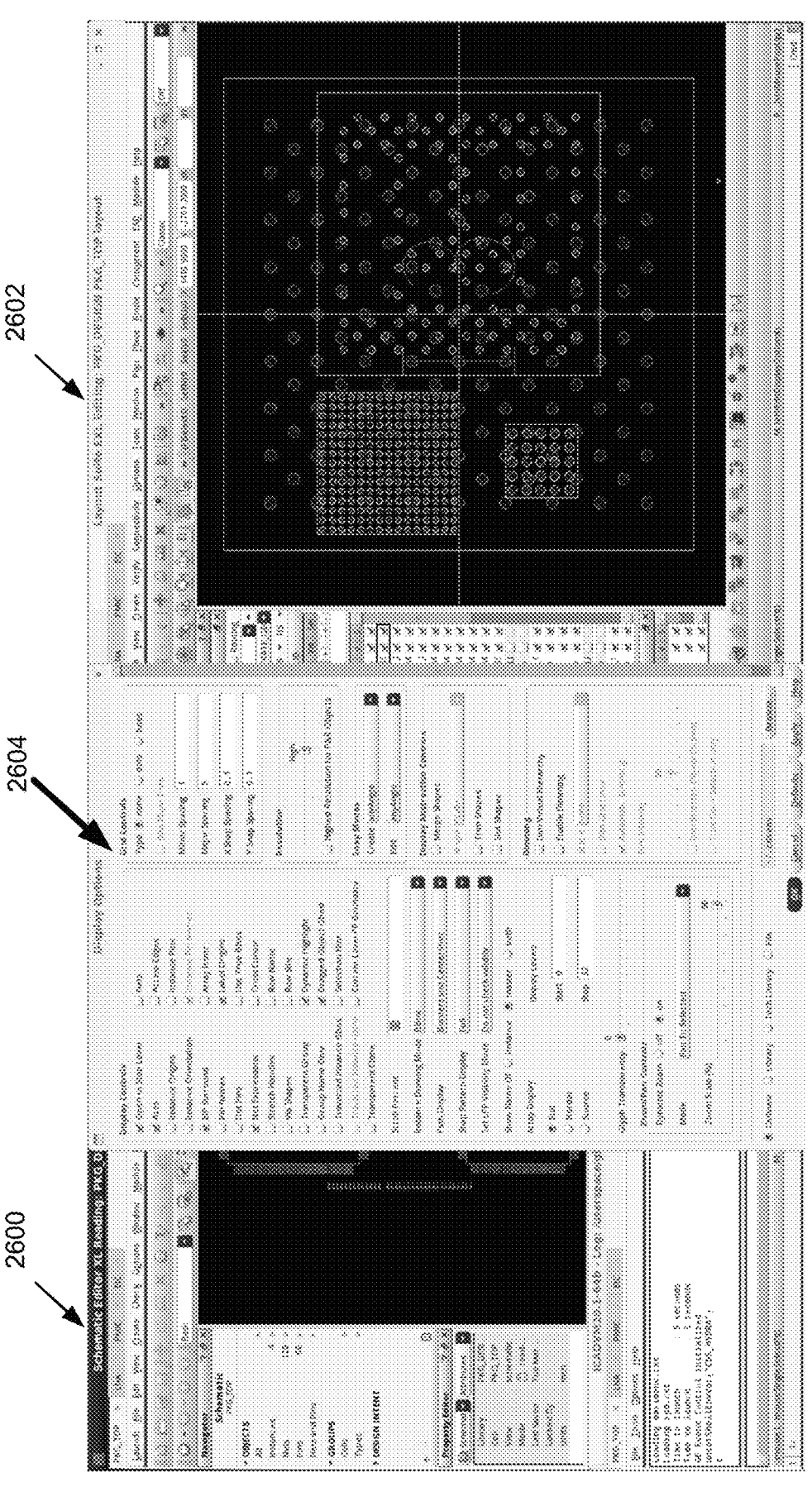
Figure 27:
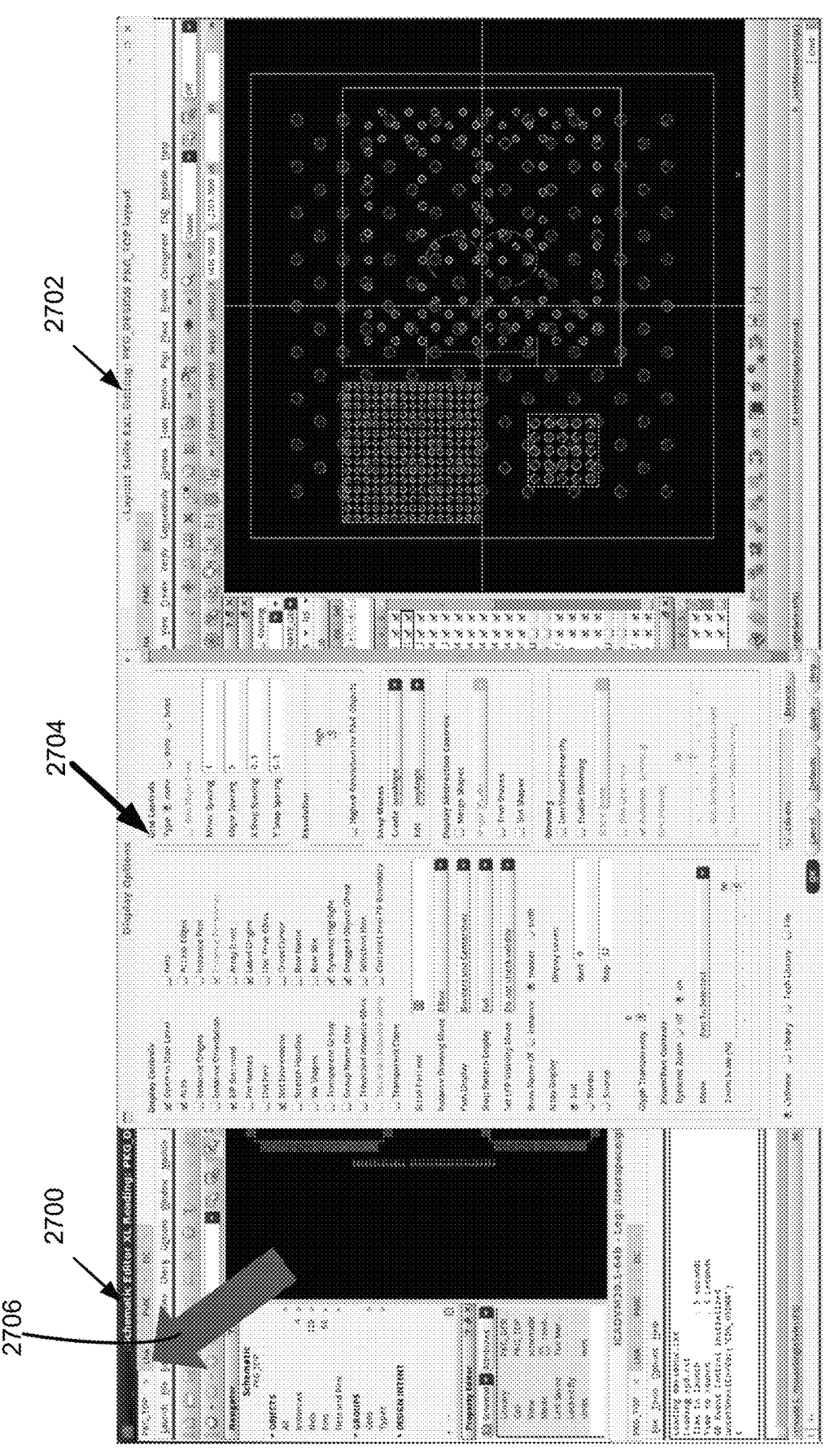
Figure 28:
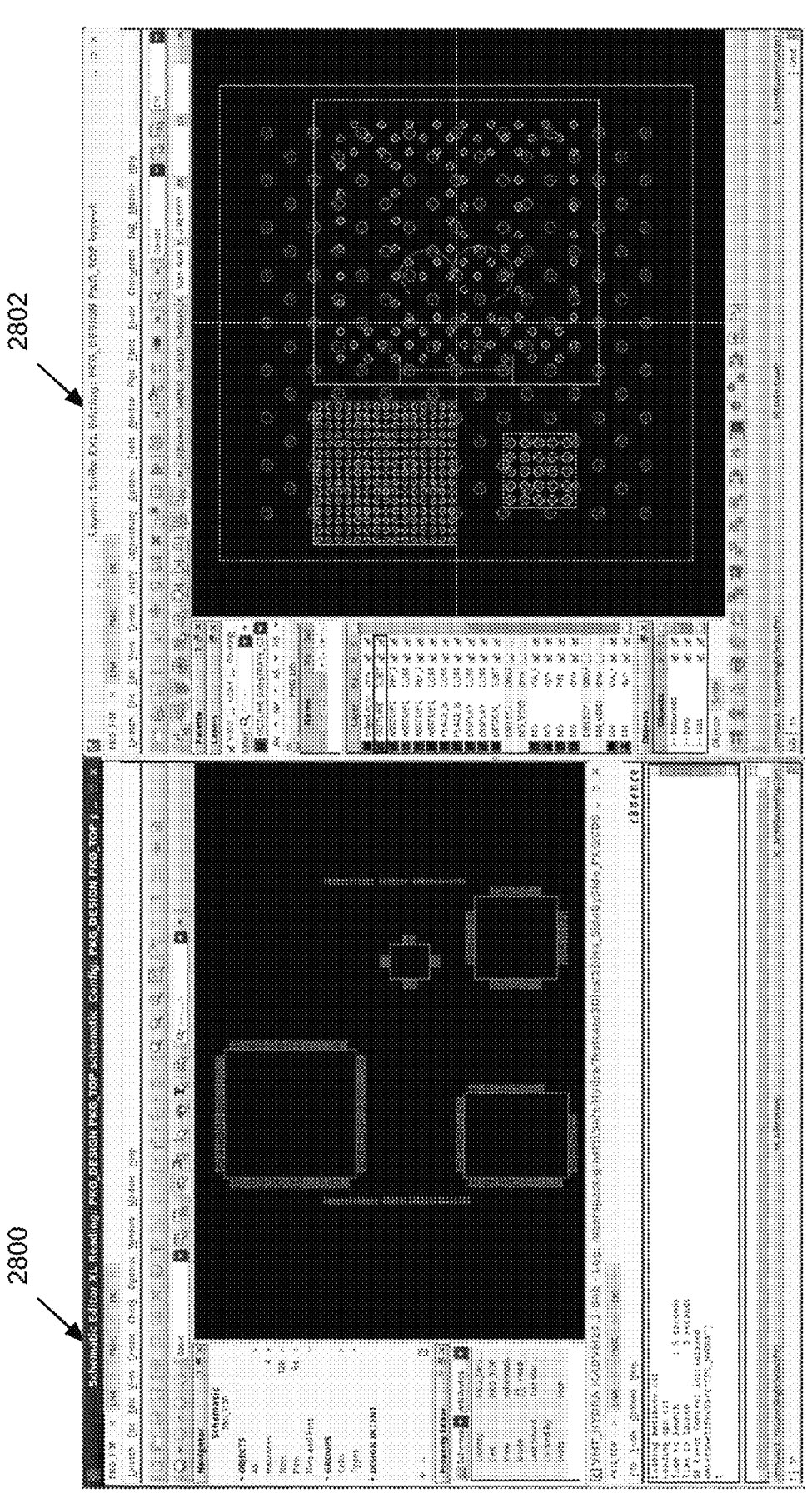

Referring to FIG. 25, an example process 2500 for controlling multiple DIA associated with the distributed EDA according to an embodiment of the present disclosure is shown. The process 2500 may include invoking (2502) (e.g., by a user) a display option form. Referring also to FIG. 26, example graphical user interfaces 2600, 2602, and 2604 associated with the distributed EDA according to an embodiment of the present disclosure are shown. In some embodiments, graphical user interface 2604 may represent the display option form (e.g., of the current EDA process). The process 2500 may further include receiving an indication (e.g., corresponding to a clicking) (2504) (e.g., by the user) associated with a container tab header (e.g., from the user clicking on the tab). Referring also to FIG. 27, example graphical user interfaces 2700, 2702, and 2704 (which may be a display option form) associated with the distributed EDA according to an embodiment of the present disclosure are shown. The indication may correspond to the user selecting (e.g., clicking) a different tab (e.g., an LNA tab which may correspond to a selected EDA process) as shown by arrow 2706. The process 2500 may also include determining (2506) if a current process is busy. In response to determining that the current process is busy, the process 2500 may ignore (2508) a request (e.g., corresponding to the indication, selection, and/or clicking, by the user for example), as it may not be desirable for the distributed EDA to switch to another process if the current one is busy.

Figure 29:
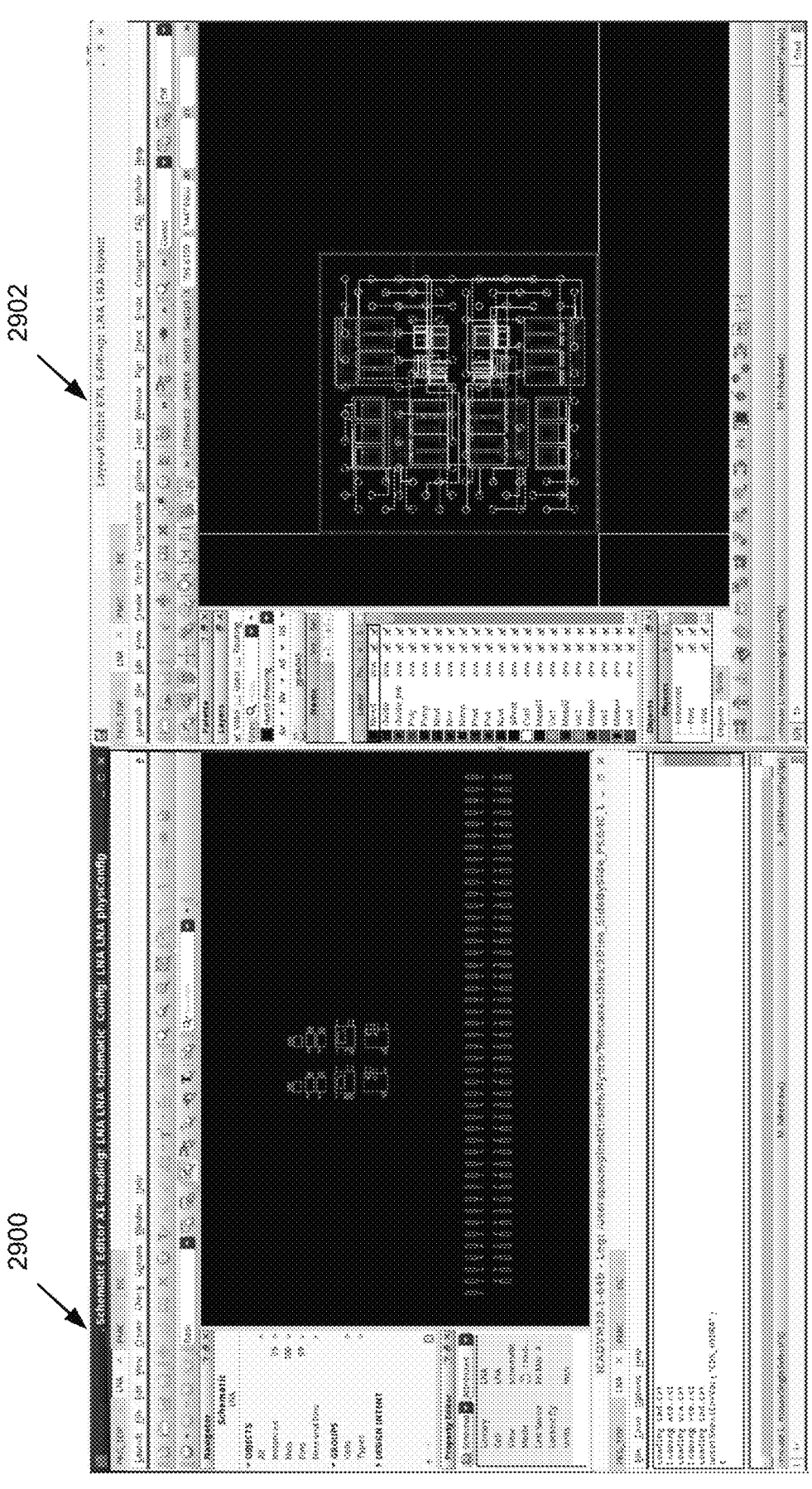

In response to determining that the current process is not busy, the process 2500 may automatically store an indication corresponding to all opened forms (e.g., memorize the open forms by the current EDA process) (2510). The process 2500 may further automatically un-map (2512) (e.g., by the current EDA process) the opened forms. For example, and referring also to FIG. 28, example graphical user interfaces 2800 and 2802 associated with the distributed EDA according to an embodiment of the present disclosure are shown, without the graphical user interface 2704 (e.g., the display option form), which may represent the un-mapping (e.g., removing one or more forms from display) operation. The graphical user interface 2704 may be an open form (or other type of widget) that may be dedicated to the current DIA. When switching to another DIA, any previously opened forms that are not embedded in a container may be un-mapped from the screen. When switching back to a previous DIA, the forms that were un-mapped may be remapped on screen such that the user retrieves the previous DIA session as it was before the user switched DIA sessions. The process 2500 may also automatically switch (2514) (e.g., by the current EDA process) all containers to the corresponding tab (e.g., corresponding to operation 2504). Referring also to FIG. 29, example graphical user interfaces 2900 and 2902 associated with the distributed EDA according to an embodiment of the present disclosure are shown, where the containers have been automatically switched to the LNA tab (e.g., LNA tabs 2904, 2906, and 2908).

Further, the process 2500 may also include automatically changing the selected EDA process to become (2516) a new current EDA process. For example, the container process may automatically send a message to the EDA process corresponding to the selected tab (e.g., the LNA tab), indicating that the selected tab is now the new current EDA process. Also, the process 2500 may include mapping (2518)

Figure 30:
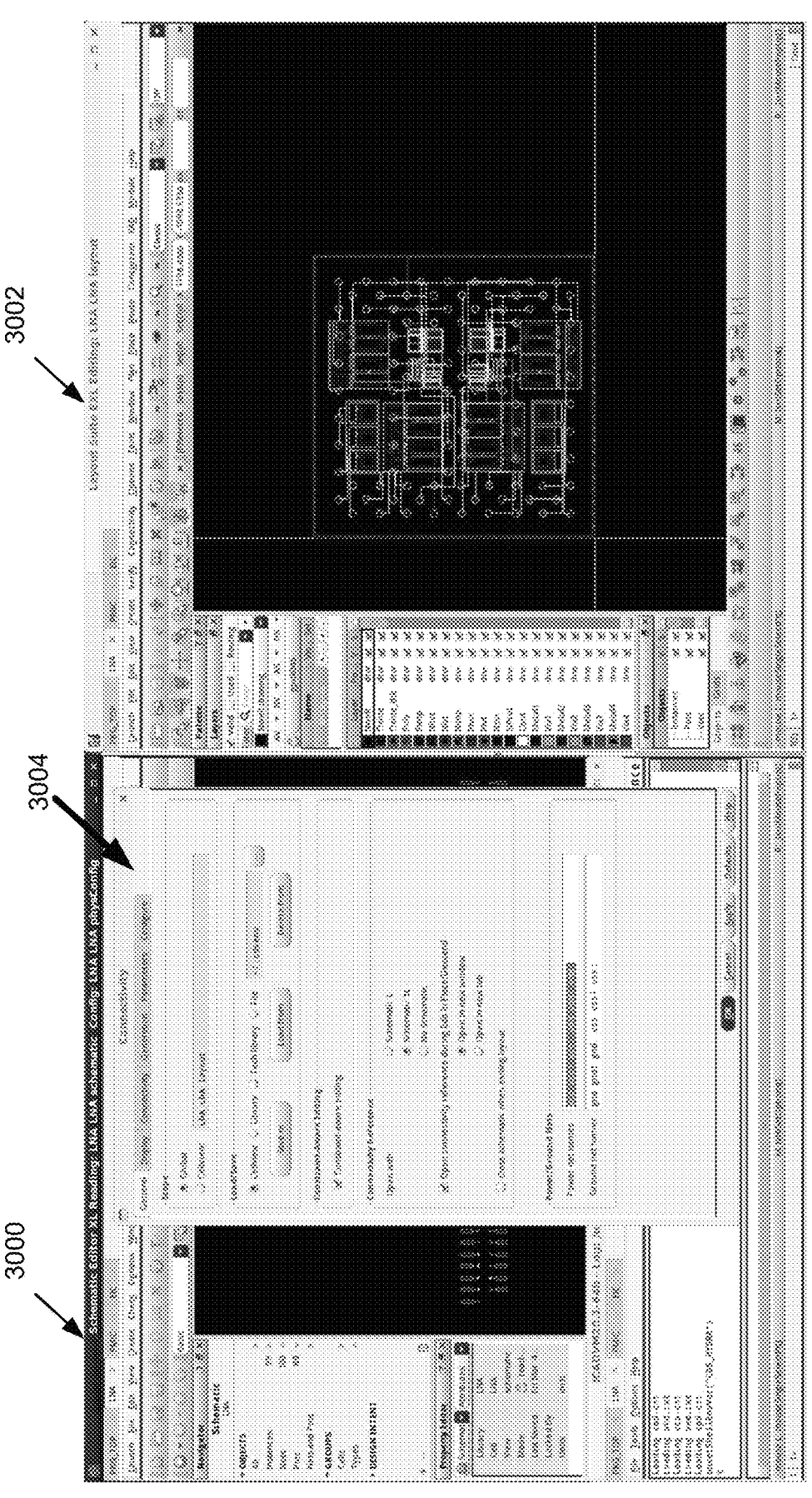

(e.g., by the current EDA process) all forms that were un-mapped previously (e.g., after performing operation 2512). For example, the current EDA process may automatically map (e.g., un-hide) any forms that were un-mapped (e.g., that were automatically un-mapped after performing operation 2512). Referring also to FIG. 30, example graphical user interfaces 3000, 3002, and 3004 (which may be the display option form) associated with the distributed EDA according to an embodiment of the present disclosure are shown. As shown, display option form 3004 may be displayed after performing operation 2518.

Referring to FIG. 31, an example processes 3100 for controlling multiple DIA associated with EDA according to an embodiment of the present disclosure is shown. The process 3100 may include one or more operations for automatic window embedding. For example, the process 3100 may include opening (3102) (e.g., by a user) a new session window within an EDA process. The process 3100 may further include automatically extracting (3104) (e.g., by the EDA process) window information (such as a corresponding xWindow ID, window name, etc.) and sending the information as a message to the container process. One or more of the following operations may be performed automatically by the container process (e.g., after, or in response to, performing operation 3104). For example, the process 3100 may also include determining (3106) whether there is a container window with an appropriate empty tab. In response to determining that there is no container window with an appropriate empty tab, the process 3100 may create (3108) a new container window. In response to determining that there is a container window with an appropriate empty tab, the process 3100 may install (3110) the (new) session window within the appropriate (empty) tab of the container window.

Referring now to FIG. 32, a flowchart depicting an embodiment consistent with DIA process 3200 for controlling multiple DIA is provided. The process (or method) 3200 described herein may include one or more of the techniques, features, and/or operations described above. The process 3200 may include receiving (3202), at a graphical user interface, a request to open an electronic design layout (e.g., as shown in graphical user interface 1602). The process may further include receiving (3204) an edit (e.g., EIC) request at the graphical user interface. The process may also include accessing (3206) a configuration file and a message server. The process may additionally include launching (3208) the container process, which may be configured to manage a plurality of display windows at the graphical user interface and to display only one process at a given time (e.g., as described by one or more operations of FIG. 25 such as operations 2514 and 2516 and shown by FIG. 29).

One or more of the following features may be included. The process may include associating (3210) the message server with the container process. The process may further include registering (3212) one or more messages that the container process will interact with. Each of the plurality of display windows may include one tab per fabric (e.g., as shown by FIG. 24). The process may also include receiving (3214) a selection of a tab (e.g., as shown by FIG. 27). The process may additionally include switching (3216) from a first process to a second process in response to receiving the selection (e.g., as shown by FIG. 29). Furthermore, the process may include synchronously updating (3218) a plurality of tabs, wherein each of a plurality of containers update substantially simultaneously. Assume for illustrative purposes that the EDA includes four EDA processes. As described above, different EDA windows of each of the EDA processes may be embedded within a container window of the distributed EDA executable process. For example, a schematic container window of the distributed EDA executable process may embed a schematic window of the EDA process hosting a corresponding package as well as schematic windows of the EDA processes hosting three dies. The four windows embedded within the schematic container window may be made accessible by tabs. In other words, when selecting (e.g., clicking on) a corresponding tab of this window, the schematic corresponding to the selected tab may be displayed. Similar operations and functionality may be provided for a layout container window, the CIW container window, and library manager container window. Thus, the synchronous tab switching capability described above may allow the user to select one tab of a container window and, in response, the distributed EDA executable may automatically select the corresponding tab within all container windows. In this way, the user may only see EDA windows of one process at a time. In other words, the distributed EDA may prevent the user from seeing two windows of two different EDA processes at the same time. Moreover, the process may include determining (3220) whether a currently displayed process is busy. Further, the process may include delaying (3222) the switching (e.g., as described by operation 2508) if a currently displayed process is determined to be busy.

Thus, one or more of the techniques, features, and/or operations described above may be implemented to enable a user to use a DIA by exposing the user to only one interactive process at a time (plus, e.g., the container process), which may reduce a number of windows exposed to the user such that the user may focus on current (EDA) process windows. This may also reduce a number of window icons within a window list footer. Further, switching processes may be performed (e.g., by the user) via tab selection and tabs may be updated synchronously (e.g., all containers may switch tabs simultaneously). As discussed above, it may be determined that the current (EDA) process is not busy before switching to another (EDA) process.

DIA Processes 3700 and 4000—Replaying Scenarios within DIA

In some embodiments, the distributed EDA may include methods or processes related to replaying scenarios within DIA (e.g., DIA processes 3700, and 4000 as shown in FIGS. 37 and 40, respectively). The DIA processes 3700, and 4000 may include one or more of the techniques, features, and/or operations described below. Replaying a scenario may refer to replaying a set of commands selected by the user. This may include capturing the commands selected within each of the EDA processes during a distributed EDA session and replaying those commands in the same way within a new distributed EDA session. Replaying scenarios may be useful to reproduce a bug or to redo the same commands over again if, for example, the user forgot to save the end result of the commands.

Referring to FIG. 33, example diagrammatic flowcharts showing operations associated with the EDA or distributed EDA are shown. The EDA or distributed EDA may be commanded by a user (e.g., using example EDA command "Terminal>EDA" or example distributed EDA command "Terminal>distributed EDA") to automatically log user actions (e.g., via EDA or distributed EDA process 3302) within a replay file (e.g., replay file 3304, which may be named cds.log or CDS_DIA.log). The replay file 3304 (e.g., CDS_DIA.log) may be created while running a distributed EDA session. Further, the EDA or distributed EDA may copy (e.g., via example EDA command "Terminal>cp CDS.log replay.au" or example distributed EDA command "Terminal>cp CDS_DIA.log replay.au") the replay file 3304 (e.g., via a copy process (cp) 3306) to a different file 3308 (which may be called replay.au). Also, the EDA or distributed EDA may replay (e.g., via example EDA command Terminal>EDA-replay replay.au or example distributed EDA command Terminal>distributed EDA-replay replay.au) the replay file 3304 (e.g., automatically). Additionally, the user may log a subset of user actions within a short ancillary log file (e.g., ancillary log file 3310, which may be named my.log). This may be done using the example EDA commands "hiStartLog" and "hiEndLog." in, for example, a commend sequence such as: "Terminal>EDA"; "EDA>first action"; "EDA>hiStartLog ("my.log)"; "EDA>second action"; "EDA>third action"; "EDA>hiEndLogFile"; "EDA>fourth action."

In some embodiments, a method or process for replaying scenarios within DIA may include creating a replay file and replaying the replay file, where either two replay files are created, or one replay file is created. Referring to FIG. 34 an example architecture of the distributed EDA for creating a replay file according to an embodiment of the present disclosure is shown. Upon launching the distributed EDA, commands may be logged (e.g., via an EDA process 3402) to a log file 3404 (e.g., CDS.log). Upon launching a DIA editing capability (which may be referred to as DIA EIC), the log file 3404 may be copied to a different file 3406 (e.g., DIA.au or CDS_DIA.log).

The DIA EIC may be a command that launches the distributed EDA executable, launches EDA processes, opens proper layouts in a cell view from the EDA processes, displays layout overlays and performs co-zooming and/or co-panning within the corresponding windows. The DIA EIC may enable the user to edit one fabric in the context of another fabric. For scenario replay capability, the distributed EDA may log all commands run by the user (e.g., editing commands such as move or delete, graphical commands such as zoom, pan, select, etc., an EIC command, and/or a SKILL script that the user my write and execute). In other words, the distributed EDA may log all commands (not just editing commands) in a manner that will enable the user to automatically redo the same operations within a new distributed EDA executable session.

Further, the different file 3406 (e.g., DIA.au for example) may be appended (e.g., with a statement or command such as_hdrReplayLogfile (\ "./DIASecond.au\"), where two replay files are created, to process a separate file 3408 (e.g., DIASecond.au) from the container process (e.g., container process 3410), whereby the separate file 3408 (e.g., DIA-Second.au) may be created. When the user switches the EDA session, the separate file 3408 (e.g., DIASecond.au) may be updated with, for example, a session fabric name and commands executed within the fabric. In some embodiments, commands run in multiple or all EDA processes (e.g., EDA processes 3412 and 3414) may be aggregated (e.g., logged) in the separate file 3408 (e.g., DIASecond.au). Alternatively (or in some embodiments, additionally), where one replay file is created, the different file 3406 (e.g., CDS_DIA.log for example) may be appended (e.g., with a statement or command such as \a hiRegTimer("_DIAReplayFile( )" 1) to pass the replay file to the container process. Further, a delimiter (e.g., \#DIAReplay) may be created (e.g., as a comment). When the user switches the EDA session, the different file 3406 (e.g., CDS_DIA.log) may be updated with a corresponding session design environment name, commands executed within that session, and information that may be logged as comments. In some embodiments, commands run in multiple or all EDA processes (e.g., EDA processes 3412 and 3414) may be aggregated (e.g., logged) in the different file 3406 (e.g., CDS_DIA.log). When completed, the user may copy the different file 3406 (e.g., CDS_DIA.log) into a new file (e.g., with a statement or command such as cp CDS_DIA.log New_DIA.au).

Referring to FIG. 35A, example log or replay files associated with the distributed EDA according to an embodiment of the present disclosure are shown (e.g., where two replay files are created). The file 3500A, which may be a log or replay file such as DIA.au as discussed above, may include a command 3502A (e.g., to launch EIC) and a command 3504A (e.g., to request to replay a secondary replay file such as DIAsecond.au from the container process). The module 3510A, which may be associated with the secondary log or replay file such as DIASecond.au as discussed above, may include a command 3512A (which may be a start delimiter for a replay file snippet), a series of commands 3514A (which may define, at least in part, the replay file snippet), and a command 3516A (which may be an end delimiter for the replay file snippet).

Referring to FIG. 35B, example log or replay files associated with the distributed EDA according to an embodiment of the present disclosure are shown (e.g., where one replay file is created). The file 3500B, which may be a log or replay file such as CDS_DIA.log as discussed above, may include a command 3502B (e.g., to launch EIC) and a command 3504B (e.g., to request to replay a replay file such as CDS_DIA.log from the container process). The module 3510B, which may be associated with the replay file such as CDS_DIA.log, may include a comment character 3518B, command 3512B (which may be a start delimiter for a replay file snippet), a series of commands 3514B (which may define, at least in part, the replay file snippet), and a command 3516B (which may be an end delimiter for the replay file snippet).

Referring to FIG. 36 an example process 3600 associated with the distributed EDA for creating a replay file according to an embodiment of the present disclosure is shown. The process 3600 may include invoking (3602) (e.g., by a user making a selection via the distributed EDA) the DIA editing capability (e.g., DIA EIC) command. The process 3600 may further include copying (3604) (e.g., automatically, by the distributed EDA) a log file (e.g., cds.log) to a different file (e.g., DIA.au or CDS_DIA.log, which may be referred to as a replay file). The process 3600 may also include annotating (3606) (e.g., automatically, by the distributed EDA) the replay file (e.g., DIA.au or CDS_DIA.log). This may include, in cases where two replay files are created, adding a request to replay a separate or secondary log file from the container process, which may be referred to as a secondary replay file (e.g., DIASecond.au). The process 3600 may additionally include setting (3608) (e.g., automatically by the distributed EDA executable process or container process) a top EDA process as a current EDA process.

Furthermore, the process 3600 may include logging (3610) (e.g., by the top EDA process) user commands in a (first) ancillary log file. Moreover, the process 3600 may include setting (3612) (e.g., by the user selecting or clicking on a (first) container tab) another EDA process (e.g., a (first) selected EDA process) as the current EDA process. Further, the process 3600 may include appending (3614) (e.g., by the container process or the distributed EDA executable process) the secondary log or replay file (e.g., DIASecond.au or CDS_DIA.log). For example, the secondary log or replay file (e.g., DIASecond.au or CDS_DIA.log) may be appended with content from the ancillary log file and one or more delimiters. Also, the process 3600 may include logging (3616) (e.g., by the (first) selected EDA process) user commands in a (second) ancillary log file. Additionally, the process 3600 may include setting (3618) (e.g., by the user selecting or clicking on a (second) container tab) another EDA process (e.g., a (second) selected EDA process) as the current EDA process. The process 3600 may furthermore include appending (3620) (e.g., by the container process or the distributed EDA executable process) the secondary log (or replay) file (e.g., DIASecond.au or CDS_DIA.log). For example, the secondary log (or replay) file may be appended with content from the (second) ancillary log file and one or more delimiters. Also, the process 3600 may include logging (3622) (e.g., by the (second) selected EDA process) user commands in a (third) ancillary log file.

One or more of the operations above may be performed one or more additional times as the user may again set another EDA process as the current EDA process. For example, the process 3600 may include setting (3624) (e.g., by the user selecting or clicking on a (third) container tab) another EDA process (e.g., a (third) selected EDA process) as the current EDA process. The process 3600 may further include appending (3626) (e.g., by the container process or the distributed EDA executable process) the secondary log (or replay) file (e.g., DIASecond.au or CDS_DIA.log). For example, the secondary log (or replay) file may be appended with content from the (third) ancillary log file and one or more delimiters.

Referring now to FIG. 37, a flowchart depicting an embodiment consistent with DIA process 3700 for creating a replay file (e.g., using one or two replay files) within DIA is provided. The process (or method) 3700 described herein may include one or more of the techniques, features, and/or operations described above. The process 3700 may include receiving (3702) an edit request (e.g., associated with the DIA EIC) at a graphical user interface associated with an EDA (e.g., the distributed EDA). The process may further include creating (3704) a first replay file (e.g., replay file 3406 such as DIA.au or CDS_DIA.log). The process may also include, in response to receiving the edit request, automatically copying (3706) first content of a first log file (e.g., file 3404 or cds.log to the first replay file (e.g., replay file 3406 such as DIA.au or CDS_DIA.log). The process may additionally include automatically annotating (3708) the first replay file (e.g., replay file 3406 such as DIA.au or CDS_DIA.log). In some embodiments where two replay files are created, the first replay file (e.g., replay file 3406 such as DIA.au or CDS_DIA.log) may be annotated with a request to replay a secondary replay file (e.g., secondary replay file 3408 or DIASecond.au).

One or more of the following features may be included. The process may include automatically setting (3710) a first EDA process as a current EDA process. The method may further include logging (3712), by the first EDA process, one or more first commands to a second log file. The process may also include receiving (3714) a request to set a second EDA process as the current EDA process. The process may additionally include appending (3716) the first replay file (e.g., replay file 3406 such as DIA.au or CDS_DIA.log) or the secondary replay file (e.g., secondary replay file 3408 or DIASecond.au) with second content from the second log file. Furthermore, the process may include logging (3718), by the second EDA process, one or more second commands to a third log file. Moreover, the process may include appending (3720) the first replay file (e.g., replay file 3406 such as DIA.au or CDS_DIA.log) or the secondary replay file (e.g., secondary replay file 3406 or DIASecond.au) with one or more delimiters (e.g., as shown in FIG. 35).

Referring to FIG. 38, an example architecture of the distributed EDA for replaying a replay file according to an embodiment of the present disclosure is shown. A replay file associated with the distributed EDA may be replayed as other EDA replay files may be replayed (e.g., as in one or more EDAs that may be available from the assignee of the present disclosure). For example, an EDA process 3802 may receive a command (e.g., replay DIA.au or replay CDS-_DIA.log) to replay the replay file 3804 (e.g., DIA.au or CDS_DIA.log). A first piece of the replay file 3804 may be replayed within a corresponding EDA session. A call to the DIA editing capability (e.g., DIA EIC) may launch the distributed EDA executable. Another call (e.g., "_hdrRe-playLogfile (\"./hydraSecond.au\ ")") to replay the replay file (e.g., to _hdrReplayLogfile or _hdrReplayfile) may tell the container process (e.g., container process 3806) or the distributed EDA executable process to replay a secondary replay file 3808 (e.g., DIASecond.au) or reprocess the DIA.au replay file (in which case the EDA may ignore comments following the call). The container process 3806 or the distributed EDA executable process may continue to set a context on a correct EDA process, extract a snippet (e.g., associated with file 3810 or snippet.au) of replay statements, and replay the snippet of replay statements within the EDA process (e.g., one of EDA process 3802, 3812, and/or 3814).

Referring to FIG. 39 an example process 3900 of the distributed EDA for replaying a replay file according to an embodiment of the present disclosure is shown. The process 3900 may include invoking (3902) a user command (e.g., "EDA—replay DIA.au" which may be received from a shell terminal). The process 3900 may further include replaying (3904) (e.g., by the distributed EDA) a replay file (e.g., replay file 3804, for example DIA.au or CDS_DIA.log). In some embodiments, the EDA may not replay items after a "HydraReplay" delimiter as only comments may be included there. In some embodiments, the process 3900 may also include requesting (3906) (e.g., by the distributed EDA) the container process to replay the replay file (e.g., DIA.au) or a secondary replay file (e.g., secondary replay file 3808 or DIASecond.au). The process 3900 may additionally include sending (3908) (e.g., by the distributed EDA) a message to the distributed EDA executable process or container process to replay the replay file or the secondary replay file (e.g., replay file 3804, for example DIA.au or CDS_DIA.log, or secondary replay file 3808 or DIASecond.au).

Furthermore, the process 3900 may also include performing (one or more times as may be necessary), by the distributed EDA executable process or the container process, one or more of the following operations or steps (3910). For example, the process 3900 may extract (3912), by the distributed EDA executable process or the container process, a next pair of delimiters and retrieve information about a next current EDA process. In some embodiments, the distributed EDA executable process may extract a command from DIA.au or CDS_DIA.log by uncommenting the command. Moreover, the process 3900 may extract (3914), by the distributed EDA executable process or the container process, a replay file snippet in between the (next) pair of delimiters. Further, the process 3900 may set (3916), by the distributed EDA executable process or the container process, a new current EDA process based on information on the extracted delimiter pair. Also, the process 3900 may request (3918), by the distributed EDA executable process or the container process, that a current EDA process replay the file snippet.

Referring now to FIG. 40, a flowchart depicting an embodiment consistent with DIA process 4000 for replaying a replay file within DIA is provided (e.g., where one or two replay files were created). The process (or method) 4000 described herein may include herein may include one or more of the techniques, features, and/or operations described above. The process 4000 may include receiving (4002), at a graphical user interface associated with an EDA (e.g., distributed EDA), a request to replay a first replay file (e.g., replay file 3804 or DIA.au). The process may further include, in response to receiving the request, replaying (4004) the first replay file (e.g., replay file 3804 or DIA.au). The process may also include requesting (4006) to replay a second replay file (e.g., secondary replay file 3808 or DIASecond.au) or the first replay file (e.g., replay file 3804 or DIA.au). The process may additionally include extracting (4008) one or more delimiters associated with a first EDA process that will become a current EDA process.

One or more of the following features may be included. Requesting to replay the second replay file (e.g., secondary replay file 3808 or DIASecond.au) or the first replay file (e.g., replay file 3804 or DIA.au) may include sending (4010) a message from the EDA (e.g., distributed EDA) to a first process to replay the second replay file (e.g., secondary replay file 3808 or DIASecond.au) or the first replay file (e.g., replay file 3804 or DIA.au). The process may include extracting (4012) a replay file snippet corresponding to the one or more delimiters. The process may further include receiving (4014) information associated with the first EDA process that will become the current EDA process. The process may also include setting (4016) the current EDA process based upon, at least in part, the information. The process may additionally include requesting (4018) that the current EDA process replay the replay file snippet.

DIA Process 5200—Creating Netlists from DIA

In some embodiments, the distributed EDA may include a method or process for creating netlists in parallel from DIA (e.g., DIA process 5200 as shown in FIG. 52). The DIA process 5200 may include one or more of the techniques, features, and/or operations described below.

Referring to FIG. 41, an illustration showing example schematic netlisting operations associated with the EDA is shown. A schematic (e.g., schematic 4102 or 4104) may instantiate symbols of other schematics or leaf cells (e.g., corresponding to transistors, resistor, etc.). A netlister (e.g., netlister 4106) may generate a netlist file (e.g., netlist file 4108) out of the schematic by recursively visiting a schematic hierarchy until, for example, leaf cells are indicated. For simulation, the netlister may request leaf cell electrical models which may be provided by corresponding files.

Referring to FIG. 42, an illustration showing example schematic netlisting operations from a netlist generation view (e.g., netlist generation view 4202) associated with the EDA is shown. The netlist generation view 4202 may include (among other things) a name corresponding to a library, cell, and/or view associated with the schematic, as well as one or more names of electrical model libraries. A netlist generation editor may open the netlist generation view 4202 and invoke a netlist creation command, which may generate a netlist 4206 (e.g., via a netlister 4204) from a schematic and add one or more names of electrical model libraries.

Referring to FIG. 43, an example of exporting a die using the EDA is shown. An EDA export die command may abstract a die symbol 4302 and die layout 4304 (which may be a pair) in one or more components. For example, a first component may be an abstracted die layout, which may be a footprint of the die layout 4304 that includes inputs/ outputs and a boundary. A second component may be an abstracted die schematic, instantiating the die symbol. A third component may be an abstracted die symbol (e.g., abstracted die symbol 4306), which may be used one level up (e.g., within a package schematic).

Referring to FIG. 44, an example package schematic associated with the EDA is shown. A user may create a package schematic 4402, instantiating exported die symbols. The netlister may netlist out from the package schematic 4402 down to IC leaf cells by recursively traversing a package schematic hierarchy. As discussed above and shown in FIG. 6, different libraries may need to be isolated (e.g., the PKG library may not include one or more die libraries). As a result, the netlister may not find an exported die schematic corresponding to the exported die symbols and thus may stop netlisting at the exported die symbols. Thus, the netlister may not have sufficient information to determine which electrical model to use for a given IC.

Referring to FIG. 45, an example process (4500) for exporting a die using the distributed EDA in accordance with the present disclosure is shown. Referring also to FIG. 46, example components associated with the example process for exporting the die (of FIG. 45) are shown. The process 4500 may include one or more operations as shown in FIG. 45. The operations may be performed automatically in response to initiating the process 4500 (e.g., by a user or system). For example, the user may call an export die command or cause the export die process (e.g., 4500) to be called (4502). The export die process 4500 may include requesting (4504) (e.g., from the user) a name of a library in which to create the exported die schematic and netlist generation view. The export die process 4500 may further include requesting (4506) from user the name of library to create the exported die symbol and abstract (e.g., as another library name may be needed because the libraries were isolated). The export die process 4500 may also include requesting (4508) from the user a name of an electrical model file. The export die process 4500 may additionally include creating (4510) the netlist generation view (e.g., 4602) and the exported die schematic, which may be preset to EDA simulation. Furthermore, the export die process 4500 may include creating (4512) the exported die abstract and symbol. Moreover, the export die process 4500 may include annotating (4514) the exported die symbol and layout and storing properties to retrieve the exported die schematic and netlist generation view.

Referring to FIG. 47, an example netlist generation view 4700 (e.g., automatically generated) generated using the distributed EDA in accordance with the present disclosure is shown. The netlist generation view 4700 may include an option 4702 for EDA simulation. Further, the netlist generation view 4700 may include, or cause a popup window to include, the electrical file model (e.g., as indicated by 4704) to use for editing an IC.

Referring to FIG. 48, an example netlisting process (4800) of the distributed EDA in accordance with the present disclosure is shown. The netlisting process 4800 may include one or more operations as shown in FIG. 48. For example, the netlisting process 4800 may include creating (4802) (e.g., in response to a command by a user) a netlist generation view (e.g., netlist generation view 4700) corresponding to a package schematic (e.g., package schematic 4402). The netlisting process 4800 may further include calling (4804) (e.g., in response to a command by a user) a netlister. The netlisting process 4800 may also include generating (4806) (e.g., by the netlister) a package top level netlist.

Referring also to FIGS. 49, 50, and 51, example netlists (e.g., package top level netlist 4900, IC netlist 5000, and stitched netlist 5100) generated using the distributed EDA in accordance with embodiments of the present disclosure are shown. The IC netlist 5000 may include an electrical model file (and/or a link to the file) 5002. The stitched netlist 5100 may include a link 5102 to the IC netlist and/or include the IC netlist itself.

The netlisting process 4800 may additionally include initializing (4808) (e.g., by new code) a container (if not yet done). Furthermore, the netlisting process 4800 may include iterating (4810) (e.g., by the new code) along the netlist generation view schematic. Moreover, the netlisting process 4800 may include launching (4812) (e.g., for each instance) an EDA session (if not yet done). Further, the netlisting process 4800 may include sending (4814) (e.g., for each instance) a message to a corresponding EDA session to open a corresponding netlist generation view. Also, the netlisting process 4800 may include sending (4816) a message to the corresponding EDA session to netlist out (e.g., as the netlist generation view may be preset for this operation). Additionally, the netlisting process 4800 may include retrieving (4818) all generated netlist names and include them in the package netlist. For example, when an EDA sub-process has completed generating the netlist, the EDA sub-process may send the name of the netlist back to a corresponding calling process. In some embodiments, the launching (4812), sending (4814), and sending (4816) operations may be performed in parallel.

Referring now to FIG. 52, a flowchart depicting an embodiment consistent with DIA process 5200 for creating netlists in parallel from DIA is provided. The process (or method) 5200 described herein may include one or more of the techniques, features, and/or operations described above. The process 5200 may include receiving (5202), using at least one processor, at least a portion of an electronic design. The process 5200 may further include automatically prompting (5204) a user for a library location indicating where to create an exported die schematic and a netlist generation view based upon, at least in part, the portion of the electronic design. The process 5200 may also include automatically generating (5206) the exported die schematic (e.g., exported or abstract die schematic 4306) and the netlist generation view (e.g., netlist generation view 4700).

One or more of the following features may be included. The process 5200 may include isolating (5208) the exported die schematic from at least one package library. The process 5200 may further include isolating (5210) the exported die schematic from at least one die library. The netlist generation view (e.g., netlist generation view 4700) may include a name of the exported die schematic and the name may correspond to at least one of a library, a cell, and a view. The netlist generation view may also include a name of an electrical model library. The process 5200 may also include annotating (5212) an exported die symbol (e.g., exported or abstracted die symbol 4402) and a layout associated with at least one of the exported die schematics (e.g., exported or abstract die schematic 4306) and the netlist generation view (e.g., netlist generation view 4700). The process 5200 may additionally include generating (5214) a plurality of IC netlists in parallel based upon, at least in part, the netlist generation view (e.g., netlist generation view 4700) that was automatically generated. Furthermore, the process may include automatically stitching (5216) at least one of the plurality of IC netlists (e.g., IC netlist 5000) with a package netlist (e.g., package top level netlist 4900) (e.g., to create stitched netlist 5100). The generating of the plurality of the IC netlists may be based upon, at least in part, a plurality of DIA.

Thus, using the techniques and features described herein, an export die process (with an exported schematic) may automatically create a configuration file based on user inputs. Further, the export die process may generate (e.g., automatically create) an EDA simulation netlist generation view (which may be preconfigured) based on user inputs. Also, the export die process may populate the exported die symbol with properties such as name associated with a library, cell, and/or view of the netlist generation view. An exported die schematic may be isolated, which may prevent a package netlister from proceeding further than the exported die symbol. Additionally, the netlister may netlist a current level and traverse die instances of the current level, which may include retrieving a name associated with a library, cell, and/or view of the netlist generation view, sending a message to launch netlist generation within a corresponding EDA session and perform netlisting, and retrieving the name of the generated netlist. Different IC netlists may be created in parallel and may be preconfigured for EDA simulation. Furthermore, the netlister may stitch different pieces of the netlist together (e.g., stitch an IC netlist within the package netlist).

DIA Processes 6000 and 6300—Opening Databases in DIA

In some embodiments, the distributed EDA may include a methods or processes for opening databases in DIA (e.g., DIA processes 6000 as shown in FIGS. 60 and 6300 as shown in FIG. 63). The DIA processes 6000 and/or 6300 may include one or more of the techniques, features, and/or operations described below.

Referring to FIG. 53, a representation of a complete layout 5300 open in the EDA is shown. The layout 5300 may include a top layout 5302 and one or more block layouts (e.g., block layout 5304). The layout 5300 may be a large layout having such size that it may not fit within a memory of a computer or system running an associated EDA process.

Referring to FIG. 54, a representation of a partial layout 5400 (e.g., corresponding to the layout 5300) open in the EDA is shown. The layout 5400 may include a top layout 5402 and one or more block layouts (e.g., block layout 5404). Because the complete layout 5300 is so large, a corresponding partial layout 5400 may be opened in the EDA where only some components of the complete layout 5300 are loaded (e.g., block layout 5404). This may prevent a user from seeing the complete layout (e.g., complete layout 5300) as the EDA may not load, for example, the bottom block instances of the layout shown in 5400 and may only display boundaries of the bottom block instances (e.g., block boundary or contour 5406).

Referring to FIG. 55, example architectures 5500 and 5520 for opening large databases within DIA are shown. As indicated by the architecture 5500, a complex layout block (shown as block layout) may be abstracted (e.g., shown as block abstract) by the EDA. In other words, an abstraction of the complex layout may be created, which may allow for a corresponding database to be smaller by orders of magnitude. Further, a top layout with layout blocks may be abstracted (e.g., shown as top layout with abstracted blocks). In other words, a top layout instantiating abstracted blocks may be created by the EDA. Opening the top layout with the abstracted blocks may require less memory as the blocks are abstracted. As large designs may exceed a capacity (or available capacity) of a computer or system running the EDA (e.g., a server), the distributed EDA may abstract hierarchical top blocks, and open a corresponding block layout within a sub-process, as if they were different fabrics. Further, the distributed EDA may open a top layout within a top EDA process and open the sub-blocks within EDA sub-processes. At rendering time, the different processes may create one pixmap at a time that may be interleaved together with top level pixmaps. As indicated by the architecture 5520, the distributed EDA executable may be launched (e.g., distributed EDA executable containers). The distributed EDA executable may launch one EDA session per abstracted block and may open the corresponding block layout that may be overlaid on the top layout window.

Referring to FIG. 56, an example abstraction associated with the distributed EDA according to an embodiment of the present disclosure is shown. In some embodiments, the distributed EDA (e.g., via a process for opening databases) may perform a block layout abstraction. For example, a block layout 5602 may be abstracted, which may result in a block abstraction 5604 including one or more block abstract pins (e.g., block abstract pin 5606). Referring to FIG. 57, an example layout associated with the distributed EDA according to an embodiment of the present disclosure is shown. In some embodiments, the distributed EDA (e.g., via a process for opening databases) may create a top-level layout instantiating one or more block abstracts. For example, a top layout 5700 may be created and may include one or more block abstracts (e.g., block abstract 5702). Referring to FIG. 58, an example DIA capability associated with the distributed EDA according to an embodiment of the present disclosure is shown. For example, the distributed EDA may invoke a DIA capability that may open one or more block layouts 5802 in an EDA session or additional EDA sessions. Further, one or more block layout pixmap IDs may be transferred from the additional EDA sessions or processes.

Referring to FIG. 59, an example partitioning process associated with the distributed EDA according to an embodiment of the present disclosure is shown. Partitioning may refer to dividing a design (e.g., a relatively large design) into smaller portions such that different EDA sessions may host the smaller portions of the design (and more easily manage interacting with corresponding databases) rather than one EDA session hosting the entire design. For example, a large IC may be split into smaller portions which may be abstracted such that a top EDA session may only open a top portion corresponding to the IC (e.g., abstracts of the top portion of the IC). A sub-EDA session may be opened and a sub-layer (e.g., another portion of the IC) may be opened. Thus, instead of opening the complete IC design in one EDA session (e.g., on one machine), the distributed EDA may open the complete IC design from different EDA sessions (e.g., on different machines), which may allow for faster opening of the IC design.

The partitioning process 5900 may be used facilitate opening databases or large databases as described herein. The partitioning process 5900 may include invoking (5902) (e.g., by the distributed EDA or by a user via the distributed EDA) a block abstractor. The block abstractor may move a block layout to a separate library accessible from a separate working directory or to a separate disk to (e.g., to speed up opening). The partitioning process 5900 may further include instantiating (5904) (e.g., by the distributed EDA or by a user via the distributed EDA). The partitioning process 5900 may also include invoking (5906) (e.g., by the distributed EDA or by a user via the distributed EDA) the DIA capability (e.g., as described above), which may open block layouts in parallel on different machines (e.g., to avoiding a hardware capacity limit and speed up opening as the block layouts may be opened in parallel).

Referring now to FIG. 60, a flowchart depicting an embodiment consistent with DIA process 6000 for opening large databases in DIA is provided. The process (or method) 6000 included herein may include one or more of the techniques, features, and/or operations described above. The process may include receiving (6002), at a graphical user interface, a request to access an electronic design layout. The process may further include receiving (6004) a block abstractor command configured to associate an electronic design layout with a separate library accessible from a separate working directory. The process may also include instantiating (6006) one or more block abstracts (e.g., block abstract 5702) at a top layout (e.g., top layout 5700). The process may additionally include opening (6008), in parallel, a first block layout (e.g., block layout 5802) on a first computing device and a second block layout (e.g., block layout 5804) on a second computing device.

One or more of the following features may be included. The process may include receiving (6010) one or more pixmap identifications from a secondary EDA process. The process may further include abstracting (6012) at least one of the first and second block layouts (e.g., block layouts 5802 and/or 5804), wherein the at least one of the first and second block layouts is associated with the electronic design layout. The process may also include generating (6014) the top-level layout (e.g., top layout 5700) instantiating the one or more block abstracts (e.g., block abstract 5702). At least one of the one or more block abstracts (e.g., block abstract 5604) may include a block abstract pin (e.g., block abstract pin 5606). Further operations related to partitioning and/or opening databases are described below.

The partitioning features and operations described above (e.g., partitioning process 5900 and/or DIA process 6000) may be used, at least in part, to perform vertical partitioning. In some embodiments, horizontal partitioning may also be performed. Referring to FIG. 61, an example partitioning associated with the distributed EDA according to an embodiment of the present disclosure is shown. FIG. 61 may illustrate an example of horizontal partitioning associated with an IC component 6100 that may have hundreds (or in some cases, thousands) of layers. The IC component 6100 may be include overlapping instances, each of which may use a defined set of layers. For example, the IC component 6100 may include an instance 6102 (which may use, e.g., defined layers 1-500), an instance 6104 (which may use, e.g., defined layers 501-1000), and an instance 6106 (which may use, e.g., defined layers 1001-1500).

In some embodiments, instead of creating a large technology file (e.g., corresponding to the IC component 6100) with, for example, 1500 defined layers, a partitioning process (e.g., horizontal) may define three different technology files, each with 500 defined layers. Creating a hierarchical layout may start at a bottom level and a cell view only including shapes (e.g., a leaf cell view may be created). Within a hierarchical cell view, an instance of the leaf cell view may be created, or an instance of another hierarchical cell view may be created. The master of an instance may be the cell view that the instance is instantiating. The partitioning process may create the instance 6102 (master) with a first technology file, the instance 6104 (master) with a second technology file, and the instance 6106 (master) with a third technology file. The instances (masters) may be abstracted and a top-level layout instantiating the abstracts may be created. Further, the DIA capability described above may be launched/invoked to view the complete IC component/system.

Referring now to FIG. 62, an example partitioning process 6200 (e.g., horizontal) associated with the distributed EDA according to an embodiment of the present disclosure is shown. The partitioning process may include invoking (6202) (e.g., by a user via the distributed EDA) a tool to split a technology file. The partitioning process may further include creating (6204) (e.g., by the user via the distributed EDA) a different master corresponding to a different technology file (or different masters each corresponding to a different technology file). The partitioning process may also include invoking (6206) (e.g., by the user via the distributed EDA) a block abstractor. The partitioning process may additionally include instantiating (6208) (e.g., by the user via the distributed EDA) one or more block abstracts in a top layout. Furthermore, the partitioning process may invoke (6210) (e.g., by the user via the distributed EDA) the DIA capability.

Referring now to FIG. 63, a flowchart depicting an embodiment consistent with DIA process 6300 for opening large databases (e.g., using partitioning as described herein) in DIA is provided. The process (or method) 6300 included herein may include one or more of the techniques, features, and/or operations described above. The process 6300 may include receiving (6302), at a graphical user interface, a request to split an initial technology file associated with an electronic design. The process may further include generating (6304) a master technology file with a plurality of subfiles based upon, at least in part, the initial tech file. The process may also include receiving (6306) a block abstractor command (e.g., from the user via the distributed EDA) configured to associate an electronic design layout with a separate library accessible from a separate working directory. The process may additionally include instantiating (6308) one or more block abstracts (e.g., block abstract 5702) at a top layout (e.g., top layout 5700). Furthermore, the process may include opening (6310), in parallel, a first block layout (e.g., block layout 5802) on a first computing device and a second block layout (e.g., block layout 5804) on a second computing device.

One or more of the following features may be included. The initial technology file may include a number of layers. Each of the plurality of subfiles may include a subset of the number of layers. The process may include abstracting (6312) at least one of the first and second block layouts (e.g., block layout 5802 and/or (e.g., block layout 5804), wherein the at least one of the first and second block layouts is associated with the electronic design layout. The process may also include generating (6314) the top-level layout (e.g., top layout 5700) instantiating the one or more block abstracts (e.g., block abstract 5702).

Thus, using techniques and features of described herein, one or more operations for partitioning, (e.g., one of more of partitioning processes 5900, 6200, DIA process 6000, and/or DIA process 6300) may be used to facilitate opening databases or large databases (e.g., in parallel on separate machines). In other words, using the partitioning processes described herein, databases related to layouts may be stored on and/or opened from separate machines or disks via separate processes or sessions.

DIA Process 7700—Overlaying a Canvas from DIA

In some embodiments, the distributed EDA may include a method or process for overlaying a canvas from DIA (e.g., DIA process 7700 as shown in FIG. 77). The DIA process

7700 may include one or more of the techniques, features, and/or operations described below.

Referring to FIG. 64, a pixmap 6400 is shown. A pixmap may be a map or array of pixels. For example, a pixmap (or pixel map) may be a grid of pixels where one or more of the pixels include color. Thus, a pixmap may represent an image or graphic as an array of colors or color values. Some applications may define pixmaps programmatically or use pixmap objects, which may include various attributes or properties including, but not limited to: a number of bits per pixel, color (e.g., as indicated by a color vector or matrix), content (e.g., the pixel values), a name, a height, and a width. The pixmap 6400 may be a 2×3 pixmap. Referring to FIG. 65, an example transparent or uncolored pixel 6500 is shown. As discussed herein, a transparent or uncolored pixel (e.g., transparent or uncolored pixel 6500) may be marked with diagonal stripes.

The EDA may redraw a layout canvas and create a pixmap. Referring to FIG. 66, an example pixmap 6600 created by the EDA is shown. In some embodiments, the pixmap 6600 may be created within Xserver memory rather than EDA memory. The EDA may create the pixmap with a black background 6602 and may include a layout 6604 of a fabric. The pixmap may have a universal identification (ID). The same pixmap can thus be reached from different processes (e.g., via the ID).

Referring to FIG. 67, an example of pixmap polishing by the distributed EDA according to an embodiment of the present disclosure is shown. In some embodiments, pixmap polishing may include setting a background 6702 of a pixmap 6700 as a transparent or uncolored pixmap 6704. Referring to FIG. 68 an example of pixmap merging by the distributed EDA according to an embodiment of the present disclosure is shown. For example, the pixmap 6800 may be merged with the pixmap 6802 to create a merged pixmap 6804. Referring to FIG. 69, an example of setting merged pixmaps as a background of a current pixmap by the distributed EDA according to an embodiment of the present disclosure is shown. Referring to FIG. 70, an example of drawing a current design on top of a background by the distributed EDA according to an embodiment of the present disclosure is shown.

Referring to FIG. 71, an example architecture (7100) for file-based pixmap overlay by the distributed EDA according to an embodiment of the present disclosure is shown. The architecture 7100 may (via a zoom/pan trigger) allow a layout canvas to be in synch. When a current process redraws the layout canvas, recursive calls to children may be made to get pixmaps, which may be saved on disk. All pixmaps may be redrawn. Further, a current fabric may be redrawn. For example, a top EDA session may display a package layout and two bottom sessions may display two different IC layouts. Assume for illustrative purposes that a user is currently interacting with the top EDA session (e.g., a package EDA session). If the user requests the package EDA session to redraw a layout canvas, the package EDA session may send a message to one or more child EDA sessions to expose the dies and to save pixmaps of the corresponding layouts in a file. The package EDA session may then open the saved file and overlay the corresponding package canvas with the content of the file. It may take time to save the pixmap file and/or perform related operations described above.

Referring to FIG. 72 (7200), an example architecture for server-based pixmap overlay by the distributed EDA according to an embodiment of the present disclosure is shown. The architecture 7200 may allow for saving pixmaps on a server (e.g., an Xserver) via shared memory. For example, when the EDA redraws a canvas, it may fill a pixmap within the XServer. That pixmap may have a universal ID. In the architecture 7200, when a distributed EDA session for a package (e.g., similar to the package EDA session described above with respect to architecture 7100, referred to as the package distributed EDA session) redraws a corresponding layout canvas, the package distributed EDA session may request the one or more child EDA sessions hosting the die layout to redraw the corresponding layouts. The child EDA sessions may then redraw the corresponding layouts and send back the universal ID of a created pixmap. The package distributed EDA session may then access the pixmap from the universal ID and overlay the pixmap within the corresponding layout canvas.

Referring to FIG. 73, an example an overlaying canvas (from DIA) process (7300) of the distributed EDA in accordance with the present disclosure is shown. The overlaying canvas process 7300 may include one or more operations as shown in FIG. 73. For example, the process 7300 may include requesting (7302) (e.g., by the user or automatically) a current process canvas redraw. The process 7300 may further include automatically getting (7304) a canvas dimension. For example, to make sure that all pixmaps have the same dimension, it may be necessary to get a pixmap dimension of a current canvas and apply the dimension to a subfabric canvas. The process 7300 may also include performing various operations automatically (7306), for each subfabric. For example, the process (7300) may additionally include getting (7308) a pixmap address and orientation. Furthermore, the process (7300) may include automatically adjusting (7310) a canvas dimension. For example, the process (7300) may set the canvas dimension as the current canvas dimension and rotate the canvas if a fabric abstract is rotated in a current EDA process canvas. Moreover, the process (7300) may include automatically redrawing (7312) the same area. For example, the process (7300) may redraw the same design area as within the current process. It should be noted that this operation may not entirely correspond to the current process, and thus the redraw may only redraw the current fabric. Further, the process (7300) may include automatically resetting (7314) canvas dimensions.

The process (7300) may also include automatically polishing (7316) pixmaps (e.g., as shown in FIG. 67), which may be necessary for pixmap merging. The process (7300) may additionally include automatically merging (7318) pixmaps (e.g., as shown in FIG. 68). Further, the process (7300) may include automatically setting (7320) a merged pixmap as a background (e.g., as shown in FIGS. 69 and 74, illustrating an example of setting merged pixmaps as a background of a current pixmap). Also, the process (7300) may include automatically redrawing (7322) a current fabric (e.g., as shown in FIGS. 70 and 75, illustrating an example of drawing a current package design on top of a background).

In some embodiments, a system may include more than one level of hierarchy and the overlaying canvas process (7300) may be recursive. Once the overlaying canvas process (7300) has collected a pixmap of a level N-1 fabric, the overlaying canvas process (7300) may automatically look for a level N-2 fabric, a level N-3 fabric, etc. The pixmap overlay may also operate from top to bottom. For example, when the current process displays a subfabric, the overlaying canvas process (7300) may operate up the system hierarchy to collect a pixmap of the "up fabrics" (e.g., fabrics up the system hierarchy) and display them accordingly. For example, referring to FIG. 76 (illustrating an example of drawing a current power management integrated circuit (PMIC) design on top of a background), a PMIC layout in the context of a package layout is shown.

Referring now to FIG. 77, a flowchart depicting an embodiment consistent with DIA process 7700 for overlaying a canvas from DIA is provided. The process (or method) 7700 included herein may include one or more of the techniques, features, and/or operations described above. The process 7700 may include receiving (7702), using at least one processor, a request to redraw a current process at an electronic design canvas. The process 7700 may further include determining (7704) a dimension of the canvas. The process 7700 may also include automatically obtaining (7706) a pixmap identifier for each subfabric. The process 7700 may additionally include automatically displaying (7708) a first pixmap corresponding to the pixmap identifier on the canvas.

One or more of the following features may be included. The process 7700 may include automatically obtaining (7710) a dimension of the canvas. The process 7700 may further include automatically polishing (7712) the first pixmap (e.g., as shown in FIG. 67). The process 7700 may also include automatically merging (7714) the first pixmap with a second pixmap to create a merged pixmap (e.g., as shown in FIG. 68). The process 7700 may additionally include automatically setting (7716) the merged pixmap as a background on the canvas (e.g., as shown in FIGS. 69 and 74). Furthermore, the process 7700 may include automatically redrawing (7718) a current fabric on top of the background (e.g., as shown in FIGS. 70 and 75). Moreover, the process 7700 may include obtaining (7720) an address and orientation of the first pixmap corresponding to the pixmap identifier. Further, the process 7700 may include applying (7722) the dimension of the canvas to a subfabric canvas. Also, the process 7700 may include automatically adjusting (7724) a subfabric canvas dimension corresponding to the dimension to produce an adjusted subfabric canvas. Additionally, the process 7700 may include automatically redrawing (7726) a subfabric within the adjusted subfabric canvas.

Thus, using the techniques and features of described herein, an overlaying canvas process may display a pixmap created by other processes in the background of the current process canvas by passing a pixmap ID from one process to another process. The overlaying canvas process may support one or more (or all) geometric transforms including, but not limited to rotation, location, flip state, and/or scaling. Further, the processes described herein may run on different machines.

DIA Process 7900—Editing Fabrics within DIA

In some embodiments, the distributed EDA may include methods or processes for editing fabrics within DIA (e.g., DIA processes 7900 and 8100 and as shown in FIGS. 79 and 81, respectively). The DIA processes 7900 and 8100 may include one or more of the techniques, features, and/or operations described below.

While embedding a subfabric (e.g., corresponding to an IC) within a fabric (e.g., corresponding to a package), it may often be necessary to move subfabric inputs/outputs to facilitate routing within the fabric. From a fabric editing platform, inputs/outputs may be moved within a subfabric footprint, which may then be out-of-synchronization with a subfabric layout. Further, when a fabric designer is working on a fabric layout, it may be necessary to move an input/output within the subfabric layout, which may also create an out-of-synchronization situation. An editing capability (e.g., an EIC capability) may be used to maintain synchronization of the subfabric layout with respect to the subfabric footprint (and vice versa). However, in a distributed EDA, any single EDA process of the distributed EDA may only have access to one fabric. For example, a fabric (e.g., corresponding to a package) EDA process may have access to a subfabric (e.g., corresponding to an IC) footprint but may not have access to a subfabric (e.g., corresponding to the IC) layout. A footprint may be an abstraction of a die. For example, a die footprint may be an abstracted die created by a die exporter and a package footprint may be an abstracted package created by a package exporter. The footprint may include corresponding inputs/outputs and a boundary.

An exported die abstract may typically include an abstraction of a die layout, which may include a die boundary and a corresponding die input-output (IO) location. The abstracted die IO may be located at the same place as the die layout IO. If a die abstract IO is moved, it may not be placed at the same location as within the die layout. Thus, it may no longer correspond the die layout. Referring to FIG. 78, an example architecture (7800) for editing fabrics by the distributed EDA according to an embodiment of the present disclosure is shown. The architecture 7800 may allow moving an input-output (IO) in a die abstract. For example, a current fabric may be a package and a user may select and move an IO within the die abstract. A message may be sent (e.g., by a message passing system) to a corresponding child process. The child process may move a corresponding die layout IO, which may be based on a current die abstract IO to die layout IO binding. In other words, the distributed EDA may allow moving the die abstract IO and the die layout IO together such that if the user moves an IO within the die abstract from the EDA session hosting the package layout (e.g., a top EDA session 7802), a message is sent to a bottom EDA session (e.g., EDA session 7804) to move the corresponding IO within the die layout.

Referring now to FIG. 79, a flowchart depicting an embodiment consistent with DIA process 7900 for editing fabrics (e.g., corresponding to footprints) within DIA is provided. The process 7900 may include receiving (7902), at a graphical user interface, a selection (e.g., by as user and/or as indicated by reference numeral 8002 of FIG. 80) of an input-output within a subfabric footprint (e.g., subfabric footprint 8000). The process may further include receiving (7904), at the graphical user interface, a user input to move (e.g., as indicated by reference numeral 8004 of FIG. 80) the selected input-output. The process may also include automatically determining (7906) a relative geometric transform between a fabric and a subfabric. Transform may refer to a corresponding location, orientation, flipping, and/or scaling, which may be required for placing a die within a package. The process may additionally include sending (7908) a message to a subfabric process to move a corresponding input-output based upon, at least in part, the relative geometric transform. Furthermore, the process may include automatically moving (7910) (e.g., as indicated by reference numeral 8012 of FIG. 80) the corresponding input-output (e.g., in a subfabric layout 8010) associated with the subfabric process.

One or more of the following features may be included. The relative geometric transform may be based upon, at least in part, an orientation of the input-output. The relative geometric transform may be based upon, at least in part, a location of the input-output. The relative geometric transform may be based upon, at least in part, a scaling associated with the input-output. The relative geometric transform may be based upon, at least in part, a flipping of the input-output.

The fabric may be a package fabric. The process may include allowing (7912) a user to select an edit option at the graphical user interface.

Referring now to FIG. 81, a flowchart depicting an embodiment consistent with DIA process 8100 for editing fabrics (e.g., corresponding to layouts) within DIA is provided. The process 8100 may include receiving (8102), at a graphical user interface, a selection (e.g., by a user and/or as indicated by reference numeral 8202 of FIG. 82) of an input-output within a subfabric layout (e.g., subfabric layout 8200). The process may further include receiving (8104), at the graphical user interface, a user input to move (e.g., as indicated by reference numeral 8204 of FIG. 82) the selected input-output. The process may also include automatically determining (8106) a relative geometric transform between a subfabric and a fabric. The process may additionally include sending (8108) a message to a fabric process to move a corresponding input-output based upon, at least in part, the relative geometric transform. Furthermore, the process may include automatically moving (8110) (e.g., as indicated by reference numeral 8212 of FIG. 82) the corresponding input-output (e.g., in a subfabric footprint 8210) associated with the fabric process.

One or more of the following features may be included. The relative geometric transform may be based upon, at least in part, an orientation of the input-output. The relative geometric transform may be based upon, at least in part, a location of the input-output. The relative geometric transform may be based upon, at least in part, a scaling associated with the input-output. The relative geometric transform may be based upon, at least in part, a flipping of the input-output. The fabric may be a package fabric. The method may include allowing (8112) a user to select an edit option at the graphical user interface.

Thus, using the techniques and features of described herein, a process for editing fabrics (e.g., corresponding to footprints and/or layouts) may automatically maintain, in synchronization, two different databases (e.g., corresponding to fabric layout and fabric footprint) loaded in two different applications during input-output editing, while accounting for relative fabric orientation, location, scaling, and/or flipping.

DIA Process 8800—Cross-Probing Between DIA

In some embodiments, the distributed EDA may include a method or process for cross-probing between DIA (e.g., DIA process 8800 as shown in FIG. 88). The DIA process 88 may include one or more of the techniques, features, and/or operations described below.

An EDA may include one or more highlighting methods including object-based highlighting and phantom based highlighting. With object-based highlighting, the EDA may highlight a contour of an object that exists in a database. For example, the EDA may include an object application programming interface (API) (e.g., geAddHilightFig( )) that may expect an object. With phantom-based highlighting, the object may not exist in the database. Thus, the EDA may need to specify a type and contour of a phantom. For example, the EDA may include a contour API that may expect a contour of, e.g., a polygon (e.g., geAddHilight-Polygo) or a rectangle (e.g., geAddHilighRectangle). Probing a net (which may be referred to as probing) may include highlighting one or more shapes assigned to the net as well as one or more holes in between those shapes.

Referring to FIG. 83, example databases and shapes associated with the EDA of the present disclosure are shown. A database 8300 may include a shape 8302 and a shape 8304. A redraw 8310 (e.g., in an EDA canvas) of the database 8300 may also include the shapes 8302 and 8304 (or instantiations of those shapes). Further, the redraw 8310 of the database 8300 may highlight the shape 8304 and the phantom shape 8304A. For example, four shapes 8330 may be assigned to net a with a hole and may be highlighted (e.g., as indicated by reference numeral 8330A on the lower right of FIG. 83).

Referring to FIG. 84, example fabric layouts associated with the EDA of the present disclosure are shown. FIG. 84 shows a redraw 8400 of a top fabric (e.g., corresponding to a package) layout without a subfabric (e.g., corresponding to an IC) layout. Further, FIG. 84 shows a redraw 8410 of the top fabric (e.g., corresponding to the package) layout without the subfabric (e.g., corresponding to the IC) layout, highlighting a net (e.g., as indicated by reference numeral 8412). FIG. 84 also shows a redraw 8420 of the top fabric (e.g., corresponding to the package) layout with the subfabric (e.g., corresponding to the IC) layout (e.g., as indicated by reference numeral 8422). FIG. 84 additionally shows a redraw 8430 of the top fabric (e.g., corresponding to the package) layout with the subfabric (e.g., corresponding to the IC) layout (e.g., as indicated by reference numeral 8432), highlighting a net (e.g., as indicated by reference numeral 8434). Shapes within the subfabric (IC) layout (e.g., indicated by reference numeral 8432) may not be highlighted as they may belong to another database opened within another EDA process.

As discussed above, probing may include highlighting shapes assigned to a net across a design hierarchy. Probing may only work for shapes within a current fabric. Referring to FIG. 85, an example architecture for cross-probing (e.g., cross-fabric connectivity probing) associated with the distributed EDA according to an embodiment of the present disclosure is provided. Cross-fabric connectivity probing may include probing net shapes within the current fabric, retrieving one or more subfabric abstract pins and pin names, and sending a message to a subfabric process to collect shapes assigned to the pin net by sending one or more pin names. The subfabric process may include retrieving a pin from the pin name, retrieving a net from the pin, collecting shapes assigned to the net, and returning sanitized shapes. The current fabric process may virtually highlight the sanitized shapes.

For example, as indicated by FIG. 85, a user may request to probe a net (e.g., highlight all the shapes of the net). The EDA may then automatically highlight (e.g., probe) all the shapes of the net. Once the net is probed, the distributed EDA may determine whether an instance connected to the net corresponds to a different fabric instance and the distributed EDA may retrieve an instTerm (instance terminal) corresponding to the instance connected to the net. Using the instTerm, the distributed EDA may retrieve a name of the terminal and send a message to the EDA session hosting the fabric to retrieve shapes (or shape information) related to the terminal name (or pin name). The shapes may not all correspond to the top EDA session and in order to send the shapes to the top EDA session, the shapes may need to be sanitized. The distributed EDA may then sanitize the shapes and send corresponding shape information back to the top (e.g., original) EDA session. The term sanitize may refer to one or more operations including, but not limited to: determining whether various attributes of (or data corresponding to) a shape (or other design object) are represented in code, files, or metadata (or the like) associated with the shape or object; retrieving corresponding attributes or data associated with the shape that may not be represented in the code (or files, metadata, etc.) which may be useful or necessary for further operations to be performed using the shape; and adding the corresponding attributes or data to the code (or files, metadata, etc.) such that further operations may be performed using the shape. Referring to FIG. 93, code module 9300 may be representative of an un-sanitized shape. To sanitize the shape corresponding to code module 9300, one or more processes described herein may perform one or more of the operations of: determining whether various attributes (e.g., library name, cell name, view name, property names or attributes, net name, etc.) of the shape are represented in code module 9300; retrieving one or more of the attributes (e.g., library name, cell name, view name, property names or attributes, net name, etc. from, for example, a database) of the shape that may not be represented in code module 9300; and adding the attributes (e.g., library name, cell name, view name, property names or attributes, net name, etc.) to code module 9300 (e.g., as shown in code module 9302, which may represent a sanitized shape). Further, the distributed EDA may then highlight the sanitized shapes in the top EDA session, which may be referred to as virtually highlighting the shapes.

Referring to FIG. 86, an example cross-probing process (8600) associated with the distributed EDA according to an embodiment of the present disclosure is shown. The process (8600) may include selecting (8602) (e.g., by a user) a net to probe and invoking a probe command. The process (8600) may further include automatically "object-based" highlighting (8604) (e.g., by the distributed EDA) a shape of the net belonging to a current process database (e.g., as shown by redraw 8430 of FIG. 84). The process (8600) may further include automatically getting (8606) (e.g., by the distributed EDA) net instTerms. The process (8600) may further include automatically getting (8608) (e.g., by the distributed EDA) net instTerms name and instTerms instance. For example, a cell view may have terminals and when a cell view is instantiated, an instance of that cell view may be created such that each terminal of the cell view corresponds to an instTerm on the instance. The instTerms on the instance may be connected to a net and the net, instTerms, and corresponding terminals may represent logical connectivity.

The process (8600) may additionally include automatically sending (8610) (e.g., by the distributed EDA) a message to EDA process(es) storing a layout of an instance and requesting sanitized shapes of a corresponding terminal name. Furthermore, the process (8600) may include receiving (8612) the message and finding (e.g., by an EDA process) the corresponding terminal from the terminal name and the net from a corresponding terminal. Moreover, the process (8600) may include sending back (8614) (e.g., by the EDA process) the sanitized shapes to a calling process (e.g., of the distributed EDA). Further, the process (8600) may include calculating (8616) (e.g., by the calling process), a physical transform to the instance and accounting for scaling, orientation, location, and/or flipping. Also, the process (8600) may include "phantom-based" highlighting (8618) (e.g., by the calling process) the sanitized shapes.

Referring to FIG. 87, an example fabric layout associated with the distributed EDA according to an embodiment of the present disclosure is shown. FIG. 87 shows an example of the phantom-based highlighting in the redraw 8700 of the top fabric (e.g., corresponding to the package) layout with the subfabric (e.g., corresponding to the IC) layout (e.g., as indicated by reference numeral 8702), highlighting the net (e.g., as indicated by reference numeral 8704). Further, as indicated by reference numerals 8706, 8708, and 8710, the shapes within the subfabric may be highlighted.

Referring now to FIG. 88, a flowchart depicting an embodiment consistent with DIA process 8800 for cross-probing between DIA is provided. The process included herein may include receiving (8802), using a processor, at least a portion of an electronic design associated with a current electronic design process. The process may further include receiving (8804), at a graphical user interface, a selection of a net of the electronic design to probe. The process may also include automatically highlighting (8806), at the graphical user interface, one or more shapes associated with the net (e.g., shapes 8706, 8708, and 8710 of FIG. 87). The process may additionally include automatically retrieving (8808) one or more pins and pin names associated with a subfabric associated with the net. Furthermore, the process may include sending (8810) a request to a subfabric process for one or more shapes associated with the pin names. Moreover, the process may include receiving (8812) one or more sanitized shapes from the subfabric process. Further, the process may include displaying and emphasizing (8814) the one or more sanitized shapes at the graphical user interface.

One or more of the following features may be included. The process may include retrieving (8816) the one or more pins and pin names from a first database. The process may further include retrieving (8818) the one or more sanitized shapes from a second database, wherein the first and second database are different. The first database may be a package layout database and the second database is an IC layout database. The displaying and emphasizing may occur only at the graphical user interface. The process may also include calculating (8820) a physical transformation of the one or more sanitized shapes. The process may additionally include determining (8822) the one or more sanitized shapes by retrieving a pin from a pin name, retrieving a net from the pin, and collecting shapes assigned to the net.

Thus, while cross-process highlighting may include highlighting the same objects in processes (e.g., two processes may open different representations of the same database and highlight the same object, net or instance), using the techniques and features described herein, the two processes may not open different representations of the same database but rather may open two different databases (e.g., a package layout database and an IC layout database). Further, using the techniques and features described herein, highlighting may only be performed in a calling platform (e.g., by virtually highlighting sanitized shapes returned by the calling process), rather than being performed in both platforms. DIA Process 9500—Cross-Querying Between DIA In some embodiments, the distributed EDA may include a method or process for cross-querying between DIA (e.g., DIA process 9500 as shown in FIG. 95). The DIA process 95 may include one or more of the techniques, features, and/or operations described below.

An EDA may include capabilities or commands (e.g., dbProduceOverlap) to query shapes within a user specified boundary box (bBox) of a cell view. The user may specify a bBox of interest, as well as layers of interest and a hierarchical depth of the query. The EDA may return a list of shape IDs and the user may access corresponding shape attributes using an operator (e.g., using the "~>" operator such as "shapeId~>?"). Referring to FIG. 89, an example shape query, shape ID, and/or shape ID structure associated with the EDA according to an embodiment of the present disclosure is shown. An object ID may be related to an object address and may be associated with an EDA process.

Referring to FIG. 90, an example graphical user interface 9000 associated with the EDA of the present disclosure is shown. The graphical user interface 9000 may be or may include a dynamic selection assistant 9002. The EDA may provide a feature to query shapes below a mouse cursor which may return shape IDs within a current fabric. For example, the dynamic selection assistant 9002 may display, within a tree, a list of objects below a mouse cursor (e.g., mouse cursor 9004). For example, the dynamic selection assistant 9002 may shows shapes within a current package fabric, but may not show shapes within a bottom left IC fabric as those shapes may belong to another EDA process (for example, displayed through pixmap sharing).

Referring also to FIG. 91, an example architecture (for cross-querying between DIA) associated with the distributed EDA according to an embodiment of the present disclosure is shown. A cross-fabric shape query may send a message to query shapes below a mouse cursor within subfabrics, which may account for a subfabrics transform (e.g., orientation, location, etc.). The query may return a list of sanitized shapes, shape attributes and properties, but may not return shape IDs. The list may be displayed in the dynamic selection assistant (e.g., dynamic selection assistant 9002).

For example, as indicated by FIG. 91, a user may query shapes in a subfabric. The distributed EDA may then send a message to each EDA session hosting a subfabric, for example, below a cursor of a mouse operated by the user. The message may include, for example, coordinate information (e.g., corresponding to shapes below the cursor). An EDA session hosting a subfabric may then query the shapes in the subfabric. Once corresponding shape information is received (e.g., for shapes below an adjusted mouse cursor), the shapes may be sanitized and sent back to the top (e.g., original) EDA session from which the shapes may be displayed. The user may then use the displayed shapes in the EDA.

Referring to FIG. 92 an example cross-querying process associated with the distributed EDA according to an embodiment of the present disclosure is shown. The process may include one or more of the following operations. The dynamic selection assistant (e.g., dynamic selection assistant 9002) may captures (automatically) (9202) a mouse cursor point (e.g., associated with mouse cursor 9004). The dynamic selection assistant may also display (automatically) (9204) current fabric shapes. The dynamic selection assistant may additionally automatically transform (9206) point to IC fabric coordinates (e.g., accounting for instance location, orientation, scaling, and/or flipping). Furthermore, the dynamic selection assistant may automatically request (9208) an IC-fabric EDA process to query sanitized shapes. Moreover, the IC-fabric EDA process may automatically query (9210) shapes under a transformed point. Further, the IC-fabric EDA process may automatically sanitize (9212) the queried shapes. For example, as an IC-fabric object ID may not be useful within a package, IC fabric shapes may be sanitized (e.g., as shown by module 9302 of FIG. 93). Also, the dynamic selection assistant may display (9214) the sanitized shapes below current fabric shapes (e.g., as indicated by reference numeral 9406 of FIG. 94).

Referring to FIG. 93 an example of shape sanitizing associated with the distributed EDA according to an embodiment of the present disclosure is shown. A module 9300 (e.g., a code module) may represent an un-sanitized shape. Further, the module 9300 (e.g., a code module) may represent a sanitized shape.

Referring to FIG. 94, another example graphical user interface 9400 associated with the distributed EDA according to an embodiment of the present disclosure is shown. The graphical user interface 9400 may be or may include a dynamic selection assistant 9402. The dynamic selection assistant 9002 may display, within a tree, a list of objects below a mouse cursor (e.g., mouse cursor 9004). The dynamic selection assistant may display sanitized shapes (e.g., subfabric (IC-fabric) shapes) below current fabric shapes (e.g., as indicated by reference numeral 9406).

Referring now to FIG. 95, a flowchart depicting an embodiment consistent with DIA process 9500 for cross-querying between DIA is provided. The process included herein may include causing (9502), at a graphical user interface, a display of a portion of the electronic design. The process may further include determining (9504) a location of a mouse cursor (e.g., mouse cursor 9404) at the graphical user interface (e.g., graphical user interface 9400). The process may also include automatically displaying (9506) at the graphical user interface (e.g., graphical user interface 9400) one or more shapes associated with a current fabric. The process may additionally include automatically performing (9508) a cross fabric shape query associated with the location of the mouse cursor (e.g., mouse cursor 9404). Furthermore, the process may include automatically displaying (9510) one or more cross fabric shapes (e.g., shapes 9406) at the graphical user interface (e.g., graphical user interface 9400).

One or more of the following features may be included. The process may include sanitizing (9512) the one or more cross fabric shapes (e.g., shapes 9406) prior to automatically displaying the one or more cross fabric shapes. The process may further include determining (9514) that a shape associated with a first fabric exists within a subfabric to avoid an electro-magnetic coupling conflict. The sanitizing may include providing a name of a net. The process may also include automatically transforming (9516) the location of the mouse cursor (e.g., mouse cursor 9404) to cross fabric coordinates. The automatically transforming may account for at least one of: an instance location, an instance orientation, and an instance scaling. The automatically transforming may account for whether an instance is flipped. The one or more cross fabric shapes may be displayed within a second graphical user interface. The second graphical user interface may be a dynamic selection assistant.

Thus, using the techniques and features described by the present disclosure, subfabric sanitized shapes may be extracted from a subfabric EDA process below the mouse cursor and the sanitized shapes may be displayed within the graphical user interface (e.g., the dynamic selection assistant). Further, the sanitized shapes may also be used for other purposes including, but not limited to, checking that a top-level metal layer shape does not exist within a subfabric at a location (e.g., as an example to avoid electro-magnetic coupling with the top-level fabric shape), and cross-probing as described above (e.g., DIA process 8800).

DIA Process 10400—Configuration and Access in DIA

In some embodiments, the distributed EDA may include a method or process for configuration and access in DIA (e.g., DIA process 10400 as shown in FIG. 104). The DIA process 104 may include one or more of the techniques, features, and/or operations described below.

A distributed EDA may operate more smoothly and/or efficiently with access to reference layouts to request pixmaps, display content of die layouts, etc. Referring back to FIG. 13, an example layout 1300 and abstract 1302 associated with the distributed EDA in accordance with the present disclosure is shown. The layout 1300 may be a die layout corresponding to an integrated circuit (IC). The abstract 1302 may be a die abstract corresponding to the IC. As discussed above, process 1200 may create the (IC) abstract

1302 from the (IC) layout 1300. The abstract 1302 may be created using an export die feature of the distributed EDA. Further, referring back to FIG. 14, an example package schematic 1400 and package layout 1402 associated with the distributed EDA in accordance with the present disclosure are shown. The package layout 1402 may be an abstract and may be an example of an exported die abstract within a package layout.

Referring to FIG. 96, example graphical user interfaces 9600, 9610, and 9620 associated with the EDA according to an embodiment of the present disclosure are shown. The graphical user interfaces 9600, 9610, and 9620 may illustrate an example of defining database locations associated with an abstract view. The graphical user interface 9600 may display the package layout 1402 of FIG. 14 including a die footprint 9602. Cell view properties corresponding to the package layout may be shown in graphical user interface 9610 which may indicate a library location corresponding to the die. For example, the cell view properties may include a library location (e.g., ./IC_LIB_EIC), a layout library name (e.g., EIC), a layout cell name (e.g., EIC), and a layout view name (e.g., layout). Further, properties corresponding to content of an instance of the abstracted die footprint 9602 may be shown in the graphical user interface 9620 including a library (e.g., die_footprints_EIC), a cell (e.g., EIC_PKG), and a view (e.g., layout). This may be referred to as property-based binding. In some situations, property-based binding as illustrated in FIG. 96 may be difficult to configure because it may need to be performed on each abstract instance and may be difficult to update if a library location is changed.

Referring to FIG. 97, an example process of the EDA according to an embodiment of the present disclosure is shown. The process 9700 may include abstracting (9702) a level N-1 fabric. For example, a user may invoke a tool (e.g., an "export fabric" tool) that may automatically create a die abstract (e.g., die abstract 1302 in this example) from a die layout (e.g., die layout 1300 in this example). The process 9700 may further include creating (9704) a fabric level N fabric schematic. For example, in some embodiments, the user may manually create a level N package schematic (e.g., package schematic 1400 in this example). The process 9700 may also include creating (9706) a fabric level N fabric layout. For example, in some embodiments, the user may manually create a level N fabric layout. In this example, the package layout 1402 may be the level N package layout (e.g., manually created by the user).

The process 9700 may also include creating (9708) a configuration file. For example, in some embodiments, the user may manually create the configuration file. The configuration file may specify where the level N-1 fabric database corresponding to the abstracted level N-1 fabric layout is stored (e.g., by CONFIGURE AsbtractedLevelN-1Lib/Cell1/View1 pathToLevelN–1WorkingDir). From a given path (e.g., pathToLevelN-1WorkingDir), a file (e.g., cds.lib) may be found that may specify paths for all libraries used in the Level N-1 fabric (e.g., as indicated by FIG. 96). One or more operations of process 9700 may need to be performed manually. Further, an update may need to be performed if instances are renamed. Also, process 9700 may not support hierarchical capability. For example, at each design level, a user may have to reconfigure a corresponding hierarchy.

Referring to FIG. 98, example abstraction operations of the EDA according to embodiments of the present disclosure are shown. An export die tool of the EDA may be launched to create an abstract view of a die. The abstract may include properties including library/cell/view names associated with a corresponding die layout. Referring to FIG. 99, example abstraction operations of the distributed EDA according to embodiments of the present disclosure are shown. An export die tool of the distributed EDA may, in addition to creating an abstract view of the die, also create a configuration file that stores properties including library/cell/view names of the die layout, a working directory of a library of the die layout and exported die schematic, and library/cell/view names of the exported die schematic. Previously, a configuration file may only have been created manually, however the distributed EDA may create the configuration file automatically (e.g., via the export die tool). In other words, the export die tool of the distributed EDA may create the abstract view of the die and automatically create the configuration file which may include the information/properties described above that previously may have been stored in a database.

For example, the configuration file may be encrypted and may include one or more items of the following information/properties: library/cell/view names corresponding to the die layout, a working directory of a library corresponding to the die layout, library/cell/view names corresponding to the exported die schematic, a working directory a library corresponding to the exported die schematic, a name of a command to launch a corresponding EDA session, an optional script to source before launching a corresponding EDA session, and a string storing a design environment name to be used for the die. The export die tool may include default values for fields of the configuration file corresponding to the information/properties above, and the user may be permitted to overwrite the default values.

Referring to FIG. 100, example libraries associated with the distributed EDA according to an embodiment of the present disclosure are shown. For example, the configuration file may indicate which libraries corresponding to abstractions (e.g., ExpSchDieLib and Exp dieLib) are defined in the same distributed EDA libraries (e.g., cds.lib). For example, the distributed EDA library 10000 may define PKG lib 10002 (e.g., including abstracted views of dies I1, I2, and I3) and Exp dieLib 10004. Further, the distributed EDA library 10010 may define dieLib 10012 and ExpSchDieLib 10014. In the example shown, a Die exp config (i.e., configuration file) may access or have knowledge of a location of the distributed EDA library 10010 defining dieLib 10012 and ExpSchDieLib 10014. In this way, the distributed EDA may automatically link an abstracted view to a corresponding physical view.

Referring to FIG. 101, an example abstract view and corresponding graphical user interface associated with the distributed EDA according to an embodiment of the present disclosure are shown. Once dies are abstracted, they may be instantiated within a package (e.g., PKG 10100). PKG 10100 may be a layout or a schematic and may include 3 die instances (e.g., I1, I2 and I3). As discussed above, the configuration file may be encrypted. As such, in order to access and modify the configuration file, a graphical user interface tool may be provided. From a PKG layout or PKG schematic, a user can invoke or otherwise access the graphical user interface tool such as a system hierarchy configurator (SHC). The SHC may read the PKG layout (or schematic), retrieve an instance layout view (or symbolic view), retrieve an instance config view (e.g., a different view of the same cell), and read corresponding configuration information from the config view.

As shown in FIG. 101, a graphical user interface 10110 corresponding to the SHC may be populated with the configuration information. For example, a row in a table of graphical user interface 10110 corresponding to instance name I1 may show that the abstracted view is referencing a view at a certain location. Design names in the table may default to tab names shown in corresponding distributed EDA windows. Further, information corresponding to reference numerals 10112 (e.g., library paths), 10114 (e.g., commands), and 10116 (e.g., design names) in the table may be edited or modified by the user. If modified, the SHC may check the library paths for path validity and provide an indication to the user regarding the path validity, if necessary. Further, the SHC may check the design names for duplicates and may adjust the design names accordingly, and the design names may be modified by the user. If the information in the graphical user interface 10110 is saved (e.g., by the user selecting the save option), the information may be saved within each die config. A config or configuration file may be a text file that may be encrypted.

In some embodiments, other tools of the distributed EDA in addition to the export die tool may create configuration files. For example, a package may be exported (e.g., abstracted) using a distributed EDA export package tool, which may (in addition to creating an abstract view of the package) also create a configuration file similar to the configuration file described above with regard to the export die tool.

Referring to FIG. 102, an example view and corresponding graphical user interfaces associated with the distributed EDA according to an embodiment of the present disclosure are shown. A PCB view 10200 may be created by instantiating a PKG abstract view. For example, an instance I4 (shown in PCB 10200) of a previously exported (e.g., abstracted) PKG may be created. From the PCB view 10200, the user may invoke or otherwise access the SHC, which may be accessible via a graphical user interface 10210. The graphical user interface 10210 may include a row (e.g., corresponding to I4) that corresponds to an abstracted instance of the PKG view. Content of the PKG layout may be obtained by the SHC by calling a batch process or standalone application when, for example, the user expands the pkgLib config (e.g., by selecting or clicking on an arrow 10212). In other words, it may not be necessary to open the PKG layout with an EDA session hosting the PCB layout and there may be no risk of library conflict. As shown in graphical user interface 10220, the content of the PKG layout (e.g., I1, I2, and I3) may be shown after the user expands the pkgLib config. The batch process or standalone application may retrieve information corresponding to the package from different instances in the package, may acquire config views corresponding to the abstracted dies included in the package view, and may populate a table of graphical user interface 10220 accordingly, which the user may edit or modify. If information corresponding to I4 is modified via the graphical user interface 10220, the modification may be saved within the pkg config view corresponding to I4. If information corresponding to I1, I2, or I3 is modified via the graphical user interface 10220, the modification may be saved within a specific config view corresponding to the respective instance I1, I2, or I3.

It should be noted that while graphical user interfaces 10210 and 10220 correspond to a PCB design level, the editing/modifying may not correspond to the config of the PCB. Instead, the editing/modifying may correspond to the config of the package and the config of the IC. In other words, editing/modifying may be performed for a config that is a design level down as compared the current design level, and not for the current design level config. This is because the current design level config may be created by the exported pkg tool or exported die tool.

Referring to FIG. 103, an example of a configuration process (10300) of the distributed EDA in accordance with the present disclosure is shown. The process may include one or more of the following operations. A user may start (10302) an EDA tool (e.g., an export die tool). Further, the user may open (10304) a PCB design (e.g., a layout or schematic). Also, the user may invoke (or otherwise activate) (10306) a SHC. The SHC may check (10308) for abstract instances in the opened PCB design and retrieve corresponding config views. Further, the SHC may be opened and may display (10310) information corresponding to the config views at design level 0 (e.g., as shown in FIG. 102 by graphical user interface 10210). Also, the user may request to expand (10312) a design level +1 on an instance (e.g., instance I4, by selecting arrow 10212 of graphical user interface 10210).

In some embodiments, the SHC may invoke or otherwise activate (10314) a batch process 10350 (e.g., a standalone application or executable) to search sub configs (e.g., corresponding to I1, I2, and/or I3 of graphical user interface 10220). The batch process 10350 may include one or more operations as shown in FIG. 103. For example, the batch process 10350 may include opening (10316) the layout of a design level N-1 instance master (e.g., not a view as this operation is part of a batch process). Further, the batch process 10350 may include searching (10318) (e.g., the layout) for abstract instances. Also, batch process 10350 may include getting or acquiring (10320) config views (e.g., corresponding to the abstract instances). Additionally, the SHC may display (10322) sub configs (e.g., as shown in graphical user interface 10220) as child configs (e.g., corresponding to I1, I2, and/or I3 of graphical user interface 10220) of the expanded config.

Referring now to FIG. 104, a flowchart depicting an embodiment consistent with DIA process 10400 for configuration and access in DIA is provided. The process included herein may include receiving (10402) a request to create an abstract view corresponding to a first design level of an electronic design. The method may further include creating (10404) the abstract view corresponding to the first design level of the electronic design. The method may also include automatically creating (10406) a configuration file by, at least in part, populating the configuration file with first information (e.g., library/cell/view names) corresponding to a layout associated with the first design level.

One or more of the following features may be included. The method may include populating (10408) the configuration file with second information (e.g., library/cell/view names) corresponding to a schematic associated with the first design level. The method may further include running (10410) a configuration tool (e.g., SHC). The method may also include determining (10412), via the configuration tool (e.g., SHC), that there is a first abstract instance (e.g., corresponding to I4 as shown in graphical user interface 10210 of FIG. 102) corresponding to the first design level. The method (10414) may additionally include retrieving third information corresponding to the first abstract instance. Furthermore, the method may include displaying (10416) a graphical user interface (e.g., graphical user interface 10210 of FIG. 102) corresponding to the configuration tool (e.g., the SHC). Moreover, the method may include displaying (10418), at the graphical user interface (e.g., graphical user interface 10210 of FIG. 102), the third information (e.g., as shown in the table of graphical user interface 10210) corresponding to the first abstract instance.

The method may further include receiving (10420) a request to display, at the graphical user interface, fourth information associated with a second design level of the electronic design. Also, the method may include opening (10422) a master corresponding to the second design level. Additionally, the method may include determining (10424) that there is a second abstract instance (e.g., I1, I2, or I3) corresponding to the second design level. The method may furthermore include retrieving (10426) the fourth information, wherein the fourth information corresponds to the second abstract instance. The method may moreover include displaying (10428), at the graphical user interface (e.g., graphical user interface 10220 as shown in FIG. 102), the fourth information (e.g., corresponding to I1, I2, or I3 as shown in the table of graphical user interface 10220) corresponding to the second abstract instance (e.g., I1, I2, or I3). The method may further include modifying (10430) the fourth information via the configuration tool, wherein the first design level is a current design level, and the second design level is a design level below the first design level. A name corresponding to the first abstract instance may not be tied to the configuration file. The method may also include encrypting (10432) the configuration file.

Thus, using the techniques and features described by the present disclosure, a configuration file may be automatically created by an export tool and the configuration file may not need to be manually created. Further, the configuration file may not track an instance name and thus it may not be necessary to update the configuration file if the instance is renamed. Also, a level (i.e., design level) N system may be configured by opening/editing/saving configuration files corresponding level (i.e., design level) N-1, level (i.e., design level) N-2, etc. For example, a package may be configured by opening/editing/saving die configs and a PCB may be configured by opening/editing/saving PKG configs and die configs.

DIA Process 11900 and 12000—Addressing Modal Dialogs in DIA

In some embodiments, the distributed EDA may include a method or process for addressing modal dialogs in DIA (e.g., DIA processes 11900 and 12000 as shown in FIGS. 119-120). The DIA processes 11900 and 12000 may include one or more of the techniques, features, and/or operations described below.

Referring now to FIGS. 105-120, DIA processes 11900 and 12000 describe a method to handle one or more modal dialogs within distributed interactive applications, when raised by a non-active electronic design session.

The term "dialog", as used herein, may refer to a pop-up window with some information/notifications. The user may just close it by selecting ok/cancel, close, Yes/No buttons, or any other suitable approach.

The term "form", as used herein, may refer to a dialog that may provide additional widgets the user may interact with to set the content of some fields, like check boxes, combo boxes, etc.

The phrase "modal dialog/form", as used herein, may, refer to a dialog/form that appears on top of the main content and moves the system into a special mode requiring user interaction. This dialog may disable the main content until the user explicitly interacts with the modal dialog/form.

The phrase "non-modal form", as used herein, may refer to a form that may be displayed but may not necessarily need an answer from the user. For example, a form that allows one or more options for the display rendering of an EDA process.

The term "conductor", as used herein, may refer to a container process configured to manage a plurality of display windows at the graphical user interface and to display only one process at a given time.

The phrase "parent current session", as used herein, may refer to the current session that temporary allowed a non-current session to be displayed on screen. The parent current session may still be the current session, but the displayed session may be a non-current session. A parent current session may be considered as the session that is waiting for answers from a non-current session temporary displayed in place.

The term "delimiter", as used herein, may refer to one or more specific tags used in replay file to delimit the scope of some replay actions.

In existing systems, a modal form freezes the process until the modal form is closed. For any reason, it may occur that a non-current session requests a modal form to be displayed/answered to get unlocked. This may be an issue when the current electronic design session waits for answers from non-current sessions. Since the current session is busy the user cannot change to another session. However, the non-current session is frozen due to a modal form that is not displayed.

Embodiments included herein may address how these modal dialogs may be handled interactively, how their actions may be logged in a replay file, and/or how generated replay files with modal dialogs of a non-current electronic design session may be replayed.

In some embodiments, DIA process 11900 may be based upon real-time logging. Accordingly, a consolidated replay file (e.g., "CDS.log" by default), may be provided at the start with –log argument, like a classical application (e.g., "log myReplay.log"). In some embodiments, only the current session/application may have its actions logged in the consolidated replay file. Additionally, and/or alternatively, when a modal dialog is raised in a non-current session by a command launched from the current session, one or more dialogs of non-current sessions may be "blocked" and the session may be highlighted in red to notify. The user may be temporarily allowed to switch.

In some embodiments, when a modal dialog is raised in a non-current session by a command launched from the current session one or more dialogs of the non-current sessions may not be exposed to user, until the user has switched to the blocked session tab. In some embodiments, a "blocked" session may be visually emphasized (e.g., highlighted in red) to notify the user that a blocking form needs to be answered. The user may be temporary allowed (in this particular case) to switch to this "blocked session". In some embodiments, the "blocked" session may not come into the current session. Real-time logging may be disabled on the current session and enabled on the non-current session. Special tags may be added in the replay file to notify the user that a temporary switch to a non-current session has occurred. The user may be allowed to interact with the blocking form and answer it. Form actions may be logged inside the parent current session replay section. Any parent current session events that may come in between are put on the side (logs postponed). Once the blocking form is closed, the process may automatically switch back on the parent current session. A special tag may be added in the replay file to notify the user that the temporary switch has ended. The process may be configured to stop real-time logging on the non-current session and reactivate it on the current session. The process may log postponed logs of the current session if any. Since everything is managed by real-time logging, the process may ensure that replay events are logged sequentially. When a temporary switch from a sub-session to a dialog with modal forms occurs, the "top" session may still be current, but it's real-time logging may be disabled. If any top log event appears in a top session while the process is answering the temporary blocked session, the events may be postponed and just added after the real-time logging is re-enabled.

Referring to FIG. 105, a diagram 10500 showing an example use model consistent with embodiments of the present disclosure is provided. In operation, a current session may wait for an answer of a non-current session. When a blocking form is popped within a non-current session window the form is not mapped and the corresponding tab may be visually highlighted at a graphical user interface (e.g., in red at a tab, etc.). The user may select and/or switch to the visually highlighted tab and this visually highlighted tab may become displayed but may not become the current session. Any dialog/form belonging to the displayed non-current session may be displayed on screen, while those of the parent current session may be hidden. In some embodiments, the user may only interact with the blocking forms and may not switch to any other session. As soon as the user disposes all blocking forms (e.g., OK, cancel), the conductor may automatically leave the visually highlighted tab and expose again the current session.

In some embodiments, DIA process 11900 may be configured to provide real-time logging functionality. In operation, when the user clicks on the visually highlighted tab, the conductor may add comments in CDS.log (e.g., \o #Start Modal SessionName). The conductor may cache all log-Strings coming from the current session and/or enable real-time logging associated with the blocked session. When the user accepts/cancels the blocking form the conductor may disable the real-time logging associated with the blocked session. The conductor may also add a comment in CDS.log (e.g., \o #End Modal) and may log cached log-Strings in CDS.log.

Referring to FIG. 106, a diagram 10600 showing an example flowchart consistent with embodiments of the present disclosure is provided. In operation, a user may invoke a command with waiting answers. The event may be logged in real-time. The conductor may then detect the modal form has been invoked from a non-current session. The conductor may then highlight the concerned tab (e.g., in red or otherwise). The user may temporarily switch to the highlighted tab (e.g., all hidden forms may be displayed with modal one on top) and the conductor may disable real-time logging on the current session. The conductor may add a start modal tag for a temporary session and may enable real-time logging on it. The current session may start to cache any log event that it may receive while its real-time logging is disabled. The user may perform actions on the modal form and close it. The modal form events may be logged, and the conductor may end the modal tag for the temporary session and disable any real-time logging. The conductor may automatically switch back to the current session. The conductor may log any cached log events in the current session. Real-time logging may be re-enabled on the current session. The user may continue to work on the current session.

Referring to FIG. 107, a diagram 10700 showing an example of replay file snippet extraction consistent with embodiments of the present disclosure is provided. When extracting a replay file snippet from a distributed replay file, the conductor may remove all modal form interactions and cache them within a session name-based table. For each blocked session within the snippet, the table may store a list of user interactions. The first item within the list may include the list of user interactions with the first modal form. The second item within the list may include a list of user interactions with the second modal form.

Referring to FIG. 108, a diagram 10800 showing an example of replay file snippet replay consistent with embodiments of the present disclosure is provided. In operation, the conductor may extract a replay file snippet from a replay file. The conductor may request that the current session replay the extracted replay file. When a non-current session is blocked by a modal form, it may call the conductor to obtain the next set of user interactions and apply those user interactions.

Figure 109:
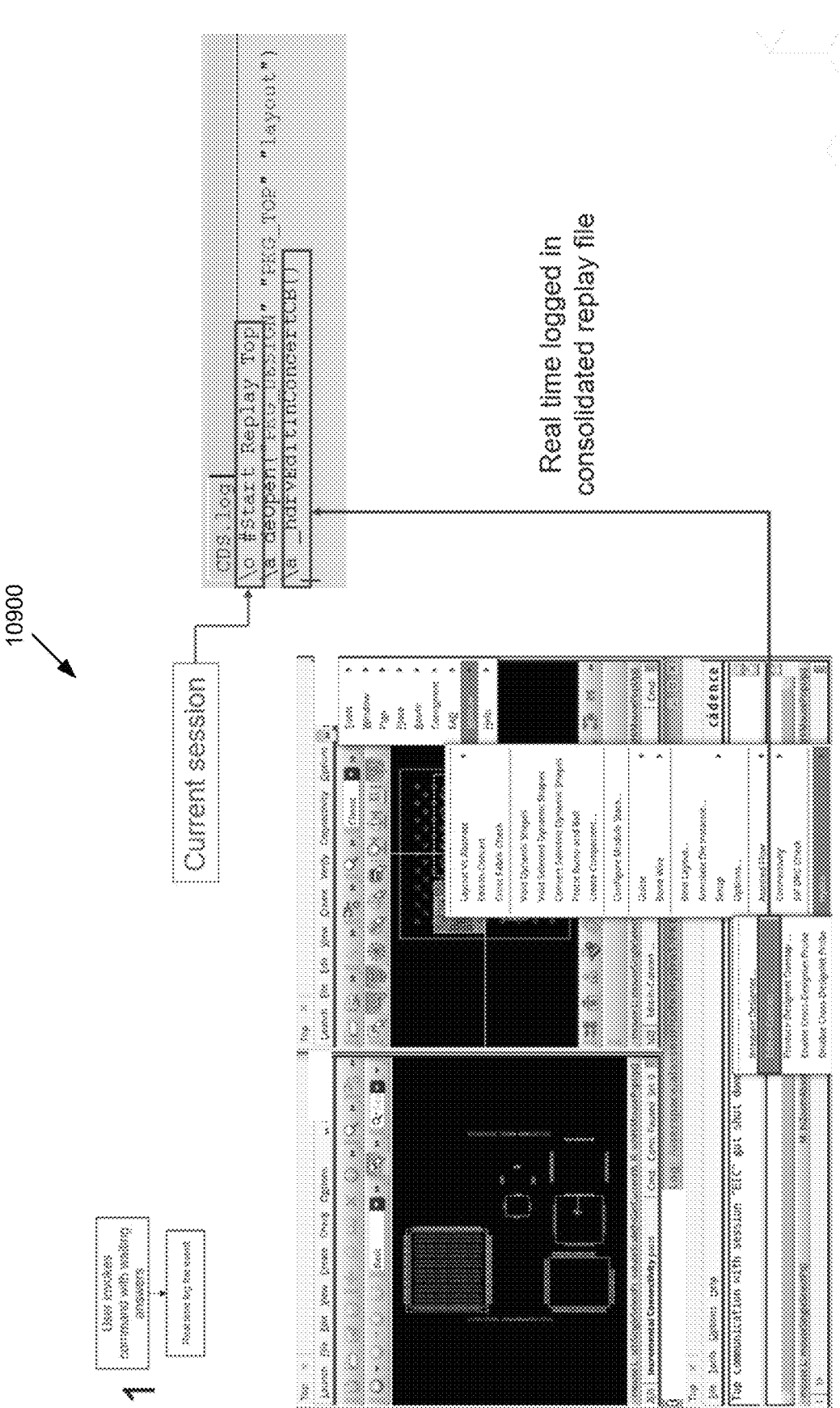

Referring now to FIGS. 109-115, graphical user interfaces showing examples of each of the operations discussed in FIG. 106 above are provided. FIG. 109 shows an example GUI 10900 where the user may have invoked a command with waiting answers. The event may be logged in real-time in a consolidated replay file. In this example, the current session is indicated by "#Start Replay Top". However, the particular labels used throughout the document are provided merely by way of example.

Figure 110:
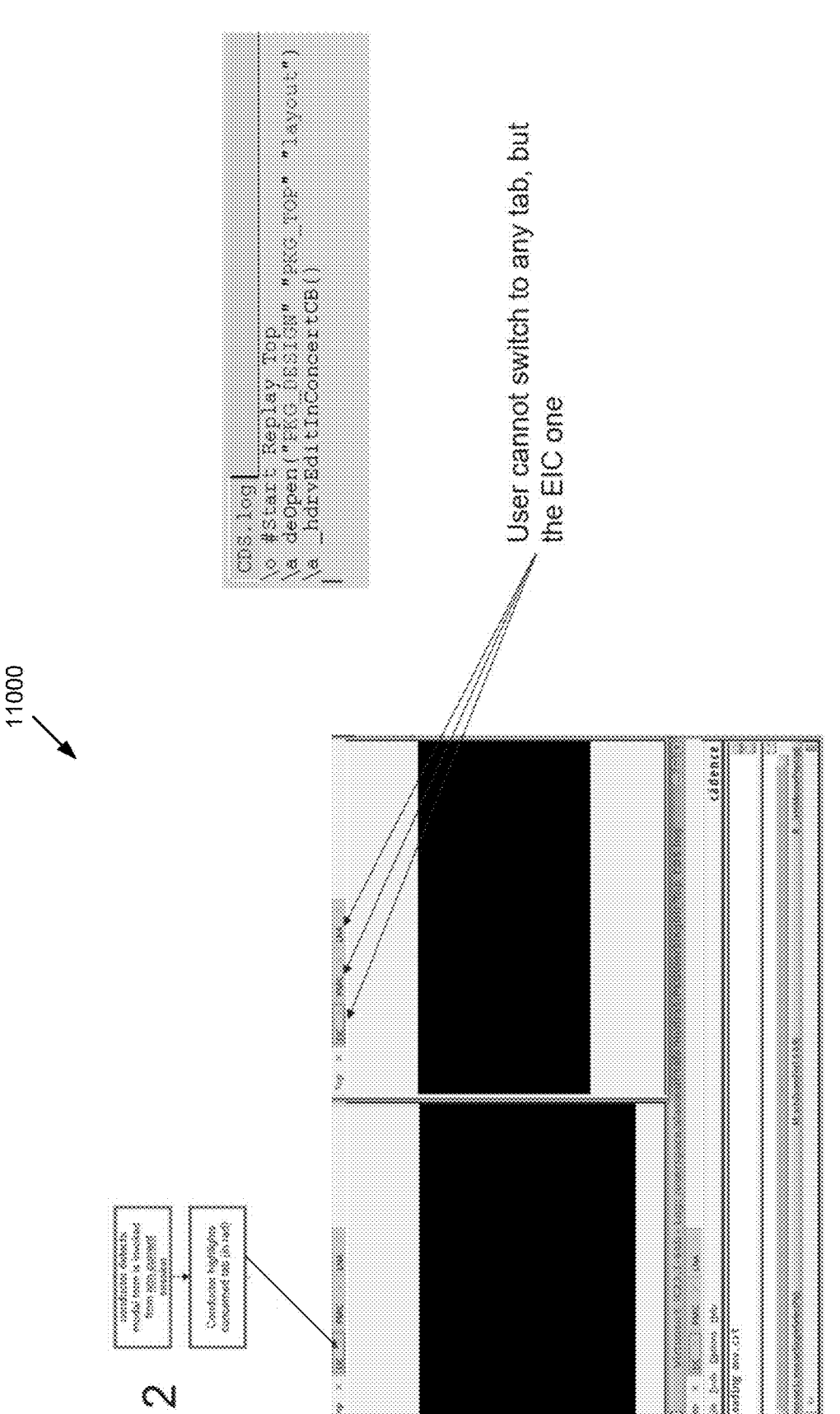

FIG. 110 shows an example GUI 11000 where the conductor detects a modal form is invoked from a non-current session. The conductor may highlight the concerned tab (e.g., in red, etc.). The process may not allow the user to switch to any other tab other than the highlighted tab.

Figure 111:
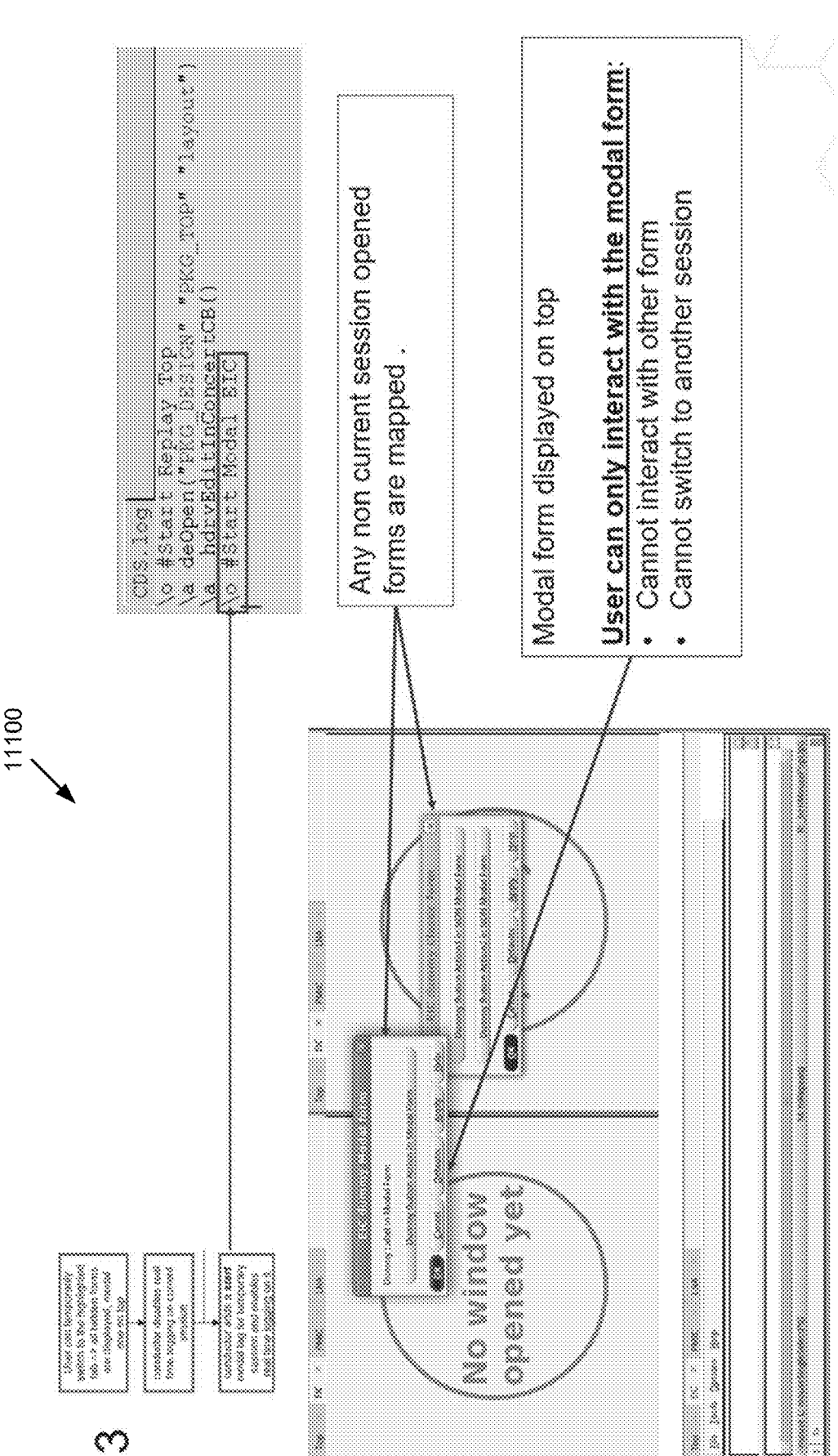

FIG. 111 shows an example GUI 11100 where the user may temporarily switch to the highlighted tab (e.g., all hidden forms may be displayed with modal one on top) and the conductor may disable real-time logging on the current session. The conductor may add a start modal tag for a temporary session and may enable real-time logging on it. As shown in the FIG. 111, any non-current session opened forms may be mapped. The modal form may be displayed on top. The user may only be allowed to interact with the modal form. As such, the user may not interact with any other form and cannot switch to any other session.

Figure 112:
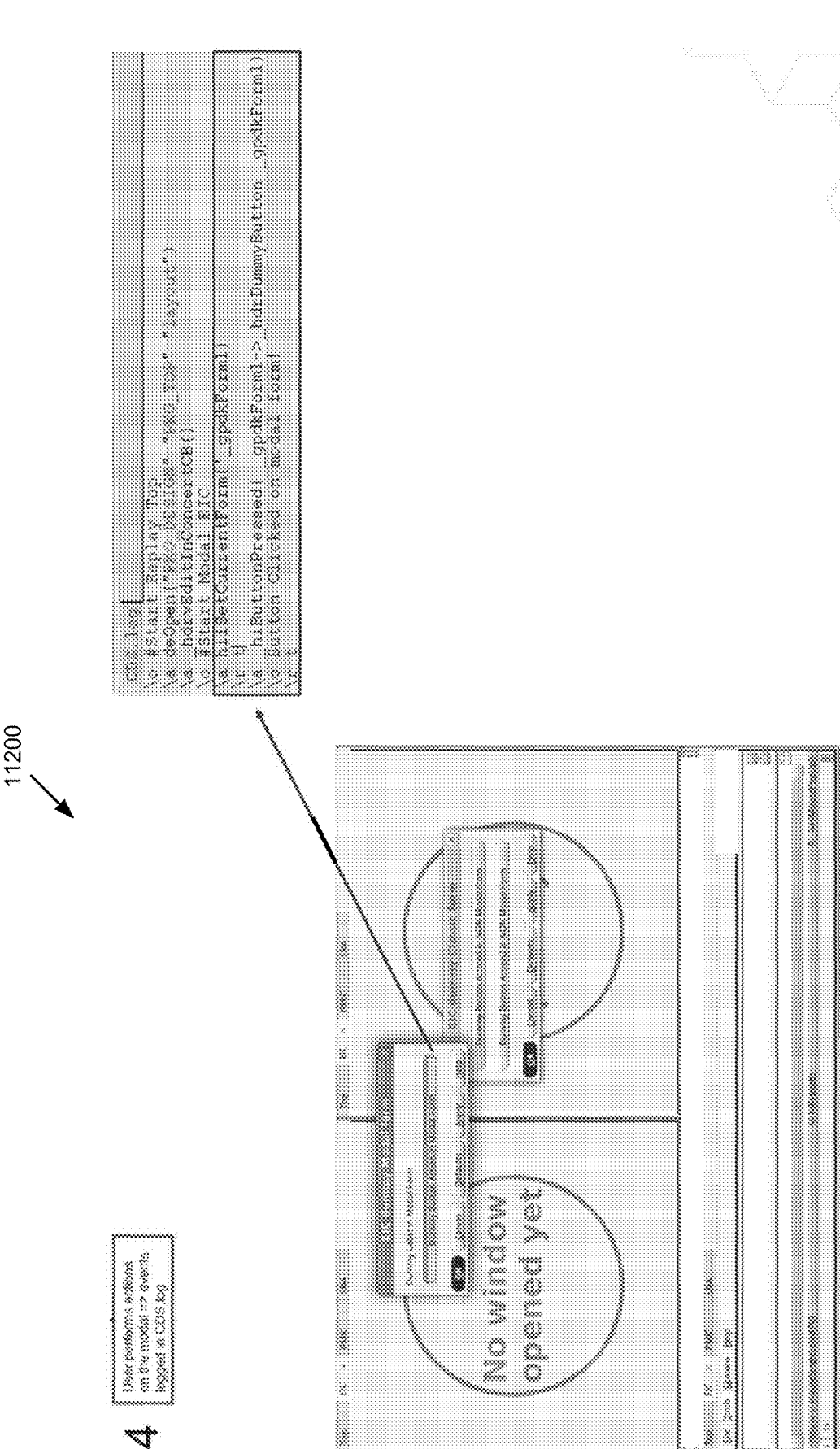
Figure 113:
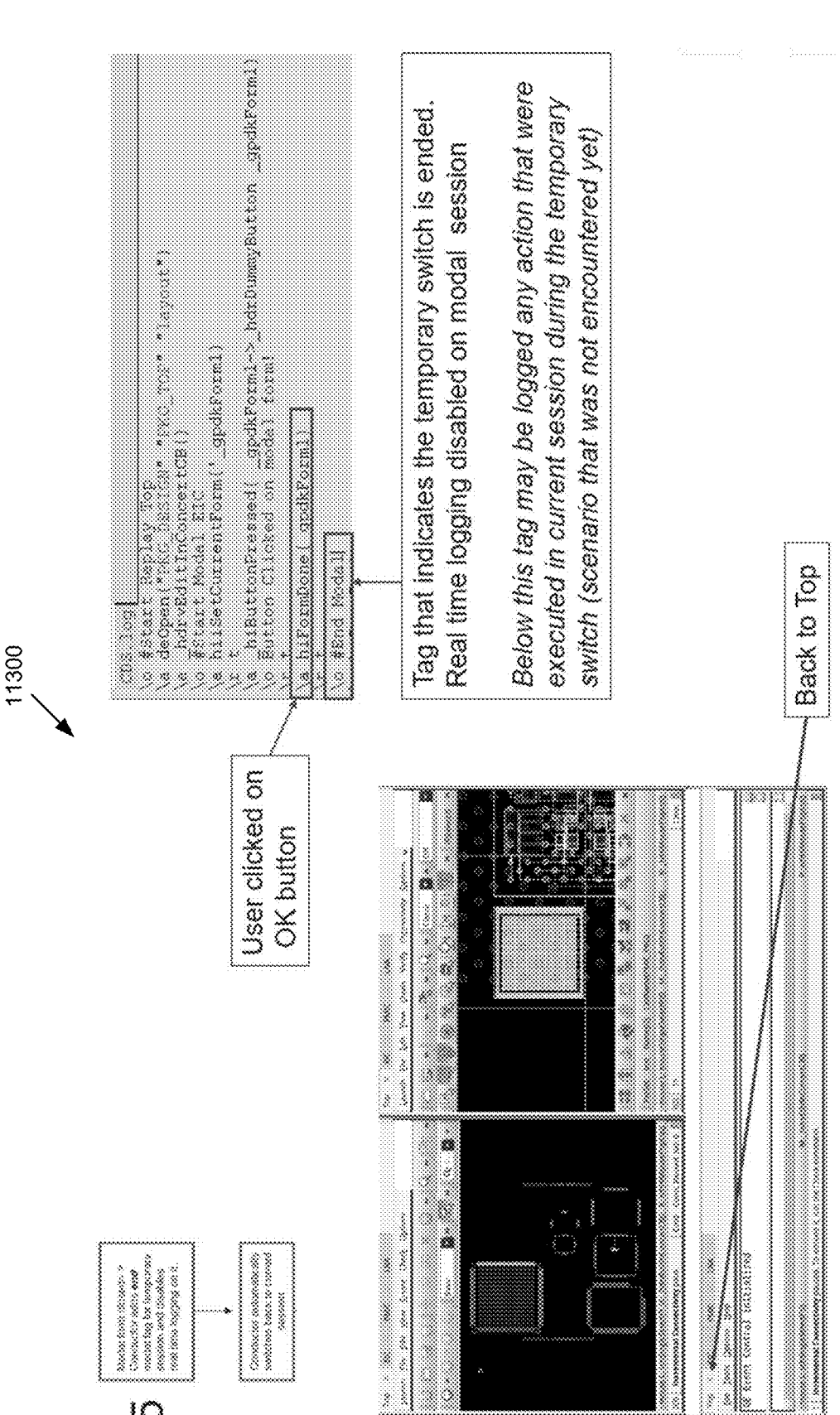
Figure 114:
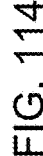
Figure 115:
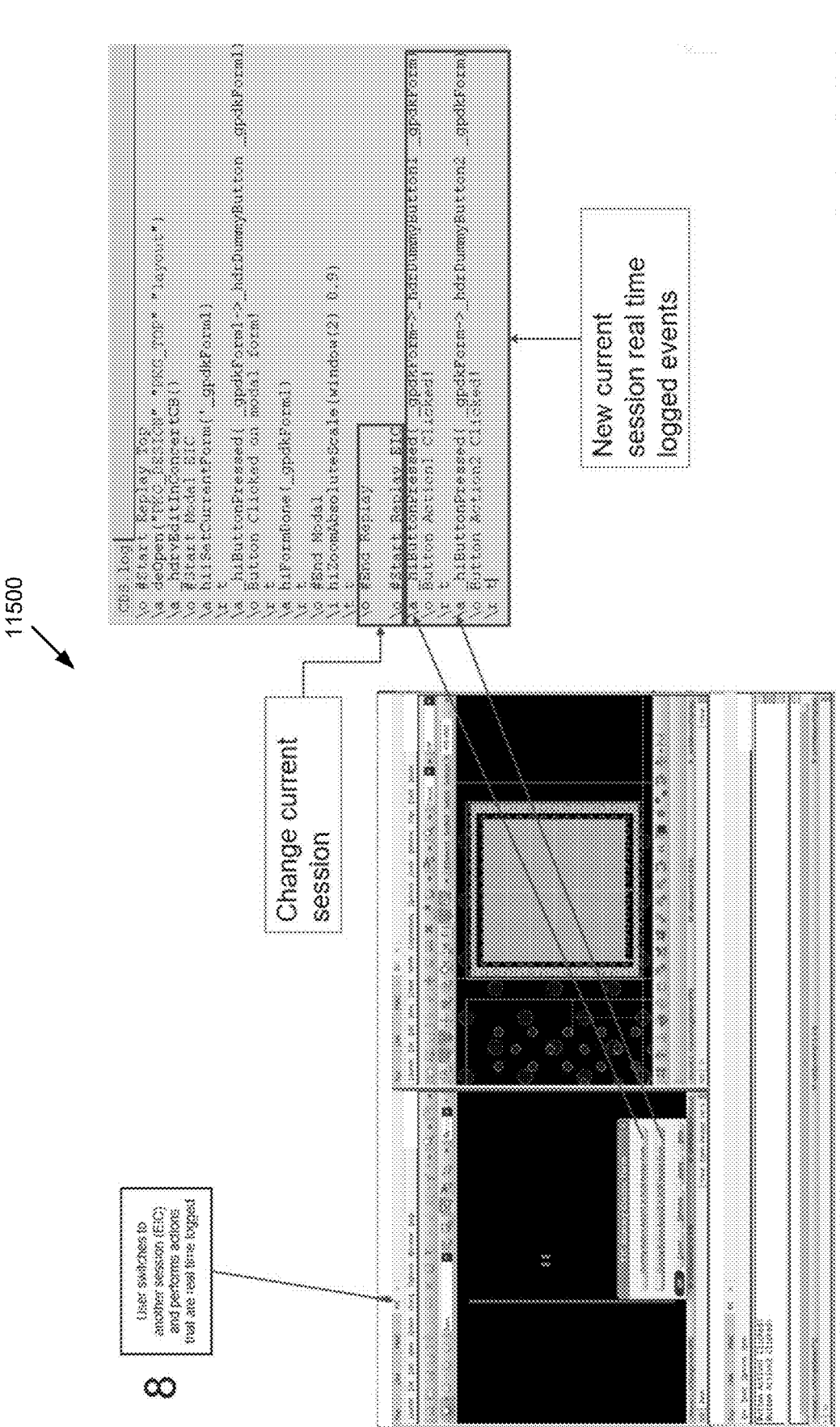

FIG. 112 shows an example GUI 11200 where the user may perform actions on the modal form and close it. The modal form events may be logged. FIG. 113 shows an example GUI 11300 where the modal form events may be logged, and the conductor may end the modal tag for the temporary session and disable any real-time logging. The conductor may automatically switch back to the current session. The tag "end modal" may indicate that the temporary switch has ended, and real-time logging has been disabled on the modal session. Below this tag any action may be logged that was executed in the current session during the temporary switch. FIG. 114 shows an example GUI 11400 where the user continues to work in the current session. FIG. 115 shows an example GUI 11500 where the user has switched to another session (e.g., EIC) and performs actions that may be logged in real-time.

Referring now to FIGS. 116-118, embodiments of the present disclosure directed towards replaying a replay file are provided. FIG. 116 depicts a flowchart 11600 showing operations for replaying a replay file consistent with embodiments of the present disclosure. In operation, the user may invoke a replay file from a shell terminal and the conductor may replay the file. The conductor process may continue as set forth below. The process may extract the next pair of delimiters and retrieve information about the next current electronic design process. The process may extract the replay file snippet in between the pair of start/end replay delimiters. The process may then remove all modal form interactions and cache them within a session name-based table. The process may proceed to set the new current process based on the information on the extracted delimiter pair and request that the current process replay the replay file snippet. The process may then detect any modal form from the non-current sessions and/or temporarily switch to a blocked session. The process may then obtain a list of user interactions in the session table for the corresponding form and replay those actions. The process may switch back to the current session replay and end the replay snippet.

Referring now to FIGS. 117-118, embodiments showing examples of graphical user interfaces consistent with the present disclosure are provided. FIG. 117 shows an example GUI 11700 for extracting the replay file snippet between the pair of delimiters. The process may remove all modal form interactions and cache them within a session name-based table. Extracted interactions for the entire replay file and extracted replay snippet for the Top session with modal interactions removed are shown. FIG. 118 shows an example GUI 11800 where the process includes requesting that the current process replay the replay file snippet and detect any modal form from the non-current session. The process may temporarily switch to the blocked session and obtain a list of user interactions in the session table for the corresponding form. The process may repeat those actions and switch back to the current session replay.

Referring now to FIG. 119, a flowchart 11900 showing a method consistent with embodiments of the present disclosure is provided. The method may include receiving 11902, at a graphical user interface, a command associated with a current electronic design session and determining 11904, using a processor, that a modal dialog from a non-current electronic design session is triggered by the command. The method may further include causing 11906 a display at the graphical user interface of a blocking form associated with the modal dialog that requires user action.

Referring now to FIG. 120, a flowchart 12000 showing a method consistent with embodiments of the present disclosure is provided. The method may include receiving 12002 a selection of a replay file associated with an electronic design and replaying the replay file. The method may further include extracting 12004 a pair of delimiters and retrieving information about a next current electronic design process. The method may also include extracting 12006 a replay file snippet located between the pair of delimiters and removing all modal form interactions.

It will be apparent to those skilled in the art that various modifications and variations can be made to the one or more DIA processes 2100-12000 and/or embodiments of the present disclosure without departing from the spirit or scope of the invention. Thus, it is intended that embodiments of the present disclosure cover the modifications and variations of this invention provided they come within the scope of the appended claims and their equivalents.

What is claimed is:

1. A computer-implemented method associated with an electronic design, comprising:
    receiving, at a graphical user interface, a command associated with a currently displayed electronic design session;
    determining, using a processor, that a modal dialog from a non-currently displayed electronic design session is triggered by the command;
    causing a display at the graphical user interface of a form associated with the modal dialog that requires user action;
    allowing a user to select the form to temporarily access the non-currently displayed electronic design session; and in response to receiving a selection, disabling a real-time logging of the currently displayed electronic design session.

2. The computer-implemented method of claim 1, further comprising:
    performing a real-time logging of the command and the determined modal dialog in the currently displayed electronic design session.

3. The computer-implemented method of claim 1, further comprising:
    caching one or more log events received while real-time logging is disabled.

4. The computer-implemented method of claim 3, further comprising:
    generating a start modal tag for a temporary session; and
    enabling real-time logging.

5. The computer-implemented method of claim 4, further comprising:
    receiving one or more user actions associated with a modal form.

6. The computer-implemented method of claim 5, further comprising:
    closing the modal form and disabling real-time logging.

7. The computer-implemented method of claim 6, further comprising:
    automatically switching back to the currently displayed electronic design session.

8. The computer-implemented method of claim 7, further comprising:
    re-enabling real-time logging of the currently displayed electronic design session; and
    logging one or more cached events of the currently displayed electronic design session.

9. The computer-implemented method of claim 1, further comprising:
    allowing a user to select the form to temporarily access the non-currently displayed electronic design session.

10. The computer-implemented method of claim 9, further comprising:
    obtaining a list of user interactions from a session table.

11. The computer-implemented method of claim 10, further comprising:
    replaying the user interactions.

12. The computer-implemented method of claim 11, further comprising:
    switching back to replaying the replay file.

13. The computer-implemented method of claim 12, further comprising:
    ending the replay file snippet.

14. A computer-implemented method associated with an electronic design, comprising:
    receiving a selection of a replay file associated with an electronic design;
    replaying the replay file;
    extracting a pair of delimiters and retrieving information about a next electronic design process;
    extracting a replay file snippet located between the pair of delimiters;
    removing all modal form interactions; and
    receiving a request to replay the replay file snippet.

15. The computer-implemented method of claim 14, further comprising:
    caching the modal form interactions within a session table.

16. The computer-implemented method of claim 14, further comprising:

setting a new current electronic design process based upon, at least in part, the replay file snippet.

17. The computer-implemented method of claim 14, further comprising:

detecting a modal form from a non-currently displayed electronic design session.

18. A computer-implemented method associated with an electronic design, comprising:

receiving a selection of a replay file associated with an electronic design;

replaying the replay file;

extracting a pair of delimiters and retrieving information about a next electronic design process;

extracting a replay file snippet located between the pair of delimiters;

removing all modal form interactions;

allowing a user to select the form to temporarily access the non-currently displayed electronic design session; and obtaining a list of user interactions from a session table.

* * * * *